(12) United States Patent
Yamazaki et al.

(10) Patent No.: US 10,586,812 B2
(45) Date of Patent: Mar. 10, 2020

(54) SEMICONDUCTOR DEVICE AND DISPLAY DEVICE INCLUDING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Junichi Koezuka, Tochigi (JP); Kenichi Okazaki, Tochigi (JP); Yukinori Shima, Gunma (JP); Shinpei Matsuda, Kanagawa (JP); Haruyuki Baba, Kanagawa (JP); Ryunosuke Honda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/355,913

(22) Filed: Mar. 18, 2019

(65) Prior Publication Data

US 2019/0280019 A1    Sep. 12, 2019

Related U.S. Application Data

(63) Continuation of application No. 15/963,141, filed on Apr. 26, 2018, now Pat. No. 10,236,306, which is a
(Continued)

(30) Foreign Application Priority Data

Mar. 22, 2016  (JP) .................. 2016-057716
Mar. 22, 2016  (JP) .................. 2016-057718
Mar. 22, 2016  (JP) .................. 2016-057720

(51) Int. Cl.
*H01L 29/786*    (2006.01)
*H01L 27/12*     (2006.01)
(Continued)

(52) U.S. Cl.
CPC ........ *H01L 27/1225* (2013.01); *H01L 27/127* (2013.01); *H01L 29/66969* (2013.01);
(Continued)

(58) Field of Classification Search
CPC ......... H01L 21/02436; H01L 21/02518; H01L 21/70; H01L 21/702; H01L 21/8232
See application file for complete search history.

(56) References Cited

U.S. PATENT DOCUMENTS 9,496,408 B2    11/2016   Yamazaki et al.
2010/0117078 A1  5/2010   Kuwabara et al.
(Continued)

FOREIGN PATENT DOCUMENTS

CN    103855194 A    6/2014
CN    104221154 A    12/2014
(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — Cheung Lee
(74) *Attorney, Agent, or Firm* — Fish & Richardson P.C.

(57) ABSTRACT

To improve field-effect mobility and reliability in a transistor including an oxide semiconductor film. A semiconductor device includes a transistor including an oxide semiconductor film. The transistor includes a region where the maximum value of field-effect mobility of the transistor at a gate voltage of higher than 0 V and lower than or equal to 10 V is larger than or equal to 40 and smaller than 150; a region where the threshold voltage is higher than or equal to minus 1 V and lower than or equal to 1 V; and a region where the S value is smaller than 0.3 V/decade.

26 Claims, 90 Drawing Sheets

Related U.S. Application Data continuation of application No. 15/464,534, filed on Mar. 21, 2017, now Pat. No. 9,960,190.

(51) Int. Cl.
  *H01L 29/778* (2006.01)
  *H01L 29/66* (2006.01)
  *H01L 29/24* (2006.01)

(52) U.S. Cl.
  CPC ...... *H01L 29/7781* (2013.01); *H01L 29/7782* (2013.01); *H01L 29/7786* (2013.01); *H01L 29/7869* (2013.01); *H01L 29/78648* (2013.01); *H01L 29/78696* (2013.01); *H01L 29/24* (2013.01)

(56) References Cited

U.S. PATENT DOCUMENTS

| | | |
|---|---|---|
| 2010/0133530 A1 | 6/2010 | Akimoto et al. |
| 2011/0180794 A1* | 7/2011 | Yamazaki ............ G02F 1/13624 257/43 |
| 2012/0286260 A1 | 11/2012 | Noda et al. |
| 2013/0270109 A1 | 10/2013 | Morita et al. |
| 2014/0110707 A1 | 4/2014 | Koezuka et al. |
| 2014/0151690 A1* | 6/2014 | Kim .................... H01L 29/7869 257/43 |
| 2015/0001532 A1* | 1/2015 | Yamazaki ............ H01L 29/7869 257/43 |
| 2015/0076487 A1 | 3/2015 | Shimoda et al. |
| 2016/0240682 A1 | 8/2016 | Shimomura et al. |
| 2016/0260837 A1 | 9/2016 | Koezuka et al. |
| 2017/0062620 A1 | 3/2017 | Yamazaki et al. |
| 2017/0170332 A1 | 6/2017 | Yamazaki |
| 2017/0236844 A1 | 8/2017 | Yamazaki et al. |
| 2017/0256654 A1 | 9/2017 | Yamazaki et al. |

FOREIGN PATENT DOCUMENTS

| | | |
|---|---|---|
| EP | 2738815 A | 6/2014 |
| JP | 2007-096055 A | 4/2007 |
| JP | 2012-253331 A | 12/2012 |
| JP | 2013-239531 A | 11/2013 |
| JP | 2014-007399 A | 1/2014 |
| JP | 2014-110429 A | 6/2014 |
| JP | 2014-229666 A | 12/2014 |
| KR | 2014-0070344 A | 6/2014 |
| KR | 2014-0146185 A | 12/2014 |
| KR | 2015-0000484 A | 1/2015 |
| TW | 201342629 | 10/2013 |
| TW | 201347199 | 11/2013 |
| TW | 201428980 | 7/2014 |
| TW | 201442249 | 11/2014 |
| WO | WO-2013/141197 | 9/2013 |
| WO | WO-2013/172237 | 11/2013 |
| WO | WO-2014/125820 | 8/2014 |

OTHER PUBLICATIONS

International Search Report (Application No. PCT/IB2017/051456) dated Jul. 11, 2017.
Written Opinion (Application No. PCT/IB2017/051456) dated Jul. 11, 2017.

* cited by examiner

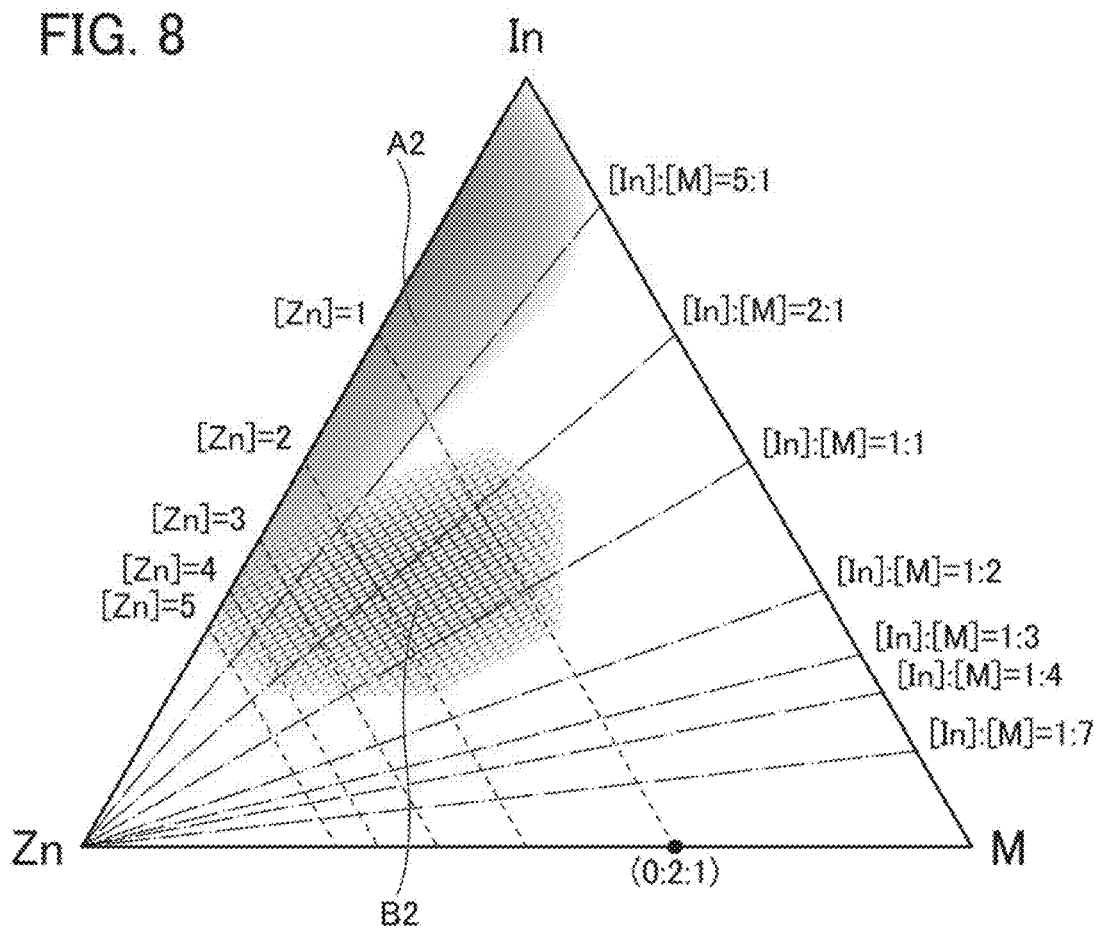

100H

100H

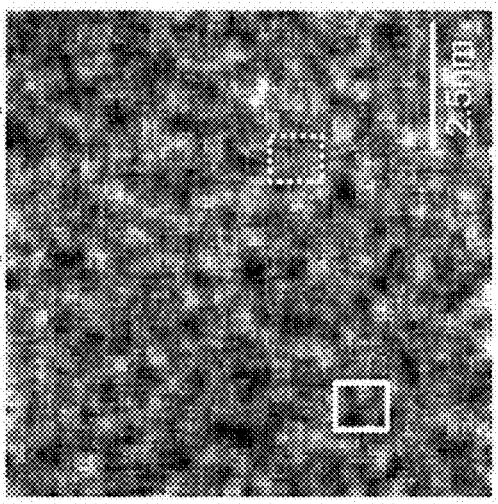
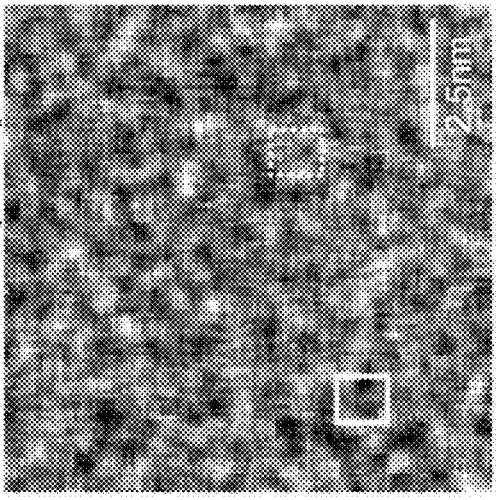
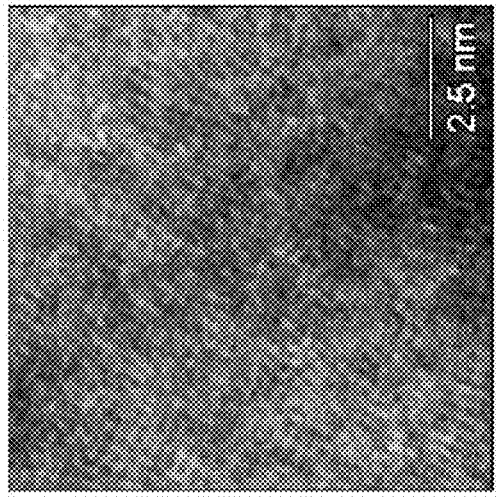
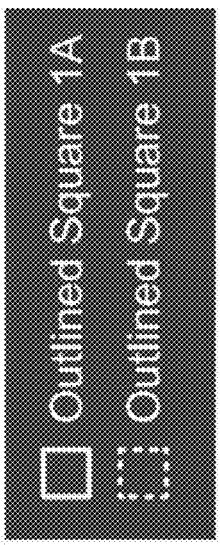
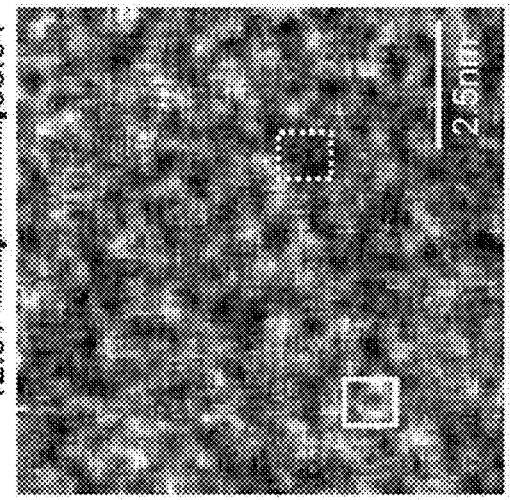
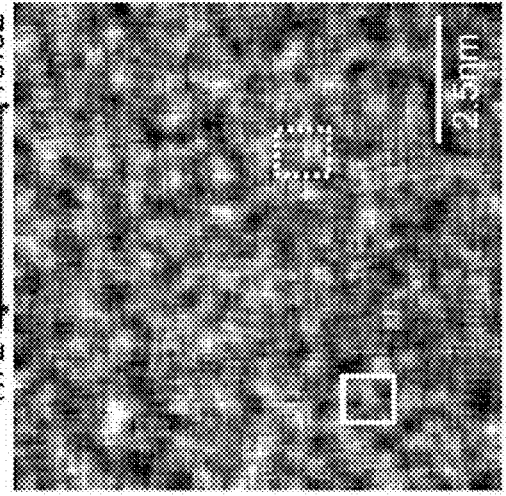

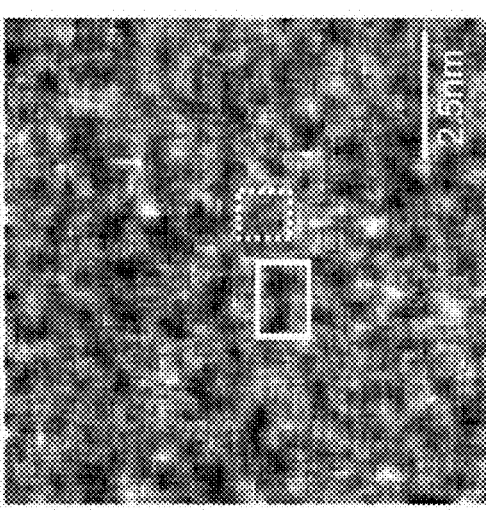
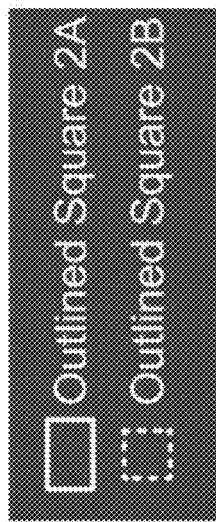
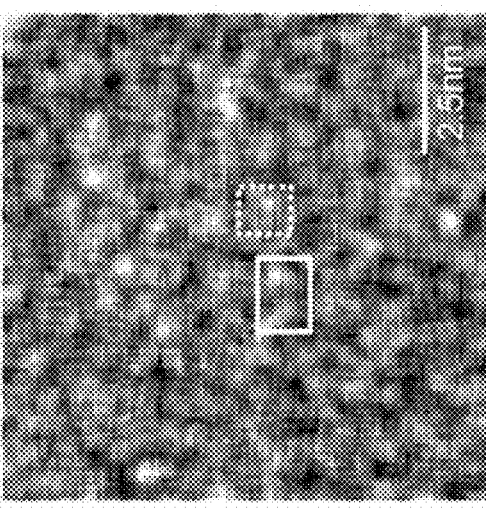
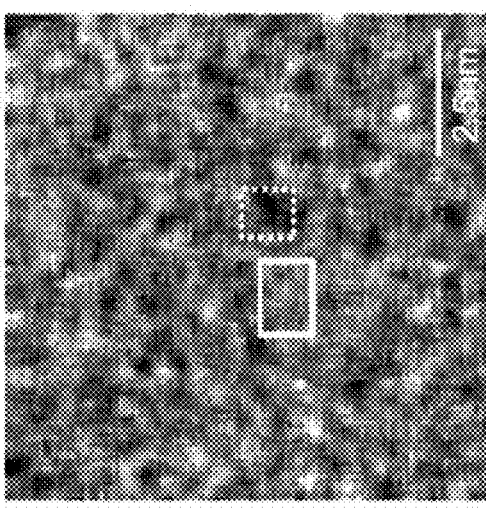
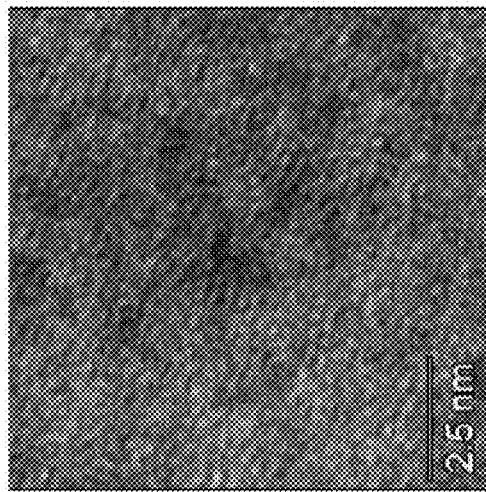
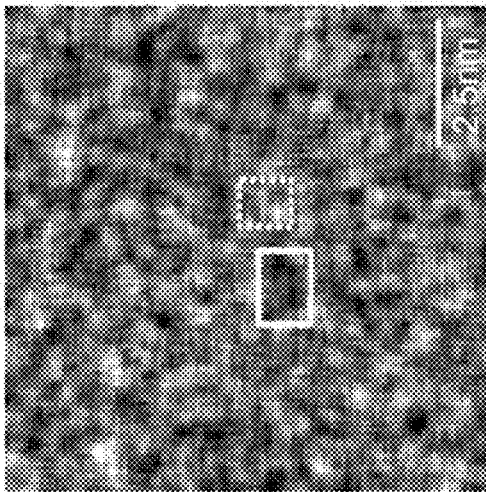

SEMICONDUCTOR DEVICE AND DISPLAY DEVICE INCLUDING THE SAME

CROSS-REFERENCE TO RELATED APPLICATIONS

This application is a continuation of U.S. application Ser. No. 15/963,141, filed Apr. 26, 2018, now allowed, which is a continuation of U.S. application Ser. No. 15/464,534, filed Mar. 21, 2017, now U.S. Pat. No. 9,960,190, which claims the benefit of foreign priority applications filed in Japan on Mar. 22, 2016, as Serial Nos. 2016-057718, 2016-057720, and 2016-057716, all of which are incorporated by reference.

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. One embodiment of the present invention particularly relates to an oxide semiconductor or a manufacturing method of the oxide semiconductor. One embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such a transistor is applied to a wide range of electronic devices such as an integrated circuit (IC) or an image display device (display device). A semiconductor material typified by silicon is widely known as a material for a semiconductor thin film that can be used in a transistor. As another material, an oxide semiconductor has been attracting attention. For example, a technique in which a transistor is fabricated using an In—Ga—Zn-based oxide semiconductor is disclosed (see Patent Document 1).

Furthermore, a semiconductor device achieving high field-effect mobility (simply referred to as mobility or $\mu_{FE}$ in some cases) with such a structure that a plurality of oxide semiconductor layers are stacked, the oxide semiconductor layers functioning as a channel in the plurality of oxide semiconductor layers contains indium and gallium, and the proportion of indium is higher than the proportion of gallium is disclosed (see Patent Document 1).

Non-Patent Document 1 discloses a homologous series represented by $In_{1-x}Ga_{1+x}O_3(ZnO)_m$ (−1≤x≤1, and m is a natural number). Furthermore, Non-Patent Document 1 discloses a solid solution range of a homologous series. For example, in the solid solution range of the homologous series in the case where m is 1, x ranges from −0.33 to 0.08, and in the solid solution range of the homologous series in the case where m is 2, x ranges from −0.68 to 0.32.

REFERENCES

Patent Documents

[Patent Document 1] Japanese Published Patent Application No. 2007-96055
[Patent Document 2] Japanese Published Patent Application No. 2014-007399

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315.

DISCLOSURE OF INVENTION

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and current flows through the transistor.

Furthermore, in a transistor that uses an oxide semiconductor film in a channel region, oxygen vacancies which are formed in the oxide semiconductor film adversely affect the transistor characteristics. For example, oxygen vacancies formed in the oxide semiconductor film are bonded with hydrogen to serve as carrier supply sources. The carrier supply sources generated in the oxide semiconductor film cause a change in the electrical characteristics, typically, shift in the threshold voltage, of the transistor including the oxide semiconductor film.

When the amount of oxygen vacancies in the oxide semiconductor film is too large, for example, the threshold voltage of the transistor is shifted in the negative direction, and the transistor has normally-on characteristics. Thus, especially in the channel region of the oxide semiconductor film, the amount of oxygen vacancies is preferably small or the amount with which the normally-on characteristics are not exhibited.

In addition, Non-Patent Document 1 discloses an example of $In_xZn_yGa_zO_w$, and when x, y, and z are set so that a composition in the neighborhood of $ZnGa_2O_4$ is obtained, i.e., x, y, and z are close to 0, 1, and 2, respectively, a spinel crystal structure is formed or is likely to be mixed. A compound represented by $AB_2O_4$ (A and B are metal) is known as a compound having a spinel crystal structure.

However, when a spinel crystal structure is formed or mixed in an In—Ga—Zn-based oxide semiconductor, electrical characteristics or reliability of a semiconductor device (e.g., a transistor) including the In—Ga—Zn-based oxide semiconductor is adversely affected by the spinel crystal structure in some cases.

In view of the foregoing problems, an object of one embodiment of the present invention is to improve field-effect mobility and reliability in a transistor including an oxide semiconductor film. An object of one embodiment of the present invention is to prevent a change in electrical characteristics of a transistor including an oxide semiconductor film and to improve the reliability of the transistor. An object of one embodiment of the present invention is to provide a semiconductor device with low power consumption. An object of one embodiment of the present invention is to provide a semiconductor device with favorable electrical characteristics. An object of one embodiment of the present invention is to provide a novel oxide semiconductor. An object of one embodiment of the present invention is to provide a novel semiconductor device. An object of one embodiment of the present invention is to provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor including an insulating film, a first conductive film, a second conductive film, a third conductive film, and an oxide semiconductor film. The first conductive film includes a region in contact with the oxide semiconductor film. The second conductive film includes a region in contact with the oxide semiconductor film. The third conductive film includes a region that overlaps with the oxide semiconductor film with the insulating film therebetween. The transistor includes a region where a maximum value of field-effect mobility of the transistor at a gate voltage of higher than 0 V and lower than or equal to 10 V is larger than or equal to 40 cm$^2$/Vs and smaller than 150 cm$^2$/Vs, a region where threshold voltage is higher than or equal to −1 V and lower than or equal to 1 V, a region where an S value is smaller than 0.3 V/decade, and a region where off-state current is lower than 1×10$^{-12}$ A/cm$^2$, and $\mu_{FE}$(max)/$\mu_{FE}$(V$_g$=2V) is larger than or equal to 1 and smaller than 1.5 where $\mu_{FE}$(max) represents the maximum value of the field-effect mobility of the transistor and $\mu_{FE}$(V$_g$=2V) represents a value of the field-effect mobility of the transistor at a gate voltage of 2 V.

One embodiment of the present invention is a semiconductor device including a transistor including a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the gate electrode, a source region in contact with the third insulating film, and a drain region in contact with the third insulating film. The first gate electrode and the second gate electrode are electrically connected to each other. The transistor includes a region where a maximum value of field-effect mobility of the transistor at a gate voltage of higher than 0 V and lower than or equal to 10 V is larger than or equal to 40 cm$^2$/Vs and smaller than 150 cm$^2$/Vs, a region where threshold voltage is higher than or equal to −1 V and lower than or equal to 1 V, a region where an S value is smaller than 0.3 V/decade, and a region where off-state current is lower than 1×10$^{-12}$ A/cm$^2$, and $\mu_{FE}$(max)/$\mu_{FE}$(V$_g$=2V) is larger than or equal to 1 and smaller than 1.5 where $\mu_{FE}$(max) represents the maximum value of the field-effect mobility of the transistor and $\mu_{FE}$(V$_g$=2V) represents a value of the field-effect mobility of the transistor at a gate voltage of 2 V.

In the above embodiments, it is preferable that the oxide semiconductor film include a region where density of shallow defect states is lower than 1.0×10$^{-12}$ cm$^2$.

One embodiment of the present invention is a semiconductor device including a transistor including an insulating film, a first conductive film, a second conductive film, a third conductive film, and an oxide semiconductor film. The first conductive film includes a region in contact with the oxide semiconductor film. The second conductive film includes a region in contact with the oxide semiconductor film. The third conductive film includes a region that overlaps with the oxide semiconductor film with the insulating film therebetween. The transistor includes a region where a maximum value of field-effect mobility of the transistor at a gate voltage of higher than 0 V and lower than or equal to 10 V is larger than or equal to 40 cm$^2$/Vs and smaller than 150 cm$^2$/Vs, a region where threshold voltage is higher than or equal to −1 V and lower than or equal to 1 V, a region where an S value is smaller than 0.3 V/decade, and a region where off-state current is lower than 1×10$^{-12}$ A/cm$^2$, and $\mu_{FE}$(max)/ $\mu_{FE}$(V$_g$=2V) is larger than or equal to 1.5 and smaller than 3 where $\mu_{FE}$(max) represents the maximum value of the field-effect mobility of the transistor and $\mu_{FE}$(V$_g$=2V) represents a value of the field-effect mobility of the transistor at a gate voltage of 2 V.

One embodiment of the present invention is a semiconductor device including a transistor including a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the gate electrode, a source region in contact with the third insulating film, and a drain region in contact with the third insulating film. The first gate electrode and the second gate electrode are electrically connected to each other. The transistor includes a region where a maximum value of field-effect mobility of the transistor at a gate voltage of higher than 0 V and lower than or equal to 10 V is larger than or equal to 40 cm$^2$/Vs and smaller than 150 cm$^2$/Vs, a region where threshold voltage is higher than or equal to −1 V and lower than or equal to 1 V, a region where an S value is smaller than 0.3 V/decade, and a region where off-state current is lower than 1×10$^{-12}$ A/cm$^2$, and $\mu_{FE}$(max)/$\mu_{FE}$(V$_g$=2V) is larger than or equal to 1.5 and smaller than 3 where $\mu_{FE}$(max) represents the maximum value of the field-effect mobility of the transistor and $\mu_{FE}$(V$_g$=2V) represents a value of the field-effect mobility of the transistor at a gate voltage of 2 V.

In the above embodiments, it is preferable that the oxide semiconductor film include a region where density of shallow defect states is higher than or equal to 1.0×10$^{-12}$ cm$^2$ and lower than 2.0×10$^{-12}$ cm$^2$.

One embodiment of the present invention is a semiconductor device including a transistor including an insulating film, a first conductive film, a second conductive film, a third conductive film, and an oxide semiconductor film. The first conductive film includes a region in contact with the oxide semiconductor film. The second conductive film includes a region in contact with the oxide semiconductor film. The third conductive film includes a region that overlaps with the oxide semiconductor film with the insulating film therebetween. The transistor includes a region where a maximum value of field-effect mobility of the transistor at a gate voltage of higher than 0 V and lower than or equal to 10 V is larger than or equal to 10 cm$^2$/Vs and smaller than 100 cm$^2$/Vs, a region where threshold voltage is higher than or equal to −1 V and lower than or equal to 1 V, a region where an S value is smaller than 0.3 V/decade, and a region where off-state current is lower than $1\times10^{-12}$ A/cm$^2$, and $\mu_{FE}(\max)/\mu_{FE}(V_g=2V)$ is larger than or equal to 3 and smaller than 10 where $\mu_{FE}(\max)$ represents the maximum value of the field-effect mobility of the transistor and $\mu_{FE}(V_g=2V)$ represents a value of the field-effect mobility of the transistor at a gate voltage of 2 V.

One embodiment of the present invention is a semiconductor device including a transistor including a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the gate electrode, a source region in contact with the third insulating film, and a drain region in contact with the third insulating film. The first gate electrode and the second gate electrode are electrically connected to each other. The transistor includes a region where a maximum value of field-effect mobility of the transistor at a gate voltage of higher than 0 V and lower than or equal to 10 V is larger than or equal to 10 cm$^2$/Vs and smaller than 100 cm$^2$/Vs, a region where threshold voltage is higher than or equal to −1 V and lower than or equal to 1 V, a region where an S value is smaller than 0.3 V/decade, and a region where off-state current is lower than $1\times10^{-12}$ A/cm$^2$, and $\mu_{FE}(\max)/\mu_{FE}(V_g=2V)$ is larger than or equal to 3 and smaller than 10 where $\mu_{FE}(\max)$ represents the maximum value of the field-effect mobility of the transistor and $\mu_{FE}(V_g=2V)$ represents a value of the field-effect mobility of the transistor at a gate voltage of 2 V.

In the above embodiments, it is preferable that the oxide semiconductor film include a region where density of shallow defect states is higher than or equal to $2.0\times10^{-12}$ cm$^2$ and lower than $3.0\times10^{-12}$ cm$^2$.

In the above embodiments, it is preferable that the oxide semiconductor film include a composite oxide semiconductor in which a first region and a second region are mixed; the first region include a plurality of first clusters including, as a main component, one or more selected from indium, zinc, and oxygen; the second region include a plurality of second clusters including, as a main component, one or more selected from indium, an element M, zinc, and oxygen; the element M be Al, Ga, Y, or Sn; the first region include a portion in which the plurality of first clusters are connected to each other; and the second region include a portion in which the plurality of second clusters are connected to each other.

In the above embodiments, it is preferable that an atomic ratio of the indium to the element M and the zinc be In:M:Zn=4:2:3 or in a neighborhood of 4:2:3, and, when the In is 4, the element M be greater than or equal to 1.5 and less than or equal to 2.5 and the Zn be greater than or equal to 2 and less than or equal to 4. In the above embodiments, it is preferable that an atomic ratio of the indium to the element M and the zinc be In:M:Zn=5:1:6 or in a neighborhood of 5:1:6, and, when the In is 5, the element M be greater than or equal to 0.5 and less than or equal to 1.5 and the Zn be greater than or equal to 5 and less than or equal to 7.

In the above embodiments, it is preferable that the first clusters have electrical conductivity and the second clusters have electrical semiconductivity.

In the above embodiments, it is preferable that the first clusters each include a portion longer than or equal to 0.5 nm and shorter than or equal to 1.5 nm.

One embodiment of the present invention is a display device including a display element and the semiconductor device of any one of the above embodiments. One embodiment of the present invention is a display module including the display device and a touch sensor. One embodiment of the present invention is an electronic device including the semiconductor device of any one of the above embodiments, the display device, or the display module; and an operation key or a battery. One embodiment of the present invention is an electronic device including the semiconductor device of any one of the above embodiments; and an inverter or a converter.

One embodiment of the present invention can improve field-effect mobility and reliability in a transistor including an oxide semiconductor film. One embodiment of the present invention can prevent a change in electrical characteristics of a transistor including an oxide semiconductor film and improve the reliability of the transistor. One embodiment of the present invention can provide a semiconductor device with low power consumption. One embodiment of the present invention can provide a semiconductor device with favorable electrical characteristics. One embodiment of the present invention can provide a novel oxide semiconductor. One embodiment of the present invention can provide a novel semiconductor device. One embodiment of the present invention can provide a novel display device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 8 illustrates an atomic ratio of an oxide semiconductor.

FIGS. 88A to 88E show a HAADF-STEM image and EDX mapping images of a plane.

FIGS. 89A to 89E show a HAADF-STEM image and EDX mapping images of a cross section.

BEST MODE FOR CARRYING OUT THE INVENTION

Figure 1:
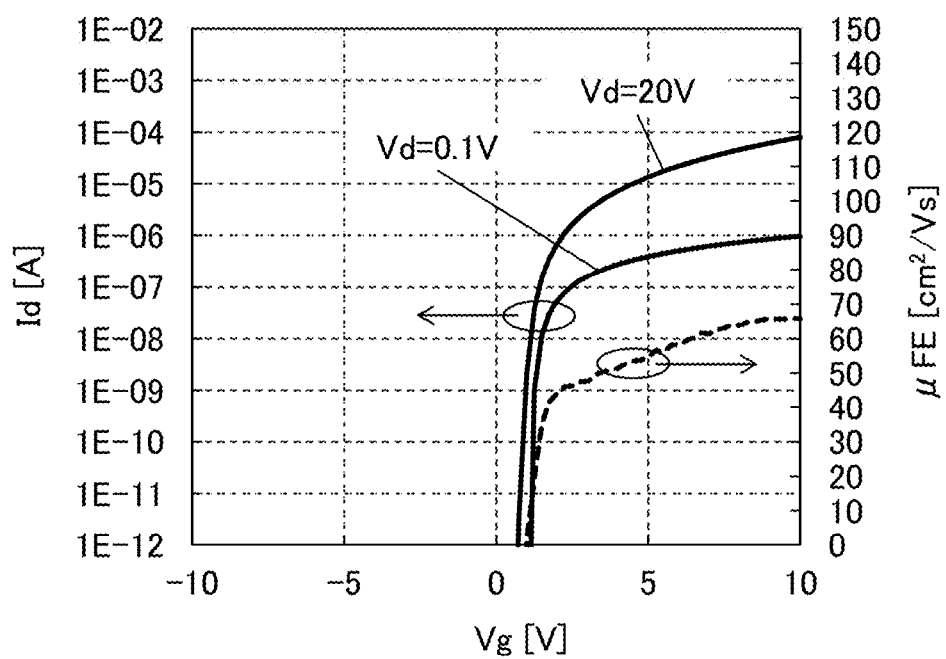
FIG. 1 shows $I_d$-$V_g$ characteristics of a transistor.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over", "above", "under", and "below", are used for convenience in describing a positional relation between components with reference to drawings. Further, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow between the drain and the source through the channel region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 50. The term "perpendicular" means that the angle formed between two straight lines is greater than or equal to 800 and less than or equal to 1000, and accordingly also covers the case where the angle is greater than or equal to 850 and less than or equal to 950.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, the off-state current in this specification and the like refers to a drain current of a transistor in an off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". Furthermore, "the off-state current of a transistor" means "the off-state current in an off state at predetermined $V_{gs}$", "the off-state current in an off state at $V_{gs}$ in a predetermined range", "the off-state current in an off state at $V_{gs}$ with which sufficiently reduced off-state current is obtained", or the like.

As an example, the assumption is made of an n-channel transistor where the threshold voltage $V_{th}$ is 0.5 V and the drain current is 1×10$^{-9}$ A at $V_{gs}$ of 0.5 V, 1×10$^{-13}$ A at $V_{gs}$ of 0.1 V, 1×10$^{-19}$ A at $V_{gs}$ of −0.5 V, and 1×10$^{-22}$ A at $V_{gs}$ of −0.8 V. The drain current of the transistor is 1×10$^{-19}$ A or lower at $V_{gs}$ of −0.5 V or at $V_{gs}$ in the range of −0.8 V to −0.5 V; therefore, it can be said that the off-state current of the transistor is 1×10$^{-19}$ A or lower. Since there is $V_{gs}$ at which the drain current of the transistor is 1×10$^{-22}$ A or lower, it may be said that the off-state current of the transistor is 1×10$^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the required reliability of a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the required reliability of a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to current that flows through a source of a transistor in an off state.

In this specification and the like, the term "leakage current" sometimes expresses the same meaning as off-state current. In this specification and the like, the off-state current sometimes refers to current that flows between a source and a drain when a transistor is off, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d[A] \times L$ [μm]/W [μm] is $1 \times 10^{-9}$ [A] where L is channel length and W is channel width.

In this specification and the like, a "semiconductor" can have characteristics of an "insulator" when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 13 elements, Group 14 elements, Group 15 elements, and transition metals other than the main components; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

Embodiment 1

In this embodiment, a semiconductor device of one embodiment of the present invention is described with reference to FIG. 1 to FIG. 35C.

One embodiment of the present invention is a semiconductor device including a transistor. The transistor includes a first gate electrode, a first insulating film over the first gate electrode, an oxide semiconductor film over the first insulating film, a second insulating film over the oxide semiconductor film, a second gate electrode over the second insulating film, and a third insulating film over the oxide semiconductor film and the second gate electrode. The oxide semiconductor film includes a channel region overlapping with the gate electrode, a source region in contact with the third insulating film, and a drain region in contact with the third insulating film. The first gate electrode and the second gate electrode are electrically connected to each other.

The transistor includes a first region where the maximum value of the field-effect mobility of the transistor at a gate voltage of higher than 0 V and lower than or equal to 10 V is larger than or equal to 40 cm²/Vs and smaller than 150 cm²/Vs, a second region where the threshold voltage is higher than or equal to −1 V and lower than or equal to 1 V, a third region where the S value is smaller than 0.3 V/decade, and a fourth region where the off-state current is lower than $1 \times 10^{-12}$ A/cm², and $\mu_{FE}(\text{max})/\mu_{FE}(V_g=2V)$ is larger than or equal to 1 and smaller than 1.5 where $\mu_{FE}(\text{max})$ represents the maximum value of the field-effect mobility of the transistor and $\mu_{FE}(V_g=2V)$ represents the value of the field-effect mobility of the transistor at a gate voltage of 2 V.

In some cases, $\mu_{FE}(\text{max})/\mu_{FE}(V_g=2V)$ is larger than or equal to 1.5 and smaller than 3 in the transistor.

The above structure can also be described as follows: a semiconductor device of one embodiment of the present invention is a transistor in which an oxide semiconductor film is included in a channel region, and the field-effect mobility, the threshold voltage, the off-state current, and the S value of the transistor are excellent. Such a semiconductor device can be suitably used as a transistor in a pixel of an organic EL display or a transistor in a driver circuit of an organic EL display.

In some cases, the transistor includes a first region where the maximum value of the field-effect mobility of the transistor at a gate voltage of higher than 0 V and lower than or equal to 10 V is larger than or equal to 10 cm²/Vs and smaller than 100 cm²/Vs, a second region where the threshold voltage is higher than or equal to −1 V and lower than or equal to 1 V, a third region where the S value is smaller than 0.3 V/decade, and a fourth region where the off-state current is lower than $1\times10^{-12}$ A/cm², and $\mu_{FE}(\max)/\mu_{FE}(V_g=2V)$ is larger than or equal to 3 and smaller than 10 where $\mu_{FE}(\max)$ represents the maximum value of the field-effect mobility of the transistor and $\mu_{FE}(V_g=2V)$ represents the value of the field-effect mobility of the transistor at a gate voltage of 2 V.

The structure is also described as follows: a semiconductor device of one embodiment of the present invention is a transistor in which an oxide semiconductor film is included in a channel region, and the transistor is highly reliable because of its high heat resistance and stable physical properties. Such a semiconductor device can be suitably used as a power device. For example, such a semiconductor device can be suitably used as a semiconductor device in an electric power converter such as an inverter or a converter. As other examples, such a semiconductor device can be used for inverter control in an electric vehicle, a hybrid vehicle, an air conditioner, or the like, various general-purpose motors, or the like. In this embodiment, an oxide semiconductor which is one embodiment of the present invention is described.

<1-1. Oxide Semiconductor Film>

First, an oxide semiconductor film that can be used in a transistor of one embodiment of the present invention is described with reference to FIG. 4A to FIG. 13.

Indium is preferably contained in an oxide semiconductor film. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor film contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. The terms of the atomic ratio of indium, the element M, and zinc contained in the oxide semiconductor film are denoted by [In], [M], and [Zn], respectively.

<1-2. Structure of Oxide Semiconductor Film>

Figure 4A:
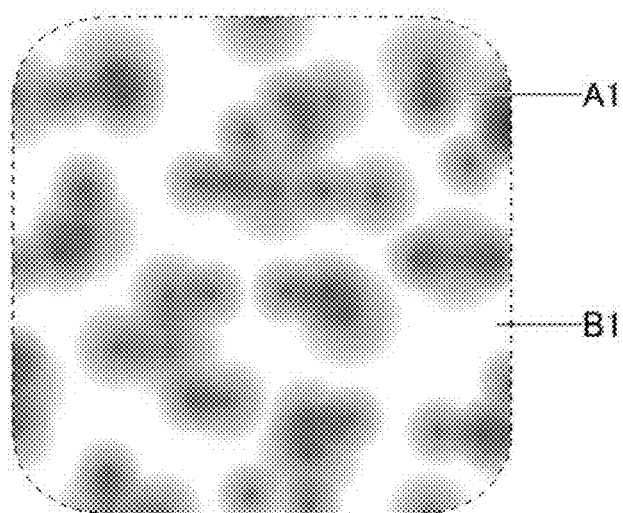
FIGS. 4A and 4B are a schematic top view and a schematic cross-sectional view illustrating a composite oxide semiconductor.
Figure 4B:
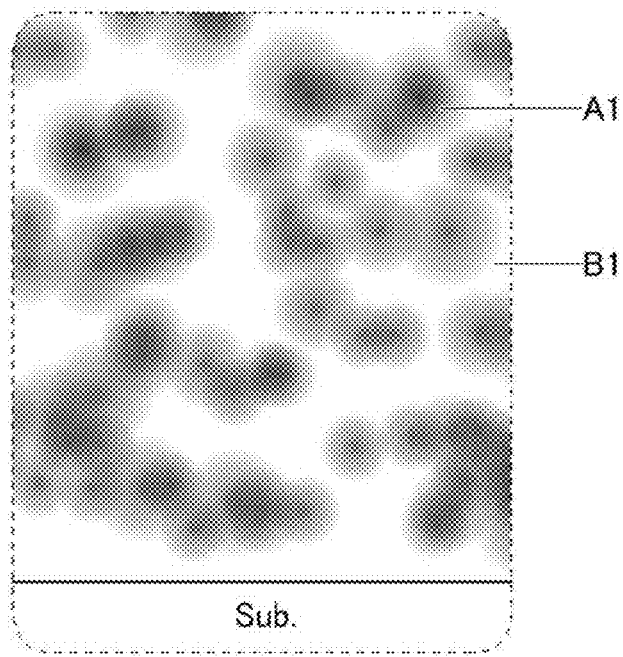

FIGS. 4A and 4B are schematic views of an oxide semiconductor film in one embodiment of the present invention.

FIG. 4A is a schematic view of a top surface of an oxide semiconductor film (a-b plane direction), and FIG. 4B is a schematic view of a cross section of the oxide semiconductor film (c-axis direction) formed over a substrate Sub.

FIGS. 4A and 4B illustrate an example in which the oxide semiconductor film is formed over the substrate; however, one embodiment of the present invention is not limited to this example and an insulating film such as a base film or an interlayer film or another semiconductor film such as an oxide semiconductor film may be formed between the substrate and the oxide semiconductor film.

The oxide semiconductor film of one embodiment of the present invention is a composite oxide semiconductor having a structure in which Region A1 and Region B1 are mixed as shown in FIGS. 4A and 4B. Therefore, in the following description, the oxide semiconductor film is referred to as a composite oxide semiconductor in some cases.

Region A1 shown in FIGS. 4A and 4B is high in In with [In]:[M]:[Zn]=x:y:z (x>0, y≥0, z≥0). In contrast, Region B1 is low in In with [In]:[M]:[Zn]=a:b:c (a>0, b>0, c>0).

Note that in this specification, for example, when the atomic ratio of In to the element M in Region A1 is greater than the atomic ratio of In to the element M in Region B1, Region A1 has higher In concentration than Region B1. Therefore, in this specification, Region A1 is also referred to as an In-rich region, and Region B1 is also referred to as an In-poor region.

For example, the In concentration in Region A1 is 1.1 or more times, preferably 2 to 10 times that in Region B1. Region A1 is an oxide containing at least In and does not necessarily contain the element M and Zn.

The atomic ratio of elements included in the composite oxide semiconductor of one embodiment of the present invention will be described here.

A phase diagram in FIG. 8 can be used to show the atomic ratio of elements in the case where Region A1 in the composite oxide semiconductor contains In, the element M, and Zn. The atomic ratio of In to the element M and Zn is denoted by x:y:z. This atomic ratio can be shown as coordinates (x:y:z) in FIG. 8. Note that the proportion of oxygen atoms is not illustrated in FIG. 8.

In FIG. 8, dashed lines correspond to a line representing the atomic ratio of [In]:[M]:[Zn]=(1+α):(1−α): 1 (−1≤α≤1), a line representing the atomic ratio of [In]:[M]:[Zn]=(1+α):(1−α):2, a line representing the atomic ratio of [In]:[M]:[Zn]=(1+α):(1−α):3, a line representing the atomic ratio of [In]:[M]:[Zn]=(1+α):(1−α):4, and a line representing the atomic ratio of [In]:[M]:[Zn]=(1+α):(1−α):5.

Dashed-dotted lines correspond to a line representing the atomic ratio of [In]:[M]:[Zn]=1:1:β (β≥0), a line representing the atomic ratio of [In]:[M]:[Zn]=1:2:3, a line representing the atomic ratio of [In]:[M]:[Zn]=1:3:3, a line representing the atomic ratio of [In]:[M]:[Zn]=1:4:3, a line representing the atomic ratio of [In]:[M]:[Zn]=1:7:3, a line representing the atomic ratio of [In]:[M]:[Zn]=2:1:3, and a line representing the atomic ratio of [In]:[M]:[Zn]=5:1:β.

An oxide semiconductor having the atomic ratio of [In]:[M]:[Zn]=0:2:1 or a neighborhood thereof in FIG. 8 tends to have a spinel crystal structure.

Region A2 in FIG. 8 represents an example of a preferred range of atomic ratios of indium to the element M and zinc contained in Region A1. Note that Region A2 includes atomic ratios on a line representing the atomic ratio of [In]:[M]:[Zn]=(1+γ):0:(1−γ) (−1≤γ≤1).

Region B2 in FIG. 8 represents an example of a preferred range of atomic ratios of indium to the element M and zinc contained in Region B1. Note that Region B2 includes atomic ratios from [In]:[M]:[Zn]=4:2:3 to [In]:[M]:[Zn]=4:2:4.1 and a neighborhood thereof. The neighborhood includes an atomic ratio of [In]:[M]:[Zn]=5:3:4. Region B2 includes an atomic ratio of [In]:[M]:[Zn]=5:1:6 and a neighborhood thereof.

Region A2 with high In concentrations provides a higher conductivity than Region B2 and has a function of increasing carrier mobility (field-effect mobility). Therefore, the on-state current and carrier mobility of a transistor using an oxide semiconductor film including Region A1 can be increased.

In contrast, Region B2 with low In concentrations provides a lower conductivity than Region A2 and has a function of decreasing leakage current. Therefore, the off-state current of a transistor using an oxide semiconductor film including Region B1 can be decreased.

In the oxide semiconductor film of one embodiment of the present invention, Region A1 and Region B1 form a composite. That is, carrier movement occurs easily in Region A1, whereas carrier movement does not occur easily in Region B1. Therefore, an oxide semiconductor of one embodiment of the present invention can be used as a material with high carrier mobility, excellent switching characteristics, and favorable semiconductor characteristics.

For example, a plurality of Regions A1 are present in particulate form (in cluster form) in the a-b plane direction and the c-axis direction as shown in FIG. 4A. Note that clusters may be distributed unevenly and irregularly. A plurality of clusters overlap each other or are connected to each other in some cases. For example, in some cases, shapes each including a cluster overlapping with another cluster are connected to each other, so that Region A1 is observed to extend in a cloud-like manner.

Note that the switching characteristics of the transistor are degraded (for example, the off-state current of the transistor is increased) when all of Regions A1 are connected in the a-b plane direction; thus, Regions A1 are preferably scattered in Region B1 as shown in FIGS. 4A and 4B. Therefore, Region A1 can exist in a state of being three-dimensionally surrounded with Region B1. That is, Region A1 is enclosed by Region B1.

Region B1 can also be regarded as having a structure including a cluster (also referred to as a second cluster) that is different from a cluster included in Region A1 (also referred to as a first cluster). In the structure, Region B1 includes a plurality of second clusters and includes a portion in which the second clusters are connected to each other. In other words, the first cluster included in Region A1 includes a portion where the first cluster and another first cluster are connected to each other in a cloud-like manner, and the second cluster included in Region B1 includes a portion where the second cluster and another second cluster are connected to each other in a cloud-like manner.

Figure 5A:
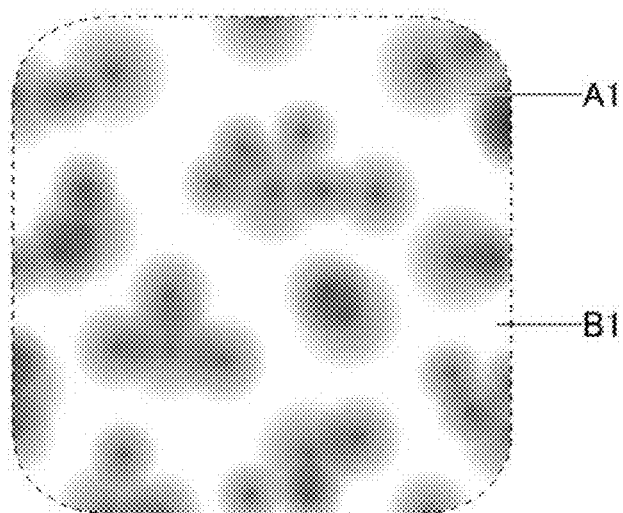
FIGS. 5A and 5B are a schematic top view and a schematic cross-sectional view illustrating a composite oxide semiconductor.
Figure 5B:
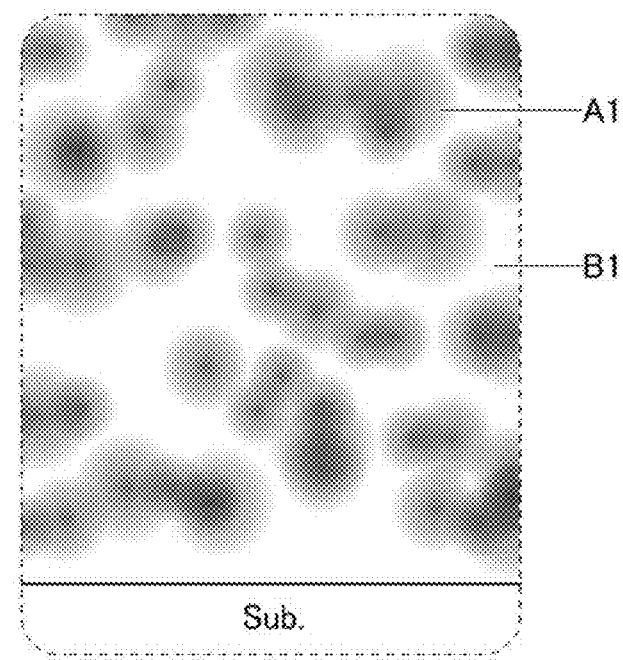

Note that the proportion of scattered Regions A1 can be adjusted by changing, for example, the formation conditions or composition of the composite oxide semiconductor. For example, it is possible to form a composite oxide semiconductor with a low proportion of Regions A1 or a composite oxide semiconductor with a high proportion of Regions A1. For example, FIGS. 5A and 5B show a composite oxide semiconductor in which the proportion of Regions A1 is lower than the proportion of Regions A1 in the composite oxide semiconductor shown in FIGS. 4A and 4B. FIG. 5A is a schematic view corresponding to FIG. 4A, and FIG. 5B is a schematic view corresponding to FIG. 4B. In a composite oxide semiconductor of one embodiment of the present invention, the proportion of Regions A1 is not always lower than that of Region B1. In a composite oxide semiconductor with an extremely high proportion of Regions A1, depending on the observation range, Region B1 is sometimes formed in Region A1. The size of the particulate region of Region A1 can be adjusted appropriately by changing, for example, the formation conditions or composition of the composite oxide semiconductor.

In some cases, the boundary between Region A1 and Region B1 is not clearly observed. The sizes of Region A1 and Region B1 can be measured with energy dispersive X-ray spectroscopy (EDX) mapping images obtained by EDX. For example, the diameter of a cluster in Region A1 is greater than or equal to 0.1 nm and less than or equal to 2.5 nm in the EDX mapping image of a cross-sectional photograph or a plan-view photograph in some cases. Note that the diameter of the cluster is preferably greater than or equal to 0.5 nm and less than or equal to 1.5 nm.

As described above, an oxide semiconductor of one embodiment of the present invention is a composite oxide semiconductor in which Region A1 and Region B1 are mixed and have different functions that are complementary. For example, when an oxide semiconductor of one embodiment of the present invention is an In—Ga—Zn oxide (hereinafter referred to as IGZO), in which Ga is used as the element M, the oxide semiconductor of one embodiment of the present invention can be called complementary IGZO (abbreviation: C/IGZO).

In contrast, when Region A1 and Region B1 are stacked in a layered manner, for example, interaction does not take place or is unlikely to take place between Region A1 and Region B1, so that the function of Region A1 and that of Region B1 are independently performed in some cases. In that case, even when the carrier mobility is increased owing to Regions A1, the off-state current of the transistor might be increased. Therefore, in the case where an oxide semiconductor of one embodiment of the present invention is the above-described composite oxide semiconductor or C/IGZO, a function of achieving high carrier mobility and a function of achieving excellent switching characteristics can be obtained at the same time. This is an advantageous effect obtained by using a composite oxide semiconductor of one embodiment of the present invention.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Note that characteristics of the composite oxide semiconductor of one embodiment of the present invention are not uniquely determined by the atomic ratio. Therefore, the illustrated regions represent preferred atomic ratios of Region A1 and Region B1 of the composite oxide semiconductor; a boundary therebetween is not clear.

Figure 6A:
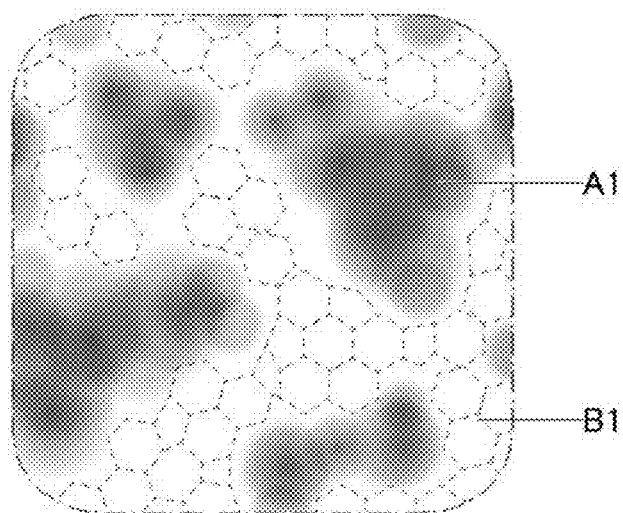
FIGS. 6A and 6B are a schematic top view and a schematic cross-sectional view illustrating a composite oxide semiconductor.
Figure 6B:
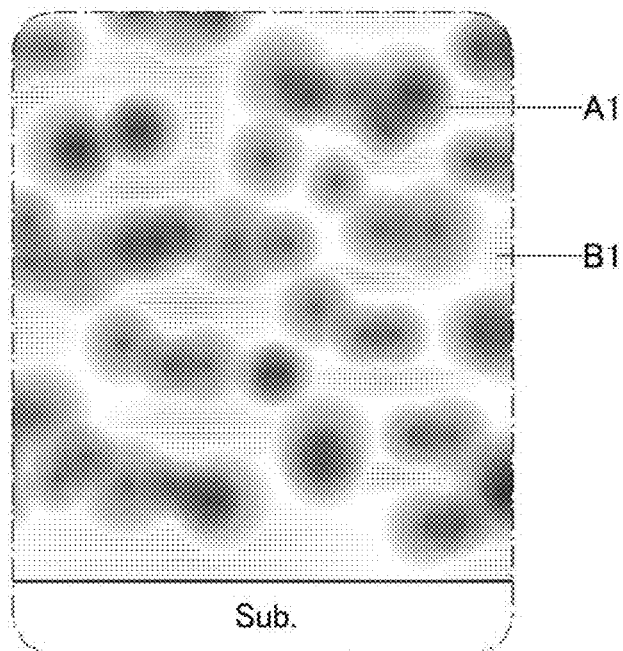
Figure 7A:
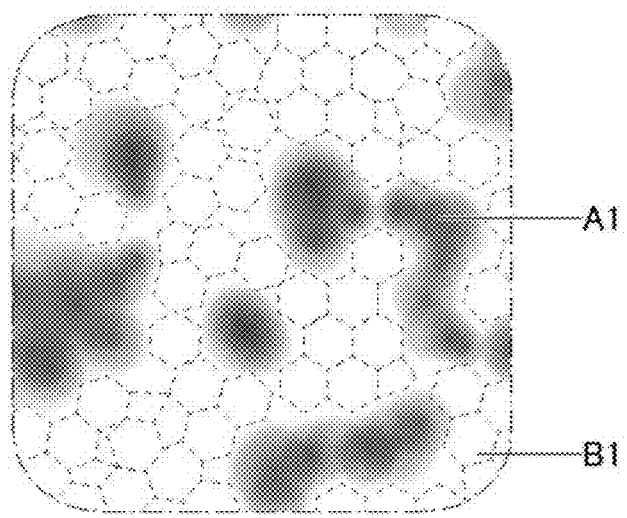
FIGS. 7A and 7B are a schematic top view and a schematic cross-sectional view illustrating a composite oxide semiconductor.
Figure 7B:
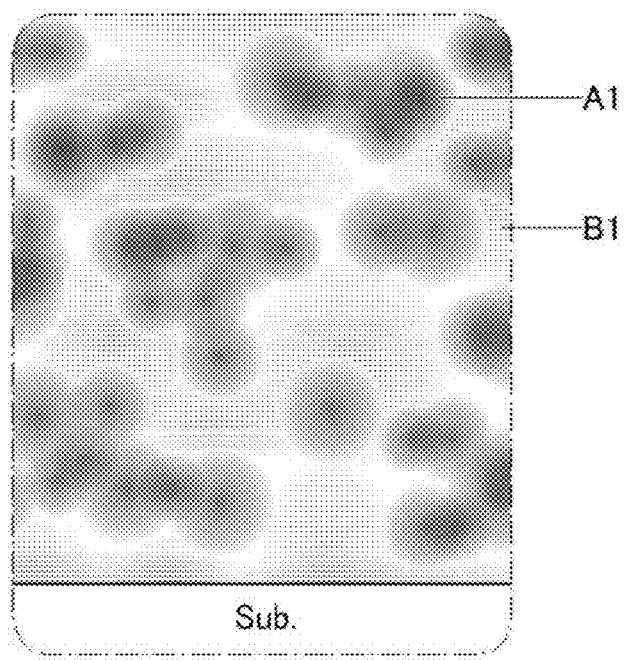

An oxide semiconductor according to the present invention is not limited to the above description. FIGS. 6A and 6B and FIGS. 7A and 7B are schematic views of oxide semiconductor films having structures different from the structure of the above-described oxide semiconductor film. FIG. 6A and FIG. 7A are the schematic views of top surfaces of composite oxide semiconductors (a-b plane direction). FIG. 6B and FIG. 7B are the schematic views of cross sections of composite oxide semiconductors (c-axis direction) each formed over a substrate Sub. Note that for the structures of the oxide semiconductor films shown in FIGS. 6A and 6B and FIGS. 7A and 7B, the description of the structure of the oxide semiconductor film shown in FIGS. 4A and 4B can be referred to except the point to be described later.

Oxide semiconductors are classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion in the CAAC-OS is a portion where the direction of a lattice arrangement changes between a region with a regular lattice arrangement and another region with a regular lattice arrangement.

In FIG. 6A and FIG. 7A, a plurality of nanocrystals are schematically shown by dashed lines. The shape of the nanocrystal is basically hexagon. However, the shape is not always a regular hexagon and is a non-regular hexagon in some cases. At the distortion, a polygonal nanocrystal such as a pentagonal nanocrystal or a heptagonal nanocrystal is included in some cases.

Note that a clear grain boundary cannot be observed even in the vicinity of distortion in the CAAC-OS. That is, a lattice arrangement is distorted so that formation of a grain boundary is inhibited. This is probably because the CAAC-OS can tolerate distortion owing to a low density of arrangement of oxygen atoms in an a-b plane direction, the interatomic bond distance changed by substitution of a metal element, and the like.

Furthermore, FIG. 6B and FIG. 7B schematically show that nanocrystals have c-axis alignment and the c-axes are aligned in a direction substantially perpendicular to a surface over which the CAAC-OS film is formed (also referred to as a formation surface) or the top surface of the CAAC-OS film. The CAAC-OS has a layered crystal structure (also referred to as a layered structure) having c-axis alignment and includes a layer containing indium and oxygen (hereinafter referred to as an In layer) and a layer containing the element M, zinc, and oxygen (hereinafter referred to as an (M,Zn) layer) that are stacked.

Note that indium and the element M are replaced with each other in some cases. Therefore, when part of the elements M in the (M,Zn) layer are replaced with indium, the layer can also be referred to as an (In,M,Zn) layer. In that case, the In layer and the (In,M,Zn) layer are stacked in the layered structure.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure intermediate between those of the nc-OS and the amorphous oxide semiconductor. The a-like OS includes a void or a low-density region. That is, the a-like OS has an unstable structure, compared to the nc-OS and the CAAC-OS.

Oxide semiconductors have various structures and various properties. An oxide semiconductor of the present invention may be a composite oxide semiconductor including two or more of the amorphous oxide semiconductor, the polycrystalline oxide semiconductor, the a-like OS, the nc-OS, and the CAAC-OS. Region A1 and Region B1 may have different crystallinities.

For example, Region A1 is preferably a non-single-crystal. Note that in the case where Region A1 has crystallinity, when Region A1 is formed of indium, Region A1 tends to have a tetragonal crystal structure. Furthermore, when Region A1 is formed of indium oxide ([In]:[M]:[Zn]= x:0:0 (x>0)), Region A1 tends to have a bixbyite crystal structure. Furthermore, when Region A1 is formed of an In—Zn oxide ([In]:[M]:[Zn]=x:0:z (x>0, z>0)), Region A1 tends to have a layered crystal structure.

Region B1 includes a CAAC-OS. Note that Region B1 does not necessarily include only a CAAC-OS and may also include a region of a polycrystalline oxide semiconductor, an nc-OS, or the like.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, with the CAAC-OS, a composite oxide semiconductor is physically stable; thus, a composite oxide semiconductor which is resistant to heat and has high reliability can be provided.

Note that the proportion of scattered Regions A1 can be adjusted by changing, for example, the formation conditions or composition of the composite oxide semiconductor. For example, as shown in FIG. 7A and FIG. 7B, it is possible to form a composite oxide semiconductor with a low proportion of Regions A1 or a composite oxide semiconductor with a high proportion of Regions A1.

<1-3. Transistor Including Oxide Semiconductor Film>

Next, the case where the above-described oxide semiconductor film is used for a transistor will be described.

With the use of the composite oxide semiconductor in a transistor, the transistor can have high carrier mobility and high switching characteristics. In addition, the transistor can have high reliability.

An oxide semiconductor film with low carrier density is preferably used for the transistor. For example, an oxide semiconductor film whose carrier density is lower than $8 \times 10^{11}/cm^3$, preferably lower than $1 \times 10^{11}/cm^3$, or further preferably lower than $1 \times 10^{10}/cm^3$, and greater than or equal to $1 \times 10^{-9}/cm^3$ is used as the oxide semiconductor film.

In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. A highly purified intrinsic or substantially highly purified intrinsic oxide semiconductor film has few carrier generation sources, and thus can have a low carrier density. A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor film. In order to reduce the concentration of impurities in the oxide semiconductor film, the concentration of impurities in a film that is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film will be described.

When silicon or carbon that is one of Group 14 elements is contained in the oxide semiconductor film, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor film contains alkali metal or alkaline earth metal, defect states are formed and carriers are generated, in some cases. Thus, a transistor including an oxide semiconductor film which contains alkali metal or alkaline earth metal is likely to be normally on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1 \times 10^{18}$ atoms/cm$^3$, and preferably lower than or equal to $2 \times 10^{16}$ atoms/cm$^3$.

When the oxide semiconductor film contains nitrogen, the oxide semiconductor film easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor film reacts with oxygen bonded to a metal atom to be water, and thus causes an oxygen vacancy ($V_o$), in some cases. Due to entry of hydrogen into the oxygen vacancy ($V_o$), an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS in the oxide semiconductor is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

The oxygen vacancies ($V_o$) in the oxide semiconductor film can be reduced by introduction of oxygen into the oxide semiconductor film. That is, the oxygen vacancies ($V_o$) in the oxide semiconductor film disappear when the oxygen vacancies ($V_o$) are filled with oxygen. Accordingly, diffusion of oxygen in the oxide semiconductor film can reduce the oxygen vacancies ($V_o$) in a transistor and improve the reliability of the transistor.

As a method for introducing oxygen into the oxide semiconductor film, for example, an oxide in which oxygen content is higher than that in the stoichiometric composition is provided in contact with the oxide semiconductor film. That is, in the oxide, a region including oxygen in excess of that in the stoichiometric composition (hereinafter also referred to as an excess oxygen region) is preferably formed. In particular, in the case of using an oxide semiconductor film in a transistor, an oxide including an excess oxygen region is provided in a base film, an interlayer film, or the like in the vicinity of the transistor, whereby oxygen vacancies in the transistor are reduced, and the reliability can be improved.

When an oxide semiconductor film with sufficiently reduced impurity concentration is used for a channel formation region in a transistor, the transistor can have stable electrical characteristics.

<1-4. Method for Manufacturing Composite Oxide Semiconductor>

An example of a method for manufacturing the composite oxide semiconductor shown in FIGS. 4A and 4B is described with reference to FIGS. 9A and 9B, FIG. 10, FIGS. 11A and 11B, FIGS. 12A and 12B, and FIG. 13. A composite oxide semiconductor of one embodiment of the present invention can be formed with a sputtering apparatus.

<1-5. Sputtering Apparatus>

Figure 9A:
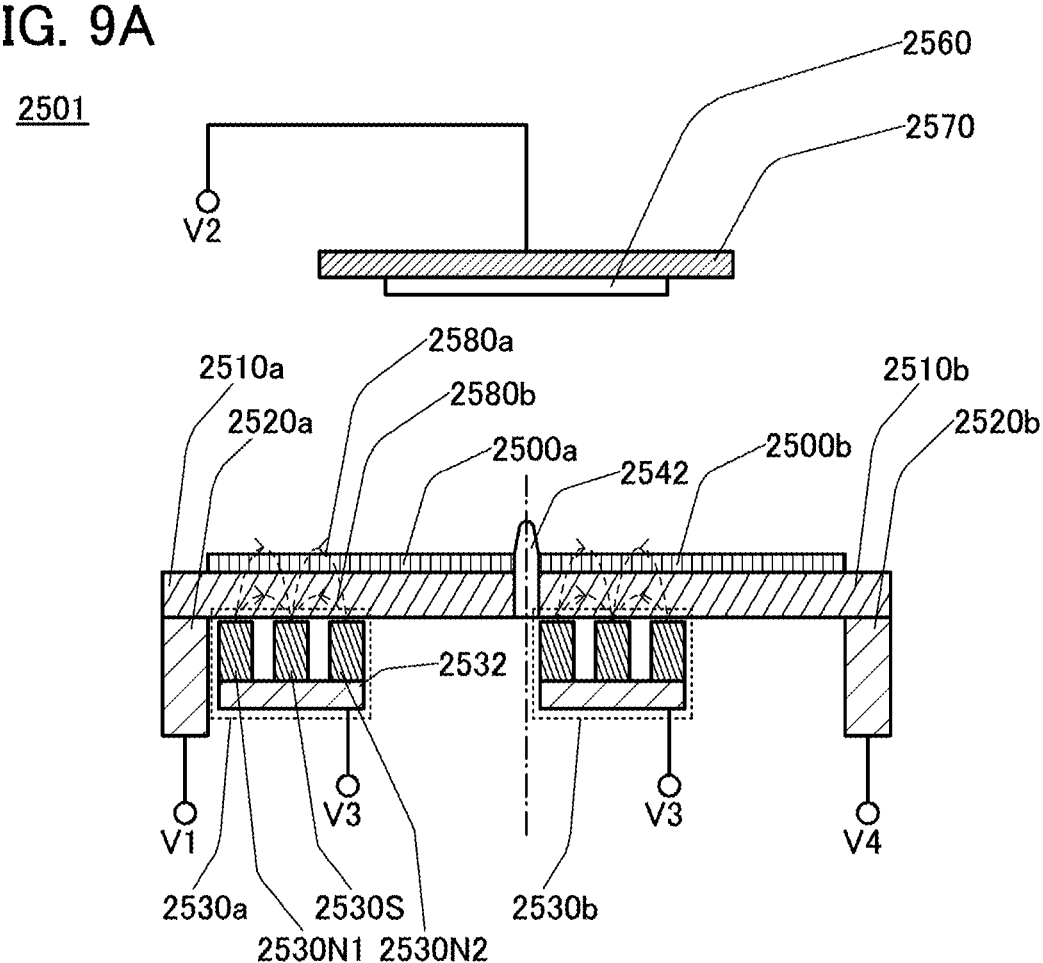
FIGS. 9A and 9B illustrate a sputtering apparatus.
Figure 9B:
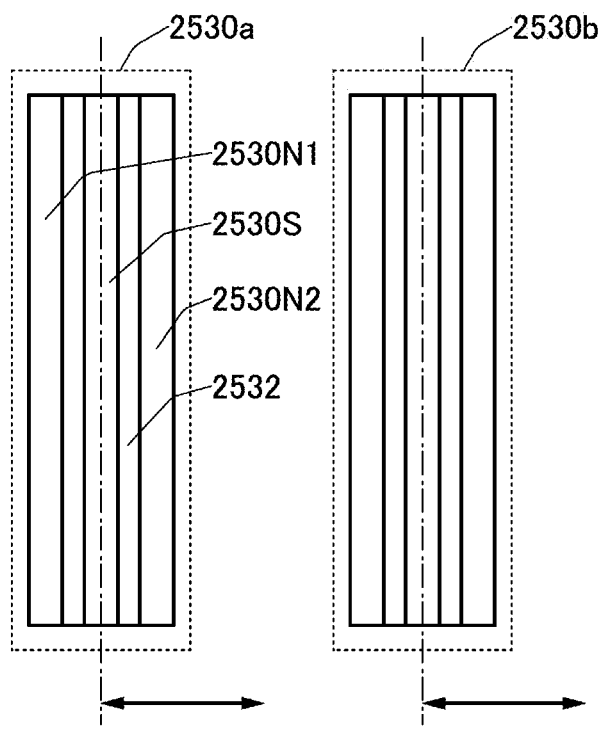

FIG. 9A is a cross-sectional view of a deposition chamber 2501 of the sputtering apparatus. FIG. 9B is a plan view of a magnet unit 2530a and a magnet unit 2530b of the sputtering apparatus.

The deposition chamber 2501 illustrated in FIG. 9A includes a target holder 2520a, a target holder 2520b, a backing plate 2510a, a backing plate 2510b, a target 2500a, a target 2500b, a member 2542, and a substrate holder 2570. Note that the target 2500a is placed over the backing plate 2510a. The backing plate 2510a is placed over the target holder 2520a. The magnet unit 2530a is placed under the target 2500a with the backing plate 2510a therebetween. The target 2500b is placed over the backing plate 2510b. The backing plate 2510b is placed over the target holder 2520b. The magnet unit 2530b is placed under the target 2500b with the backing plate 2510b therebetween.

As illustrated in FIGS. 9A and 9B, the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1, the magnet 2530N2, and the magnet 2530S are spaced. Note that the magnet unit 2530b has a structure similar to that of the magnet unit 2530a. When the substrate 2560 is transferred into the deposition chamber 2501, the substrate 2560 is placed in contact with the substrate holder 2570.

The target 2500a, the backing plate 2510a, and the target holder 2520a are separated from the target 2500b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2500a with the backing plate 2510a positioned therebetween. The target holder 2520b and the backing plate 2510b are fixed to each other with a screw (e.g., a bolt) and have the same potential. The target holder 2520b has a function of supporting the target 2500b with the backing plate 2510b positioned therebetween.

The backing plate 2510a has a function of fixing the target 2500a. The backing plate 2510b has a function of fixing the target 2500b.

Magnetic lines of force 2580a and 2580b formed by the magnet unit 2530a are illustrated in FIG. 9A.

As illustrated in FIG. 9B, the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 9B. For example, the magnet unit 2530a may be oscillated with a beat of greater than or equal to 0.1 Hz and less than or equal to 1 kHz.

The magnetic field over the target 2500a changes in accordance with oscillation of the magnet unit 2530a. The region with an intense magnetic field is a high-density plasma region; thus, sputtering of the target 2500a easily occurs in the vicinity of the region. The same applies to the magnet unit 2530b.

<1-6. Manufacturing Flow of Composite Oxide Semiconductor>

Figure 10:
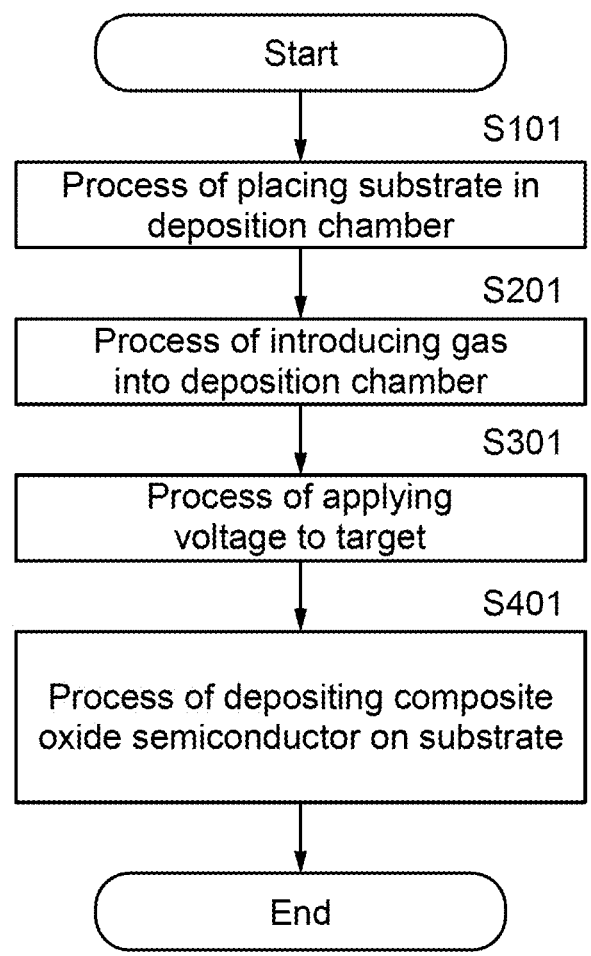
FIG. 10 is a process flow chart showing a method for manufacturing a composite oxide semiconductor.

FIG. 10 is a process flow chart showing a method for manufacturing a composite oxide semiconductor.

The composite oxide semiconductor shown in FIGS. 4A and 4B is manufactured through at least first to fourth processes shown in FIG. 10.

[First Process: Process of Placing Substrate in Deposition Chamber]

The first process includes a step of placing a substrate in a deposition chamber (see Step S101 in FIG. 10).

In the first process, for example, the substrate 2560 is placed on the substrate holder 2570 of the deposition chamber 2501 shown in FIGS. 9A and 9B.

The temperature of the substrate 2560 can be set higher than or equal to room temperature (25° C.) and lower than or equal to 200° C., preferably higher than or equal to room temperature and lower than or equal to 130° C. The substrate temperature in the above range is suitable for the case of using a large glass substrate. In particular, when the substrate temperature in deposition of a composite oxide semiconductor is room temperature, i.e., the substrate is not heated intentionally, the substrate can be favorably prevented from bending or warping.

The substrate 2560 may be cooled with a cooling mechanism or the like provided for the substrate holder 2570.

In the case where the temperature of the substrate 2560 is set higher than or equal to 100° C. and lower than or equal to 130° C., water in the composite oxide semiconductor can be removed. Water as an impurity is removed in this manner, whereby the composite oxide semiconductor shown in FIGS. 5A and 5B can be formed easily. Thus, the field-effect mobility and the reliability can be improved at the same time.

Furthermore, in the case where the temperature of the substrate 2560 is set higher than or equal to 100° C. and lower than or equal to 130° C., the sputtering apparatus can be prevented from warping due to overheat. Accordingly, semiconductor devices can be manufactured with higher productivity. The productivity is thus stabilized, so that a large-scale production apparatus is easy to employ. Thus, a large display device including a large substrate can be easily manufactured.

[Second Process: Process of Introducing Gas into Deposition Chamber]

The second process includes a step of introducing a gas into the deposition chamber (see Step S201 in FIG. 10).

In the second process, for example, a gas is introduced into the deposition chamber 2501 in FIGS. 9A and 9B. One or both of an argon gas and an oxygen gas are introduced as the gas. Note that instead of an argon gas, an inert gas such as helium, xenon, or krypton can be used.

The proportion of oxygen in the whole deposition gas in forming a composite oxide semiconductor using an oxygen gas is referred to as an oxygen flow rate percentage in some cases. The oxygen flow rate percentage in forming a composite oxide semiconductor is higher than or equal to 0% and lower than or equal to 30%, preferably higher than or equal to 5% and lower than or equal to 30%, further preferably higher than or equal to 7% and lower than or equal to 15%.

In the case of depositing the composite oxide semiconductor shown in FIGS. 5A and 5B, the oxygen flow rate percentage in deposition at room temperature is set higher than 30% and lower than 70%, preferably higher than 30% and lower than or equal to 50%. Furthermore, the oxygen flow rate percentage in thermal deposition (e.g., at a temperature higher than or equal to 70° C. and lower than or equal to 150° C.) is set higher than or equal to 10% and lower than or equal to 50%, preferably higher than or equal to 30% and lower than or equal to 50%.

In the case of forming the composite oxide semiconductor shown in FIGS. 6A and 6B or the composite oxide semiconductor shown in FIGS. 7A and 7B, a mixed gas of a rare gas and oxygen is used, and the proportion of oxygen to the rare gas is set higher than or equal to 70% and lower than or equal to 100%.

In addition, increasing the purity of the gas is necessary. For example, as an oxygen gas or an argon gas used as the gas, a gas which is highly purified to have a dew point of $-40°$ C. or lower, preferably $-80°$ C. or lower, further preferably $-100°$ C. or lower, still further preferably $-120°$ C. or lower is used, whereby entry of moisture or the like into the composite oxide semiconductor can be minimized.

The deposition chamber 2501 is preferably evacuated to high vacuum (about $5\times10^{-7}$ Pa to $1\times10^{-4}$ Pa) with an entrapment vacuum evacuation pump such as a cryopump so that water or the like, which is an impurity for the composite oxide semiconductor, is removed as much as possible. In particular, the partial pressure of gas molecules corresponding to $H_2O$ (gas molecules corresponding to m/z=18) in the deposition chamber 2501 in the standby mode of the sputtering apparatus is preferably lower than or equal to $1\times10^{-4}$ Pa, further preferably lower than or equal to $5\times10^{-5}$ Pa.

[Third Process: Process of Applying Voltage to Target]

The third process includes a step of applying voltage to a target (see Step S301 in FIG. 10).

In the third process, for example, voltage is applied to the target holder 2520a and the target holder 2520b in FIGS. 9A and 9B. As an example, a potential applied to a terminal V1 connected to the target holder 2520a is lower than a potential applied to a terminal V2 connected to the substrate holder 2570. A potential applied to a terminal V4 connected to the target holder 2520b is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminals V1, V2, V3, and V4 are not limited to the above potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source, an AC power source, or an RF power source may be used.

As the target 2500*a* and the target 2500*b*, a target including indium, the element M (M is Al, Ga, Y, or Sn), zinc, and oxygen is preferably used. For example, an In—Ga—Zn metal oxide target (In:Ga:Zn=4:2:4.1 [atomic ratio]) or an In—Ga—Zn metal oxide target (In:Ga:Zn=5:1:7 [atomic ratio]) can be used as the target 2500*a* and the target 2500*b*. In the following description, the case of using an In—Ga—Zn metal oxide target (In:Ga:Zn=4:2:4.1 [atomic ratio]) is described.

Note that by using a sputtering target including a polycrystalline oxide having a plurality of crystal grains as the target 2500*a* and the target 2500*b*, a composite oxide semiconductor that has crystallinity and is shown in FIGS. 4A and 4B or FIG. 8 is obtained easily.

[Fourth Process: Process of Depositing Composite Oxide Semiconductor on Substrate]

The fourth process includes a step in which sputtered particles are ejected from the target and a composite oxide semiconductor is deposited on the substrate (see Step S401 in FIG. 10).

In the fourth process, for example, in the deposition chamber 2501 illustrated in FIGS. 9A and 9B, an argon gas or an oxygen gas is ionized to be separated into cations and electrons, and plasma is created. Then, the cations in the plasma are accelerated toward the targets 2500*a* and 2500*b* by the potentials applied to the target holders 2520*a* and 2520*b*. Sputtered particles are generated when the cations collide with the In—Ga—Zn metal oxide target, and the sputtered particles are deposited on the substrate 2560.

Note that in an In—Ga—Zn metal oxide target with an atomic ratio of In:Ga:Zn=4:2:4.1 or 5:1:7 that is used as the targets 2500*a* and 2500*b*, a plurality of crystal grains with different compositions are included in some cases. In most cases, for example, the diameters of the plurality of crystal grains are each 10 μm or less. In the case where, for example, crystal grains with a high proportion of In are included in the In—Ga—Zn metal oxide target, the proportion of Region A1 described above is increased in some cases.

<1-7. Deposition Model>

Figure 11A:
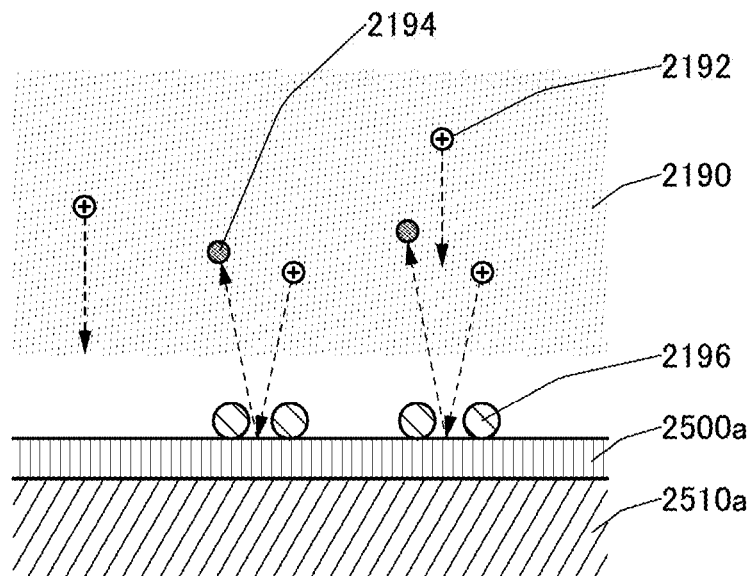
FIGS. 11A and 11B show a cross section of the vicinity of a target.
Figure 11B:
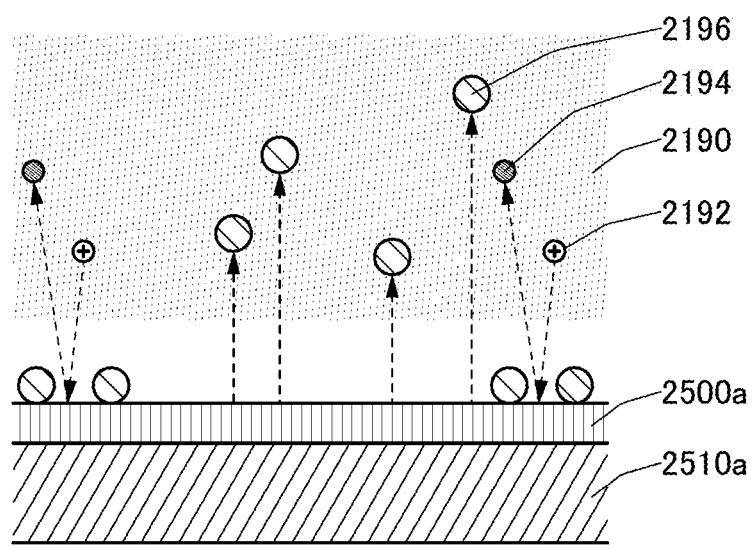

In the fourth process, a deposition model shown in FIGS. 11A and 11B can be presumed.

FIGS. 11A and 11B are cross-sectional views of the vicinity of the target 2500*a* shown in FIGS. 9A and 9B. Note that in FIGS. 11A and 11B, the backing plate 2510*a*, the target 2500*a*, plasma 2190, cations 2192, sputtered particles 2194, and the like are shown.

[First Step]

In FIG. 11A, an argon gas or an oxygen gas is ionized and separated into the cations 2192 and electrons (not illustrated), and the plasma 2190 is generated. After that, the cations 2192 in the plasma 2190 are accelerated toward the target 2500*a* (here, an In—Ga—Zn metal oxide target). The cations 2192 collide with the In—Ga—Zn metal oxide target, whereby the sputtered particles 2194 are generated and ejected from the In—Ga—Zn metal oxide target. Note that from the In—Ga—Zn metal oxide target, first, Ga and Zn are preferentially sputtered as the sputtered particles 2194.

Specifically, the cations 2192 collide with the In—Ga—Zn metal oxide target, so that Ga and Zn, which have lower relative atomic masses than In, are preferentially ejected from the In—Ga—Zn metal oxide target. The ejected In, Ga, and Zn are bonded to oxygen and then deposited on the substrate, whereby Region B1 shown in FIGS. 4A and 4B is formed.

Note that as shown in FIG. 11A, preferential sputtering of Ga and Zn as the sputtered particles 2194 brings about a state in which In is segregated on a surface of the target 2500*a* (here, a surface of the In—Ga—Zn metal oxide target) in some cases. Note that in FIG. 11A, segregated In is shown as a cluster 2196.

[Second Step]

Then, as shown in FIG. 11B, the cluster 2196 (here, a cluster including In) is sputtered from the In—Ga—Zn metal oxide target after In is segregated, i.e., after the cluster 2196 is formed.

Specifically, In segregated at the surface of the In—Ga—Zn metal oxide target is ejected from the In—Ga—Zn metal oxide target as a structure like a plurality of clusters. The segregated In having a structure like a plurality of clusters is bonded to oxygen and collides with Region B1 deposited earlier, whereby Region A1 is deposited in cluster form (in particulate form). Note that since the segregated In is ejected, In, Ga, and Zn exist at the surface of the In—Ga—Zn metal oxide target in a state closer to the original atomic ratio.

Note that as shown in FIG. 11B, in one region of the surface of the target 2500*a*, In is segregated, and in another region of the surface of the target 2500*a*, segregated In is ejected. That is, a mechanism of In segregation and a mechanism of ejecting of segregated In work at the same time, leading to a structure in which Region A1 is surrounded with Region B1 and distributed unevenly and irregularly.

The deposition model including the first step and the second step is repeated, whereby the composite oxide semiconductor that is one embodiment of the present invention and shown in FIGS. 4A and 4B can be obtained.

Note that the formation method is not limited to a sputtering method; a pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of a thermal CVD method, a metal organic chemical vapor deposition (MOCVD) method can be given.

<1-8. Examination of Deposition Model>

Sample Z1 described below was formed to examine the above-described deposition model.

[Sample Z1]

In Sample Z1, an insulating film 82, an insulating film 84, an oxide semiconductor film 88, and an insulating film 86 were sequentially formed over a glass substrate.

The insulating films 82 and 84 function as a base film. As the insulating film 82, a 400-nm-thick silicon nitride film was formed with a PECVD apparatus. As the insulating film 84, a 50-nm-thick silicon oxynitride film was formed with a PECVD apparatus.

As the oxide semiconductor film 88, a 40-nm-thick In—Ga—Zn oxide film was formed with a sputtering apparatus. Note that the oxide semiconductor film 88 was formed under the following conditions: the substrate temperature was 170° C., an argon gas at a flow rate of 35 sccm and an oxygen gas at a flow rate of 15 sccm were introduced into a chamber, the pressure was 0.2 Pa, and an AC power of 1500 W was supplied to a metal oxide target (In:Ga:Zn=4:2:4.1 [atomic ratio]) placed in the sputtering apparatus.

Note that in this embodiment, the oxide semiconductor film 88 is assumed to be a sputtering target for forming a composite oxide semiconductor.

After the oxide semiconductor film 88 was formed, plasma treatment was performed on a surface of the oxide semiconductor film 88 using an argon gas. This is assumed to be sputtering in a sputtering apparatus. The plasma treatment was performed under the following conditions: an argon gas at a flow rate of 100 sccm was introduced into a chamber; the pressure in the chamber was set to 40 Pa; and power of 1000 W was supplied to an RF power source (27.12 MHz).

After the plasma treatment, the insulating film 86 was formed over the oxide semiconductor film 88. The insulating film 86 functions as a protective insulating film. As the insulating film 86, a 100-nm-thick silicon oxynitride film was formed with a PECVD apparatus.

Through the process, Sample Z1 for examining the deposition model was formed.

Next, a high-angle annular dark field STEM (HAADF-STEM) image of a cross section of Sample Z1 was observed. Note that for the HAADF-STEM observation, JEM-ARM200F manufactured by JEOL Ltd. was used under the conditions where the acceleration voltage was 200 kV.

Figure 13:
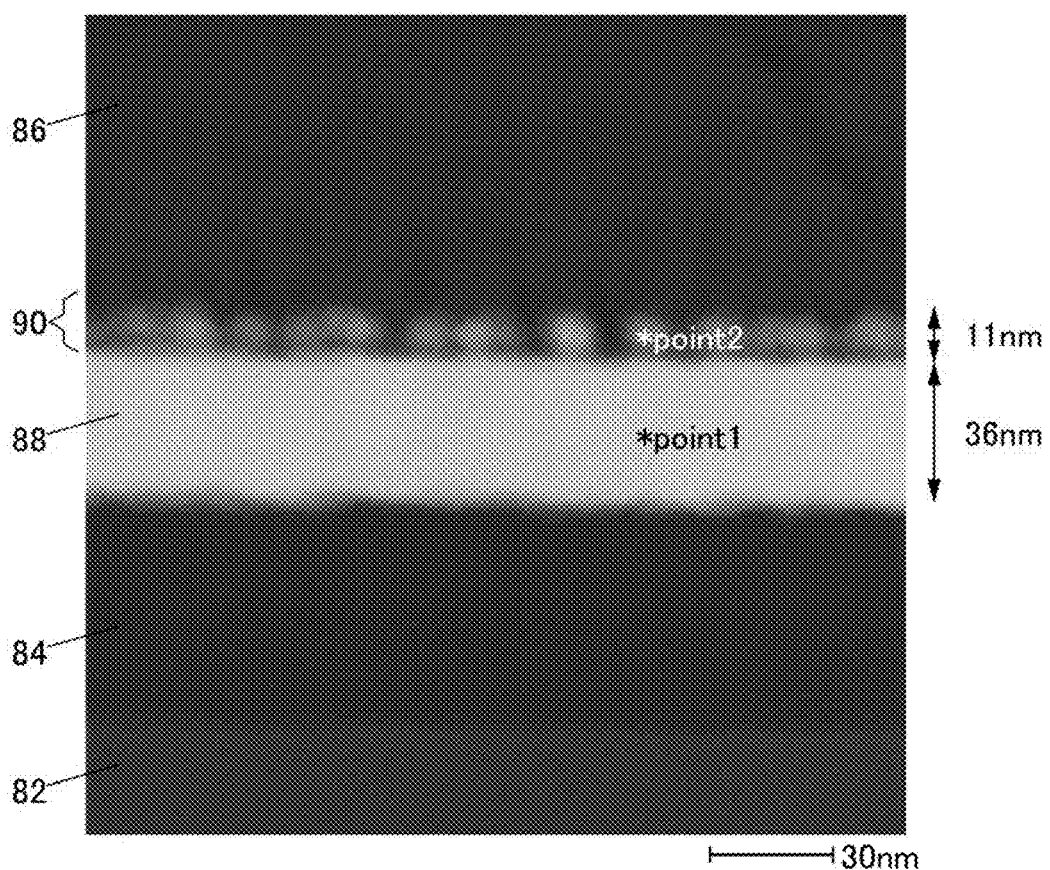
FIG. 13 shows HAADF-STEM observations.

FIG. 13 shows the HAADF-STEM observations of Sample Z1.

As shown in FIG. 13, a structure 90 was formed over the oxide semiconductor film 88. Furthermore, from the HAADF-STEM observations, the thickness of the oxide semiconductor film 88 was approximately 36 nm and the thickness of the structure 90 was approximately 11 nm.

To evaluate the composition of the structure 90, elementary analysis was conducted at a point 1 shown in the oxide semiconductor film 88 and a point 2 shown in the structure 90. Note that the elementary analysis was conducted with an EDX apparatus JET-2300T. The beam diameter of the elementary analysis was set to 0.1 nmφ.

Table 1 shows the EDX analysis results.

TABLE 1

|  | In | Ga | Zn | O | Total |
|---|---|---|---|---|---|
| point1 | 25.6 | 12.8 | 15.6 | 46.0 | 100 |
| point2 | 66.0 | 4.8 | 1.2 | 27.9 | 100 |

Unit: atomic %

When the values for the point 1 shown in Table 1 are normalized by a value of In of the metal oxide target, the atomic ratio is In:Ga:Zn:O=4:2:2.4:7.2. Although the proportion of Zn atoms is slightly apart from the proportion of Zn atoms in the composition of the metal oxide target, the composition of the oxide semiconductor film 88 roughly corresponds to the composition of the metal oxide target. Meanwhile, the structure 90 has a high proportion of In as shown in Table 1. Therefore, the structure 90 can also be regarded as a precipitate of In or a precipitate of an indium oxide.

The precipitate of In or the precipitate of an indium oxide can be assumed as In segregated at the surface of the In—Ga—Zn metal oxide target in the above-described deposition model (i.e., the cluster 2196). This indicates that the above deposition model is quite appropriate.

Figure 12A:
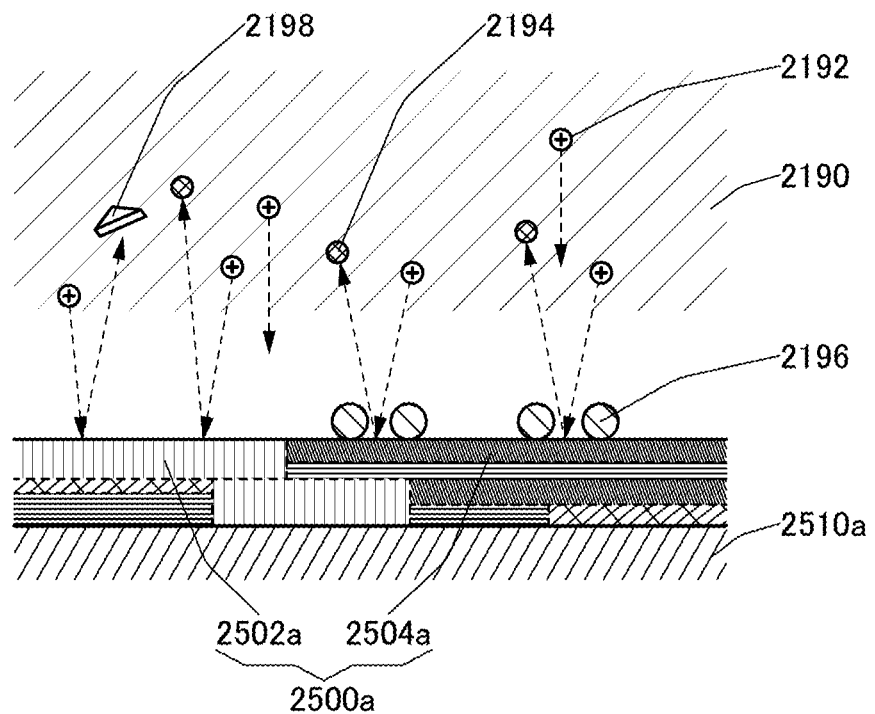
FIGS. 12A and 12B show a cross section of the vicinity of a target.
Figure 12B:
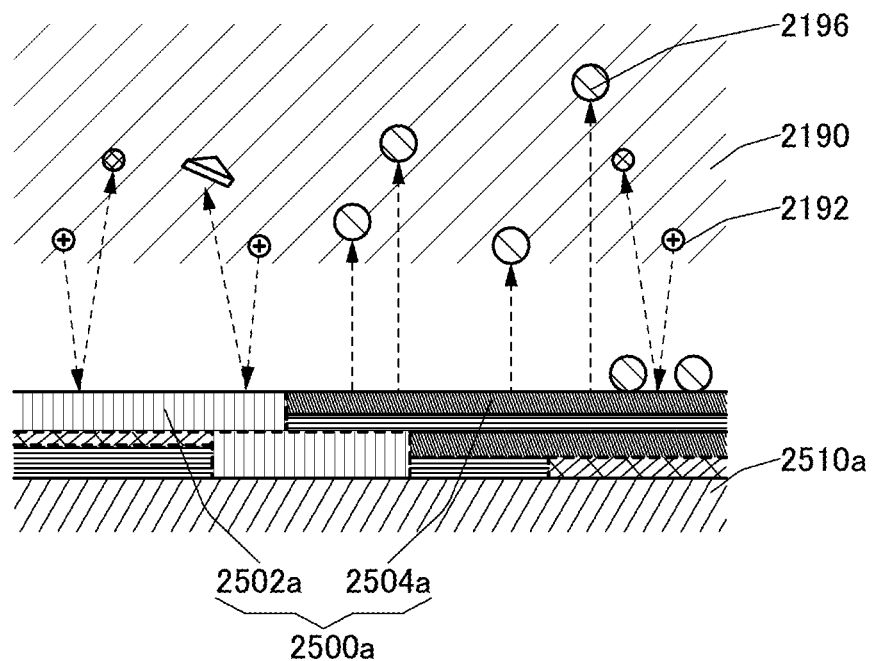

Note that in the case of depositing the composite oxide semiconductor that is one embodiment of the present invention and shown in FIGS. 6A and 6B, a deposition model shown in FIGS. 12A and 12B can be presumed in the fourth process.

FIGS. 12A and 12B are cross-sectional views of the vicinity of the target 2500a shown in FIGS. 9A and 9B. Note that in FIGS. 12A and 12B, the backing plate 2510a, the target 2500a, the plasma 2190, the cations 2192, the sputtered particles 2194, and the like are shown.

In the deposition chamber 2501 illustrated in FIG. 12A, an argon gas or an oxygen gas is ionized and separated into the cations 2192 and electrons (not illustrated), and the plasma 2190 is generated. After that, the cations 2192 in the plasma 2190 are accelerated toward the target 2500a (here, an In—Ga—Zn metal oxide target). The cations 2192 collide with the In—Ga—Zn metal oxide target, whereby the sputtered particles 2194 are generated and ejected from the In—Ga—Zn metal oxide target.

Here, the targets 2500a and 2500b have a polycrystalline structure including a plurality of crystal grains. In most cases, the diameters of the plurality of crystal grains are each 10 μm or less. Furthermore, in some cases, the plurality of crystal grains have different compositions in the In—Ga—Zn metal oxide target with an atomic ratio of In:Ga:Zn=4:2:4.1 or 5:1:7, for example.

For example, in FIG. 12A, the target 2500a includes at least a region 2502a in which the proportion of In atoms is lower than the proportion of In atoms in the target and a region 2504a in which the proportion of In atoms is higher than the proportion of In atoms in the target.

First, the region 2502a with a low proportion of In in the target 2500a is described.

As shown in FIG. 12A, the cations 2192 generated in the high-density plasma region are accelerated toward the target 2500a side by an electric field, and then collide with the region 2502a included in the target 2500a. At this time, a cluster 2198 that is a flat-plate-like nanocrystal is separated from the region 2502a. In most cases, the cluster includes two M-Zn—O layers and an In—O layer therebetween. Note that along with the separation of the cluster 2198, the sputtered particles 2194 are also ejected from the target 2500a.

In some cases, the cluster 2198 includes a triangular plane, e.g., regular triangular plane. In some cases, the cluster 2198 includes a hexagonal plane, e.g., regular hexagonal plane. However, the shape of a plane of the cluster 2198 is not limited to a triangle or a hexagon. For example, the plane may have a shape formed by combining two or more triangles. For example, a quadrangle (e.g., rhombus) may be formed by combining two triangles (e.g., regular triangles).

The thickness of the cluster 2198 is determined depending on the kind of the deposition gas and the like. The thickness of the cluster 2198 is, for example, greater than or equal to 0.4 nm and less than or equal to 1 nm, and preferably greater than or equal to 0.6 nm and less than or equal to 0.8 nm. In addition, for example, the width of the cluster 2198 is greater than or equal to 1 nm and less than or equal to 3 nm, preferably greater than or equal to 1.2 nm and less than or equal to 2.5 nm.

The surface of the sputtered particle 2194 may be negatively or positively charged when the sputtered particle 2194 passes through the plasma 2190. For example, the sputtered particle 2194 sometimes receives a negative charge from $O_2^-$ that is present in the plasma 2190. As a result, oxygen atoms on the surface of the sputtered particle 2194 may be negatively charged. In addition, when passing through the plasma 2190, the sputtered particle 2194 is sometimes combined with In, the element M, Zn, oxygen, or the like in the plasma 2190 to grow. Thus, the sputtered particle 2194 has an atom or an aggregate of several atoms.

The cluster 2198 and the sputtered particles 2194 that have passed through the plasma 2190 reach a surface of the substrate. Since the cluster 2198 has a flat-plate-like shape, it is deposited with its flat plane facing the surface of the substrate. Note that some of the sputtered particles 2194 are discharged to the outside by a vacuum pump or the like because the sputtered particle 2194 is small in mass.

The sputtered particles 2194 reach the surface of the substrate. The sputtered particles 2194 are more likely to be bonded to a side surface of the cluster 2198 than to a top surface of the cluster 2198. The sputtered particles 2194 are deposited preferentially on the side surface of the cluster 2198 so as to fill a region where the cluster 2198 is not formed. Since available bonds of the sputtered particle 2194 are activated, the sputtered particle 2194 is chemically bonded to the cluster 2198 to form lateral growth portions. In other words, the sputtered particle 2194 enters a region between one cluster and another cluster.

The lateral growth portions further grow in a lateral direction so as to fill the region between one cluster and another cluster (the region is also referred to as a lateral growth buffer region, LGBR). The lateral direction indicates a direction perpendicular to the c-axis in a cluster, for example.

A reaction is likely to occur in which a sputtered particle is attached onto the lateral growth portion of the cluster, oxygen diffused passing through the LGBR is attached onto the sputtered particle, and another sputtered particle is attached similarly. It is assumed that solid-phase growth in the lateral direction occurs by the repetition of the reaction. Such lateral growth of the clusters can also be referred to as self-assembly.

The lateral growth portions further grow laterally and collide with each other. The adjacent clusters are connected to each other using a portion where the lateral growth portions collide with each other as a connecting portion. In other words, the sputtered particles fill the region between one of the clusters and the other cluster by forming the lateral growth portions on the side surfaces of the clusters and causing lateral growth. In this manner, the lateral growth portions are formed until a region where a cluster is not formed is filled. This mechanism is similar to a deposition mechanism of an atomic layer deposition (ALD) method.

Therefore, even when a plurality of formed clusters are oriented in different directions, Region B1 including a CAAC-OS is formed without forming a clear grain boundary because the sputtered particles grow laterally to fill a gap between one of the clusters and the other cluster.

Note that in the CAAC-OS, a layered crystal structure is stable over a wide range of compositions, and the bonding strength and the equilibration distance between a metal atom and an oxygen atom depend on the metal atom. Therefore, it is assumed that the crystal structure of the CAAC-OS is tolerant to distortion. That is, the clusters are smoothly connected (anchored) by the sputtered particles, so that a crystal structure different from a single crystal and a polycrystal is formed in the connecting portion. In other words, a crystal structure having distortion is formed in the connecting portion between the adjacent clusters. Owing to this, for example, in the connecting portion, the shape of a hexagonal top surface of a crystal structure is changed to a pentagonal or heptagonal shape in some cases.

Next, the region 2504a with a high proportion of In in the target 2500a is described.

The cations 2192 generated in the high-density plasma region are accelerated toward the target 2500a side by an electric field, and then collide with the region 2504a included in the target 2500a. In the case of using the In—Ga—Zn metal oxide target, Ga and Zn are preferentially sputtered as the sputtered particles 2194. That is, the cations 2192 collide with the In—Ga—Zn metal oxide target, so that Ga and Zn, which have lower relative atomic masses than In, are preferentially ejected from the In—Ga—Zn metal oxide target. As described above, the sputtered particles 2194 ejected are deposited on the substrate to fill the region between the clusters 2198 ejected from the region 2502a and deposited on the substrate, whereby the region B1 is formed.

Furthermore, as shown in FIG. 12A, after Ga and Zn are preferentially sputtered as the sputtered particles 2194, a state where In is segregated at the surface of the region 2504a with a high proportion of In is obtained. Note that in FIG. 12A, segregated In is shown as the cluster 2196. The diameter of the cluster 2196 is preferably approximately greater than or equal to 0.5 nm and less than or equal to 1.5 nm.

As shown in FIG. 12B, after In is segregated, i.e., after the cluster 2196 is formed, the cluster 2196 is sputtered from the region 2504a with a high proportion of In.

Specifically, In segregated at the surface of the In—Ga—Zn metal oxide target is ejected from the In—Ga—Zn metal oxide target as a structure like a plurality of particulate clusters. The segregated In having a structure like a plurality of clusters is bonded to oxygen and collides with Region B1 deposited earlier, whereby Region A1 having particulate clusters is deposited. Note that since the segregated In is ejected, In, Ga, and Zn existing at the surface of the region 2504a have an atomic ratio closer to the original atomic ratio.

Note that as shown in FIGS. 12A and 12B, in one region of the surface of the region 2504a with a high proportion of In in the target 2500a, In is segregated, and in another region of the surface, segregated In is ejected. That is, a mechanism of In segregation and a mechanism of ejecting of segregated In work at the same time.

Accordingly, the region 2504a with a high proportion of In tends to form Region A1 because the cluster 2196 is easily formed in the region 2504a. Meanwhile, the region 2502a with a low proportion of In tends to form Region B1 by deposition of the ejected clusters and the sputtered particles bonded to oxygen on the substrate.

Consequently, Region A1 and Region B1 extend in a cloud-like manner and are distributed unevenly and irregularly. In the above-described manner, the composite oxide semiconductor that is one embodiment of the present invention and shown in FIGS. 6A and 6B can be obtained.

<1-9. Classification of Oxide Semiconductor>

Next, classification of oxide semiconductors is described.

Oxide semiconductors are classified into a single crystal oxide semiconductor and a non-single-crystal oxide semiconductor. Examples of the non-single-crystal oxide semiconductor include a CAAC-OS, a polycrystalline oxide semiconductor, an nc-OS, an a-like OS, and an amorphous oxide semiconductor.

From another perspective, oxide semiconductors are classified into an amorphous oxide semiconductor and a crystalline oxide semiconductor. Examples of the crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS in some cases.

[A-Like OS]

An a-like OS has a structure between the structure of an nc-OS and the structure of an amorphous oxide semiconductor.

The a-like OS contains a void or a low-density region. The a-like OS has an unstable structure because it contains a void.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of the nc-OS and the density of the CAAC-OS are each higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor whose atomic ratio of In to Ga to Zn is 1:1:1, the density of single crystal $InGaZnO_4$ with a rhombohedral crystal structure is 6.357 $g/cm^3$. Accordingly, in the case of the oxide semiconductor whose atomic ratio of In to Ga to Zn is 1:1:1, the density of the a-like OS is higher than or equal to 5.0 $g/cm^3$ and lower than 5.9 $g/cm^3$, for example. In the case of the oxide semiconductor whose atomic ratio of In to Ga to Zn is 1:1:1, the density of the nc-OS and the density of the CAAC-OS are each higher than or equal to 5.9 $g/cm^3$ and lower than 6.3 $g/cm^3$, for example.

In the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

As described above, oxide semiconductors have various structures and various properties. In the oxide semiconductor film of one embodiment of the present invention, two or more of an amorphous oxide semiconductor, an a-like OS, an nc-OS, and a CAAC-OS may be mixed.

Note that Region A1 described above is preferably non-single-crystal. Region B1 is preferably non-single-crystal. Region A1 and Region B1 may have different crystallinities.

<1-10. Characteristics of Transistor>

Next, general characteristics of a transistor are described with reference to FIGS. 14A and 14B, FIG. 15, FIG. 16, and FIGS. 17A to 17C.

[$I_d$-$V_g$ Characteristics of Transistors]

Figure 14A:
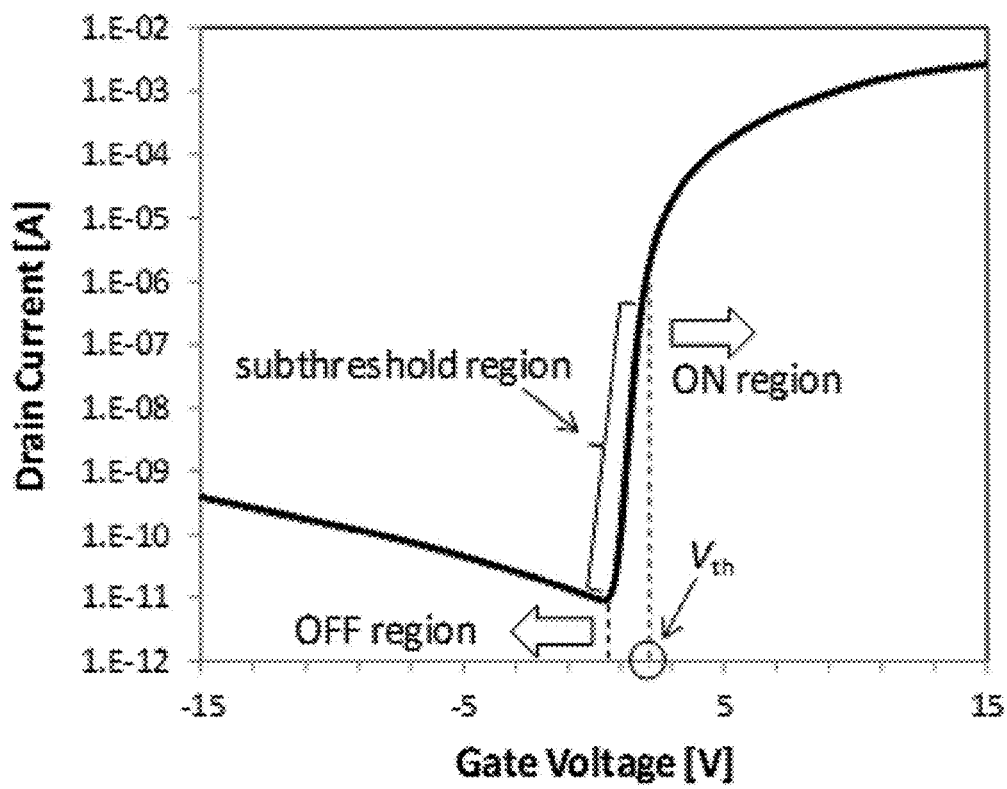
FIGS. 14A and 14B show $I_d$-$V_g$ characteristics and $I_d$-$V_d$ characteristics of a transistor.

First, drain current-gate voltage characteristics ($I_d$-$V_g$ characteristics) of a transistor are described. FIG. 14A illustrates an example of $I_d$-$V_g$ characteristics of the transistor. FIG. 14A shows the case where polycrystalline silicon is used for an active layer of the transistor for easy understanding. In FIG. 14A, the vertical axis and the horizontal axis represent $I_d$ and $V_g$, respectively.

As illustrated in FIG. 14A, $I_d$-$V_g$ characteristics are broadly divided into three regions. A first region, a second region, and a third region are referred to as an off region (OFF region), a subthreshold region, and an on region (ON region), respectively. A gate voltage at a boundary between the subthreshold region and the on region is referred to as a threshold voltage ($V_{th}$).

To obtain favorable characteristics of the transistor, it is preferable that the drain current in the off region (also referred to as off-state current or $I_{off}$) be low and the drain current in the on region (also referred to as on-state current or $I_{on}$) be high. As an index of the on-state current of the transistor, the field-effect mobility is often used. The details of the field-effect mobility are described later.

To drive the transistor at a low voltage, the slope of the $I_d$-$V_g$ characteristics in the subthreshold region is preferably steep. An index of the degree of change in the $I_d$-$V_g$ characteristics in the subthreshold region is referred to as subthreshold swing (SS) or an S value. The S value is represented by the following formula (1).

[Formula 1]

$$SS = \min\left(\frac{\partial V_g}{\partial \log_{10}(I_d)}\right) \quad (1)$$

The S value is a minimum value of the amount of change in gate voltage which is needed for changing a drain current by an order of magnitude in the subthreshold region. As the S value is smaller, switching operation between on and off states can be performed rapidly.

[$I_d$-$V_d$ Characteristics of Transistor]

Figure 14B:
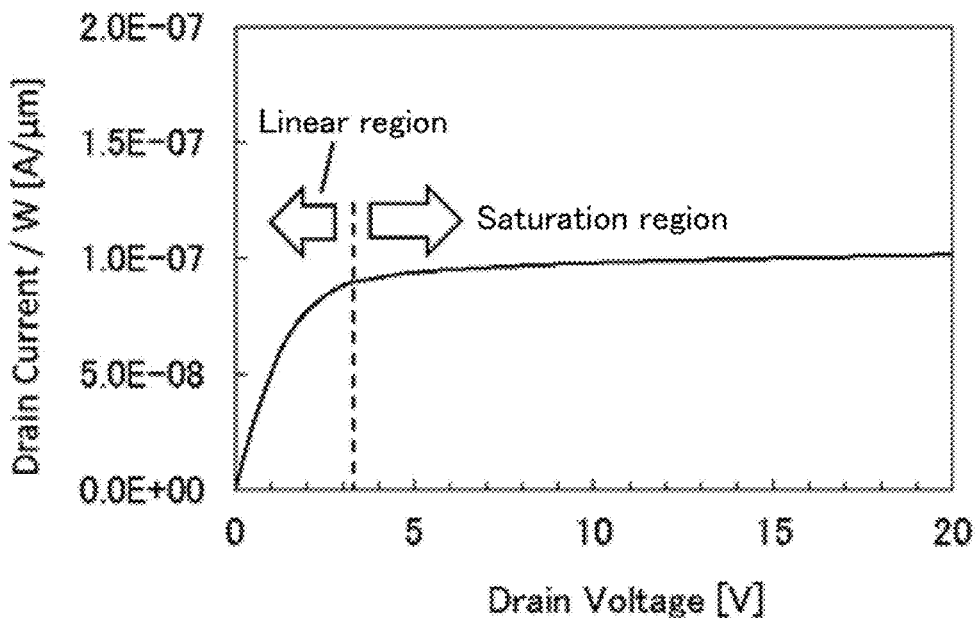

Next, drain current-drain voltage characteristics ($I_d$-$V_d$ characteristics) of a transistor are described. FIG. 14B illustrates an example of $I_d$-$V_d$ characteristics of the transistor. In FIG. 14B, the vertical axis and the horizontal axis represent $I_d$ and $V_d$, respectively.

As illustrated in FIG. 14B, the on region is further divided into two regions. A first region and a second region are referred to as a linear region and a saturation region, respectively. In the linear region, drain current increases in a parabola shape in accordance with the increase in drain voltage. On the other hand, in the saturation region, drain current does not greatly change even when drain voltage changes. According to a vacuum tube, the linear region and the saturation region are referred to as a triode region and a pentode region in some cases.

The linear region indicates the state where $V_g$ is higher than $V_d$ ($V_d < V_g$) in some cases. The saturation region indicates the state where $V_d$ is higher than $V_g$ ($V_g < V_d$) in some cases. However, in practice, the threshold voltage of the transistor needs to be considered. Thus, the state where a value obtained by subtracting the threshold voltage of the transistor from the gate voltage is higher than the drain voltage ($V_d < V_g - V_{th}$) is referred to as the linear region in some cases. Similarly, the state where a value obtained by subtracting the threshold voltage of the transistor from the gate voltage is lower than the drain voltage ($V_g - V_{th} < V_d$) is referred to as the saturation region in some cases.

The $I_d$-$V_d$ characteristics of the transistor with which current in the saturation region is constant are expressed as "favorable saturation" in some cases. The favorable saturation of the transistor is important particularly when the transistor is used in an organic EL display. For example, a transistor with favorable saturation is used as a transistor of a pixel of an organic EL display, whereby a change in luminance of the pixel can be suppressed even when the drain voltage is changed.

[Analysis Model of Drain Current]

Next, an analysis model of the drain current is described. As the analysis model of the drain current, analytic formulae of drain current based on gradual channel approximation (GCA) is known. On the basis of GCA, the drain current of the transistor is represented by the following formula (2).

[Formula 2]

$$I_d = \begin{cases} \mu\frac{W}{L}C_{ox}\left[(V_g - V_{th})V_d - \frac{1}{2}V_d^2\right] & \ldots (V_g - V_{th} > V_d) \\ \mu\frac{W}{2L}C_{ox}(V_g - V_{th})^2 & \ldots (V_g - V_{th} \leq V_d) \end{cases} \quad (2)$$

In the formula (2), the upper formula is a formula for drain current in a linear region and the lower formula is a formula for drain current in a saturation region. In the formula (2), $I_d$ represents the drain current, μ represents the mobility of the active layer, L represents the channel length of the transistor, W represents the channel width of the transistor, $C_{OX}$ represents the gate capacitance, $V_g$ represents the gate voltage, $V_d$ represents the drain voltage, and $V_{th}$ represents the threshold voltage of the transistor.

[Field-Effect Mobility]

Next, field-effect mobility is described. As an index of current drive capability of a transistor, the field-effect mobility is used. As described above, the on region of the transistor is divided into the linear region and the saturation region. From the characteristics in the regions, the field-effect mobility of the transistor can be calculated on the basis of the analytic formulae of the drain current based on GCA. The field-effect mobility in the linear region and the field-effect mobility in the saturation region are referred to as linear mobility and saturation mobility, respectively, when they need to be distinguished from each other. The linear mobility is represented by the following formula (3) and the saturation mobility is represented by the following formula (4).

[Formula 3]

$$\mu_{FE}^{lin} = \frac{L}{WC_{OX}}\frac{\partial I_d}{\partial V_g}\frac{1}{V_d} \quad (3)$$

[Formula 4]

$$\mu_{FE}^{sat} = \frac{2L}{WC_{OX}}\left(\frac{\partial \sqrt{I_d}}{\partial V_g}\right)^2 \quad (4)$$

Figure 15:
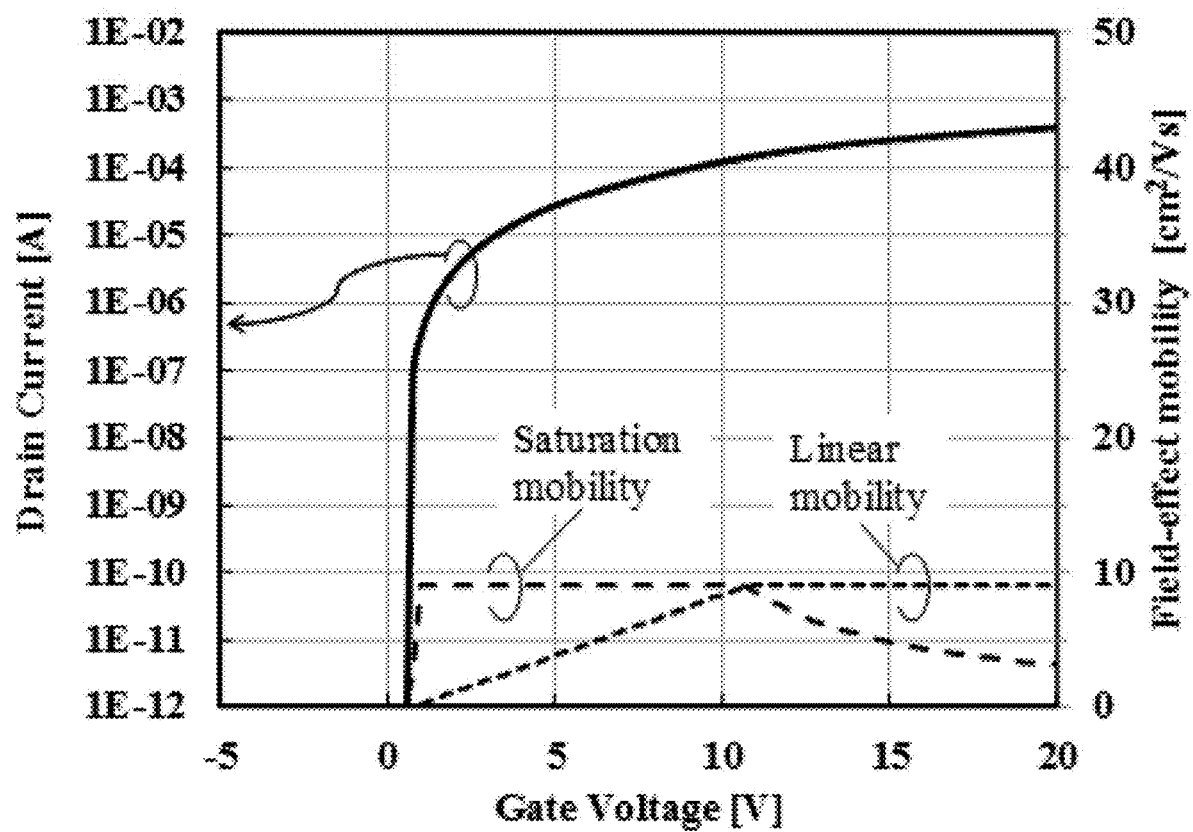
FIG. 15 shows $I_d$-$V_g$ characteristics and linear and saturation mobility curves which are calculated on the basis of GCA.

In this specification and the like, curves calculated from the formula (3) and the formula (4) are referred to as mobility curves. FIG. 15 shows mobility curves calculated from the analytic formulae of drain current based on GCA. In FIG. 15, the $I_d$-$V_g$ characteristics at $V_d$=10 V and the mobility curves of the linear mobility and the saturation mobility at the time when GCA is assumed to be effective are shown together.

In FIG. 15, the $I_d$-$V_g$ characteristics are calculated from the analytic formulae of drain current based on GCA. The shapes of the mobility curves can be a lead to understanding the state of the inside of the transistor.

Figure 16:
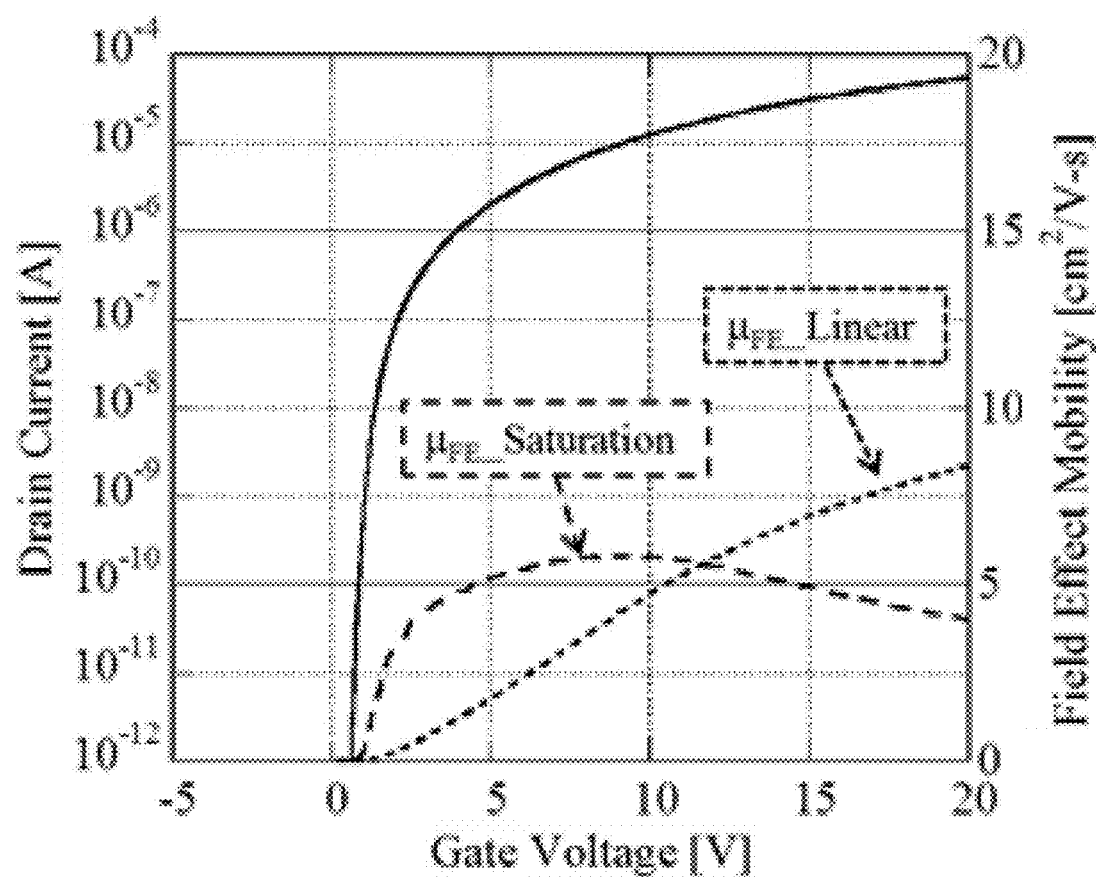
FIG. 16 shows $I_d$-$V_g$ characteristics and field-effect mobility curves of a FET including a CAAC-OS.

As an example, FIG. 16 shows the measured $I_d$-$V_g$ characteristics of a FET including a CAAC-OS. In FIG. 16, the $I_d$-$V_g$ characteristics and the mobility curves of the saturation mobility and the linear mobility of the FET are shown together. Note that an oxide semiconductor (IGZO) film with an atomic ratio of In:Ga:Zn=1:1:1 is used as a semiconductor layer of the FET. The mobility curves of the saturation mobility and the linear mobility are each obtained from the $I_d$-$V_g$ characteristics curve at $V_d$=10 V.

As shown in FIG. 16, when the FET shape follows GCA, the curve of the saturation mobility plateaus in the saturation region and goes down gradually in the linear region.

<1-11. Fabrication of Transistor for Evaluating Characteristics>

Next, the structure of the transistor of one embodiment of the present invention is described, and evaluation results of electrical characteristics of the transistor which was fabricated are shown.

Structure Example 1 of Transistor

Figure 17A:
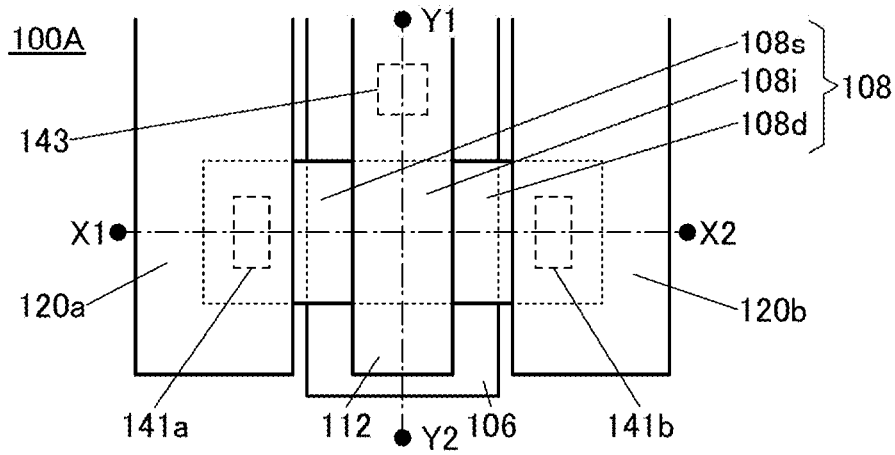
FIG. 17A is a top view of a transistor.
Figure 17B:
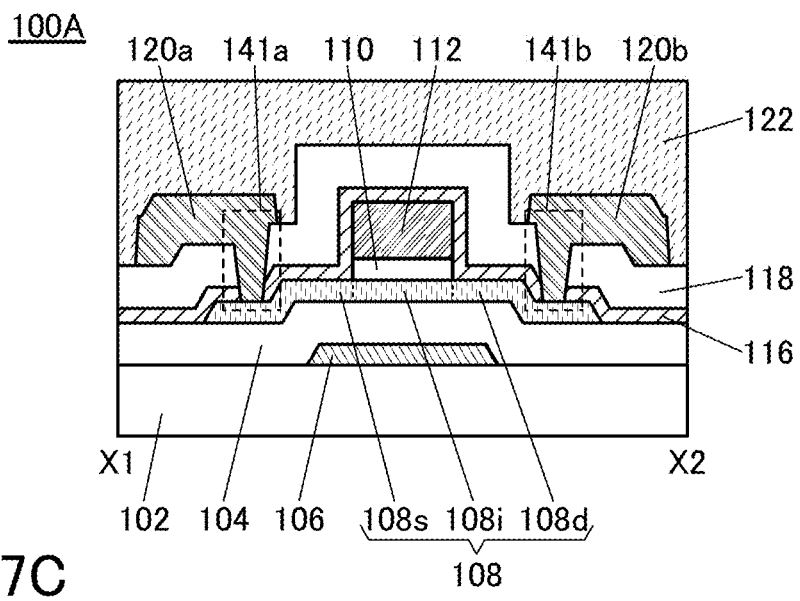
FIGS. 17B and 17C are cross-sectional views thereof.
Figure 17C:
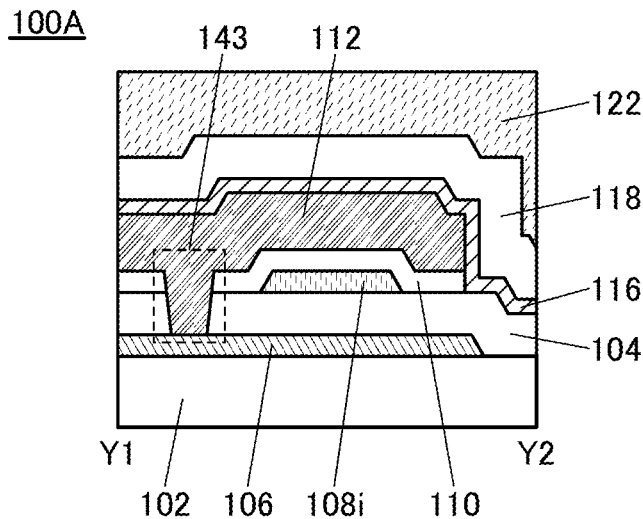

FIG. 17A is a top view of a transistor 100A. FIG. 17B is a cross-sectional view taken along the dashed-dotted line X1-X2 in FIG. 17A. FIG. 17C is a cross-sectional view taken along the dashed-dotted line Y1-Y2 in FIG. 17A. For clarity, FIG. 17A does not illustrate some components such as an insulating film 110. As in FIG. 17A, some components are not illustrated in some cases in top views of transistors described below. Furthermore, the direction of the dashed-dotted line X1-X2 may be referred to as a channel length (L) direction, and the direction of dashed-dotted line Y1-Y2 may be referred to as a channel width (W) direction.

The transistor 100A illustrated in FIGS. 17A to 17C includes a conductive film 106 over a substrate 102; an insulating film 104 over the conductive film 106; an oxide semiconductor film 108 over the insulating film 104; the insulating film 110 over the oxide semiconductor film 108; a conductive film 112 over the insulating film 110; and an insulating film 116 over the insulating film 104, the oxide semiconductor film 108, and the conductive film 112. Note that the oxide semiconductor film 108 includes a channel region 108i overlapping with the conductive film 112, a source region 108s in contact with the insulating film 116, and a drain region 108d in contact with the insulating film 116.

Furthermore, the insulating film 116 contains nitrogen or hydrogen. The insulating film 116 is in contact with the source region 108s and the drain region 108d, so that nitrogen or hydrogen that is contained in the insulating film 116 is added to the source region 108s and the drain region 108d. The source region 108s and the drain region 108d each have a high carrier density when nitrogen or hydrogen is added thereto.

The transistor 100A may further include an insulating film 118 over the insulating film 116, a conductive film 120a electrically connected to the source region 108s through an opening portion 141a provided in the insulating films 116 and 118, and a conductive film 120b electrically connected to the drain region 108d through an opening portion 141b provided in the insulating films 116 and 118. In addition, an insulating film 122 may be provided over the insulating film 118, the conductive film 120a, and the conductive film 120b. Although the structure where the insulating film 122 is provided is shown in FIGS. 17B and 17C, one embodiment of the present invention is not limited thereto, and the insulating film 122 is not necessarily provided.

In this specification and the like, the insulating film 104 may be referred to as a first insulating film, the insulating film 110 may be referred to as a second insulating film, the insulating film 116 may be referred to as a third insulating film, the insulating film 118 may be referred to as a fourth insulating film, and the insulating film 122 may be referred to as a fifth insulating film. The insulating film 104 functions as a first gate insulating film, and the insulating film 110 functions as a second gate insulating film. The insulating films 116 and 118 function as a protective insulating film and the insulating film 122 functions as a planarization insulating film.

The insulating film 110 includes an excess oxygen region. Since the insulating film 110 includes the excess oxygen region, excess oxygen can be supplied to the channel region 108i included in the oxide semiconductor film 108. As a result, oxygen vacancies that might be formed in the channel region 108i can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. In that case, excess oxygen contained in the insulating film 104 might also be supplied to the source region 108s and the drain region 108d included in the oxide semiconductor film 108. When excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied only to the channel region 108i. Alternatively, the carrier density of the source and drain regions 108s and 108d can be selectively increased after excess oxygen is supplied to the channel region 108i and the source and drain regions 108s and 108d, in which case an increase in the resistance of the source and drain regions 108s and 108d can be prevented.

Furthermore, each of the source region 108s and the drain region 108d included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element are helium, neon, argon, krypton, and xenon. The element that forms an oxygen vacancy is diffused from the insulating film 116 to the source region 108s and the drain region 108d in the case where the insulating film 116 contains one or more such elements. In addition or alternatively, the element that forms an oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

The conductive film 106 functions as a first gate electrode and the conductive film 112 functions as a second gate electrode. The conductive film 120a functions as a source electrode and the conductive film 120b functions as a drain electrode.

As illustrated in FIG. 17C, an opening portion 143 is provided in the insulating films 104 and 110. The conductive film 106 is electrically connected to the conductive film 112 through the opening portion 143. Thus, the same potential is applied to the conductive film 106 and the conductive film 112. Note that different potentials may be applied to the conductive film 106 and the conductive film 112 without providing the opening portion 143. Alternatively, the conductive film 106 may be used as a light-shielding film without providing the opening portion 143. When the conductive film 106 is formed using a light-shielding material, for example, light irradiating the channel region 108i from the bottom can be reduced.

As illustrated in FIGS. 17B and 17C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening portion 143 provided in the insulating films 104 and 110, a side surface of the oxide semiconductor film 108 in the channel width direction faces the conductive film 112 with the insulating film 110 placed therebetween.

In other words, in the channel width direction of the transistor 100A, the conductive films 106 and 112 are connected to each other through the opening portion 143 provided in the insulating films 104 and 110, and the conductive films 106 and 112 surround the oxide semiconductor film 108 with the insulating films 104 and 110 placed therebetween.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of the first gate electrode and the second gate electrode electrically surround the oxide semiconductor film 108 in which a channel region is formed can be referred to as a surrounded channel (s-channel) structure. Note that the transistor 100A can also be called a dual-gate transistor owing to the number of its gate electrodes.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. Since the on-state current can be increased, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

Note that in the channel width direction of the transistor 100A, an opening portion which is different from the opening portion 143 may be formed on the side of the oxide semiconductor film 108 on which the opening portion 143 is not formed.

Note that the transistor 100A can also be called a top-gate self-aligned (TGSA) FET, owing to the position of the conductive film 112 with respect to the oxide semiconductor film 108 and a formation method of the conductive film 112. Note that the semiconductor device of one embodiment of the present invention is not limited thereto and may be a bottom-gate top-contact (BGTC) FET.

[Formation of Transistor]

Next, transistors which correspond to the above-described transistor 100A were formed and the electrical characteristics of the transistors were evaluated. In this embodiment, Samples S1A to S1C described below were fabricated. Samples S1A to S1C are each a sample in which a transistor with a channel length L of 2 μm and a channel width W of 3 μm is formed. Sample S1A includes the composite oxide semiconductor shown in FIGS. 4A and 4B as the oxide semiconductor film 108, Sample S1B includes the composite oxide semiconductor shown in FIGS. 5A and 5B as the oxide semiconductor film 108, and Sample S1C includes the composite oxide semiconductor shown in FIGS. 6A and 6B as the oxide semiconductor film 108.

[Method for Forming Samples S1A to S1C]

First, a 10-nm-thick titanium film and a 100-nm-thick copper film were formed over a glass substrate with a sputtering apparatus. Next, the conductive film was processed by a photolithography method.

A stack including four insulating films was formed over the substrate and the conductive film. The insulating films were formed in succession in a vacuum with a plasma-enhanced chemical deposition (PECVD) apparatus. As the insulating films, a 50-nm-thick silicon nitride film, a 300-nm-thick silicon nitride film, a 50-nm-thick silicon nitride film, and a 50-nm-thick silicon oxynitride film were used and stacked in this order.

Next, an oxide semiconductor film was formed over the insulating film and was processed into an island shape, whereby a semiconductor layer was formed. A 40-nm-thick oxide semiconductor film was formed as the oxide semiconductor film 108. Note that the oxide semiconductor film is the above-described composite oxide semiconductor or C/IGZO.

The oxide semiconductor film of Sample S1A was formed under the following conditions: the substrate temperature was room temperature (25° C.); an argon gas with a flow rate of 180 sccm and an oxygen gas with a flow rate of 20 sccm were introduced into a chamber of the sputtering apparatus; the pressure was set to 0.6 Pa; and an AC power of 2.5 kw was applied to a metal oxide target containing indium, gallium, and zinc (In:Ga:Zn=4:2:4.1 [atomic ratio]). The oxygen flow rate percentage in deposition of the oxide semiconductor film of Sample S1A was 10%.

Next, an insulating film was formed over the insulating film and the oxide semiconductor layer. As the insulating film, a 150-nm-thick silicon oxynitride film was formed with a PECVD apparatus.

Next, heat treatment was performed. The heat treatment was performed at 350° C. in a mixed gas atmosphere of nitrogen and oxygen for one hour.

An opening portion was formed in a desired region of the insulating film. The opening portion was formed by a dry etching method.

Then, a 100-nm-thick oxide semiconductor film was formed over the insulating film and in the opening portion and the oxide semiconductor film was processed into an island shape, whereby a conductive film was formed. In addition, the insulating film in contact with the bottom surface of the conductive film was processed in succession after the formation of the conductive film, whereby the insulating film was formed.

As the conductive film, a 10-nm-thick oxide semiconductor film, a 50-nm-thick titanium nitride film, and a 100-nm-thick copper film were formed in this order. The oxide semiconductor film was formed under the following conditions: the substrate temperature was 170° C.; an oxygen gas with a flow rate of 200 sccm was introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). The titanium nitride film and the copper film were formed with a sputtering apparatus.

Then, plasma treatment was performed from above the oxide semiconductor film, the insulating film, and the conductive film. The plasma treatment was performed with a PECVD apparatus at a substrate temperature of 220° C. in a mixed gas atmosphere containing an argon gas and a nitrogen gas.

Then, an insulating film was formed over the oxide semiconductor film, the insulating film, and the conductive film. The insulating film was formed by stacking a 100-nm-thick silicon nitride film and a 300-nm-thick silicon oxynitride film with a PECVD apparatus.

Then, a mask was formed over the formed insulating film and an opening portion was formed in the insulating film with use of the mask.

A conductive film was formed to fill the opening portion and was processed into an island shape, whereby the conductive films serving as a source electrode and a drain electrode was formed. For the conductive films, a 10-nm-thick titanium film and a 100-nm-thick copper film were formed with a sputtering apparatus.

After that, an insulating film was formed over the insulating film and the conductive films. A 1.5-μm-thick acrylic-based photosensitive resin was used for the insulating film.

In such a manner, Sample S1A was formed.

Sample S1B was formed in a manner similar to the manner in which Sample S1A was formed, except the formation conditions of the oxide semiconductor film. The oxide semiconductor film of Sample S1B was formed under the following conditions: the substrate temperature was room temperature (25° C.); an argon gas with a flow rate of 100 sccm and an oxygen gas with a flow rate of 100 sccm were introduced into a chamber of the sputtering apparatus; the pressure was set to 0.6 Pa; and an AC power of 2.5 kw was applied to a metal oxide target containing indium, gallium, and zinc (In:Ga:Zn=4:2:4.1 [atomic ratio]). The oxygen flow rate percentage in deposition of the oxide semiconductor film of Sample S1B was 50%.

Sample S1C was formed in a manner similar to the manner in which Sample S1A was formed, except the formation conditions of the oxide semiconductor film. The oxide semiconductor film of Sample S1C was formed under the following conditions: the substrate temperature was room temperature (25° C.); an oxygen gas with a flow rate of 200 sccm was introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). The oxygen flow rate percentage in deposition of the oxide semiconductor film of Sample S1C was 100%.

[$I_d$-$V_g$ Characteristics of Transistors]

Next, $I_d$-$V_g$ characteristics of the transistors in Samples S1A to S1C were measured. As conditions for measuring the $I_d$-$V_g$ characteristics of each transistor, a voltage applied to the conductive film serving as a first gate electrode (hereinafter the voltage is also referred to as gate voltage ($V_g$)) and a voltage applied to the conductive film serving as the second gate electrode (hereinafter the voltage is also referred to as back gate voltage ($V_{bg}$)) were changed from −10 V to +10 V in increments of 0.25 V. A voltage applied to the conductive film serving as a source electrode (the voltage is also referred to as source voltage (Vs)) was 0 V (comm), and a voltage applied to the conductive film serving as a drain electrode (the voltage is also referred to as drain voltage ($V_d$)) was 0.1 V and 20 V.

Figure 2:
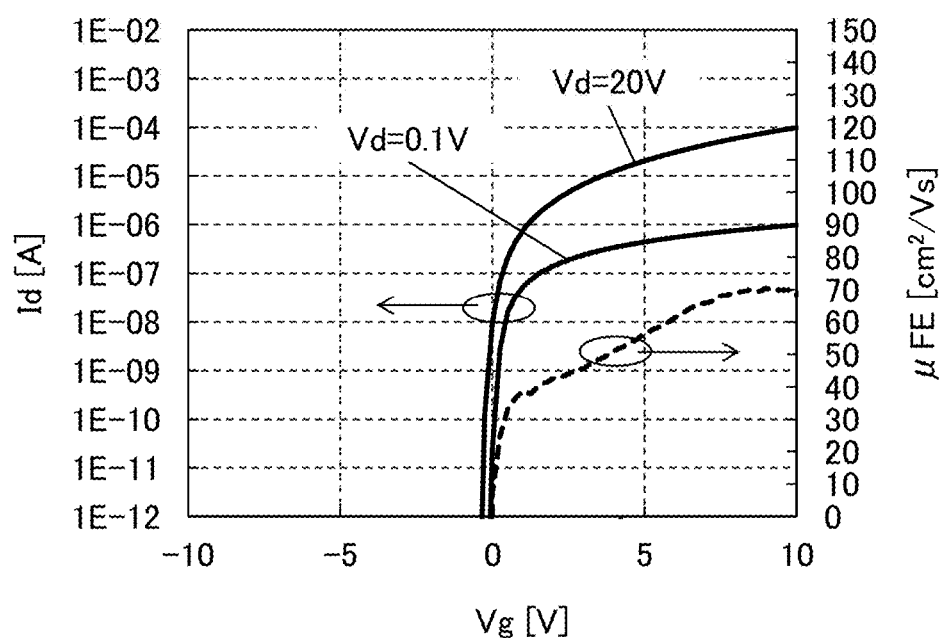
FIG. 2 shows $I_d$-$V_g$ characteristics of a transistor.
Figure 3:
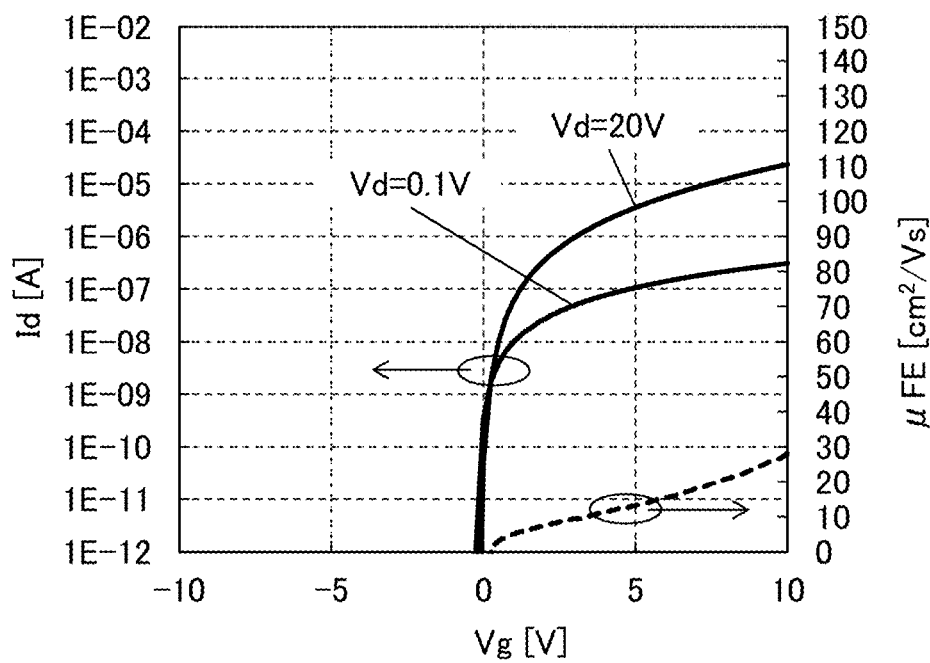
FIG. 3 shows $I_d$-$V_g$ characteristics of a transistor.

FIG. 1 shows results of $I_d$-$V_g$ characteristics of Sample S1A, FIG. 2 shows results of $I_d$-$V_g$ characteristics of Sample S1B, and FIG. 3 shows results of $I_d$-$V_g$ characteristics of Sample S1C. In FIG. 1 to FIG. 3, the first vertical axis represents $I_d$ (A), the second vertical axis represents field-effect mobility ($\mu_{FE}$) (cm$^2$/Vs), and the horizontal axis represents $V_g$ (V). Note that the field-effect mobility was measured when $V_d$ was 20 V.

As shown in FIG. 1, the transistor that is a semiconductor device of one embodiment of the present invention has favorable electrical characteristics. Table 2 shows the transistor characteristics shown in FIG. 1.

TABLE 2

| μFE(max) [cm$^2$V$^{-1}$s$^{-1}$] | Vth [V] | S [V/decade] | Ioff [A/cm$^2$] | μFE(@Vg = 2 V) [cm$^2$V$^{-1}$s$^{-1}$] | μFE(max)/ μFE(@Vg = 2 V) |
|---|---|---|---|---|---|
| 65.9 | 0.95 | 0.09 | <1 × 10$^{-12}$ | 44.2 | 1.49 |

As shown in Table 2, Sample S1A includes a first region where the maximum value of the field-effect mobility of the transistor at a gate voltage of higher than 0 V and lower than or equal to 10 V is larger than or equal to 40 cm$^2$/Vs and smaller than 150 cm$^2$/Vs, a second region where the threshold voltage is higher than or equal to −1 V and lower than or equal to 1 V, a third region where the S value is smaller than 0.3 V/decade, and a fourth region where the off-state current is lower than 1×10$^{-12}$ A/cm$^2$, and $\mu_{FE}$(max)/$\mu_{FE}$($V_g$=2V) is larger than or equal to 1 and smaller than 1.5 where $\mu_{FE}$(max) represents the maximum value of the field-effect mobility of the transistor and $\mu_{FE}$($V_g$=2V) represents the value of the field-effect mobility of the transistor at a gate voltage of 2 V.

As shown in FIG. 2, the transistor that is a semiconductor device of one embodiment of the present invention has favorable electrical characteristics. Table 3 shows the transistor characteristics shown in FIG. 2.

TABLE 3

| μFE(max) [cm$^2$V$^{-1}$s$^{-1}$] | Vth [V] | S [V/decade] | Ioff [A/cm$^2$] | μFE(@Vg = 2 V) [cm$^2$V$^{-1}$s$^{-1}$] | μFE(max)/ μFE(@Vg = 2 V) |
|---|---|---|---|---|---|
| 70.5 | −0.17 | 0.13 | <1 × 10$^{-12}$ | 42.5 | 1.66 |

As shown in Table 3, Sample S1B includes a first region where the maximum value of the field-effect mobility of the transistor at a gate voltage of higher than 0 V and lower than or equal to 10 V is larger than or equal to 40 cm$^2$/Vs and smaller than 150 cm$^2$/Vs, a second region where the threshold voltage is higher than or equal to −1 V and lower than or equal to 1 V, a third region where the S value is smaller than 0.3 V/decade, and a fourth region where the off-state current is lower than 1×10$^{-12}$ A/cm$^2$, and $\mu_{FE}$(max)/$\mu_{FE}$($V_g$=2V) is larger than or equal to 1.5 and smaller than 3 where $\mu_{FE}$(max) represents the maximum value of the field-effect mobility of the transistor and $\mu_{FE}$($V_g$=2V) represents the value of the field-effect mobility of the transistor at a gate voltage of 2 V.

As shown in FIG. 3, the transistor that is a semiconductor device of one embodiment of the present invention has favorable electrical characteristics. Table 4 shows the transistor characteristics shown in FIG. 3.

TABLE 4

| μFE(max) [cm²V⁻¹s⁻¹] | Vth [V] | S [V/decade] | Ioff [A/cm²] | μFE(@Vg = 2 V) [cm²V⁻¹s⁻¹] | μFE(max)/ μFE(@Vg = 2 V) |
|---|---|---|---|---|---|
| 28.0 | 0.21 | 0.16 | <1 × 10⁻¹² | 7.3 | 3.84 |

As shown in Table 4, Sample S1C includes a first region where the maximum value of the field-effect mobility of the transistor at a gate voltage of higher than 0 V and lower than or equal to 10 V is larger than or equal to 10 cm²/Vs and smaller than 100 cm²/Vs, a second region where the threshold voltage is higher than or equal to −1 V and lower than or equal to 1 V, a third region where the S value is smaller than 0.3 V/decade, and a fourth region where the off-state current is lower than $1 \times 10^{-12}$ A/cm², and $\mu_{FE}(max)/\mu_{FE}(V_g=2V)$ is larger than or equal to 3 and smaller than 10 where $\mu_{FE}(max)$ represents the maximum value of the field-effect mobility of the transistor and $\mu_{FE}(V_g=2V)$ represents the value of the field-effect mobility of the transistor at a gate voltage of 2 V.

The transistor characteristics can be obtained by using the above-described composite oxide semiconductor or C/IGZO. In the transistor including the above-described composite oxide semiconductor or C/IGZO as the semiconductor layer, a function of achieving high carrier mobility and a function of achieving excellent switching characteristics can be obtained at the same time.

<1-12. Examination of Shape of Mobility Curve by Device Simulation>

Next, the shape of the mobility curve of the field-effect mobility of the transistor that is shown in FIG. 1 was examined by device simulation from various viewpoints.

In the device simulation, as factors which determine the shape of the mobility curve, three factors were assumed: 1. Temperature dependence of mobility; 2. Donor density distribution in channel region; and 3. Density of shallow defect states (also referred to as sDOS) in oxide semiconductor film.

[1. Temperature Dependence of Mobility]

In a transistor including an oxide semiconductor film, the field-effect mobility is increased rapidly due to self-heating. The temperature dependence of electron mobility ($\mu_n$) of the oxide semiconductor film is represented by the following formula (5).

[Formula 5]

$$\mu_n = \mu_{n300}\left(\frac{T_L}{300}\right)^{1.5} \quad (5)$$

In the formula (5), $\mu_{n300}$ represents electron mobility of the oxide semiconductor film at room temperature and TL represents lattice temperature. As shown in the formula (5), the field-effect mobility of the transistor including the oxide semiconductor film increases in proportion to approximately the temperature T to the power of 1.5.

[2. Donor Density Distribution in Channel Region]

Here, the effective channel lengths of the transistors of Samples S1A to S1C are described with reference to FIG. 18.

Figure 18:
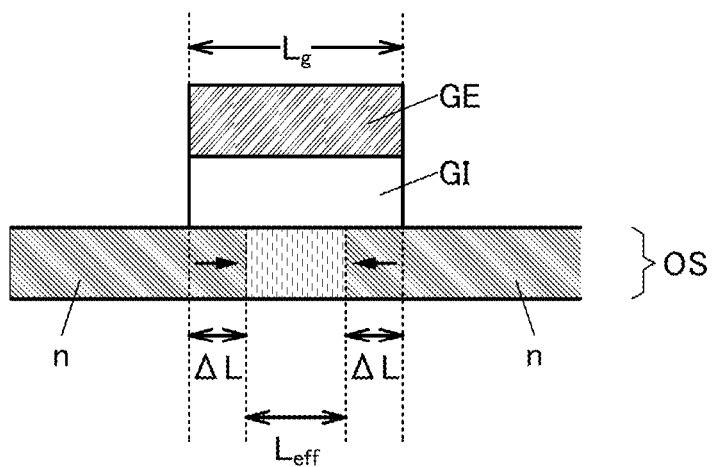
FIG. 18 is a schematic view illustrating a concept of an effective channel length of a transistor.

FIG. 18 is a schematic view illustrating a concept of an effective channel length of a transistor.

In FIG. 18, GE, GI, and OS refer to a gate electrode, a gate insulating film, and an oxide semiconductor film, respectively. In the oxide semiconductor film, an n-type region is formed. The effective channel length ($L_{eff}$) of the transistor is represented by the following formula (6).

[Formula 6]

$$L_{eff} = L_g - 2\Delta L \quad (6)$$

In the formula (6), $L_g$ represents a gate length and $\Delta L$ represents a reduction width of a channel length.

The effective channel length of the transistor can be obtained by transmission line model (TLM) analysis, for example.

Figure 19A:
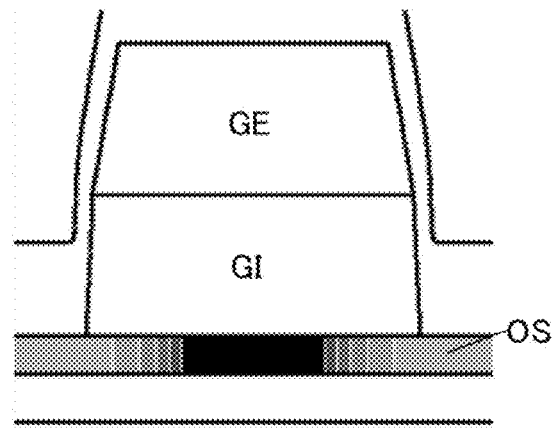
FIGS. 19A to 19C are schematic views each illustrating a donor density.
Figure 19B:
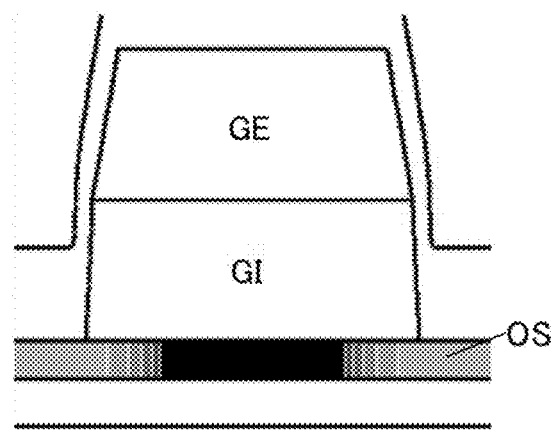
Figure 19C:
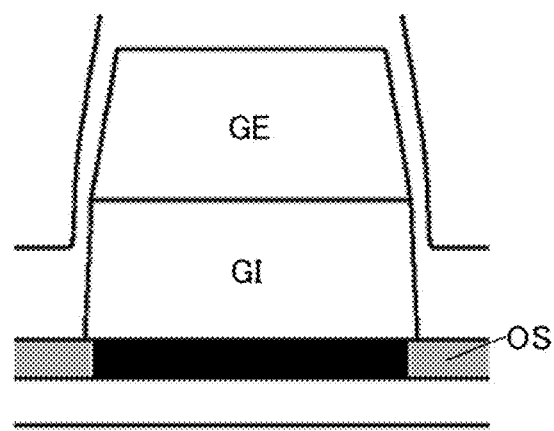

In the following description, a model in which a donor density is gradually decreased from an n-type region to a channel region was assumed on the basis of the above-described effective channel length. That is, donors are decreased toward the channel region in accordance with the Gaussian distribution. FIGS. 19A to 19C show schematic views illustrating donor densities of channel regions.

FIGS. 19A, 19B, and 19C illustrate a donor density of Sample S1A, a donor density of Sample S1B, and a donor density of Sample S1C, respectively.

In FIGS. 19A to 19C, GE, GI, and OS refer to a gate electrode, a gate insulating film, and an oxide semiconductor film, respectively. In the oxide semiconductor films illustrated in FIGS. 19A to 19C, a region where a donor density is higher than or equal to $5 \times 10^{18}$ cm³ is shown in gray and a region where a donor density is lower than or equal to $1 \times 10^{16}$ cm³ is shown in black.

From the results shown in FIGS. 19A, 19B, and 19C, the effective channel lengths in the transistors shown in FIGS. 19A, 19B, and 19C were estimated to be 2.0 μm, 1.2 μm, and 0.8 μm, respectively. In other words, ΔL of the transistor shown in FIG. 19A, ΔL of the transistor shown in FIG. 19B, and ΔL of the transistor shown in FIG. 19C were estimated to be 0 μm, 0.4 μm, and 0.6 μm, respectively.

[3. Density of Shallow Defect States in Oxide Semiconductor Film]

Next, a density of shallow defect states (also referred to as sDOS) in an oxide semiconductor film is described. The sDOS of an oxide semiconductor film can be estimated from electrical characteristics of a transistor including the oxide semiconductor film. In the description below, the density of interface states of the transistor was measured. In addition, a method for estimating subthreshold leakage current in consideration of the density of interface states and the number of electrons trapped by the interface states, $N_{trap}$ is described.

The number of electrons trapped by the interface state, $N_{trap}$, can be measured by comparing drain current-gate voltage ($I_d$-$V_g$) of the transistor that was actually measured and drain current-gate voltage ($I_d$-$V_g$) characteristics that was calculated.

Figure 20:
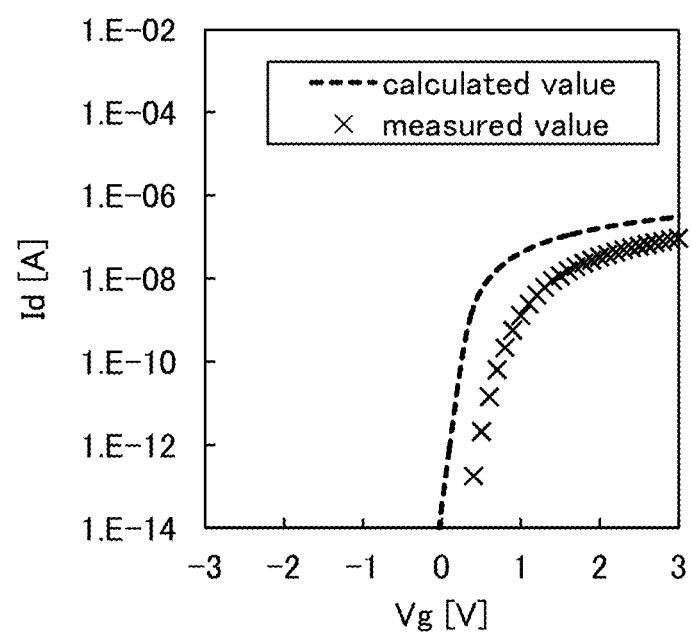
FIG. 20 shows $I_d$-$V_g$ characteristics.

FIG. 20 illustrates ideal $I_d$-$V_g$ characteristics obtained by calculation and the actually measured $I_d$-$V_g$ characteristics of the transistor when a source voltage Vs is 0 V and a drain voltage $V_d$ is 0.1 V. Note that only values more than or equal to $1 \times 10^{-13}$ A at which drain voltage $I_d$ can be easily measured were plotted among the measurement results of the transistor.

A change of the drain current $I_d$ with respect to the gate voltage $V_g$ is more gradual in the actually measured $I_d$-$V_g$ characteristics than in the ideal $I_d$-$V_g$ characteristics obtained by calculation. This is probably because an electron is trapped by a shallow interface state positioned near energy at the bottom of the conduction band (represented as $E_C$). In this measurement, the density of interface surface Nit can be estimated more accurately in consideration of the number of electrons (per unit area and unit energy) trapped by a shallow interface state, $N_{trap}$, with use of the Fermi distribution function.

Figure 21:
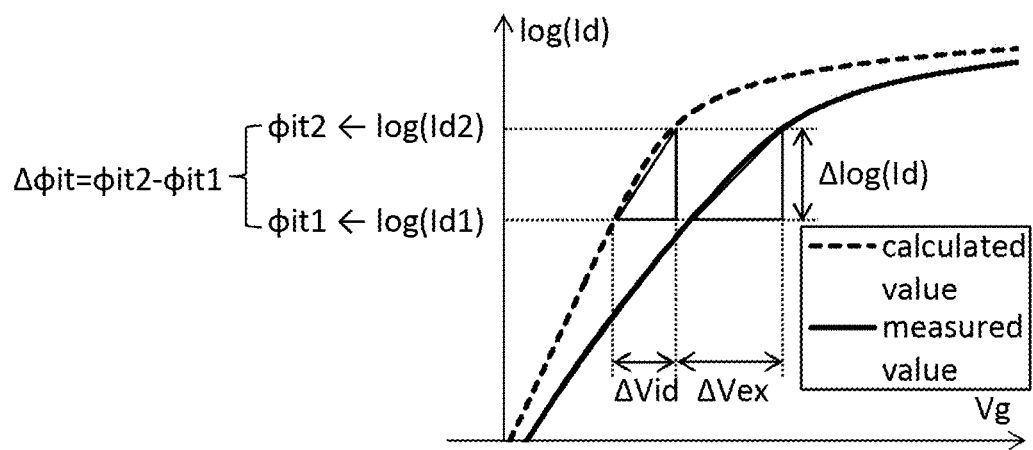
FIG. 21 shows $I_d$-$V_g$ characteristics.

First, a method for evaluating the number of electrons trapped by an interface trap state, $N_{trap}$, by using schematic $I_d$-$V_g$ characteristics illustrated in FIG. 21 is described. The dashed line indicates ideal $I_d$-$V_g$ characteristics without trap state and is obtained by the calculation. On the dashed line, a change in gate voltage $V_g$ when the drain current changes from $I_d1$ to $I_d2$ is represented by $\Delta V_{id}$. The solid line indicates the actually measured $I_d$-$V_g$ characteristics. On the solid line, a change in gate voltage $V_g$ when the drain current changes from $I_d1$ to $I_d2$ is represented by $\Delta V_{ex}$. The potential at the target interface when the drain current is $I_d1$, the potential at the target interface when the drain current is $I_d2$, and the amount of change are represented by $\phi_{it1}$, $\phi_{it2}$, and $\Delta\phi_{it}$, respectively.

The slope of the actually measured values is smaller than that of the calculated values in FIG. 21, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, $\Delta Q_{trap}$ which the amount of change in charge due to trapped electrons can be expressed by the following formula (7).

[Formula 7]

$$\Delta Q_{trap} = -C_{tg}(\Delta V_{ex} - \Delta V_{id}) \quad (7)$$

$C_{tg}$ is combined capacitance of an insulator and a semiconductor per unit area. In addition, $\Delta Q_{trap}$ can be expressed by the formula (8) by using the number of trapped electrons $N_{trap}$ (per unit area and per unit energy). Note that q represents elementary charge.

[Formula 8]

$$\Delta Q_{trap} = -q N_{trap} \Delta\phi_{it} \quad (8)$$

Simultaneously solving the formulae (7) and (8) gives the formula (9).

[Formula 9]

$$-C_{tg}(\Delta V_{ex} - \Delta V_{id}) = -q N_{trap} \Delta\phi_{it} \quad (9)$$

Then, taking the limit zero of $\Delta\phi_{it}$ in the formula (9) gives the formula (10).

[Formula 10]

$$N_{trap} = \frac{C_{tg}}{q} \lim_{\Delta\phi_{it} \to 0} \left( \frac{\Delta V_{ex}}{\Delta\phi_{it}} - \frac{\Delta V_{id}}{\Delta\phi_{it}} \right) = C_{tg}\left( \frac{\partial V_{ex}}{\partial \phi_{it}} - \frac{\partial V_{id}}{\partial \phi_{it}} \right) \quad (10)$$

In other words, the number of electrons trapped by an interface surface, $N_{trap}$, can be estimated by using the ideal $I_d$-$V_g$ characteristics, the actually measured $I_d$-$V_g$ characteristics, and the formula (10). Note that the relationship between the drain current and the potential at the interface surface can be obtained by calculation with the device simulator described above.

The relationship between the number of electrons $N_{trap}$ per unit area and per unit energy and the density of interface surface Nit is expressed by the formula (11).

[Formula 11]

$$N_{trap} = \frac{\partial}{\partial \phi_{it}} \int_{-\infty}^{\infty} N_{it}(E) f(E) dE \quad (11)$$

Here, f(E) is Fermi distribution function. The $N_{trap}$ obtained from the formula (10) is fitted with the formula (11) to determine Nit. The conduction characteristics including $I_d$<0.1 pA can be obtained by the device simulator to which the Nit is set.

Figure 22:
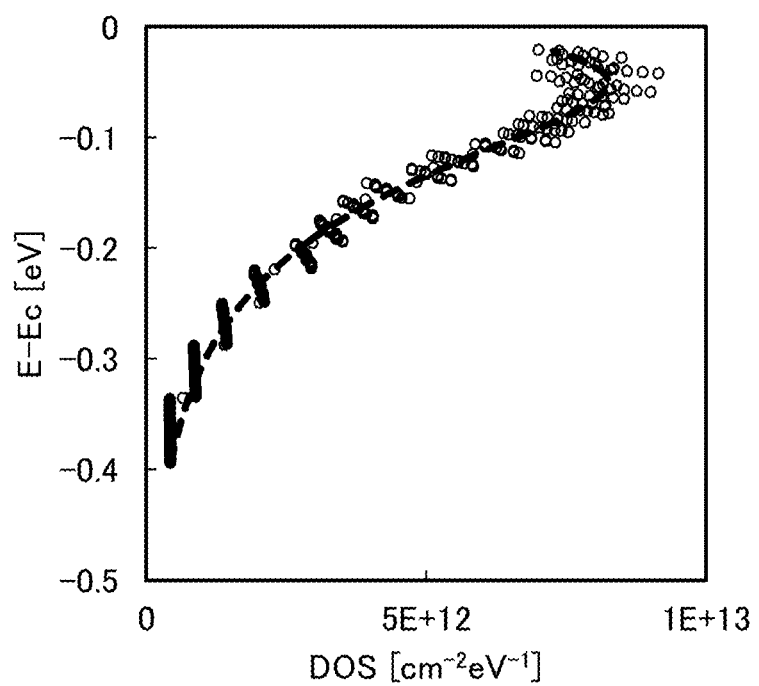
FIG. 22 shows calculation results of a density of interface states.

The actually measured $I_d$-$V_g$ characteristics in FIG. 22 is applied to the formula (10) and the results of extracting $N_{trap}$ are plotted as white circles in FIG. 20. The vertical axis in FIG. 22 represents Fermi energy Ef at the bottom of the conduction band $E_C$ of a semiconductor. The maximum value is positioned on the dashed line just under $E_C$. When tail distribution of the formula (12) is assumed as Nit of the formula (11), $N_{trap}$ can be fitted well like the dashed line in FIG. 22. As a result, the peak value $N_{ta}=1.67\times10^{13}$ cm$^{-2}$ eV$^{-1}$ and the characteristic width $W_{ta}=0.105$ eV are obtained as the fitting parameters.

[Formula 12]

$$N_{it}(E) = N_{ta} \exp\left[ \frac{E - E_c}{W_{ta}} \right] \quad (12)$$

Figure 23A:
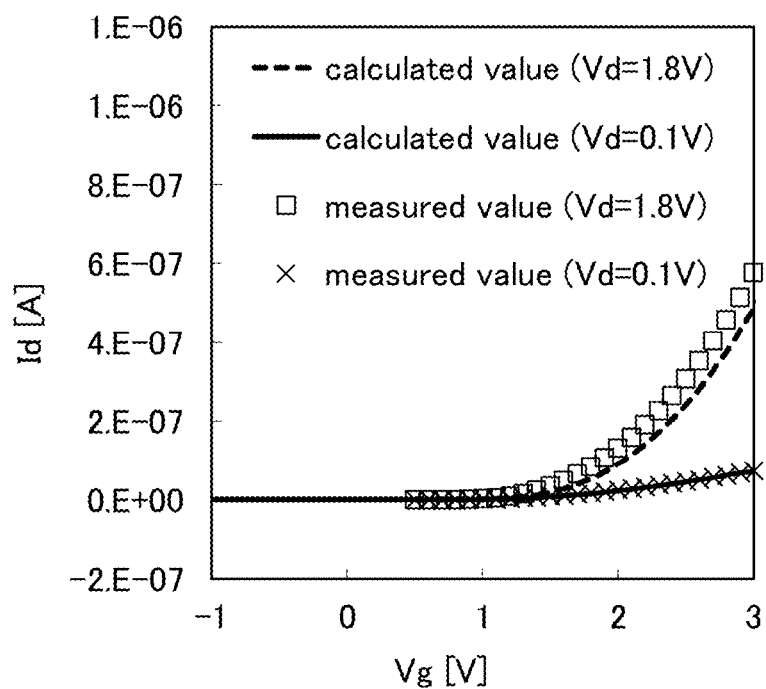
FIGS. 23A and 23B show $I_d$-$V_g$ characteristics.
Figure 23B:
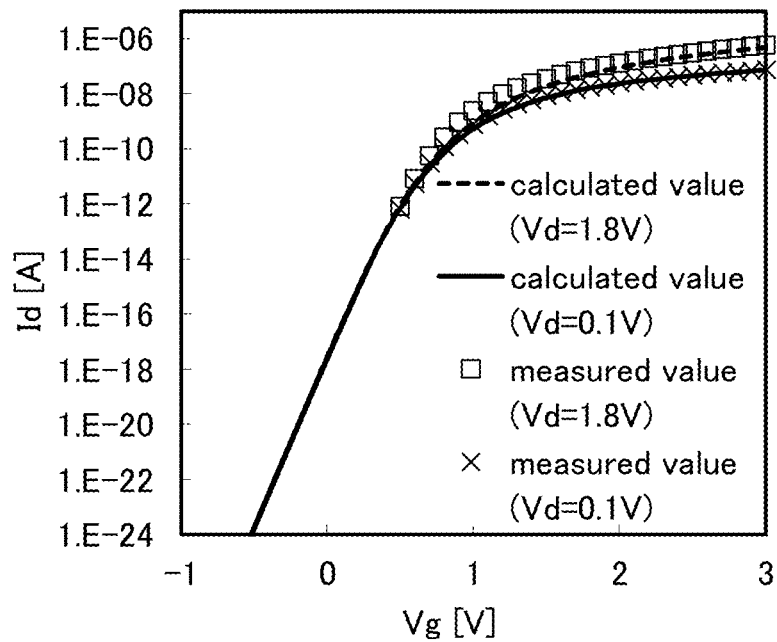

FIGS. 23A and 23B show the inverse calculation results of $I_d$-$V_g$ characteristics by feeding back the obtained fitting curve of interface state to the calculation using the device simulator. FIG. 23A shows the calculated $I_d$-$V_g$ characteristics when the drain voltage $V_d$ is 0.1 V and 1.8V and the actually measured $I_d$-$V_g$ characteristics when the drain voltage $V_d$ is 0.1 V and 1.8V. FIG. 23B is a graph in which the drain current $I_d$ is a logarithm in FIG. 23A.

The curve obtained by the calculation substantially matches with the plot of the actually measured values, which suggests that the calculated values and the measured values are highly reproducible. Thus, the above method is quite appropriate as a method for calculating the density of shallow defect states.

[4. Calculation Results of Mobility Curve]

The sDOS in the oxide semiconductor film influences the mobility curve of the field-effect mobility. In particular, in the vicinity of the threshold voltage, the shape of the mobility curve is changed because electrons are trapped by the sDOS. The sDOS in the oxide semiconductor film is represented by the product of $N_{ta}$ and $W_{ta}$ in the formula (12) and the thickness of $t_{OS}$. Then, the mobility curve was calculated on the basis of the formula (12). Table 5 shows parameters used for the calculation.

TABLE 5

| Structure | | | |
|---|---|---|---|
| | L length | 2 | μm |
| | W width | 3 | μm |
| S/D electrode | Material | Cu | — |
| | Work function | 4.4 | eV |
| | Thickness | 110 | μm |
| Directly under S/D and entire Loff region | n+ | 5.00E+18 | cm$^{-3}$ |
| Passivation film | Material | SiON | — |
| | Relative permittivity ε | 3.9 | — |
| | Thickness | 400 | nm |
| | Material | SiN | — |
| | Relative permittivity ε | 7.5 | — |
| | Thickness | 50 | nm |
| Upper gate electrode | Material | W | — |
| | Work function | 5.0 | — |
| | Thickness | 110 | nm |
| Upper GI | Material | SiON | — |
| | Relative permittivity ε | 3.9 | — |
| | Thickness | 150 | nm |
| OS | Composition formula | IGZO(4:2:4.1) | — |
| | Electron affinity | 4.4 | eV |
| | Eg | 3.0 | eV |
| | Relative permittivity ε | 15 | — |
| | Donor density | 6.60E−09 | cm$^{-3}$ |
| | Electron mobility | 15 | cm$^2$/Vs |
| | Hole mobility | 0.01 | cm$^2$/Vs |
| | Nc | 5.00E+18 | cm$^{-3}$ |
| | Nv | 5.00E+18 | cm$^{-3}$ |
| | Thermal conductivity | 0.014 | W/cmK |
| | Thickness | 40 | nm |
| Lower GI | Material | SiON | — |
| | Relative permittivity ε | 3.9 | — |
| | Thickness | 50 | nm |
| | Material | SiN | — |
| | Relative permittivity ε | 7.5 | — |
| | Thickness | 400 | — |
| Lower gate electrode | Material | W | — |
| | Work function | 5.0 | — |
| | Thickness | 110 | nm |

Figure 24:
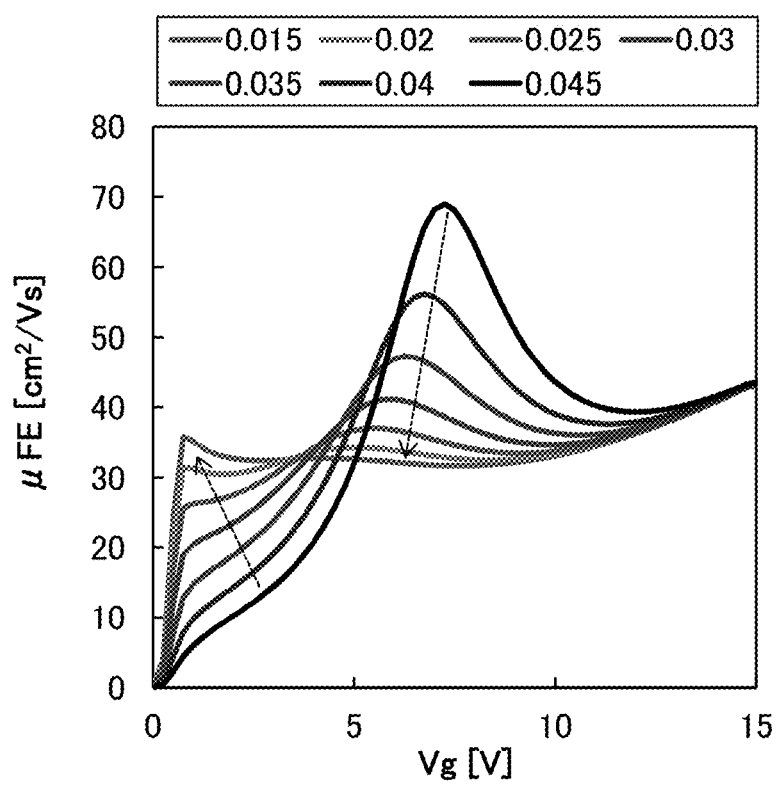
FIG. 24 shows shapes of mobility curves.

In this embodiment, the mobility curve in the case where the value of $W_{ta}$ was varied was calculated. FIG. 24 shows the shapes of the mobility curves with different values of $W_{ta}$. In FIG. 24, $N_{ta}$ is $2.5 \times 10^{19}$ cm$^3$ eV$^1$ and ΔL is 0. In addition, there were seven conditions where $W_{ta}$ was 0.015 eV, 0.02 eV, 0.025 eV, 0.03 eV, 0.035 eV, 0.04 eV, and 0.045 eV.

As shown in FIG. 24, as the value of $W_{ta}$ is smaller, that is, as the energy width of the sDOS is narrower, the mobility curve rises more steeply. In addition, it is found that as the energy width of the sDOS is narrower, the peak value of the mobility curve is shifted from the high $V_g$ side to the low $V_g$ side and reduced.

[5. Influence of Diffusion Current on Mobility Curve]

Next, the influence of diffusion current on a mobility curve is described. The drain current of a FET is represented by the following formula (13).

[Formula 13]

$$j_n = qn\mu_n E + qD_n \nabla_n \quad (13)$$

Figure 25:
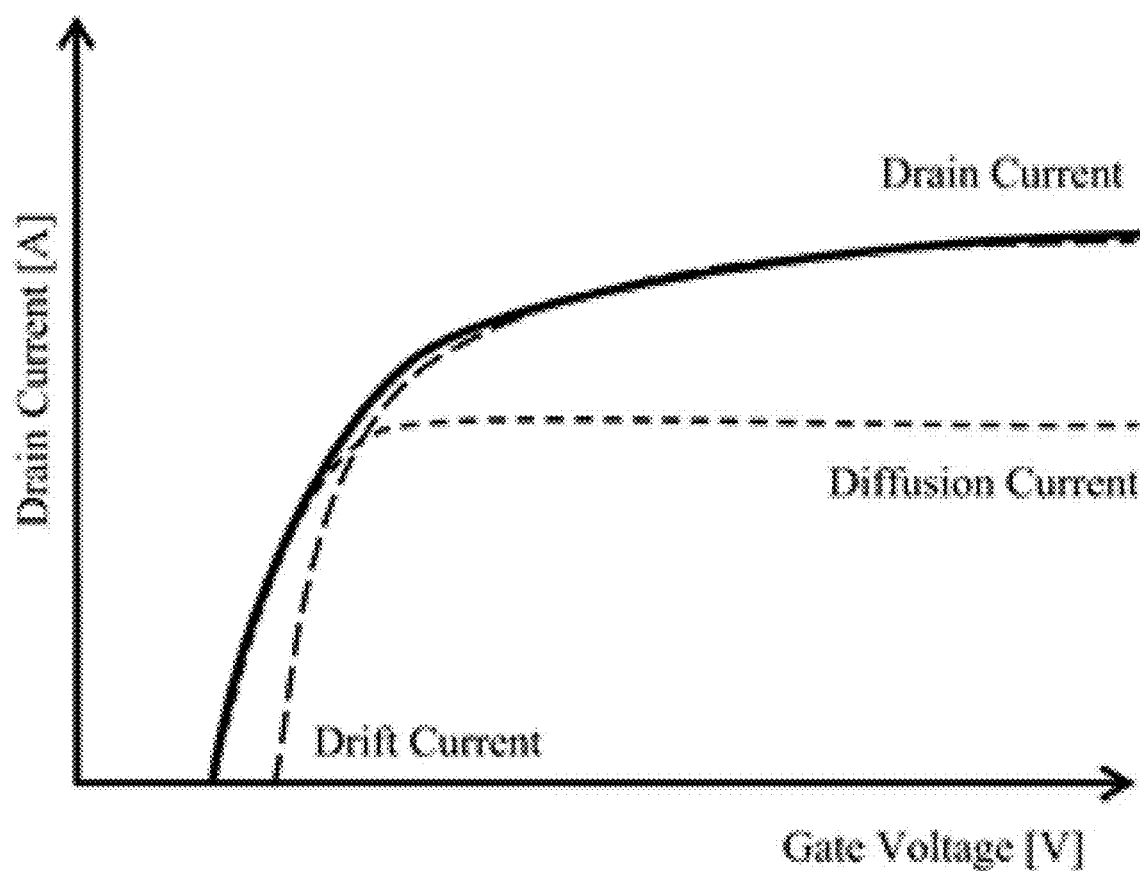
FIG. 25 is a schematic view showing the contribution of drift current and diffusion current in $I_d$-$V_g$ characteristics.

As shown in the formula (13), the drain current is the sum of the component of drift current and the component of diffusion current. Note that in the formula (13), the first term and the second term represent drift current and diffusion current, respectively. FIG. 25 is a schematic view illustrating the contribution of the components of diffusion current and drift current in the $I_d$–$V_g$ characteristics.

The influence of the component of diffusion current on a mobility curve (saturation) was estimated by device simulation. As a FET, a dual-gate FET in which an active layer was an oxide semiconductor, source and drain regions were n$^+$ regions, and a channel region was intrinsic was assumed. Table 6 shows the calculation conditions. Note that trap states (e.g., sDOS) at the interface between a GI and the active layer and in the active layer are not assumed.

TABLE 6

| Channel length | 6 μm |
|---|---|
| Channel width | 50 μm |
| Thickness of OS film | 35 nm |
| Thickness of GI film | 256 nm |
| Thickness of passivation film | 480 nm |
| Mobility of OS | 10 (cm$^2$/Vsec) |
| Donor density in channel portion | 6.6E−9 (1/cm$^3$) |
| Donor density directly under S/D | 1.0E+19 (1/cm$^3$) |
| Drain voltage | 0.1 V, 10 V |

Figure 26:
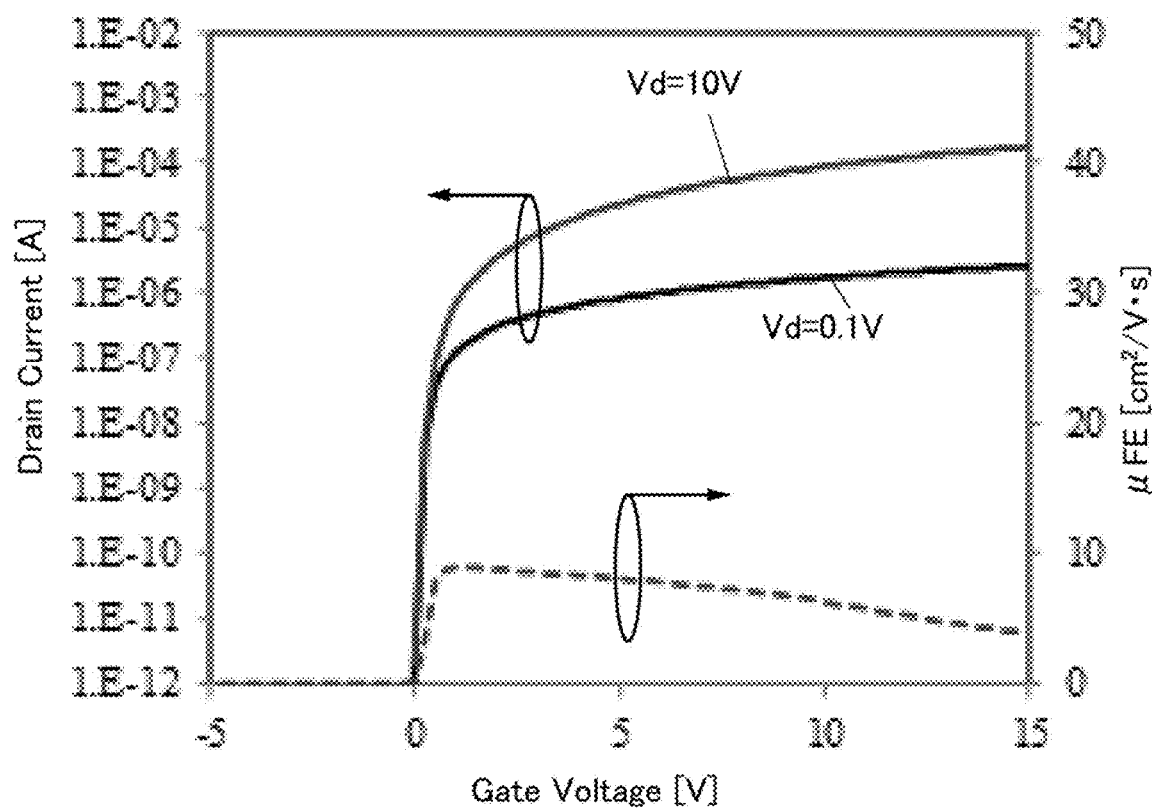
FIG. 26 shows $I_d$-$V_g$ characteristics and mobility curves of BGTC dual-gate FETs each including a CAAC-OS where sDOS is not assumed.

FIG. 26 shows $I_d$–$V_g$ characteristics and a saturation-mobility curve obtained by the simulation. Note that in FIG. 26, the $I_d$–$V_g$ characteristics and the saturation-mobility curve overlap with each other. As shown in FIG. 26, the mobility curve has a peak near $V_{th}$ of the $I_d$–$V_g$ characteristics.

Figure 27:
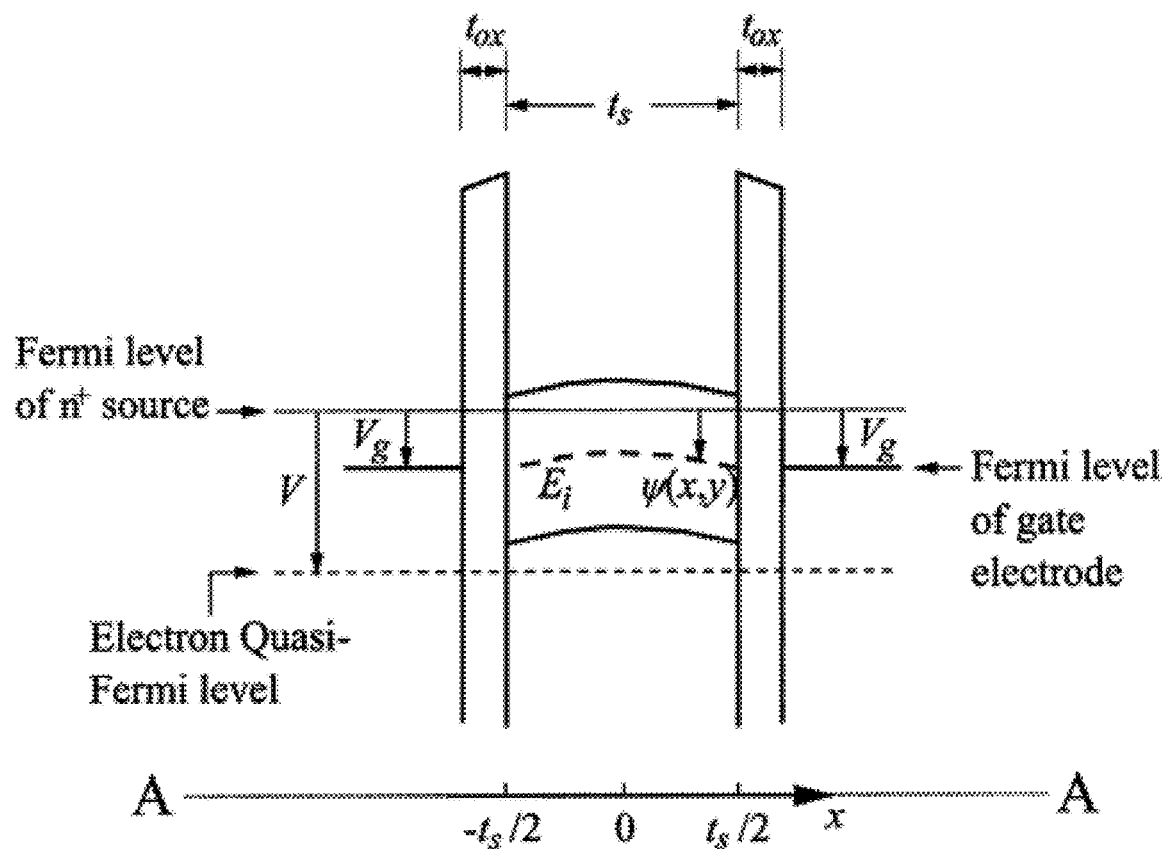
FIG. 27 is a band diagram in the thickness direction.

FIG. 27 is a schematic band diagram of the dual-gate FET in the thickness direction.

As shown in FIG. 27, the band is comparatively flat in the thickness direction of the semiconductor owing to a gate electric field and current thus flows in the whole film of the semiconductor. In a dual-gate FET having such a band, the drain current in a subthreshold region is represented by the following formula (14).

[Formula 14]

$$I_d = \frac{W}{L}\mu k T n_i t_S \exp\left(\frac{-q\Delta\phi}{kT}\right)\left[\exp\left(\frac{qV_g}{kT}\right) - \exp\left(\frac{q(V_{th})}{kT}\right)\right] \quad (14)$$

In the formula (14), k represents the Boltzmann constant, T represents the temperature, $n_i$ represents the intrinsic carrier density, $t_S$ represents the thickness of the active layer, and Δφ represents the difference between the intrinsic Fermi level and the work function of the gate. The formula (14) implies that the diffusion current is proportional to the difference between the diffusion current density at the end portion of the source region and the diffusion current density at the end portion of the drain region.

By substituting the formula (14) into the formula defining the saturation mobility, a formula (15) can be obtained.

[Formula 15]

$$\mu_{FE}^{sat} \equiv \left(\frac{d\sqrt{I_d}}{dV_g}\right)^2 \frac{2L}{C_{OX}W} = \mu \frac{q^2 n_i t_S \exp(-q\Delta\phi/kT)}{C_{OX}kT} \frac{\exp(qV_g/kT)}{1 - \exp(q(V_{th} - V_g)/kT)} \quad (15)$$

According to the formula (15), the saturation-mobility curve has a peak near $V_{th}$. That is, it is probable that the peak near $V_{th}$ of the saturation-mobility curve, which is observed in the ideal simulation where trap states such as sDOS are not assumed, is caused by the diffusion current flowing in the whole active layer.

Figure 28:
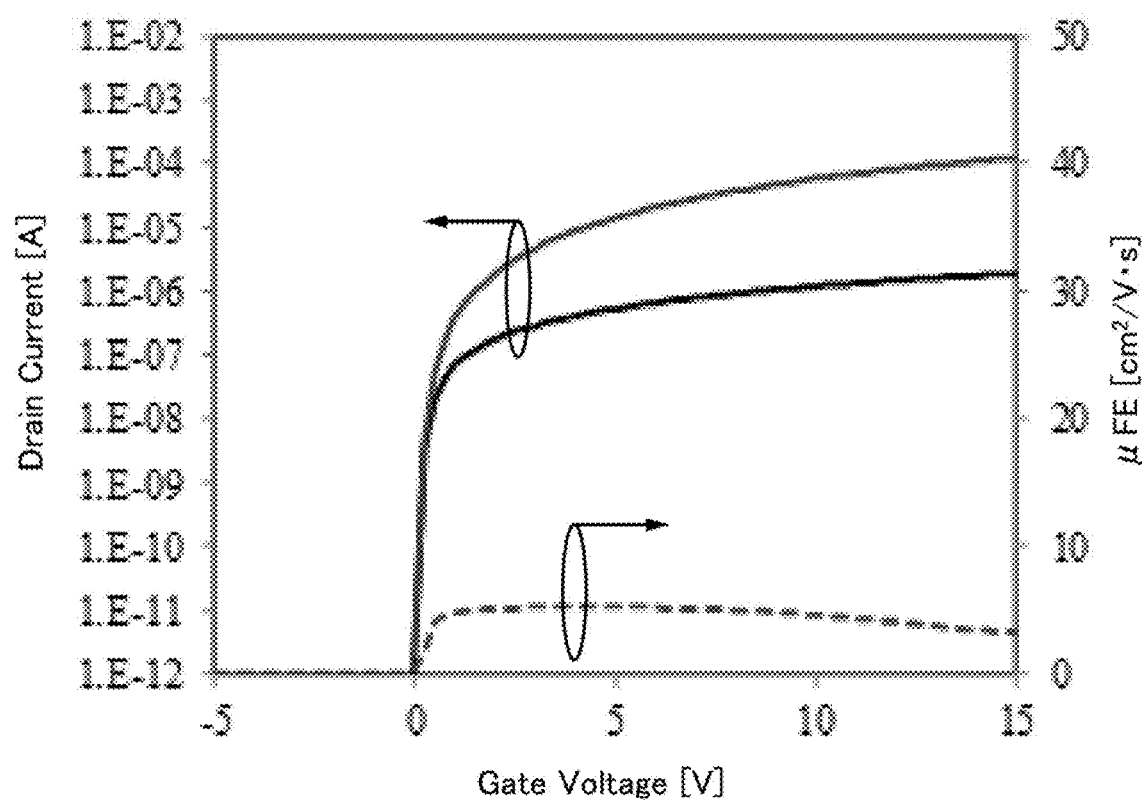
FIG. 28 shows $I_d$-$V_g$ characteristics and mobility curves of BGTC dual-gate FETs each including a CAAC-OS where sDOS is assumed.

However, in an actual mobility curve of an IGZO-FET, such a sharp peak near $V_{th}$ is not observed. When shallow electron trap states (i.e., sDOS) are assumed to exist in the OS film or at the interface between the OS film and the gate insulating film, the mobility curve can be made close to the shape of a measured mobility curve. FIG. 28 shows the device simulation results where sDOS is assumed in the OS film.

Figure 29:
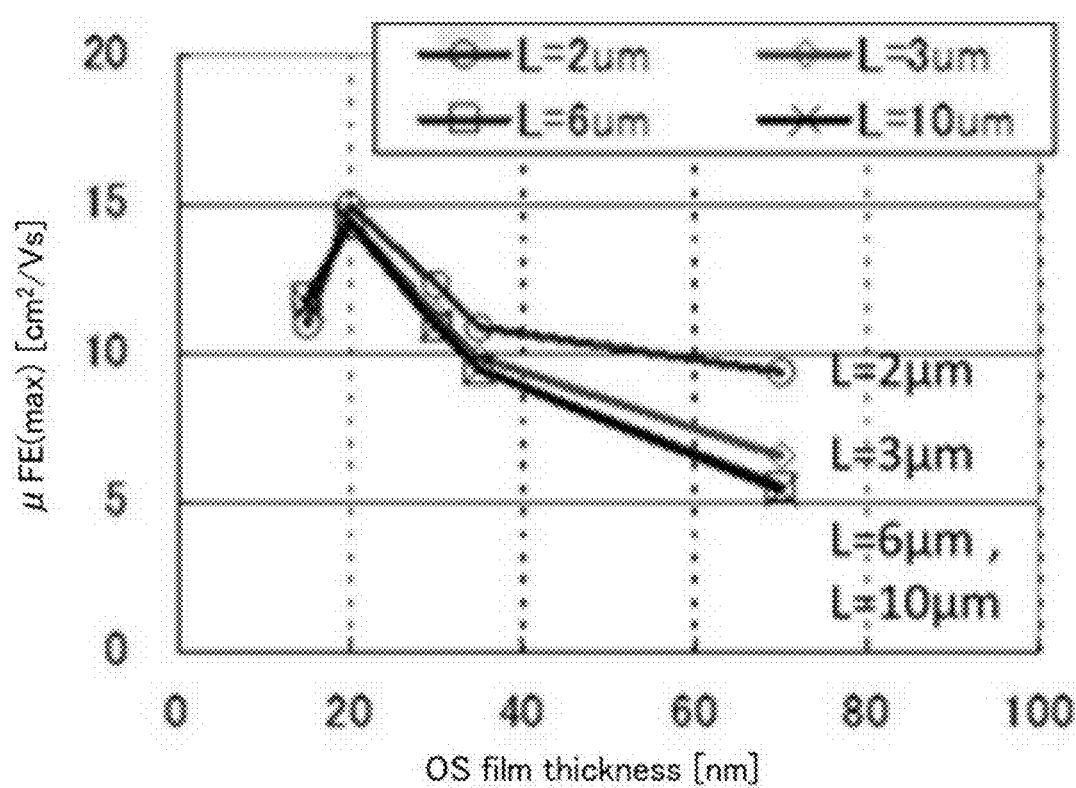
FIG. 29 shows the dependence of field-effect mobility (maximum) on an IGZO film thickness.

FIG. 28 suggests that the mobility curve is influenced by sDOS in the OS film. The amount of sDOS in the OS film increases with an increase in OS film thickness. Therefore, the field-effect mobility decreases with an increase in OS film thickness. FIG. 29 shows the relation between the field-effect mobility (maximum) and the OS film thickness of an FET.

In FIG. 29, the vertical axis represents the field-effect mobility (maximum) and the horizontal axis represents the OS film thickness. Furthermore, in FIG. 29, the results of transistors of four kinds differing in channel length L (L=2 µm, 3 µm, 6 µm, and 10 µm) overlap with each other. As shown in FIG. 29, the field-effect mobility decreases with an increase in OS film thickness.

Figure 30A:
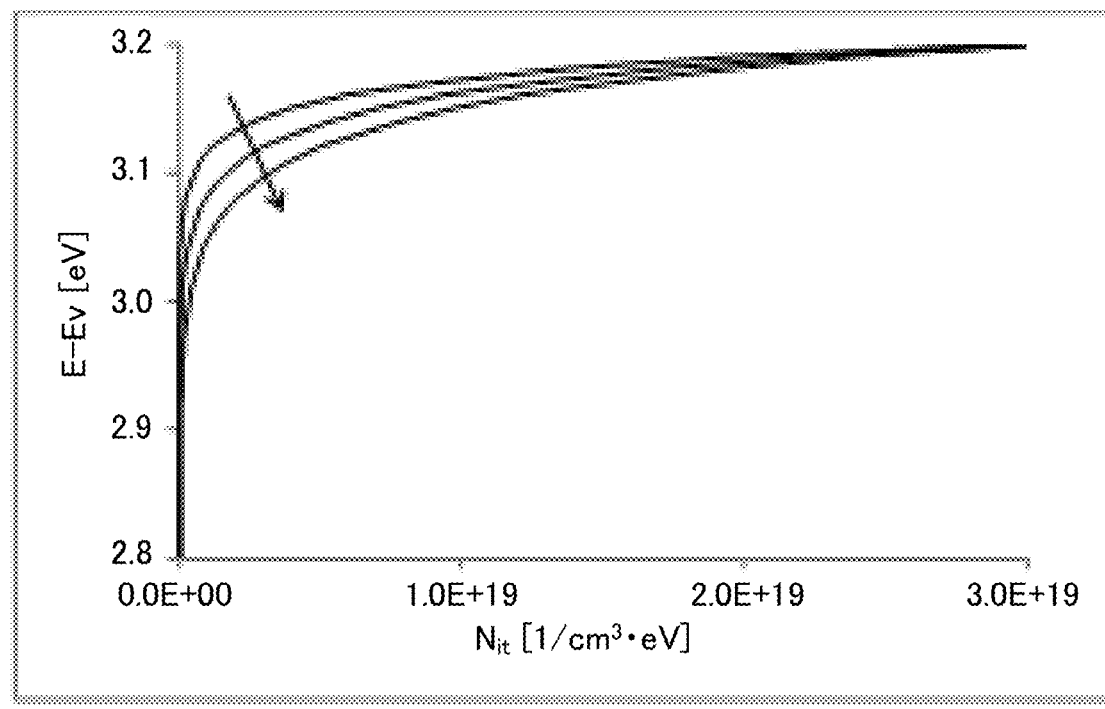
FIGS. 30A and 30B are graphs illustrating sDOS distribution in IGZO films and shapes of mobility curves.
Figure 30B:
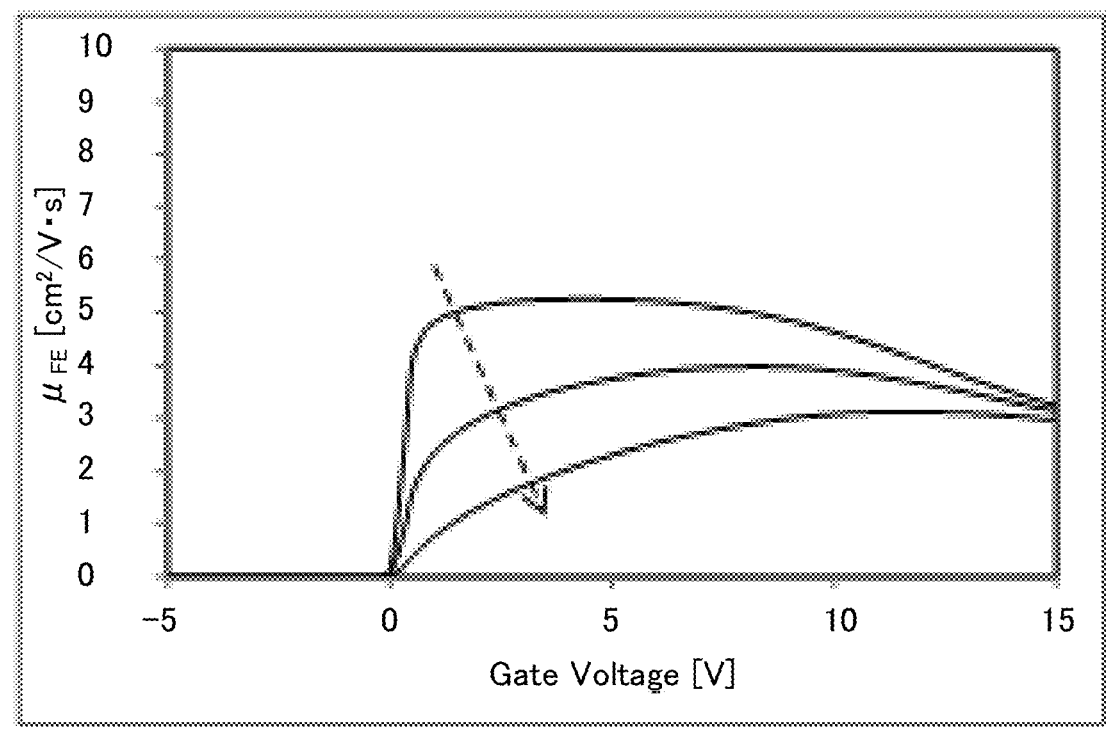

FIGS. 30A and 30B show saturation-mobility curves calculated under the conditions of different distribution of sDOS. FIG. 30A shows the distribution of sDOS in OS films and FIG. 30B shows the shapes of mobility curves. As shown by the arrows in FIGS. 30A and 30B, the shape of saturation-mobility curve changes with the amount of the energy levels of sDOS or the distribution of sDOS.

[6. Influence of Parasitic Resistances of Source Region and Drain Region]

Next, the influence of parasitic resistances of a source region and a drain region (also referred to as SD regions) of a TGSA OS-FET is described. A TGSA OS-FET includes, on both sides of a channel region, a source region and a drain region formed by reducing the resistance of an active layer. There is a case where the source region and the drain region behave as parasitic resistances in FET characteristics. The TGSA OS-FET in this case is represented by a circuit diagram as in FIG. 31A.

Figure 31A:
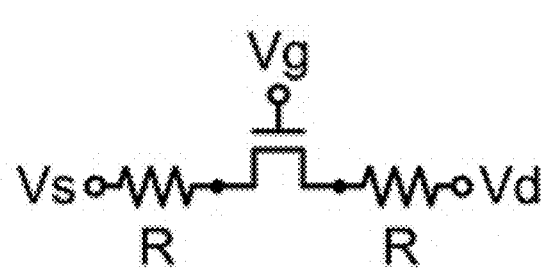
FIG. 31A is a circuit diagram illustrating resistances and a FET.

In the case of the circuit diagram shown in FIG. 31A, $V_d$ is divided into voltages applied to two parasitic resistances and a voltage applied to the FET as shown in a formula (16).

[Formula 16]

$$V_d = RI_d + V_{FET} + RI_d \tag{16}$$

In the formula (16), R represents parasitic resistance and $V_{FET}$ represents the potential difference applied to both ends of the channel of the FET. In a GCA formula, a region higher than or equal to $V_g$ that satisfies $V_{FET}=V_g-V_{th}$ is considered as a linear region. Therefore, in the case where a parasitic resistance exists as shown in FIG. 31A, $V_g$ at which the linear region is formed, i.e., $V_g$ that satisfies $V_{FET}=V_g-V_{th}$, is lower than that in the case where no parasitic resistance exists.

Figure 31B:
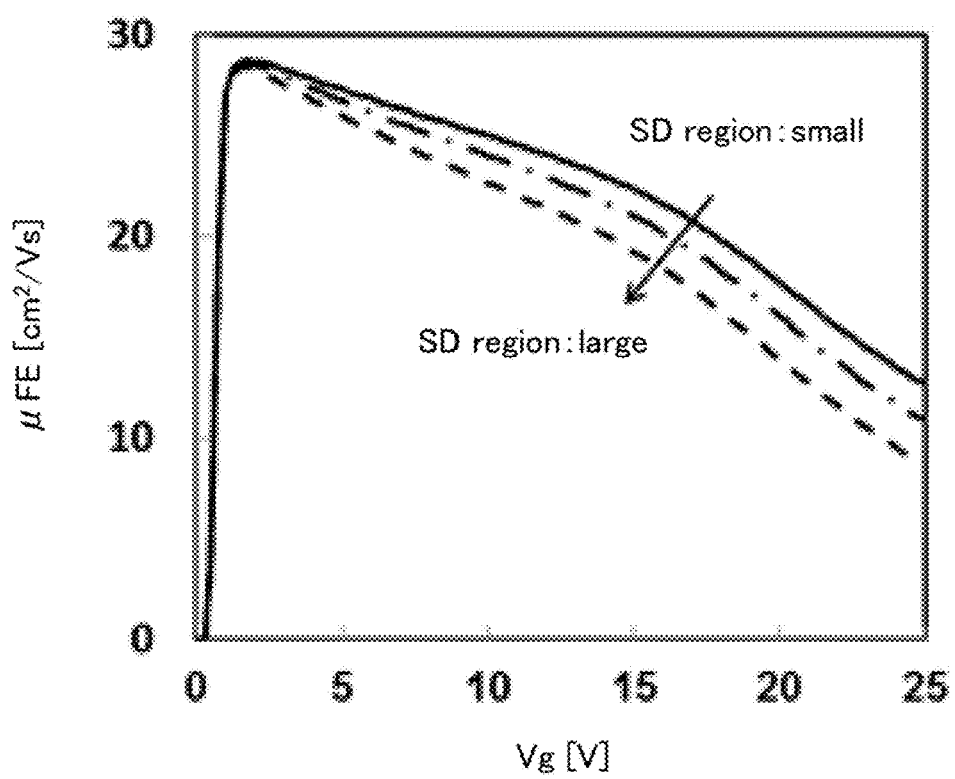
FIG. 31B is a graph illustrating the relation between field-effect mobility and source and drain regions formed by reducing the resistance of a channel region.

As shown in FIG. 15, the saturation mobility decreases after entering the linear region. In light of this, it is assumed that $V_g$ at the lower limit of the linear region is decreased with an increase in the resistance value of a parasitic resistance. Hence, the relation between the field-effect mobility and $V_g$ was obtained by device simulation in which the sizes of the source region and the drain region were changed. FIG. 31B shows the device simulation results. As shown in FIG. 31B, by increasing the sizes of the source region and the drain region formed by reducing the resistance of the active layer to increase parasitic resistances, $V_g$ at the lower limit of the linear region, i.e., $V_g$ at which the saturation-mobility curve starts decreasing, is lowered.

[7. Influence of Self-Generated Heat]

Next, the influence of self-generated heat of a FET is described. A FET generates heat when current flows in the FET. The amount of generated heat increases with an increase in the amount of current, which is clear from Joule's law. Furthermore, the amount of current in a FET increases with an increase in $V_g$, and self-generated heat of a FET increases with an increase in $V_g$ according to Joule's law.

According to the above-described GCA, drain current in a saturation region is proportional to $(V_g-V_{th})^2$ as shown in Formula (2). Therefore, when the square roots of drain current are plotted, a linear shape is obtained in the saturation region. The slope of the linear portion is calculated by differentiation, and the calculation results are normalized by a channel length, a channel width, and a gate capacitance to convert them into mobility; thus, the saturation mobility is obtained.

An obvious variable of temperature is not included in the GCA formula, so it appears that the saturation mobility does not depend on temperature. However, in an OS-FET, some of parameters included in the GCA have temperature dependence. Therefore, the shape of the saturation-mobility curve is changed by the influence of self-generated heat of the FET.

Figure 32:
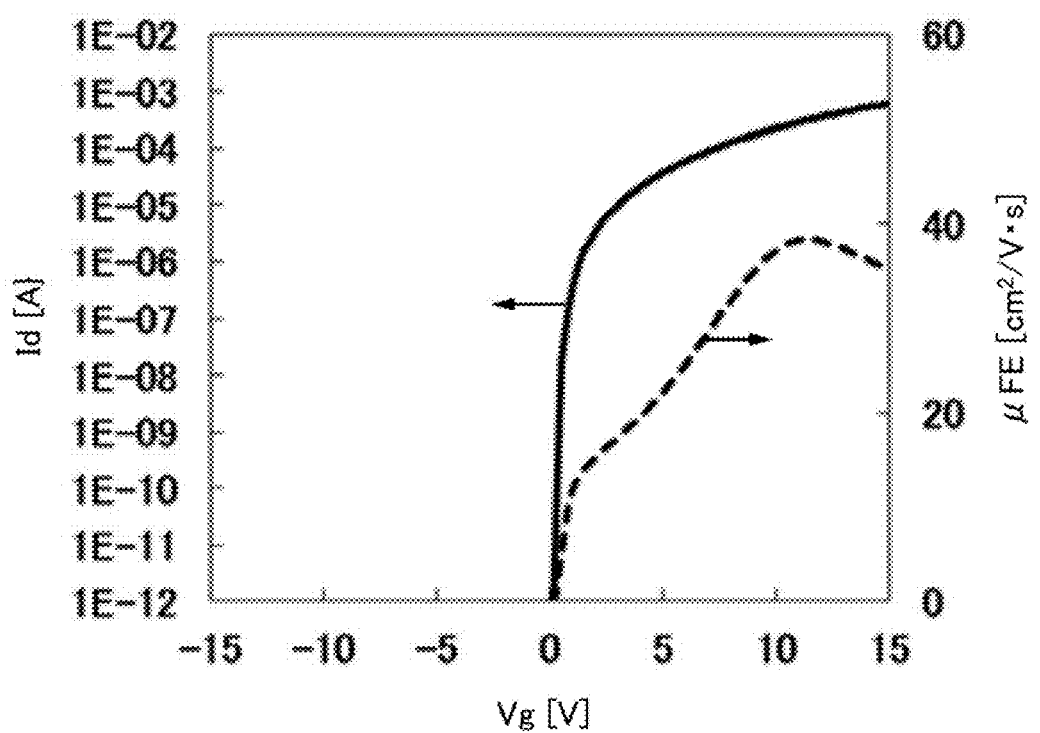
FIG. 32 is a graph illustrating saturation mobility when mobility depends on temperature.

The first of the parameters that change depending on temperature is the electron mobility of an IGZO. The electron mobility of an IGZO is increased with a temperature increase. That is, the electron mobility of an IGZO is increased if the amount of current flowing in a FET is increased and the temperature of the FET is increased. Therefore, under the conditions where $V_g$ or $V_d$ is high, the temperature of a FET is high due to self-generated heat, so that the electron mobility is increased and the drain current is increased. Consequently, the slope of the $\sqrt{I_d}-V_g$ characteristics in the saturation region is increased, and the saturation mobility is increased. The influence of the self-generated heat of a FET is examined by device simulation. FIG. 32 shows the device simulation results. In FIG. 32, the calculation results of the $I_d-V_g$ characteristics and the saturation-mobility curve of a TGSA CAAC-OS-FET are shown.

The influence of the self-generated heat of a FET is noticeable particularly in a TGSA FET. This is because a TGSA FET is less likely to release heat than a BGTC FET.

A BGTC FET has an excellent heat dissipation property because a source electrode and a drain electrode are positioned near a channel region where heat is generated in a BGTC FET. In contrast, a TGSA FET has a low heat dissipation property because an electrode serving as a heat dissipation path is apart from a channel region in a TGSA FET. Thus, the temperature of a TGSA FET is easily increased by self-generated heat, and the mobility curve is easily influenced by the self-generated heat.

The second of the parameters that change depending on temperature is the number of carrier electrons. The number of electrons per unit area that are accumulated in a gate capacitance is represented by $C_{OX}(V_g-V_{th})$. In the case where electron traps exist, some of the accumulated electrons are trapped by the electron traps, and carrier electrons are decreased accordingly. As described above, an OS includes electron traps, sDOS; thus, some of electrons accumulated in the gate capacitance do not serve as carriers.

The sDOS level is lower than the lower end of the conduction band; therefore, the proportion of carrier electrons to trapped electrons is increased with a temperature increase when Boltzmann distribution is taken into consideration. Since the temperature of a FET is increased with a $V_g$ increase as described above, the proportion of carrier electrons is increased with a $V_g$ increase. Accordingly, the saturation mobility is also increased with a $V_g$ increase.

Figure 33:
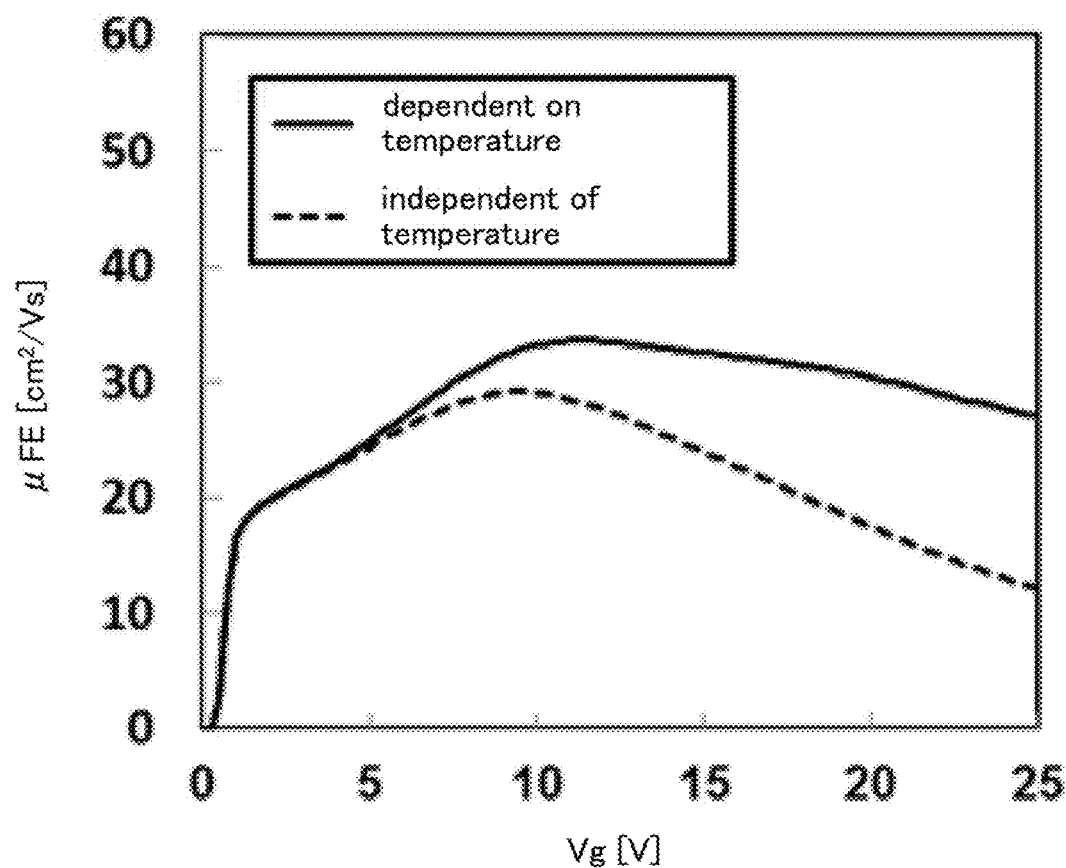
FIG. 33 shows saturation-mobility curves of FETs.

The temperature dependence of the saturation mobility of a FET was calculated by device simulation on the assumption that sDOS is taken into consideration and the electron mobility of a CAAC-OS does not depend on temperature. The calculation results are shown in FIG. 33. As shown in FIG. 33, the mobility increases with a $V_g$ increase more clearly in the case where the electron mobility is dependent on temperature than in the case where the electron mobility is independent of temperature.

[8. Influence of Reduction in Effective Channel Length]

Figure 34:
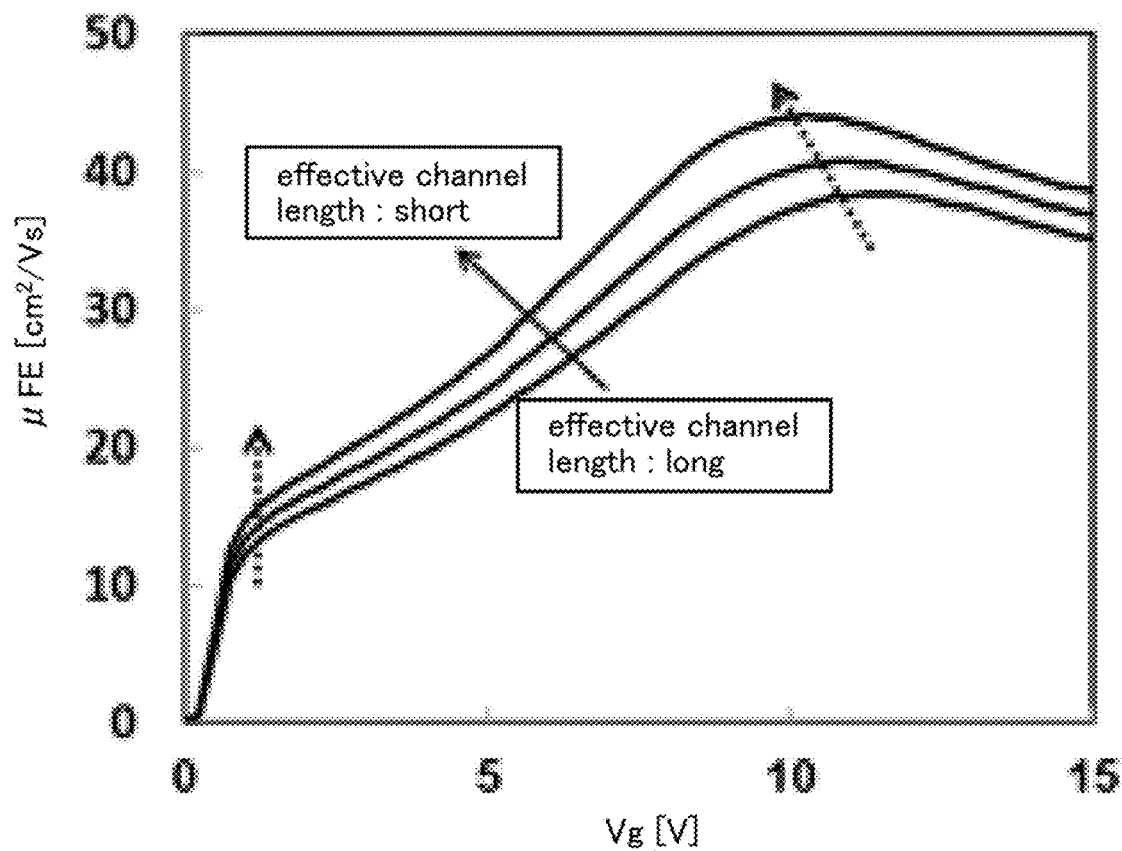
FIG. 34 is a graph illustrating the influence of a reduction in effective channel length on the shape of a mobility curve.

The channel length of a CAAC-OS FET corresponds to the distance between a source electrode and a drain electrode in a BGTC structure and the length of a gate electrode in a TGSA structure. In actual FET characteristics, however, an effective channel length is the distance between n$^+$ regions of a source region and a drain region. In accordance with process conditions, the boundary between an n$^+$ region and a channel region is not aligned with a gate electrode end; in some cases, the n$^+$ region extends beyond the gate electrode end in a channel direction. In this case, the field-effect mobility is increased apparently. FIG. 34 shows the relation between field-effect mobility and $V_g$. In FIG. 34, the vertical axis represents field-effect mobility and the horizontal axis represents $V_g$.

Figures 35A, 35B, 35C:
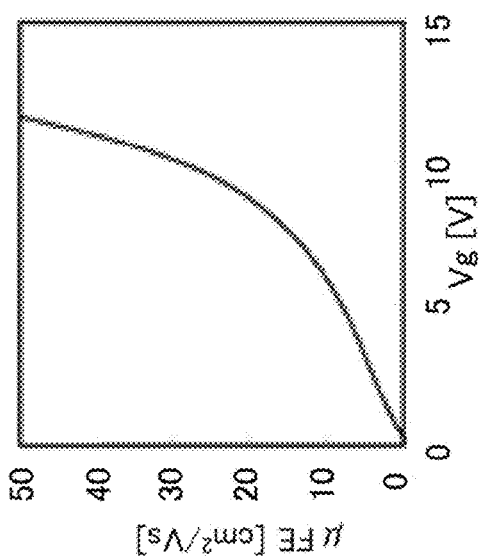
FIGS. 35A to 35C show mobility curves obtained by device simulation under different conditions.

In the case where the description so far is assumed, three kinds of shapes of saturation-mobility curves of TGSA OS-FETs are obtained. FIGS. 35A to 35C show calculation results of the saturation mobility of the TGSA OS-FETs. FIG. 35A corresponds to Sample S1A, FIG. 35B corresponds to Sample S1B, and FIG. 35C corresponds to Sample S1C.

As shown in FIGS. 35A to 35C, the shape of the saturation-mobility curve is changed variously, in particular, by setting a parameter of sDOS to a proper value. In the case of a semiconductor device corresponding to Sample S1A, the saturation-mobility curve has a shape like that shown in FIG. 35A, which suggests that a sDOS value is small. Similarly, in the case of a semiconductor device corresponding to Sample S1B, the saturation-mobility curve has a shape like that shown in FIG. 35B, which suggests that a sDOS value is small. In the case of a semiconductor device corresponding to Sample S1C, the saturation-mobility curve has a shape like that shown in FIG. 35C.

An sDOS value of the oxide semiconductor film of Sample S1A was measured using the $I_d$-$V_g$ characteristics of the transistor that are shown in FIG. 1. In the measurement results, sDOS of the oxide semiconductor film of Sample S1A was $6.4 \times 10^{-12}$ cm$^2$. Thus, the oxide semiconductor film of one embodiment of the present invention includes a region with a small sDOS value, i.e., a region where density of shallow defect states is lower than $1.0 \times 10^{-12}$ cm$^2$.

An sDOS value of the oxide semiconductor film of Sample S1B was measured using the $I_d$-$V_g$ characteristics of the transistor that are shown in FIG. 2. In the measurement results, sDOS of the oxide semiconductor film of Sample S1B was $1.7 \times 10^{-12}$ cm$^2$. Thus, the oxide semiconductor film of one embodiment of the present invention includes a region with a small sDOS value, i.e., a region where density of shallow defect states is higher than or equal to $1.0 \times 10^{-12}$ cm$^2$ and lower than $2.0 \times 10^{-12}$ cm$^2$.

An sDOS value of the oxide semiconductor film of Sample S1C was measured using the $I_d$-$V_g$ characteristics of the transistor that are shown in FIG. 3. In the measurement results, sDOS of the oxide semiconductor film of Sample S1C was $2.4 \times 10^{-12}$ cm$^2$. Thus, the oxide semiconductor film of one embodiment of the present invention includes a region with a small sDOS value, i.e., a region where density of shallow defect states is higher than or equal to $2.0 \times 10^{-12}$ cm$^2$ and lower than $3.0 \times 10^{-12}$ cm$^2$.

<1-13. Components of Transistor>

Next, details of the components of the transistor in FIGS. 17A to 17C will be described.

[Substrate]

A material having heat resistance high enough to withstand heat treatment in the manufacturing process can be used for the substrate 102.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass preferably has a thickness greater than or equal to 0.2 mm and less than or equal to 0.7 mm, for example. The non-alkali glass may be polished to obtain the above thickness.

Using the non-alkali glass, a large-sized glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 102, a single-crystal semiconductor substrate or a polycrystalline semiconductor substrate made of silicon or silicon carbide, a compound semiconductor substrate made of silicon germanium or the like, an SOI substrate, or the like may be used.

Alternatively, an inorganic material such as metal may be used as the substrate 102. Examples of the inorganic material such as a metal include stainless steel or aluminum.

Alternatively, for the substrate 102, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

Alternatively, for the substrate 102, a composite material of a combination of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

Note that the substrate 102 may be formed using one or more of an insulating film, a semiconductor film, and a conductive film as long as it can at least support a film or a layer formed thereover and thereunder.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108*i* of the oxide semiconductor film 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Oxide Semiconductor Film]

As the oxide semiconductor film 108, the above-described composite oxide semiconductor or C/IGZO is suitably used.

[Second Insulating Film]

The insulating film 110 has a function of supplying oxygen to the oxide semiconductor film 108, particularly to the channel region 108*i*. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide ($NO_2$) might be observed in the insulating film 110. The signal is split into three signals according to nuclear spin of N; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density due to nitrogen dioxide ($NO_2$) is higher than or equal to $1\times10^{17}$ spins/cm$^3$ and lower than $1\times10^{18}$ spins/cm$^3$ as the insulating film 110, for example.

Note that a nitrogen oxide ($NO_x$) such as a nitrogen dioxide ($NO_2$) forms a level in the insulating film 110. The level is positioned in the energy gap of the oxide semiconductor film 108. Thus, when nitrogen oxide ($NO_x$) is diffused to the interface between the insulating film 110 and the oxide semiconductor film 108, an electron might be trapped by the level on the insulating film 110 side. As a result, the trapped electron remains in the vicinity of the interface between the insulating film 110 and the oxide semiconductor film 108; thus, the threshold voltage of the transistor is shifted in the positive direction. Accordingly, the use of a film with a low nitrogen oxide content as the insulating film 110 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount of ammonia released by heat treatment in a range from 50° C. to 650° C. or a range from 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 110 is analyzed by SIMS, the nitrogen concentration in the film is preferably lower than or equal to $6\times10^{20}$ atoms/cm$^3$.

The insulating film 110 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), or hafnium oxide. The use of such a high-k material enables a reduction in gate leakage current of a transistor.

[Third Insulating Film]

The insulating film 116 contains nitrogen or hydrogen. The insulating film 116 may contain fluorine. The insulating film 116 is a nitride insulating film, for example. The nitride insulating film can be formed using silicon nitride, silicon nitride oxide, silicon oxynitride, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108*s* and the drain region 108*d* of the oxide semiconductor film 108. Thus, the concentration of an impurity (nitrogen or hydrogen) in the source region 108*s* and the drain region 108*d* in contact with the insulating film 116 is increased, leading to an increase in the carrier density of the source region 108s and the drain region 108d.

[Fourth Insulating Film]

As the insulating film 118, an oxide insulating film can be used. Alternatively, a stack including an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Fifth Insulating Film]

The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

[Conductive Film]

The conductive films 106, 112, 120a, and 120b can be formed by a sputtering method, a vacuum evaporation method, a pulsed laser deposition (PLD) method, a thermal CVD method, or the like. Furthermore, as the conductive films 106, 112, 120a, and 120b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, or a three-layer structure in which a titanium film, a copper film, and a titanium film are stacked in this order may be used. In particular, a conductive film containing a copper element is preferably used because the resistance can be reduced. As an example of the conductive film containing a copper element, an alloy film containing copper and manganese is given. The alloy film is preferable because it can be processed by a wet etching method.

A tantalum nitride film is preferably used as each of the conductive films 106, 112, 120a, and 120b. Such a tantalum nitride film has conductivity and a high barrier property against copper or hydrogen. The tantalum nitride film can be used most preferably as a metal film in contact with the oxide semiconductor film 108 or a metal film in the vicinity of the oxide semiconductor film 108 because the amount of hydrogen released from the tantalum nitride film is small.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 112, 120a, and 120b can be formed by electroless plating. As a material formed by the electroless plating, one or more of Cu, Ni, Al, Au, Sn, Co, Ag, and Pd can be used. Particularly, Cu or Ag is preferable because the resistance of the conductive film can be low.

In the case where the conductive film is formed by electroless plating, a diffusion prevention film may be formed below the conductive film so as to prevent diffusion of constituent elements of the conductive film into the outside. In addition, a seed layer that enables the conductive film to grow may be formed between the diffusion prevention film and the conductive film. The diffusion prevention film can be formed by, for example, a sputtering method. As the diffusion prevention film, for example, a tantalum nitride film or a titanium nitride film can be used. The seed layer can be formed by an electroless plating method. Alternatively, the seed layer can be formed using a material the same as a material of the conductive film that can be formed by an electroless plating method.

Note that an oxide semiconductor typified by an In—Ga—Zn oxide may be used for the conductive film 112. The oxide semiconductor can have a high carrier density when nitrogen or hydrogen is supplied from the insulating film 116. In other words, the oxide semiconductor functions as an oxide conductor (OC). Accordingly, the oxide semiconductor can be used for a gate electrode.

The conductive film 112 can have, for example, a single-layer structure of an oxide conductor (OC), a single-layer structure of a metal film, or a stacked-layer structure of an oxide conductor (OC) and a metal film.

Note that it is suitable that the conductive film 112 has a single-layer structure of a light-shielding metal film or a stacked-layer structure of an oxide conductor (OC) and a light-shielding metal film because the channel region 108i formed under the conductive film 112 can be shielded from light. In the case where the conductive film 112 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 106, 112, 120a, and 120b can be greater than or equal to 30 nm and less than or equal to 500 nm, or greater than or equal to 100 nm and less than or equal to 400 nm.

At least part of this embodiment can be implemented in combination with any of the other embodiments described in this specification as appropriate.

Embodiment 2

In this embodiment, a transistor in a mode different from that of the transistor in Embodiment 1 is described with reference to FIG. 36A to FIG. 51C.

<2-1. Structure Example 2 of Transistor>

Figure 36A:
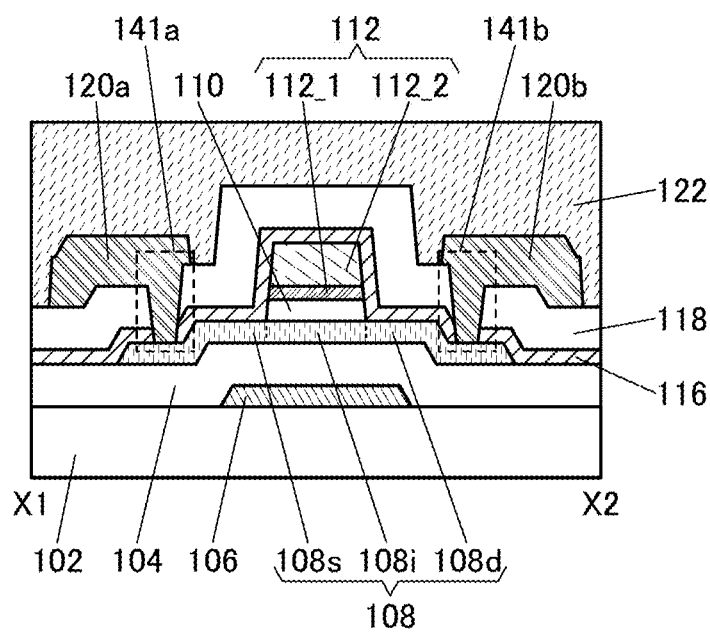
FIGS. 36A and 36B are cross-sectional views illustrating a semiconductor device.
Figure 36B:
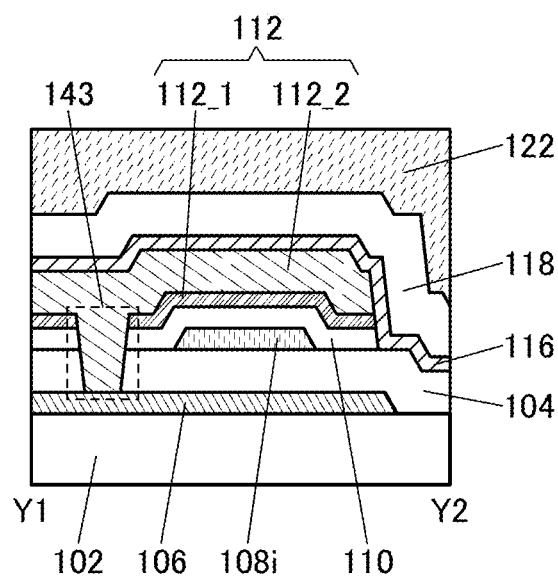
Figure 37A:
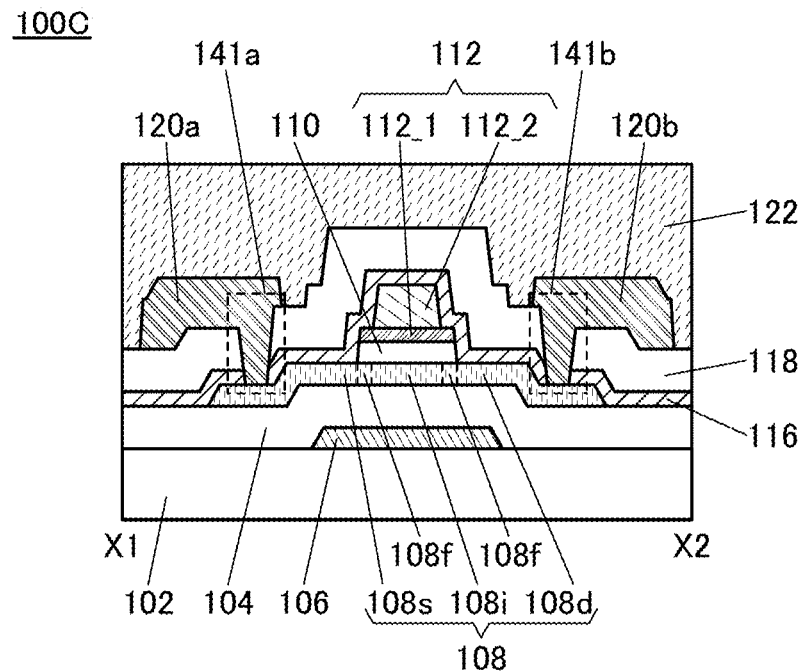
FIGS. 37A and 37B are cross-sectional views illustrating a semiconductor device.
Figure 37B:
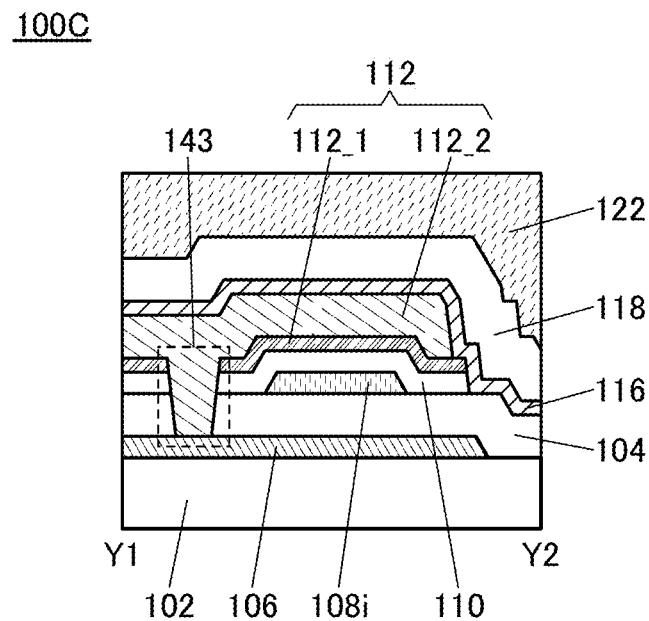
Figure 38A:
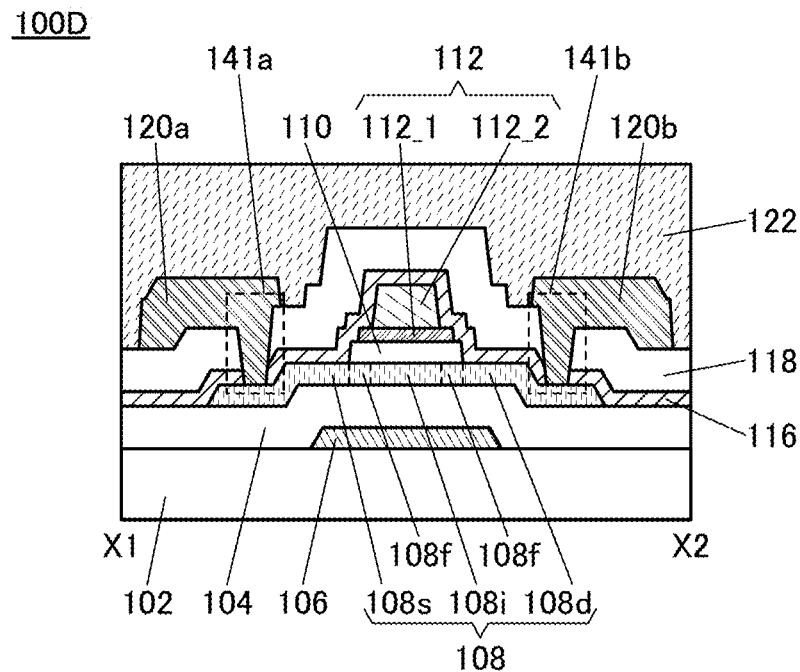
FIGS. 38A and 38B are cross-sectional views illustrating a semiconductor device.
Figure 38B:
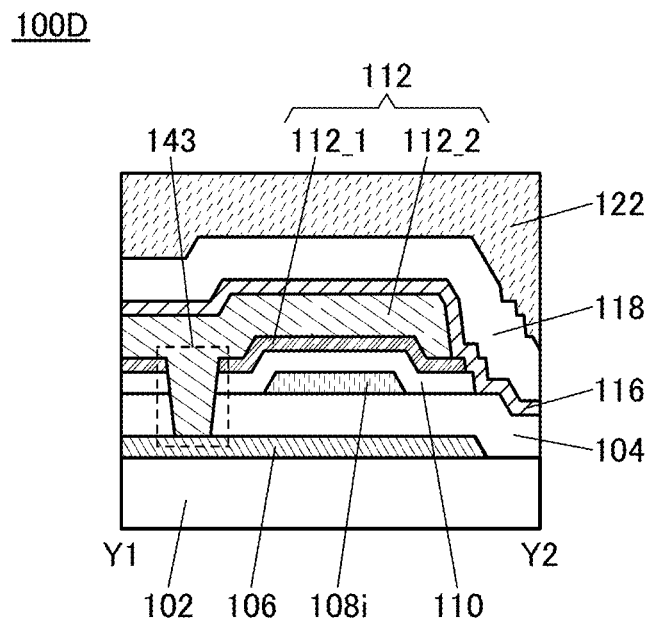

FIGS. 36A and 36B are cross-sectional views of a transistor 100B. FIGS. 37A and 37B are cross-sectional views of a transistor 100C. FIGS. 38A and 38B are cross-sectional views of a transistor 100D. The top views of the transistors 100B, 100C, and 100D are not illustrated because they are similar to the top view of the transistor 100A in FIG. 17A.

The transistor 100B illustrated in FIGS. 36A and 36B is different from the transistor 100A in the layered structure of the conductive film 112, the shape of the conductive film 112, and the shape of the insulating film 110.

The conductive film 112 in the transistor 100B includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide film containing indium and tin, an oxide film containing tungsten and indium, an oxide film containing tungsten, indium, and zinc, an oxide film containing titanium and indium, an oxide film containing titanium, indium, and tin, an oxide film containing indium and zinc, an oxide film containing silicon, indium, and tin, or an oxide film containing indium, gallium, and zinc can be used, for example.

As illustrated in FIG. 36B, the conductive film 112_2 is connected to the conductive film 106 through the opening portion 143. By forming the opening portion 143 after a conductive film to be the conductive film 112_1 is formed, the shape illustrated in FIG. 36B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 100B have a tapered shape. More specifically, the lower end portion of the conductive film 112 is located outward from the upper end portion of the conductive film 112. The lower end portion of the insulating film 110 is located outward from the upper end portion of the insulating film 110. In addition, the lower end portion of the conductive film 112 is formed in substantially the same position as that of the upper end portion of the insulating film 110.

It is suitable that the conductive film 112 and the insulating film 110 of the transistor 100B are formed to have tapered shapes because the coverage with the insulating film 116 can be high as compared with the case of the transistor 100A in which the conductive film 112 and the insulating film 110 have rectangular shapes.

The other components of the transistor 100B are similar to those of the transistor 100A described above and have similar effects.

The transistor 100C illustrated in FIGS. 37A and 37B is different from the transistor 100A in the layered structure of the conductive film 112, the shape of the conductive film 112, and the shape of the insulating film 110.

The conductive film 112 in the transistor 100C includes the conductive film 112_1 over the insulating film 110 and the conductive film 112_2 over the conductive film 112_1. A lower end portion of the conductive film 112_1 is located outward from an upper end portion of the conductive film 112_2. For example, the conductive film 112_1, the conductive film 112_2, and the insulating film 110 are processed with one mask, the conductive film 112_2 is processed by a wet etching method, and the conductive film 112_1 and the insulating film 110 are processed by a dry etching method, whereby the above-described structure can be obtained.

With the structure of the transistor 100C, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 112 functioning as a gate electrode. In the case where the regions 108f are high-resistance regions, the regions 108f function as offset regions. To suppress a decrease in the on-state current of the transistor 100C, the regions 108f functioning as offset regions may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the regions 108f serve as LDD regions, for example, the regions 108f are formed by supplying one or more of nitrogen, hydrogen, and fluorine from the insulating film 116 to the regions 108f or by adding an impurity element from above the conductive film 112_1 using the insulating film 110 and the conductive film 112_1 as a mask so that the impurity element is added to the oxide semiconductor film 108 through the conductive film 112_1 and the insulating film 110.

As illustrated in FIG. 37B, the conductive film 112_2 is connected to the conductive film 106 through the opening portion 143.

The other components of the transistor 100C are similar to those of the transistor 100A described above and have similar effects.

The transistor 100D illustrated in FIGS. 38A and 38B is different from the transistor 100A in the layered structure of the conductive film 112, the shape of the conductive film 112, and the shape of the insulating film 110.

The conductive film 112 in the transistor 100D includes the conductive film 112_1 over the insulating film 110 and the conductive film 112_2 over the conductive film 112_1. A lower end portion of the conductive film 112_1 is located outward from a lower end portion of the conductive film 112_2. Furthermore, a lower end portion of the insulating film 110 is located outward from the lower end portion of the conductive film 112_1. For example, the conductive film 112_1, the conductive film 1122, and the insulating film 110 are processed with one mask, the conductive film 112_2 and the conductive film 112_1 are processed by a wet etching method, and the insulating film 110 is processed by a dry etching method, whereby the above-described structure can be obtained.

As in the transistor 100C, the regions 108*f* are formed in the oxide semiconductor film 108 in the transistor 100D, in some cases. The regions 108*f* are formed between the channel region 108*i* and the source region 108*s* and between the channel region 108*i* and the drain region 108*d*.

As illustrated in FIG. 38B, the conductive film 112_2 is connected to the conductive film 106 through the opening portion 143.

The other components of the transistor 100D are similar to those of the transistor 100A described above and have similar effects.

<2-2. Structure Example 3 of Transistor>

Figure 39A:
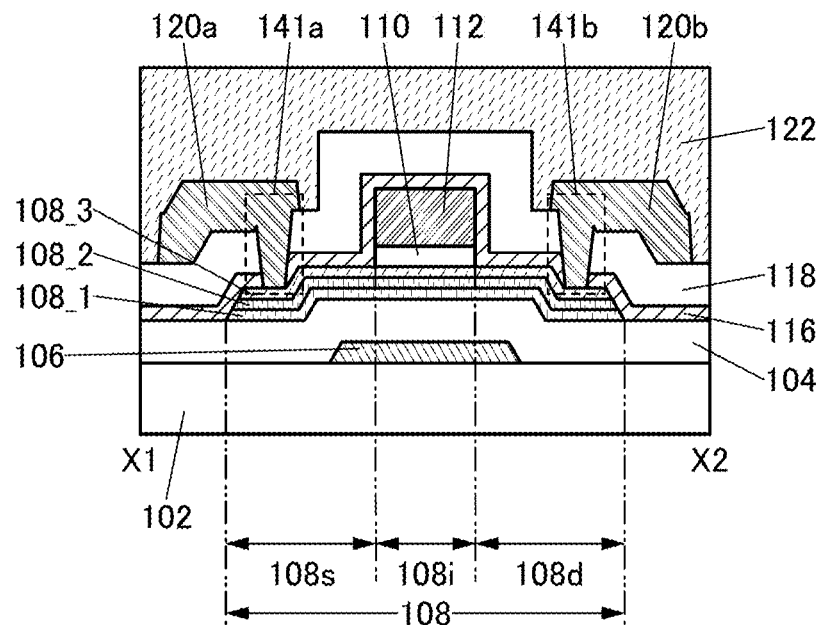
FIGS. 39A and 39B are cross-sectional views illustrating a semiconductor device.
Figure 39B:
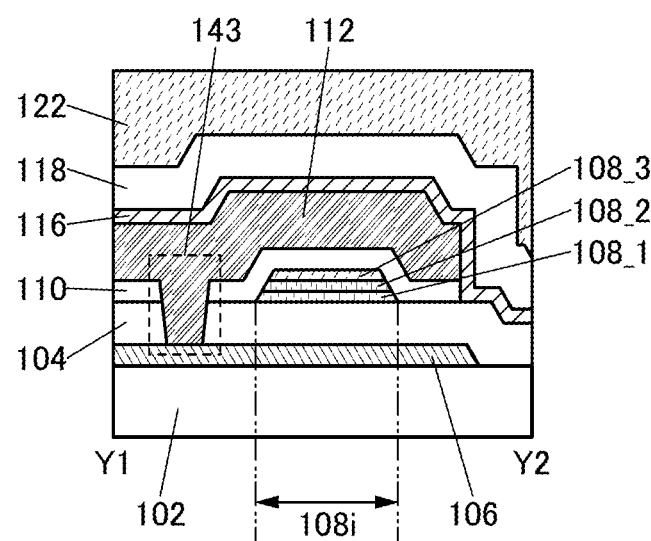
Figure 40A:
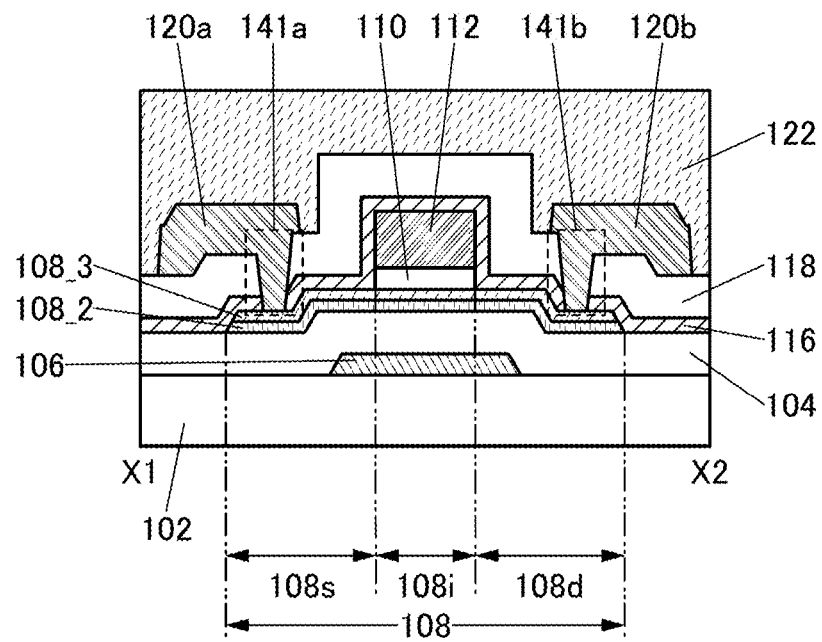
FIGS. 40A and 40B are cross-sectional views illustrating a semiconductor device.
Figure 40B:
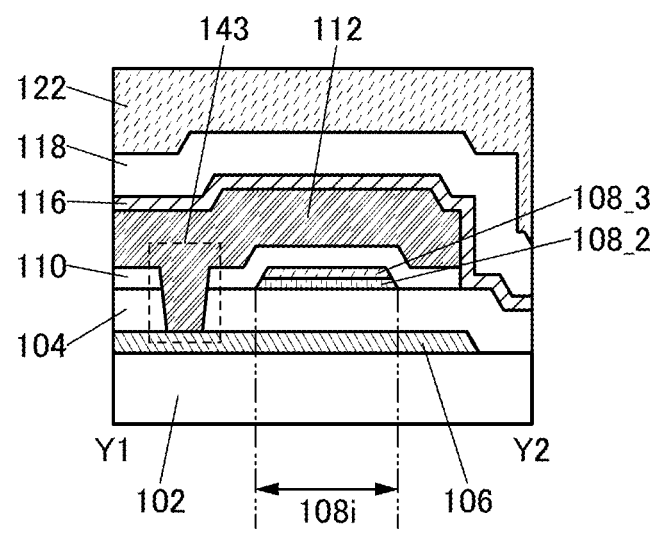
Figure 41A:
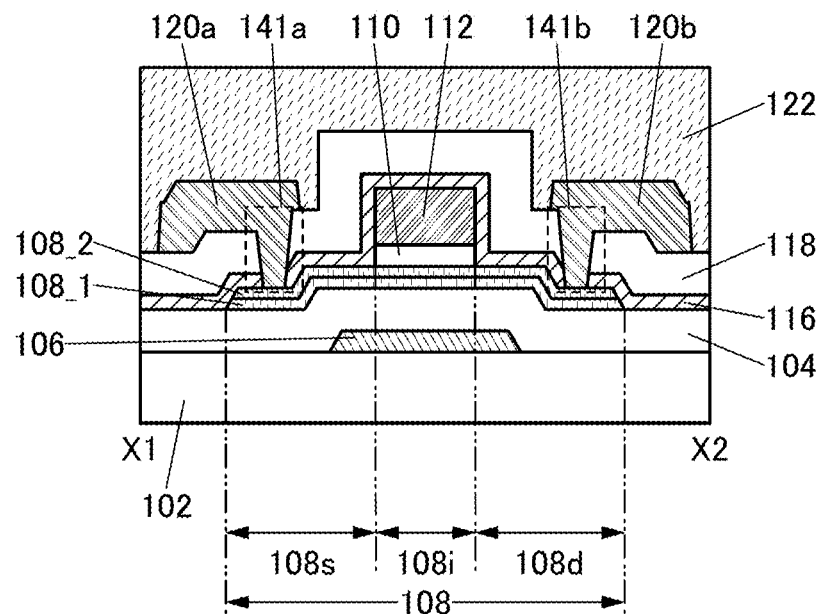
FIGS. 41A and 41B are cross-sectional views illustrating a semiconductor device.
Figure 41B:
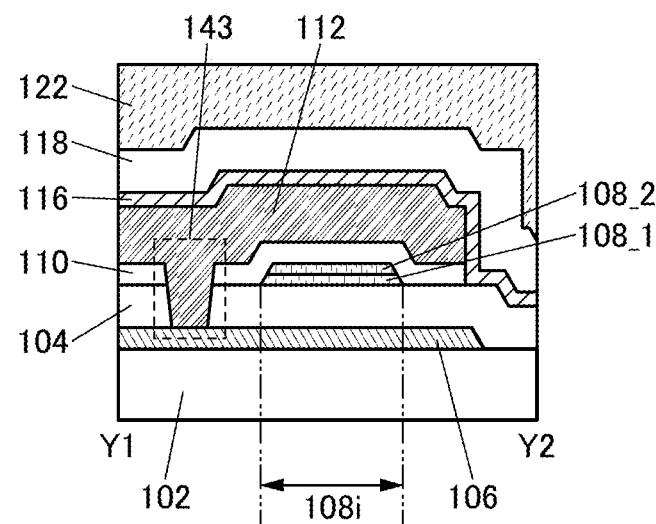
Figure 42A:
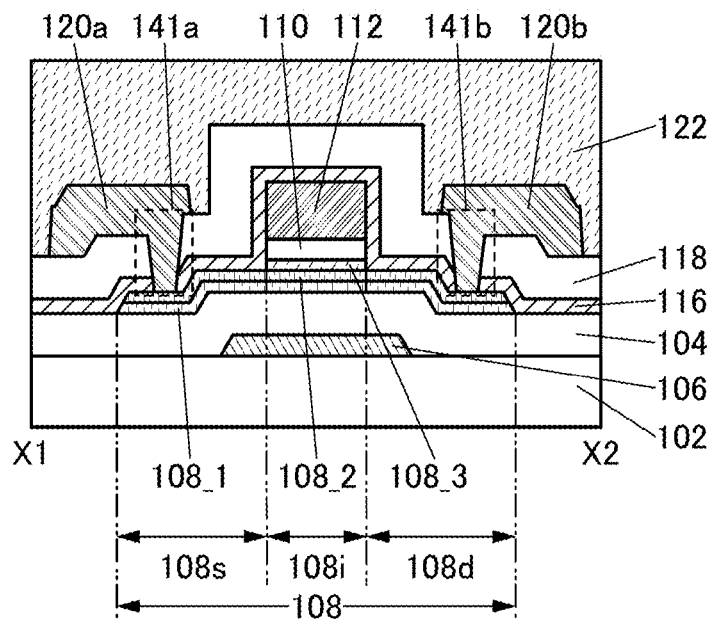
FIGS. 42A and 42B are cross-sectional views illustrating a semiconductor device.
Figure 42B:
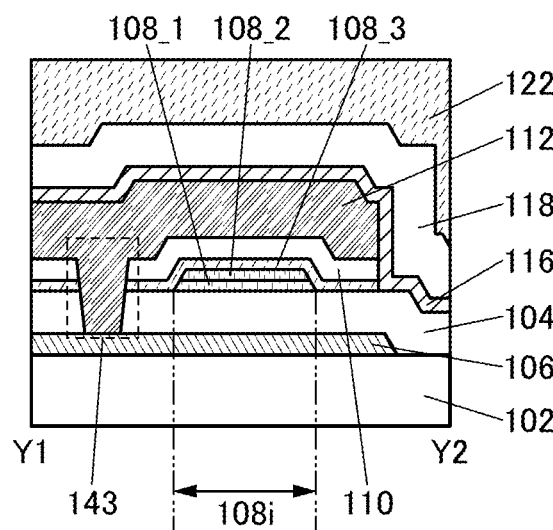
Figure 43A:
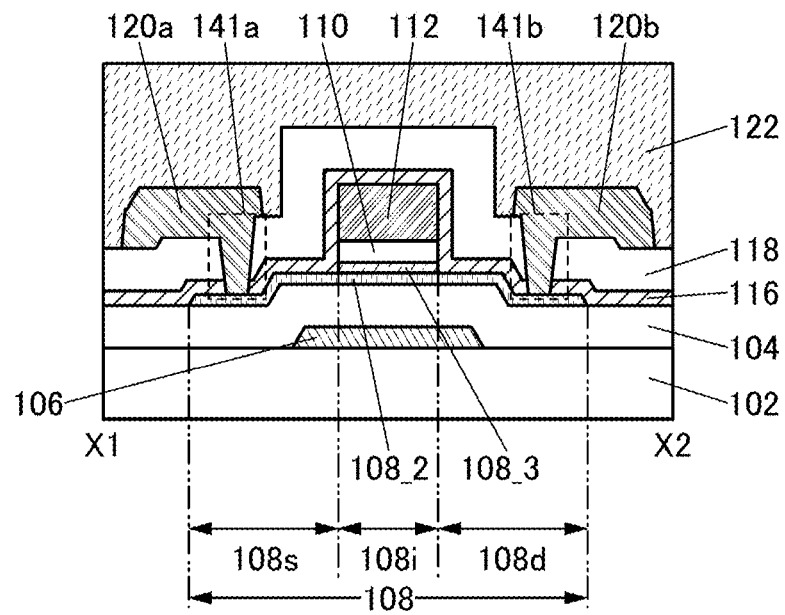
FIGS. 43A and 43B are cross-sectional views illustrating a semiconductor device.
Figure 43B:
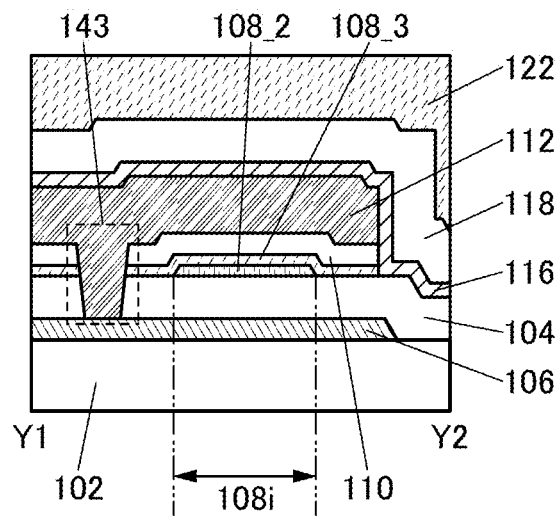

FIGS. 39A and 39B are cross-sectional views of a transistor 100E. FIGS. 40A and 40B are cross-sectional views of a transistor 100F. FIGS. 41A and 41B are cross-sectional views of a transistor 100G. FIGS. 42A and 42B are cross-sectional views of a transistor 100H. FIGS. 43A and 43B are cross-sectional views of a transistor 100J. The top views of the transistors 100E, 100F, 100G, 100H, and 100J are not illustrated because they are similar to the top view of the transistor 100A in FIG. 17A.

The transistors 100E, 100F, 100G, 100H, and 100J are different from the above-described the transistor 100A in the structure of the oxide semiconductor film 108. The other components are similar to those of the transistor 100A and have similar effects.

The oxide semiconductor film 108 of the transistor 100E illustrated in FIGS. 39A and 39B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108*i*, the source region 108*s*, and the drain region 108*d* each have a three-layer structure of the oxide semiconductor film 108_1, the oxide semiconductor film 108_2, and the oxide semiconductor film 108_3.

The oxide semiconductor film 108 of the transistor 100F illustrated in FIGS. 40A and 40B includes the oxide semiconductor film 108_2 over the insulating film 104, and the oxide semiconductor film 108_3 over the oxide semiconductor film 108_2. The channel region 108*i*, the source region 108*s*, and the drain region 108*d* each have a two-layer structure of the oxide semiconductor film 108_2 and the oxide semiconductor film 108_3.

The oxide semiconductor film 108 of the transistor 100G illustrated in FIGS. 41A and 41B includes the oxide semiconductor film 108_1 over the insulating film 104, and the oxide semiconductor film 108_2 over the oxide semiconductor film 108_1. The channel region 108*i*, the source region 108*s*, and the drain region 108*d* each have a two-layer structure of the oxide semiconductor film 108_1 and the oxide semiconductor film 108_2.

The oxide semiconductor film 108 of the transistor 100H illustrated in FIGS. 42A and 42B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108*i* has a three-layer structure of the oxide semiconductor film 108_1, the oxide semiconductor film 108_2, and the oxide semiconductor film 108_3. The source region 108*s* and the drain region 108*d* each have a two-layer structure of the oxide semiconductor film 108_1 and the oxide semiconductor film 108_2. Note that in the cross section of the transistor 100H in the channel width (W) direction, the oxide semiconductor film 108_3 covers side surfaces of the oxide semiconductor film 108_1 and the oxide semiconductor film 108_2.

The oxide semiconductor film 108 of the transistor 100J illustrated in FIGS. 43A and 43B includes the oxide semiconductor film 108_2 over the insulating film 104, and the oxide semiconductor film 108_3 over the oxide semiconductor film 108_2. The channel region 108*i* has a two-layer structure of the oxide semiconductor film 108_2 and the oxide semiconductor film 108_3. The source region 108*s* and the drain region 108*d* each have a single-layer structure of the oxide semiconductor film 108_2. Note that in the cross section of the transistor 100J in the channel width (W) direction, the oxide semiconductor film 108_3 covers side surfaces of the oxide semiconductor film 108_2.

A side surface of the channel region 108*i* in the channel width (W) direction or a region in the vicinity of the side surface is easily damaged by processing, resulting in a defect (e.g., oxygen vacancy), or easily contaminated by an impurity attached thereto. Therefore, even when the channel region 108*i* is substantially intrinsic, stress such as an electric field applied thereto activates the side surface of the channel region 108*i* in the channel width (W) direction or the region in the vicinity of the side surface and turns it into a low-resistance (n-type) region easily. Moreover, if the side surface of the channel region 108*i* in the channel width (W) direction or the region in the vicinity of the side surface is an n-type region, a parasitic channel may be formed because the n-type region serves as a carrier path.

Thus, in the transistor 100H and the transistor 100J, the channel region 108*i* has a stacked-layer structure and side surfaces of the channel region 108*i* in the channel width (W) direction are covered with one layer of the stacked layers. With such a structure, defects on or in the vicinity of the side surfaces of the channel region 108*i* can be suppressed or adhesion of an impurity to the side surfaces of the channel region 108*i* or to regions in the vicinity of the side surfaces can be reduced.

[Band Structure]

Here, a band structure of the insulating film 104, the oxide semiconductor films 108_1, 1082, and 108_3, and the insulating film 110, a band structure of the insulating film 104, the oxide semiconductor films 108_2 and 108_3, and the insulating film 110, and a band structure of the insulating film 104, the oxide semiconductor films 108_1 and 108_2, and the insulating film 110 will be described with reference to FIGS. 44A to 44C. Note that FIGS. 44A to 44C are each a band structure of the channel region 108*i*.

Figure 44A:
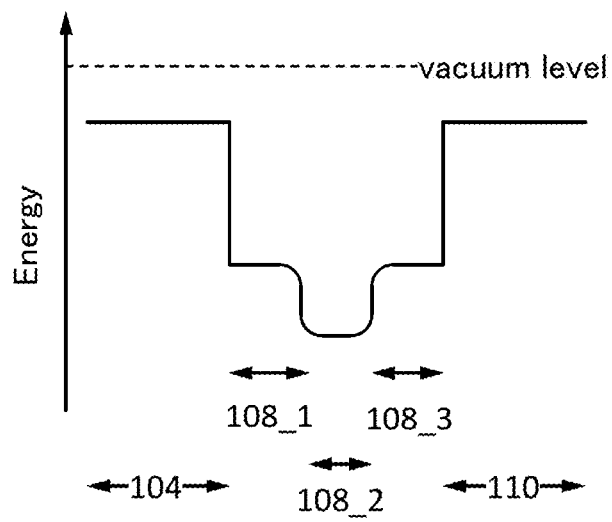
FIGS. 44A to 44C show band structures.

FIG. 44A shows an example of a band structure in the thickness direction of a stack including the insulating film 104, the oxide semiconductor films 108_1, 1082, and 108_3, and the insulating film 110. FIG. 44B shows an example of a band structure in the thickness direction of a stack including the insulating film 104, the oxide semiconductor films 108_2 and 108_3, and the insulating film 110. FIG. 44C shows an example of a band structure in the thickness direction of a stack including the insulating film 104, the oxide semiconductor films 108_1 and 108_2, and the insulating film 110. For easy understanding, the band structures show the conduction band minimum ($E_C$) of the insulating film 104, the oxide semiconductor films 108_1, 1082, and 108_3, and the insulating film 110.

In the band structure of FIG. 44A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 44B:
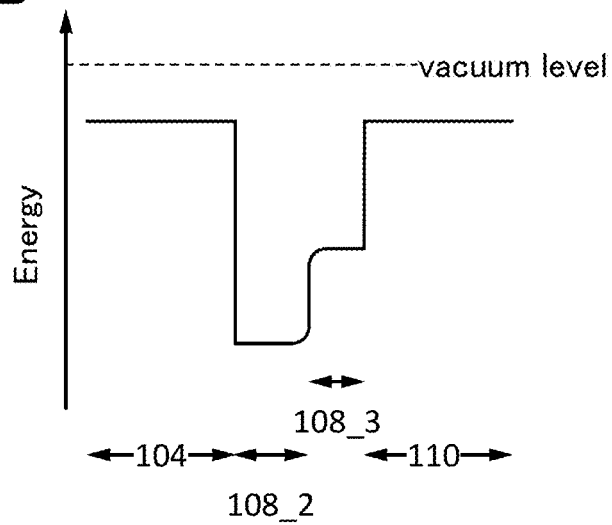
Figure 44C:
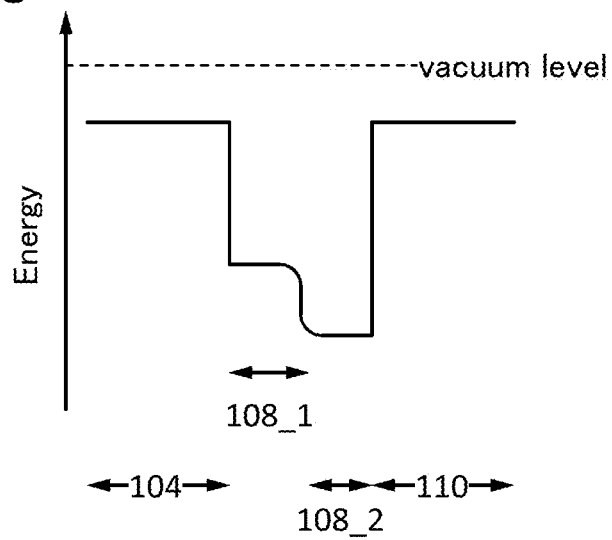

In the band structure of FIG. 44B, a silicon oxide film is used as each of the insulating films 104 and 110, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

In the band structure of FIG. 44C, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, and an oxide semiconductor film formed using a metal oxide target whose atomic ratio of In to Ga and Zn is 4:2:4.1 is used as the oxide semiconductor film 108_2.

As illustrated in FIG. 44A, the conduction band minimum gradually varies between the oxide semiconductor films 1081, 108_2, and 108_3. As illustrated in FIG. 44B, the conduction band minimum gradually varies between the oxide semiconductor films 108_2 and 108_3. As illustrated in FIG. 44C, the conduction band minimum gradually varies between the oxide semiconductor films 108_1 and 108_2. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air with a multi-chamber deposition apparatus (sputtering apparatus) provided with a load lock chamber.

With the band structure of FIG. 44A, FIG. 44B, or FIG. 44C, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from defect states.

In addition, the defect states might be more distant from the vacuum level than the conduction band minimum ($E_C$) of the oxide semiconductor film 108_2 functioning as a channel region, so that electrons are likely to be accumulated in the defect states. When the electrons are accumulated in the defect states, the electrons become negative fixed electric charge, so that the threshold voltage of the transistor is shifted in the positive direction. Therefore, it is preferable that the defect states be closer to the vacuum level than the conduction band minimum ($E_C$) of the oxide semiconductor film 108_2. Such a structure inhibits accumulation of electrons in the defect states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the electron affinity of the oxide semiconductor film 108_2 is higher than those of the oxide semiconductor films 108_1 and 108_3. The difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of current. In other words, the oxide semiconductor film 108_2 serves as a channel region, and the oxide semiconductor films 108_1 and 108_3 serve as oxide insulating films. It is preferable that the oxide semiconductor films 108_1 and 108_3 each include one or more metal elements constituting the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. A material used for the oxide semiconductor films 108_1 and 108_3 has a smaller electron affinity (a difference between the vacuum level and the conduction band minimum) than the oxide semiconductor film 108_2 and is selected such that a difference (band offset) exists between the conduction band minimum of each of the oxide semiconductor films 108_1 and 108_3 and that of the oxide semiconductor film 108_2. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, further preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120*a* and 120*b* might be diffused into the oxide semiconductor film 108_2 at the interface between the spinel crystal structure and another region. Note that each of the oxide semiconductor films 108_1 and 108_3 is preferably a CAAC-OS film described later, in which case a higher blocking property against constituent elements of the conductive films 120*a* and 120*b*, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, 1:4:5, 1:5:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. In that case, it is suitable that an oxide semiconductor film formed using a metal oxide target whose atomic ratio of In to Ga and Zn is 1:1:1 is used as the oxide semiconductor film 108_2 and an oxide semiconductor film formed using a metal oxide target whose atomic ratio of Ga to Zn is 10:1 is used as each of the oxide semiconductor films 108_1 and 108_3 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be 1:$\beta$1:$\beta$2 (0<$\beta$1≤2, 0<$\beta$2≤2). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be 1:$\beta$3:$\beta$4 (1≤$\beta$3≤5, 2≤$\beta$4≤6). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be 1:$\beta$5:$\beta$6 (1≤$\beta$5≤5, 4≤$\beta$6≤8).

<2-3. Structure Example 4 of Transistor>

Figure 45A:
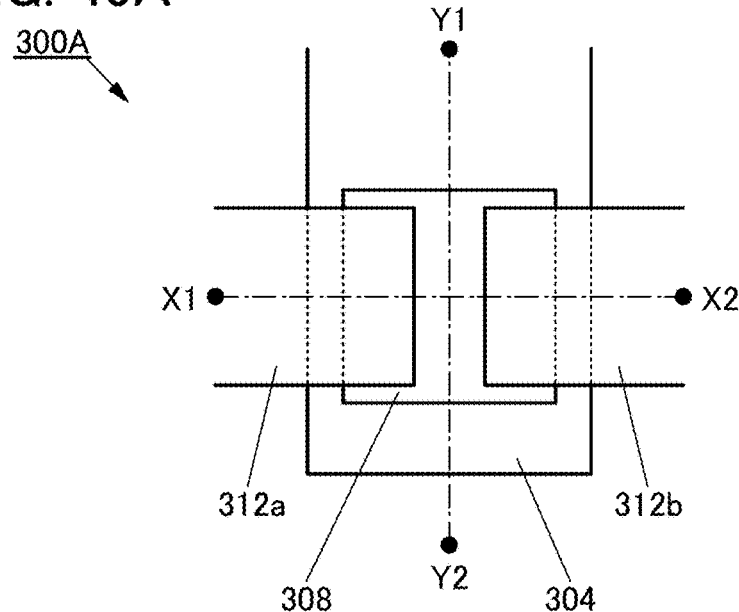
FIGS. 45A to 45C are a top view and cross-sectional views illustrating a semiconductor device.
Figure 45B:
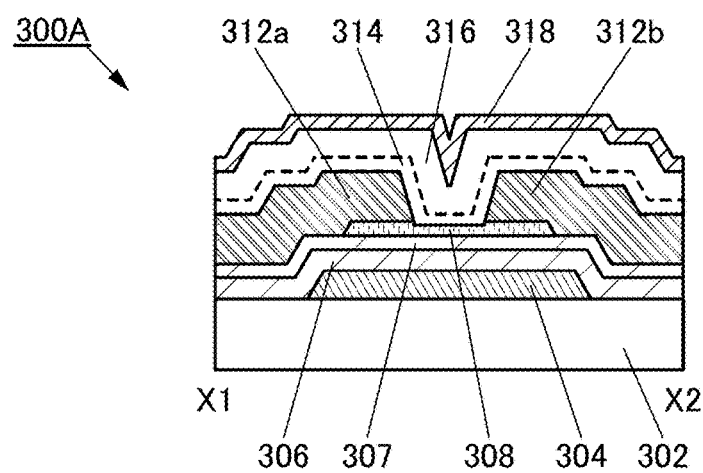
Figure 45C:
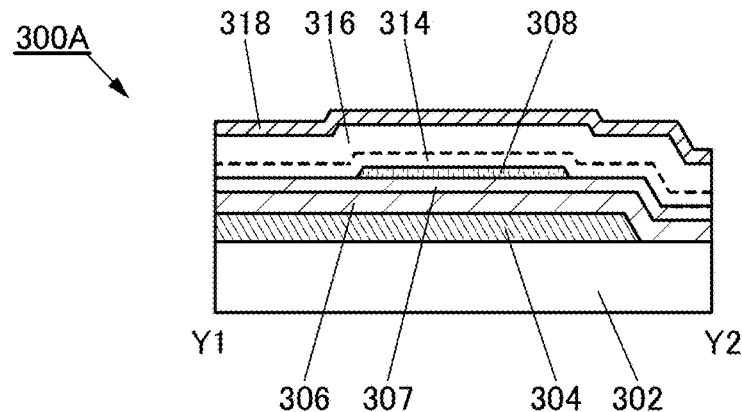

FIG. 45A is a top view of a transistor 300A. FIG. 45B is a cross-sectional view taken along the dashed-dotted line X1-X2 in FIG. 45A. FIG. 45C is a cross-sectional view taken along the dashed-dotted line Y1-Y2 in FIG. 45A. Note that in FIG. 45A, some components of the transistor 300A (e.g., an insulating film functioning as a gate insulating film) are not illustrated to avoid complexity. The direction of the dashed-dotted line X1-X2 may be referred to as a channel length direction, and the direction of the dashed-dotted line Y1-Y2 may be referred to as a channel width direction. As in FIG. 45A, some components are not illustrated in some cases in top views of transistors described below.

The transistor 300A illustrated in FIGS. 45A to 45C includes a conductive film 304 over a substrate 302, an insulating film 306 over the substrate 302 and the conductive film 304, an insulating film 307 over the insulating film 306, an oxide semiconductor film 308 over the insulating film 307, a conductive film 312a over the oxide semiconductor film 308, and a conductive film 312b over the oxide semiconductor film 308. Over the transistor 300A, specifically, over the conductive films 312a and 312b and the oxide semiconductor film 308, an insulating film 314, an insulating film 316, and an insulating film 318 are provided.

In the transistor 300A, the insulating films 306 and 307 function as the gate insulating films of the transistor 300A, and the insulating films 314, 316, and 318 function as protective insulating films of the transistor 300A. Furthermore, in the transistor 300A, the conductive film 304 functions as a gate electrode, the conductive film 312a functions as a source electrode, and the conductive film 312b functions as a drain electrode.

In this specification and the like, the insulating films 306 and 307 may be referred to as a first insulating film, the insulating films 314 and 316 may be referred to as a second insulating film, and the insulating film 318 may be referred to as a third insulating film.

The transistor 300A illustrated in FIGS. 45A to 45C is a channel-etched transistor. The oxide semiconductor film of one embodiment of the present invention is suitable for a channel-etched transistor.

<2-4. Structure Example 5 of Transistor>

Figure 46A:
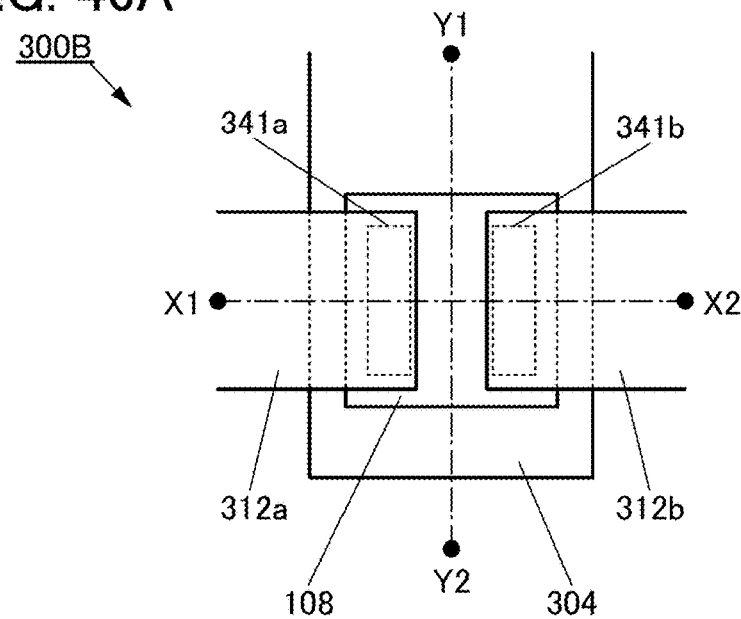
FIGS. 46A to 46C are a top view and cross-sectional views illustrating a semiconductor device.
Figure 46B:
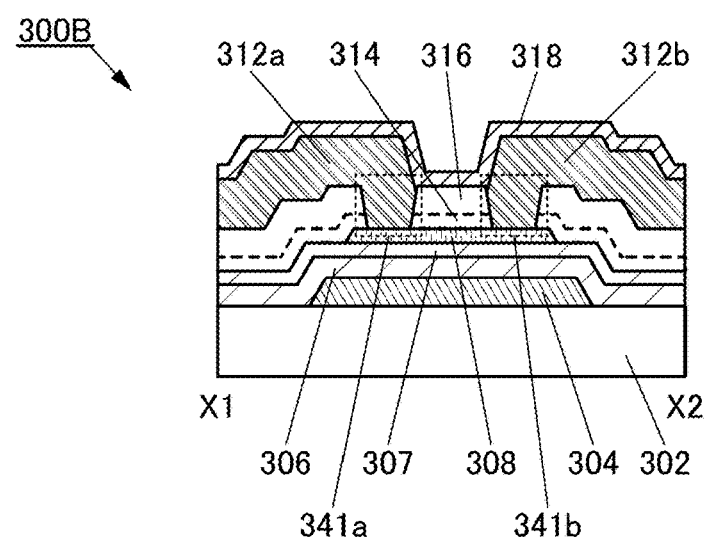
Figure 46C:
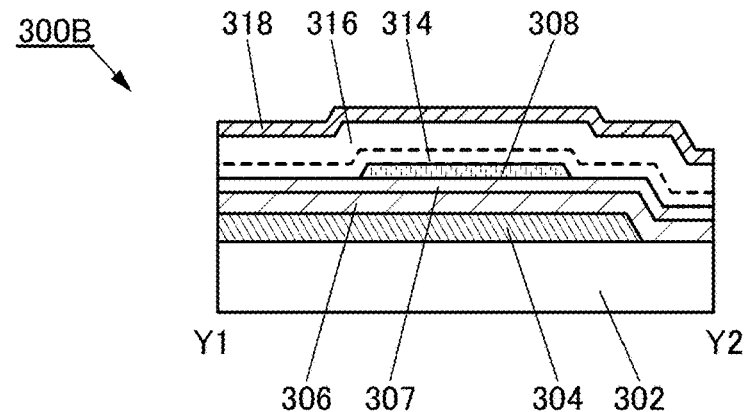

FIG. 46A is a top view of a transistor 300B. FIG. 46B is a cross-sectional view taken along the dashed-dotted line X1-X2 in FIG. 46A. FIG. 46C is a cross-sectional view taken along the dashed-dotted line Y1-Y2 in FIG. 46A.

The transistor 300B illustrated in FIGS. 46A to 46C includes the conductive film 304 over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312a electrically connected to the oxide semiconductor film 308 through an opening 341a provided in the insulating films 314 and 316, and the conductive film 312b electrically connected to the oxide semiconductor film 308 through an opening 341b provided in the insulating films 314 and 316. Over the transistor 300B, specifically, over the conductive films 312a and 312b and the insulating film 316, the insulating film 318 is provided.

In the transistor 300B, the insulating films 306 and 307 each function as a gate insulating film of the transistor 300B, the insulating films 314 and 316 each function as a protective insulating film of the oxide semiconductor film 308, and the insulating film 318 functions as a protective insulating film of the transistor 300B. Moreover, in the transistor 300B, the conductive film 304 functions as a gate electrode, the conductive film 312a functions as a source electrode, and the conductive film 312b functions as a drain electrode.

The transistor 300A illustrated in FIGS. 45A to 45C has a channel-etched structure, whereas the transistor 300B in FIGS. 46A to 46C has a channel-protective structure. The oxide semiconductor film of one embodiment of the present invention is suitable for a channel-protective transistor as well.

<2-5. Structure Example 6 of Transistor>

Figure 47A:
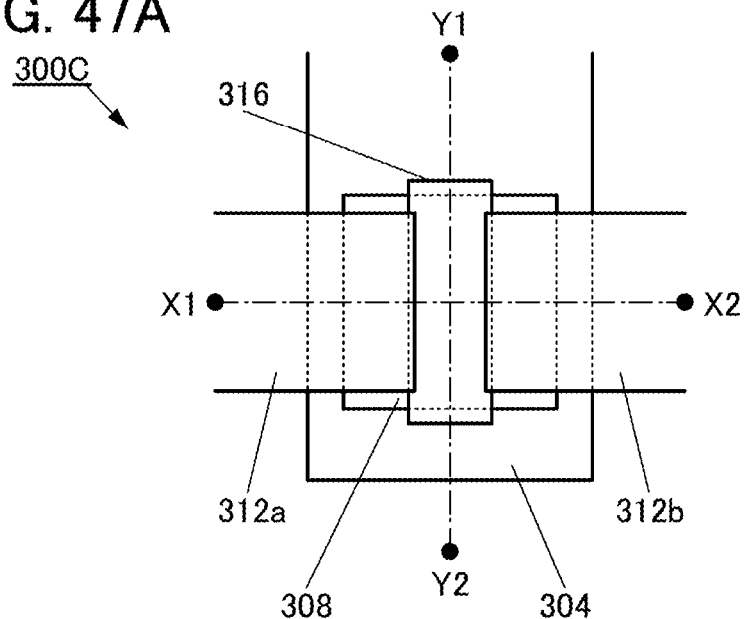
FIGS. 47A to 47C are a top view and cross-sectional views illustrating a semiconductor device.
Figure 47B:
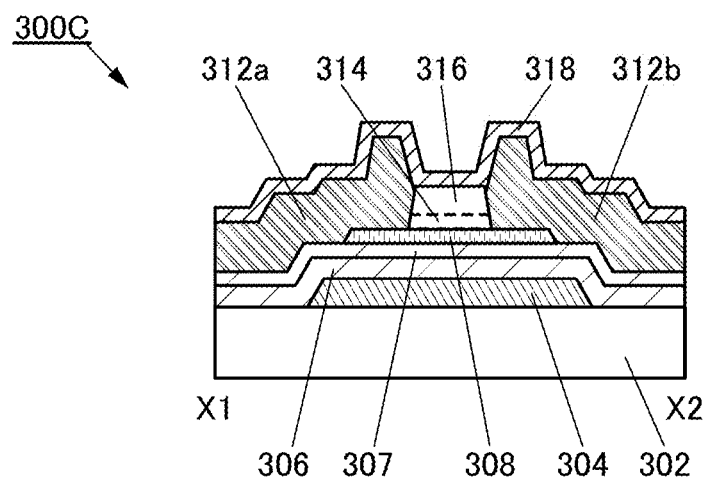
Figure 47C:
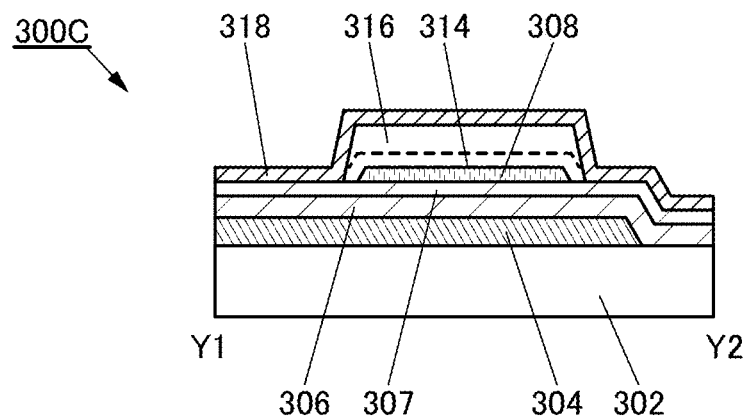

FIG. 47A is a top view of a transistor 300C. FIG. 47B is a cross-sectional view taken along the dashed-dotted line X1-X2 in FIG. 47A. FIG. 47C is a cross-sectional view taken along the dashed-dotted line Y1-Y2 in FIG. 47A.

The transistor 300C illustrated in FIGS. 47A to 47C is different from the transistor 300B in FIGS. 46A to 46C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

<2-6. Structure Example 7 of Transistor>

Figure 48A:
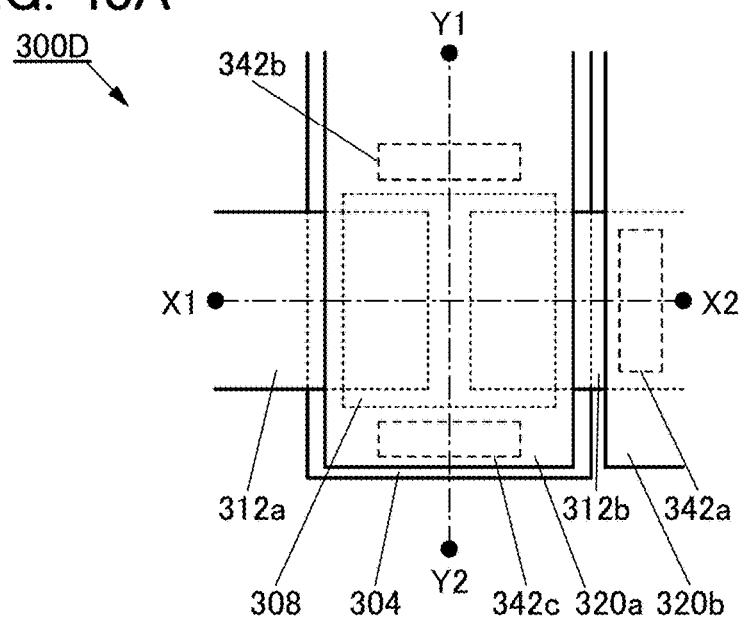
FIGS. 48A to 48C are a top view and cross-sectional views illustrating a semiconductor device.
Figure 48B:
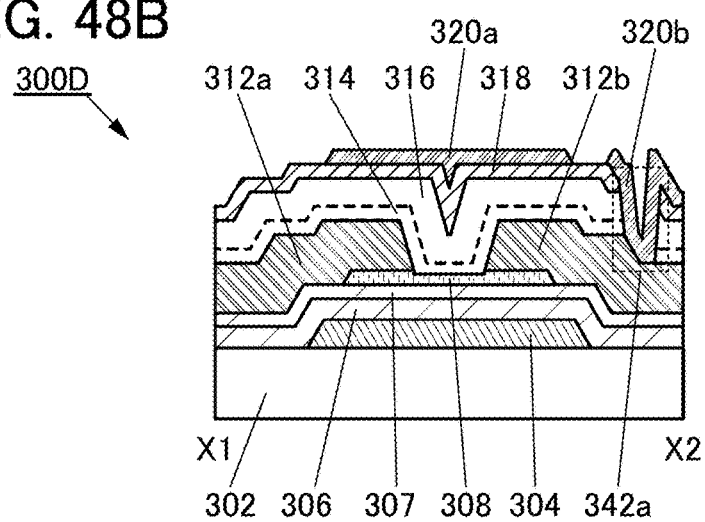
Figure 48C:
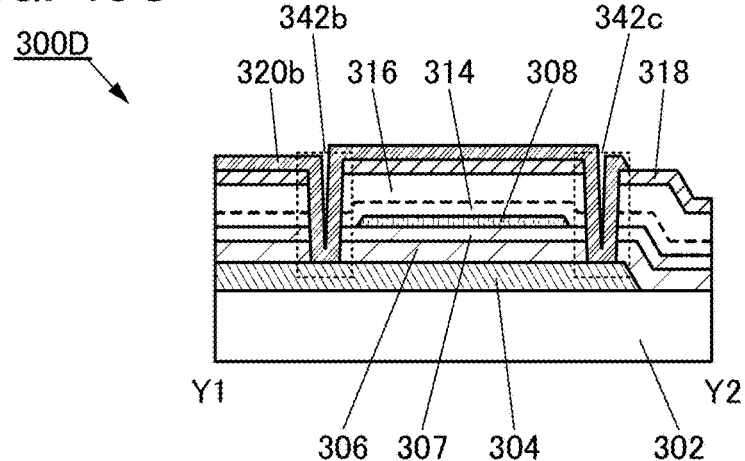

FIG. 48A is a top view of a transistor 300D. FIG. 48B is a cross-sectional view taken along the dashed-dotted line X1-X2 in FIG. 48A. FIG. 48C is a cross-sectional view taken along the dashed-dotted line Y1-Y2 in FIG. 48A.

The transistor 300D illustrated in FIGS. 48A to 48C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the insulating film 318 over the insulating film 316, and conductive films 320a and 320b over the insulating film 318.

In the transistor 300D, the insulating films 306 and 307 function as first gate insulating films of the transistor 300D, and the insulating films 314, 316, and 318 function as second gate insulating films of the transistor 300D. Furthermore, in the transistor 300D, the conductive film 304 functions as a first gate electrode, the conductive film 320a functions as a second gate electrode, and the conductive film 320b functions as a pixel electrode used for a display device. The conductive film 312a functions as a source electrode, and the conductive film 312b functions as a drain electrode.

As illustrated in FIG. 48C, the conductive film 320a is connected to the conductive film 304 in an opening portion 342b and an opening portion 342c provided in the insulating films 306, 307, 314, 316, and 318. Thus, the same potential is applied to the conductive film 320a and the conductive film 304.

The structure of the transistor 300D is not limited to that described above, in which the opening portions 342b and 342c are provided so that the conductive film 320a is connected to the conductive film 304. For example, a structure in which only one of the opening portions 342b and 342c is provided so that the conductive film 320a is connected to the conductive film 304, or a structure in which the conductive film 320a is not connected to the conductive film 304 without providing the opening portions 342b and 342c may be employed. Note that in the case where the conductive film 320a is not connected to the conductive film 304, it is possible to apply different potentials to the conductive film 320a and the conductive film 304.

The conductive film 320b is connected to the conductive film 312b through an opening portion 342a provided in the insulating films 314, 316, and 318.

Note that the transistor 300D has the S-channel structure described above.

<2-7. Structure Example 8 of Transistor>

The oxide semiconductor film 308 included in the transistor 300A in FIGS. 45A to 45C may have a stacked-layer structure. FIGS. 49A and 49B and FIGS. 50A and 50B illustrate examples of such a case.

Figure 49A:
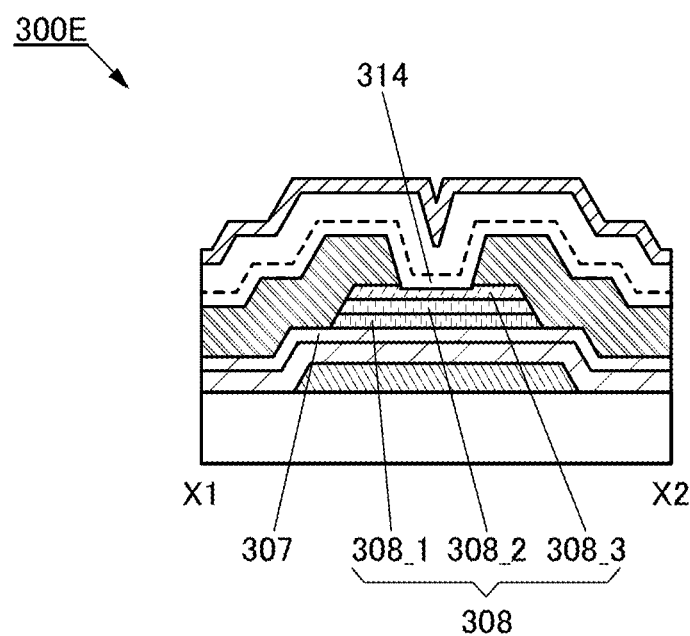
FIGS. 49A and 49B are cross-sectional views illustrating a semiconductor device.
Figure 49B:
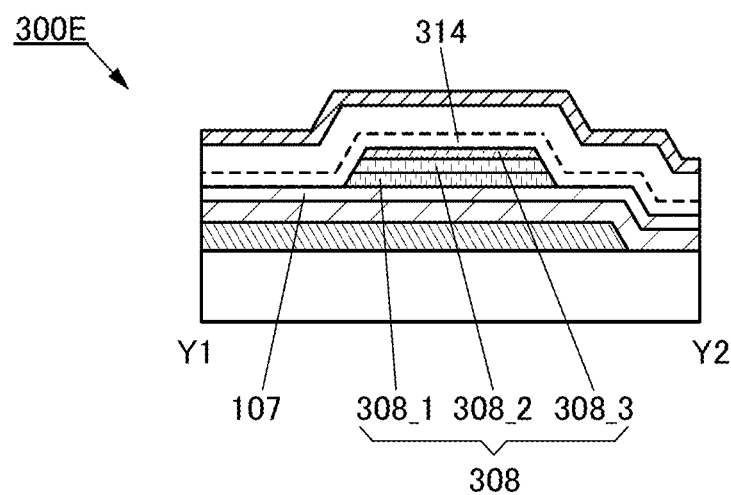
Figure 50A:
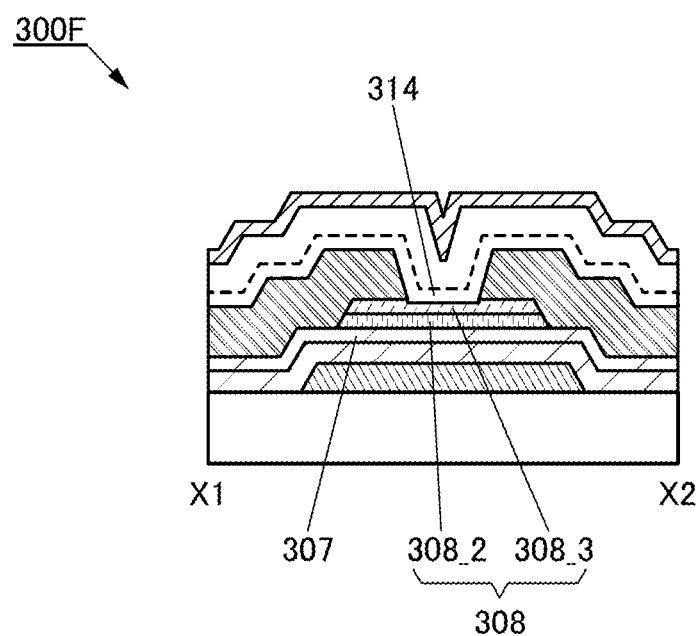
FIGS. 50A and 50B are cross-sectional views illustrating a semiconductor device.
Figure 50B:
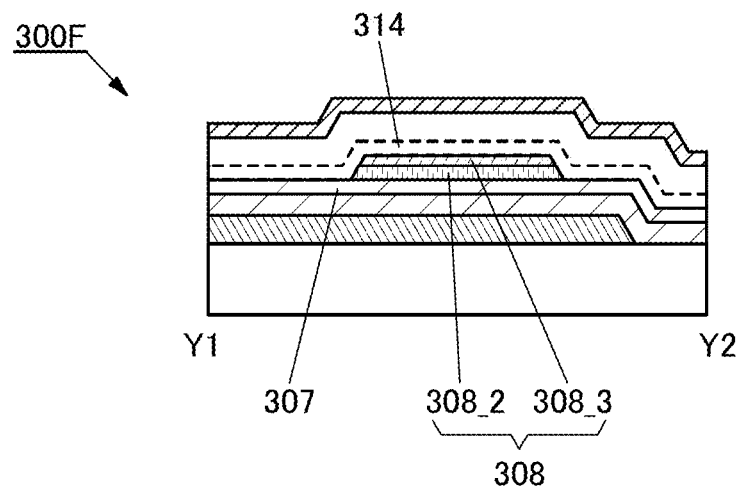

FIGS. 49A and 49B are cross-sectional views of a transistor 300E and FIGS. 50A and 50B are cross-sectional views of a transistor 300F. The top views of the transistors 300E and 300F are similar to that of the transistor 300A illustrated in FIG. 45A.

The oxide semiconductor film 308 of the transistor 300E illustrated in FIGS. 49A and 49B includes an oxide semiconductor film 308_1, an oxide semiconductor film 308_2, and an oxide semiconductor film 308_3. The oxide semiconductor film 308 of the transistor 300F illustrated in FIGS. 50A and 50B includes the oxide semiconductor film 308_2 and the oxide semiconductor film 308_3.

Note that the conductive film 304, the insulating film 306, the insulating film 307, the oxide semiconductor film 308, the oxide semiconductor film 308_1, the oxide semiconductor film 308_2, the oxide semiconductor film 308_3, the conductive films 312a and 312b, the insulating film 314, the insulating film 316, the insulating film 318, and the conductive films 320a and 320b can be formed using the materials of the conductive film 106, the insulating film 116, the oxide semiconductor film 108, the oxide semiconductor film 108_1, the oxide semiconductor film 108_2, the oxide semiconductor film 108_3, the conductive films 120a and 120b, the insulating film 104, the insulating film 118, the insulating film 116, and the conductive film 112, respectively, described above.

<2-8. Structure Example 9 of Transistor>

Figure 51A:
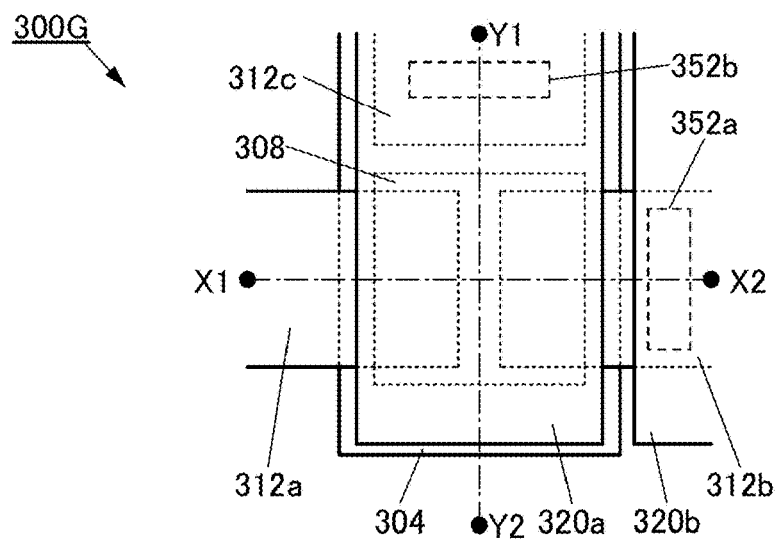
FIGS. 51A to 51C are a top view and cross-sectional views illustrating a semiconductor device.
Figure 51B:
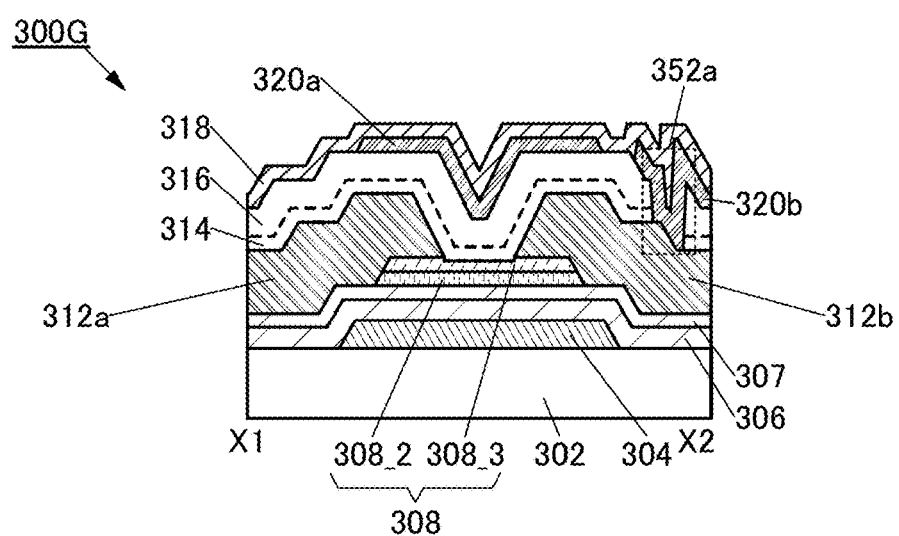
Figure 51C:
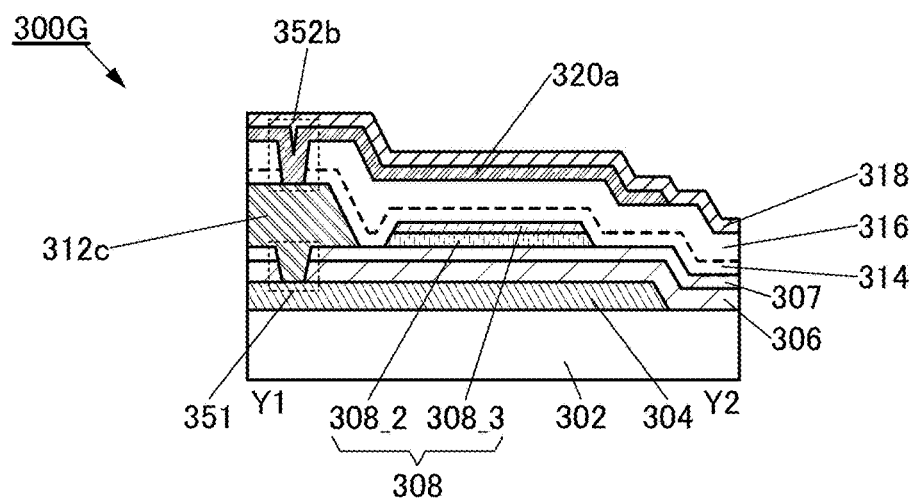

FIG. 51A is a top view of a transistor 300G. FIG. 51B is a cross-sectional view taken along the dashed-dotted line X1-X2 in FIG. 51A. FIG. 51C is a cross-sectional view taken along the dashed-dotted line Y1-Y2 in FIG. 51A.

The transistor 300G illustrated in FIGS. 51A to 51C includes the conductive film 304 over the substrate 302, the insulating film 306 over the substrate 302 and the conductive film 304, the insulating film 307 over the insulating film 306, the oxide semiconductor film 308 over the insulating film 307, the conductive film 312a over the oxide semiconductor film 308, the conductive film 312b over the oxide semiconductor film 308, the insulating film 314 over the oxide semiconductor film 308 and the conductive films 312a and 312b, the insulating film 316 over the insulating film 314, the conductive film 320a over the insulating film 316, and the conductive film 320b over the insulating film 316.

The insulating films 306 and 307 have an opening 351. A conductive film 312c, which is electrically connected to the conductive film 304 through the opening 351, is formed over the insulating films 306 and 307. The insulating films 314 and 316 have an opening 352a that reaches the conductive film 312b and an opening 352b that reaches the conductive film 312c.

The oxide semiconductor film 308 includes the oxide semiconductor film 308_2 on the conductive film 304 side and the oxide semiconductor film 308_3 over the oxide semiconductor film 308_2.

The insulating film 318 is provided over the transistor 300G. The insulating film 318 is formed to cover the insulating film 316, the conductive film 320a, and the conductive film 320b.

In the transistor 300G, the insulating films 306 and 307 function as first gate insulating films of the transistor 300G, and the insulating films 314 and 316 function as second gate insulating films of the transistor 300G, and the insulating film 318 functions as a protective insulating film of the transistor 300G. Furthermore, in the transistor 300G, the conductive film 304 functions as a first gate electrode, the conductive film 320a functions as a second gate electrode, and the conductive film 320b functions as a pixel electrode used for a display device. Moreover, in the transistor 300G, the conductive film 312a functions as a source electrode, the conductive film 312b functions as a drain electrode, and the conductive film 312c functions as a connection electrode.

Note that the transistor 300G has the S-channel structure described above.

The structures of the transistors 300A to 300G can be freely combined with each other.

At least part of this embodiment can be implemented in combination with any of the other embodiments described in this specification as appropriate.

Embodiment 3

In this embodiment, examples of a display device that includes the semiconductor device described in the above embodiments are described below with reference to FIG. 52 to FIG. 59.

Figure 52:
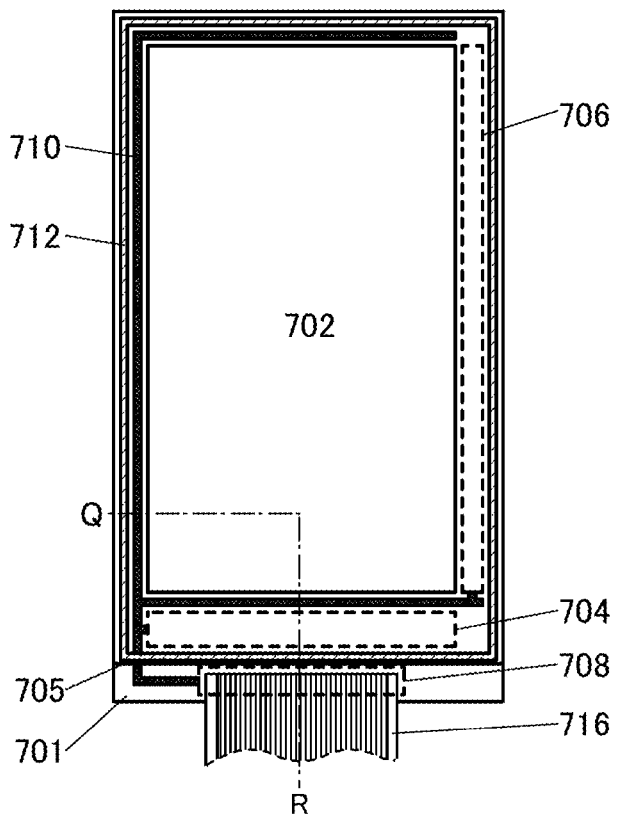
FIG. 52 is a top view illustrating one embodiment of a display device.

FIG. 52 is a top view illustrating an example of a display device. A display device 700 in FIG. 52 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 52, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 53:
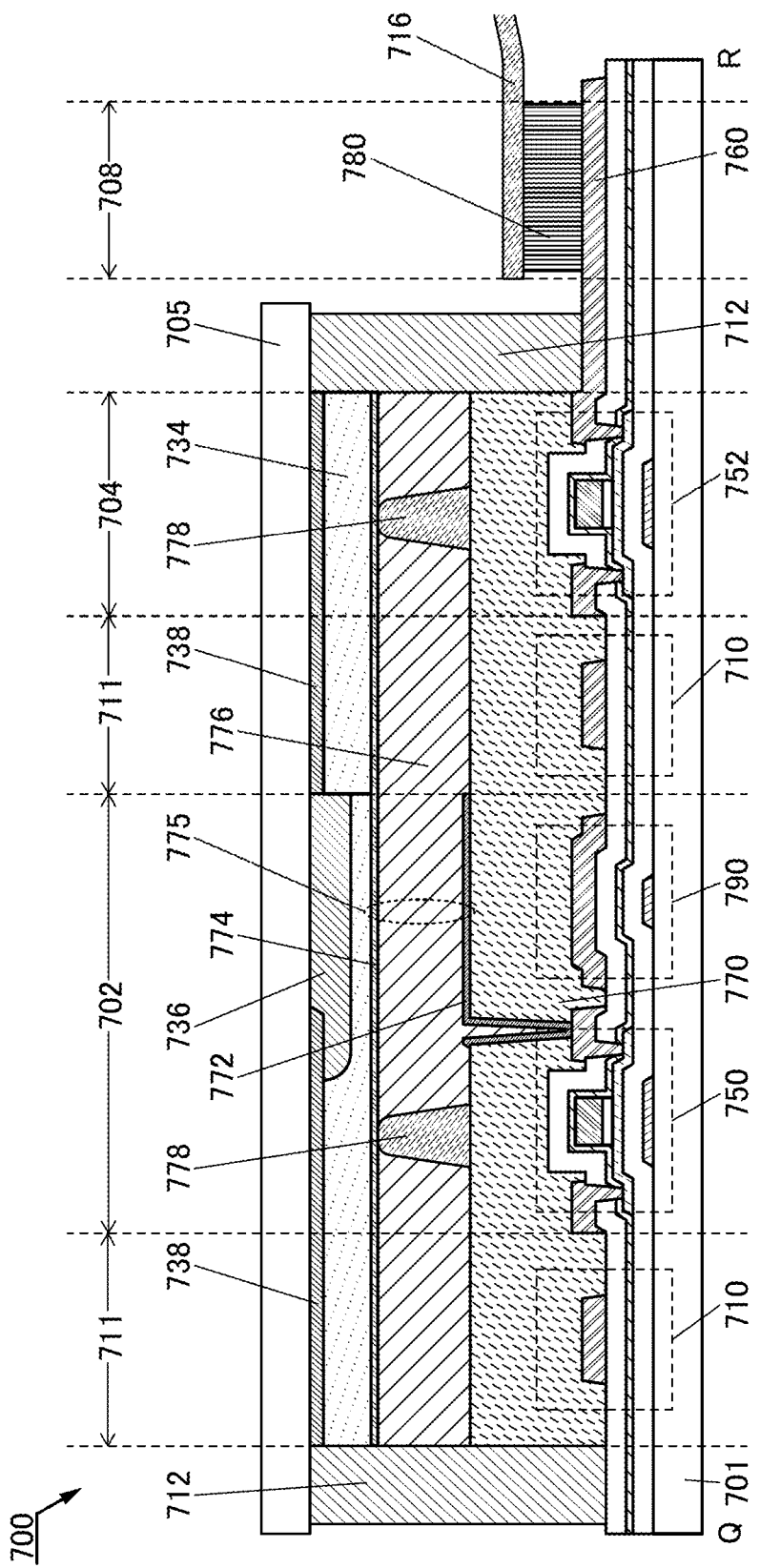
FIG. 53 is a cross-sectional view illustrating one embodiment of a display device.
Figure 54:
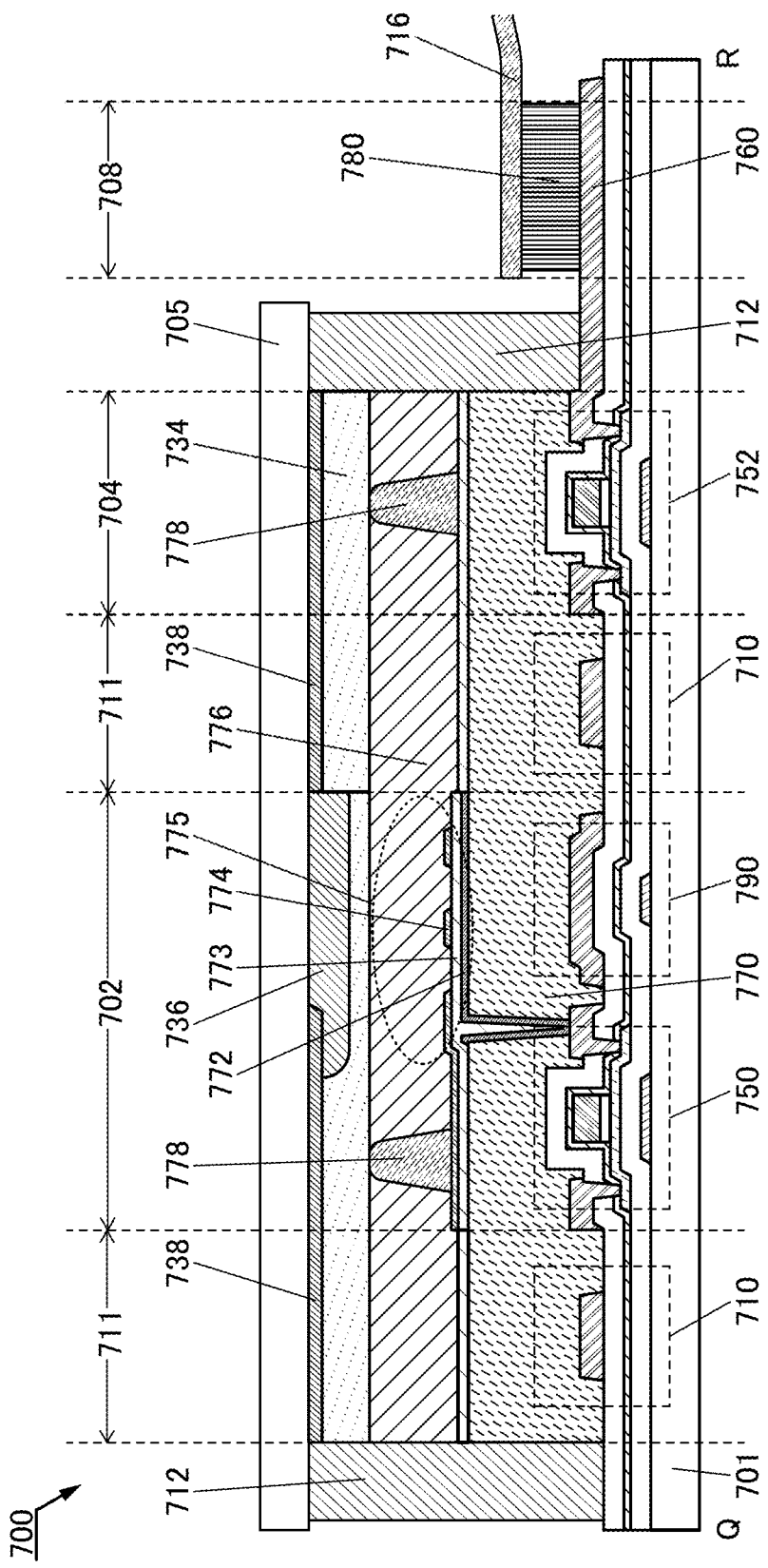
FIG. 54 is a cross-sectional view illustrating one embodiment of a display device.
Figure 55:
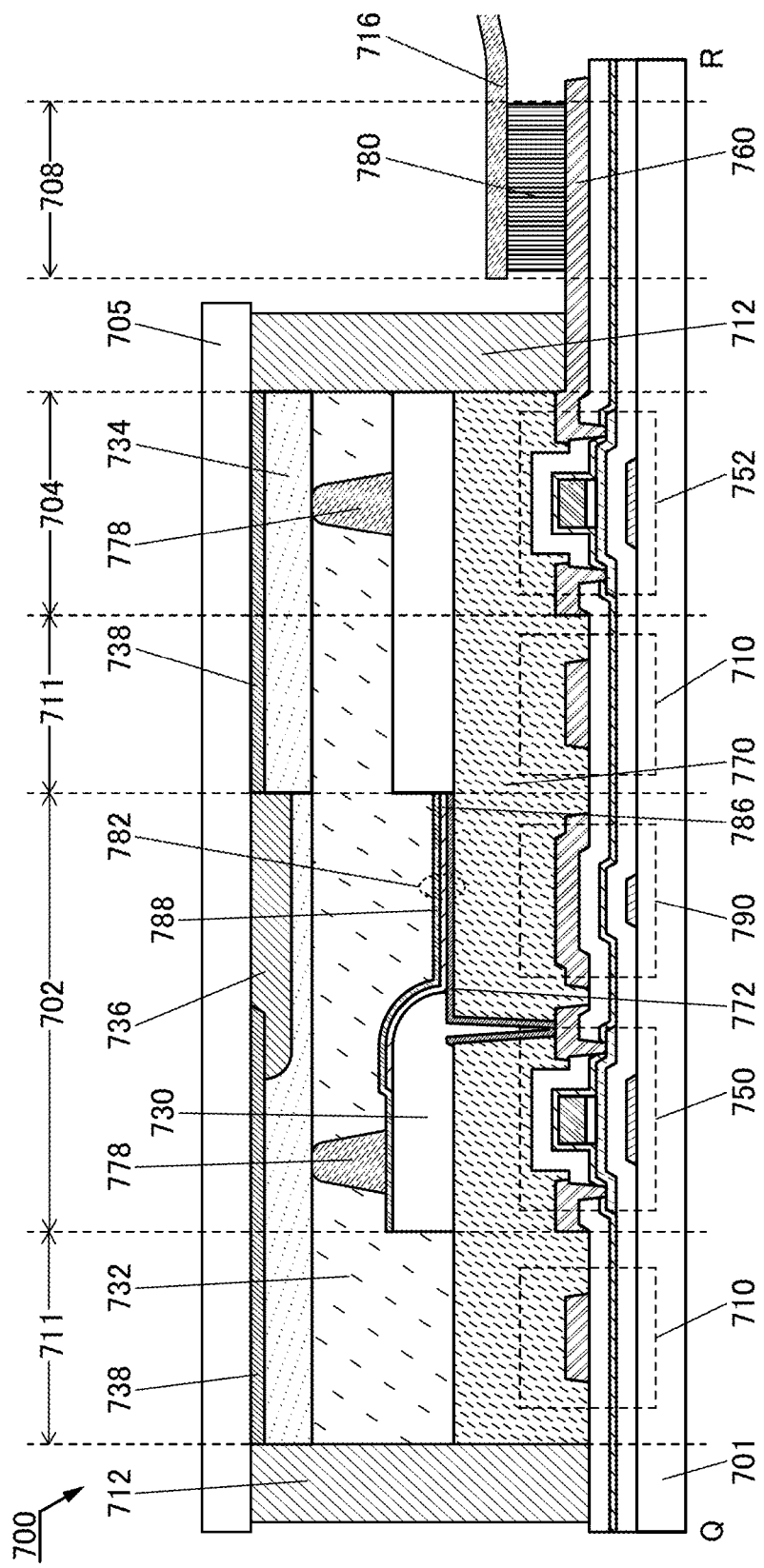
FIG. 55 is a cross-sectional view illustrating one embodiment of a display device.

In this embodiment, a structure including a liquid crystal element as a display element and a structure including an EL element as a display element are described with reference to FIG. 53 to FIG. 55. FIG. 53 and FIG. 54 are each a cross-sectional view taken along dashed-dotted line Q-R in FIG. 52 and illustrate the structure including a liquid crystal element as a display element. FIG. 55 is a cross-sectional view taken along dashed-dotted line Q-R in FIG. 52 and illustrates the structure including an EL element as a display element.

Portions common to FIG. 53 to FIG. 55 are described first, and then, different portions are described.

<3-1. Portions Common to Display Devices>

The display device 700 in FIG. 53 to FIG. 55 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes or a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 53 to FIG. 55, a planarization insulating film 770 is provided over the transistor 750, the transistor 752, and the capacitor 790.

Although FIG. 53 to FIG. 55 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 53 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 53 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device.

The method for driving the liquid crystal element can be changed by changing the structure over the conductive film 772, an example of this case is illustrated in FIG. 54. The display device 700 illustrated in FIG. 54 is an example of employing a horizontal electric field mode (e.g., an FFS mode) as a driving mode of the liquid crystal element. In the structure illustrated in FIG. 54, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 53 and FIG. 54, the conductive film 772 and/or the conductive film 774 may be provided with an alignment film on a side in contact with the liquid crystal layer 776. Although not illustrated in FIG. 53 and FIG. 54, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<3-3. Display Device Including Light-Emitting Element>

The display device 700 illustrated in FIG. 55 includes a light-emitting element 782. The light-emitting element 782 includes a conductive film 772, an EL layer 786, and a conductive film 788. The display device 700 illustrated in FIG. 55 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 58A to 58D. FIGS. 58A to 58D are cross-sectional views illustrating the method for forming the EL layer 786.

Figure 58A:
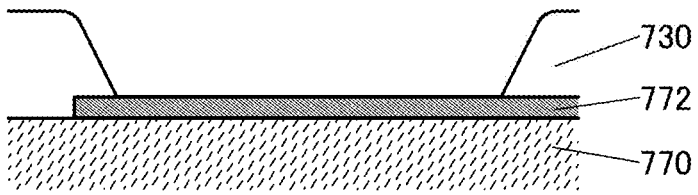
FIGS. 58A to 58D are cross-sectional views illustrating a method for forming an EL layer.
Figure 58B:
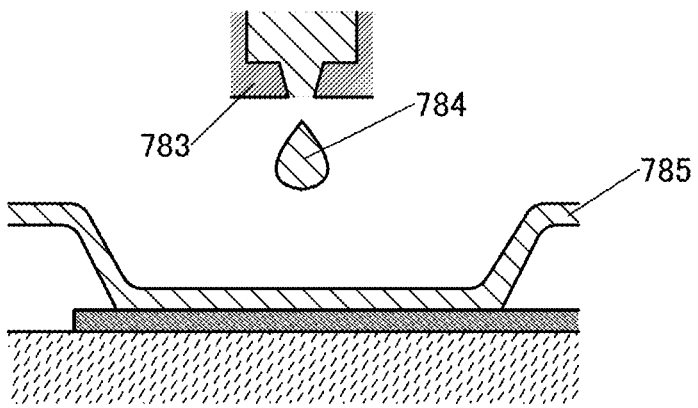

First, the conductive film 772 is formed over the planarization insulating film 770, and an insulating film 730 is formed to cover part of the conductive film 772 (see FIG. 58A).

Then, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached to the conductive film 772 (see FIG. 58B).

Note that the step of discharging the droplet 784 may be performed under reduced pressure.

Figure 58C:
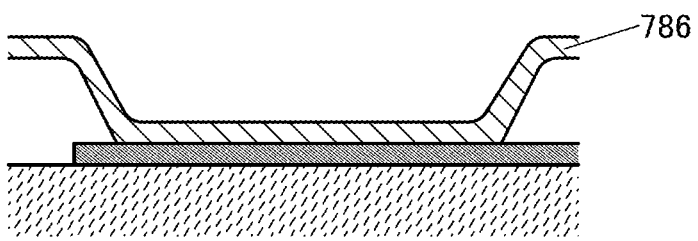

Next, the solvent is removed from the layer 785 containing the composition, and the resulting layer is solidified to form the EL layer 786 (see FIG. 58C).

The solvent may be removed by drying or heating.

Figure 58D:
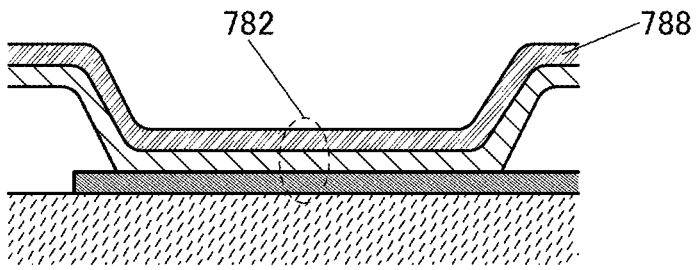

Next, the conductive film 788 is formed over the EL layer 786; thus, the light-emitting element 782 is formed (see FIG. 58D).

When the EL layer 786 is formed by a droplet discharge method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 59:
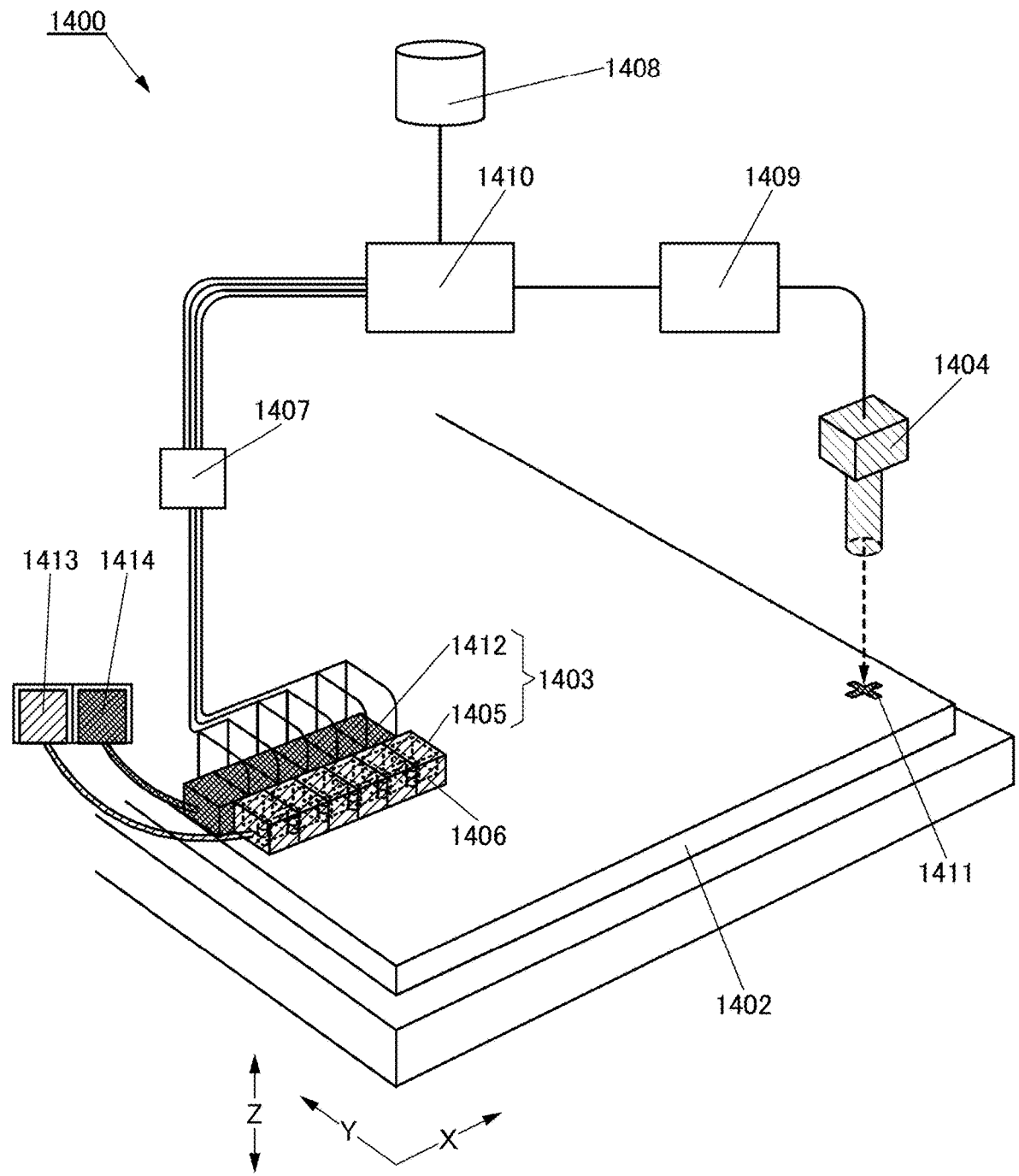
FIG. 59 is a conceptual diagram illustrating a droplet discharge apparatus.

Next, a droplet discharge apparatus used for the droplet discharge method is described with reference to FIG. 59. FIG. 59 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal-oxide-semiconductor (CMOS) can be used as the imaging means 1404. Note that information about a pattern to be formed over the substrate 1402 is stored in a storage medium 1408, and a control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 59, and a region in which a pattern is drawn can be freely set. Thus, a plurality of the same patterns can be drawn over one substrate.

Furthermore, a step of discharging the composition may be performed under reduced pressure. A substrate may be heated when the composition is discharged. After discharging the composition, either drying or baking or both of them are performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that there is no particular limitation on the timing of the heat treatment and the number of times of the heat treatment. The temperature for performing each of the steps of drying and baking in a favorable manner depends on the materials of the substrate and the properties of the composition.

In the above-described manner, the EL layer 786 can be formed with the droplet discharge apparatus.

The display device 700 shown in FIG. 55 is described again.

In the display device 700 in FIG. 55, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 55, in which the coloring film 736 is provided. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 54 and FIG. 55. As an example of the input/output device, a touch panel or the like can be given.

Figure 56:
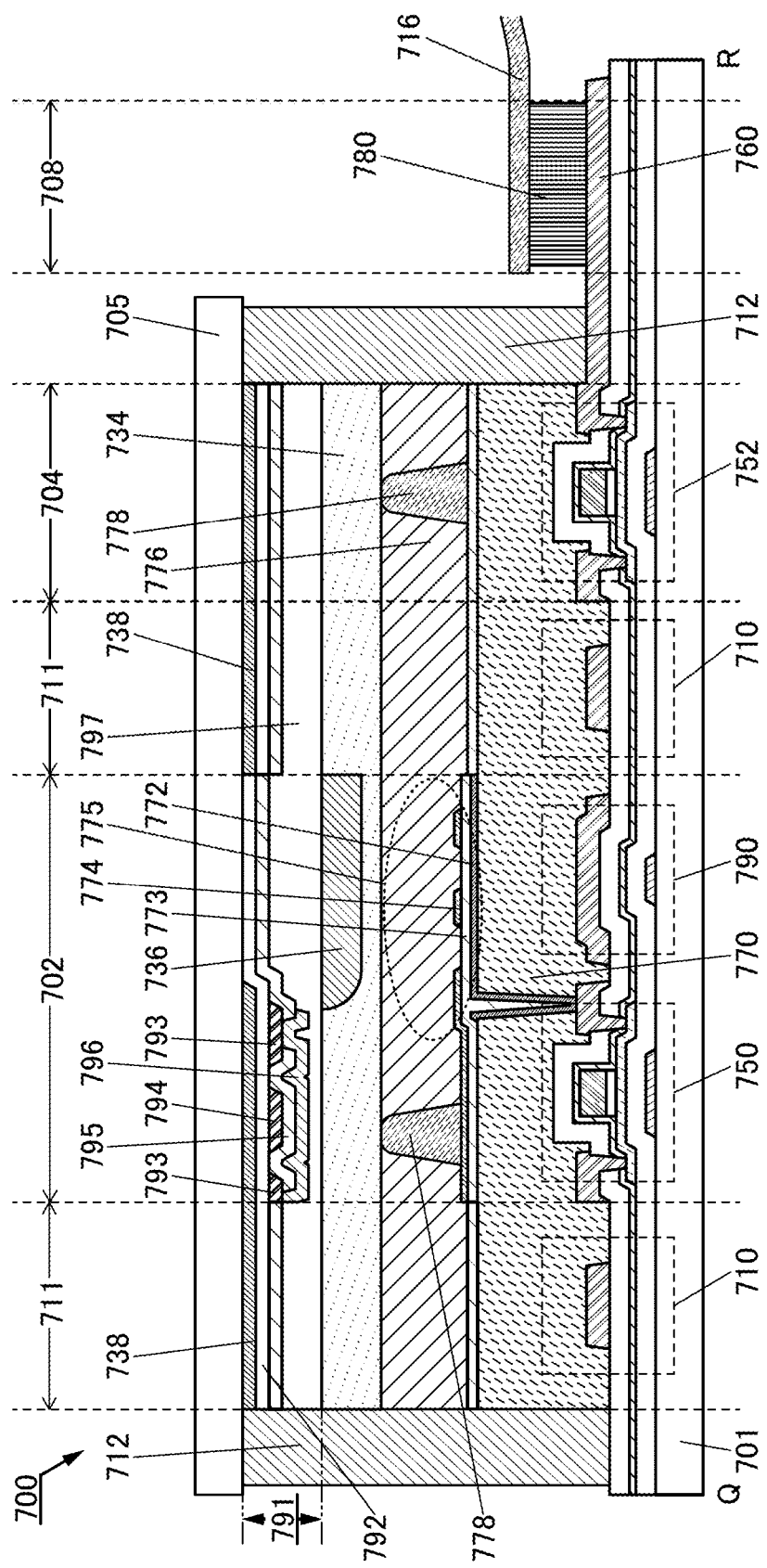
FIG. 56 is a cross-sectional view illustrating one embodiment of a display device.
Figure 57:
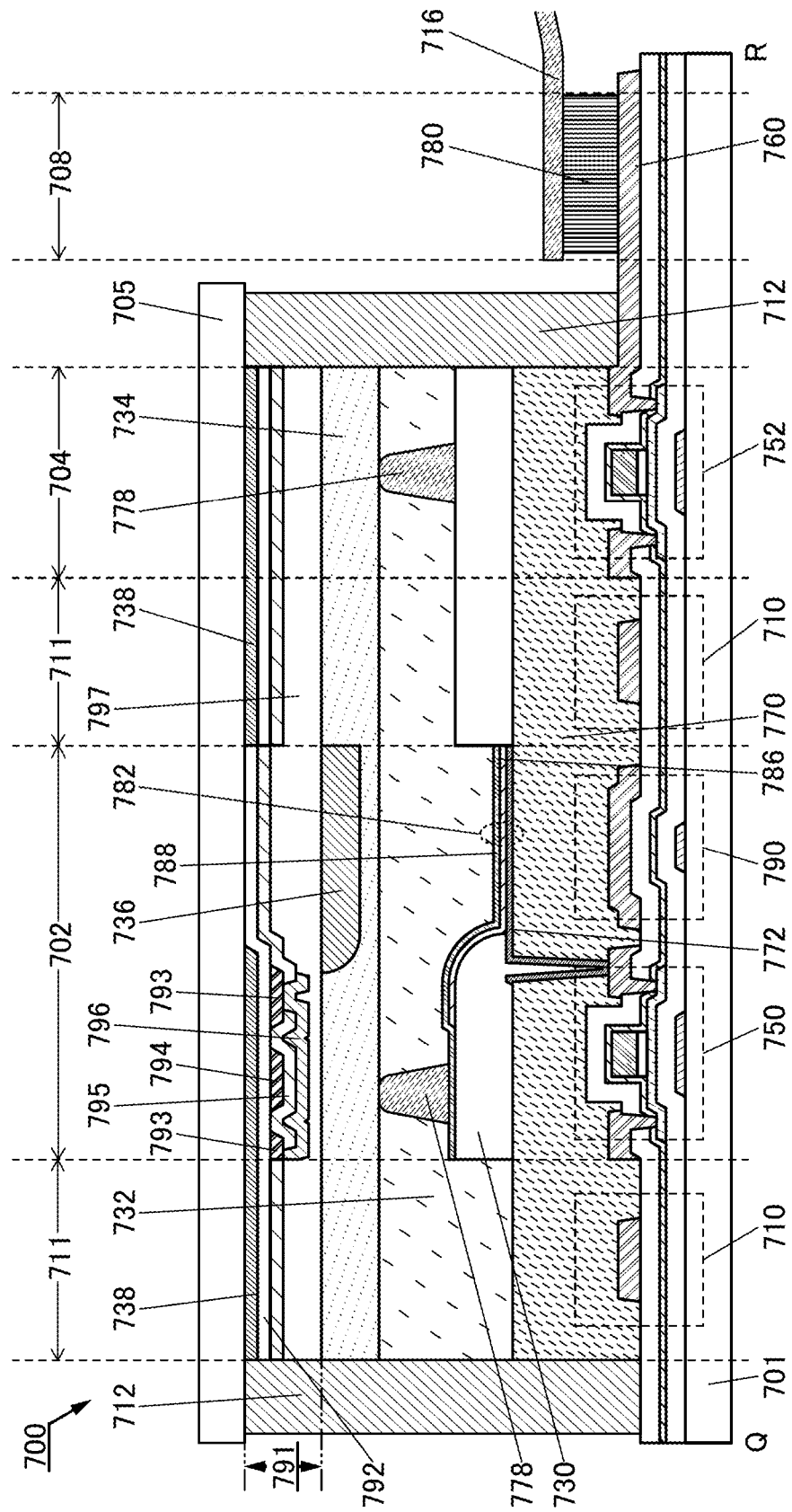
FIG. 57 is a cross-sectional view illustrating one embodiment of a display device.

FIG. 56 illustrates a structure in which the display device 700 illustrated in FIG. 54 includes a touch panel 791. FIG. 57 illustrates a structure in which the display device 700 illustrated in FIG. 55 includes the touch panel 791.

FIG. 56 is a cross-sectional view of the structure in which the touch panel 791 is provided in the display device 700 illustrated in FIG. 54, and FIG. 57 is a cross-sectional view of the structure in which the touch panel 791 is provided in the display device 700 illustrated in FIG. 55.

First, the touch panel 791 illustrated in FIG. 56 and FIG. 57 is described below.

The touch panel 791 illustrated in FIG. 56 and FIG. 57 is what is called an in-cell touch panel provided between the substrate 705 and the coloring film 736. The touch panel 791 is formed on the substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. A change in the mutual capacitance between the electrodes 793 and 794 can be detected when an object such as a finger or a stylus approaches, for example.

A portion in which the electrode 793 intersects with the electrode 794 is illustrated in the upper portion of the transistor 750 illustrated in FIG. 56 and FIG. 57. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 56 and FIG. 57 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 56, it is preferable that the electrode 793 not overlap with the light-emitting element 782. As illustrated in FIG. 57, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/sq. and less than or equal to 100 Ω/sq.

Although the structure of the in-cell touch panel is illustrated in FIG. 56 and FIG. 57, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

At least part of this embodiment can be implemented in combination with any of the other embodiments described in this specification as appropriate.

Embodiment 4

In this embodiment, a display device including a semiconductor device of one embodiment of the present invention is described with reference to FIGS. 60A to 60C.
<4. Circuit Configuration of Display Device>

A display device illustrated in FIG. 60A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 60A:
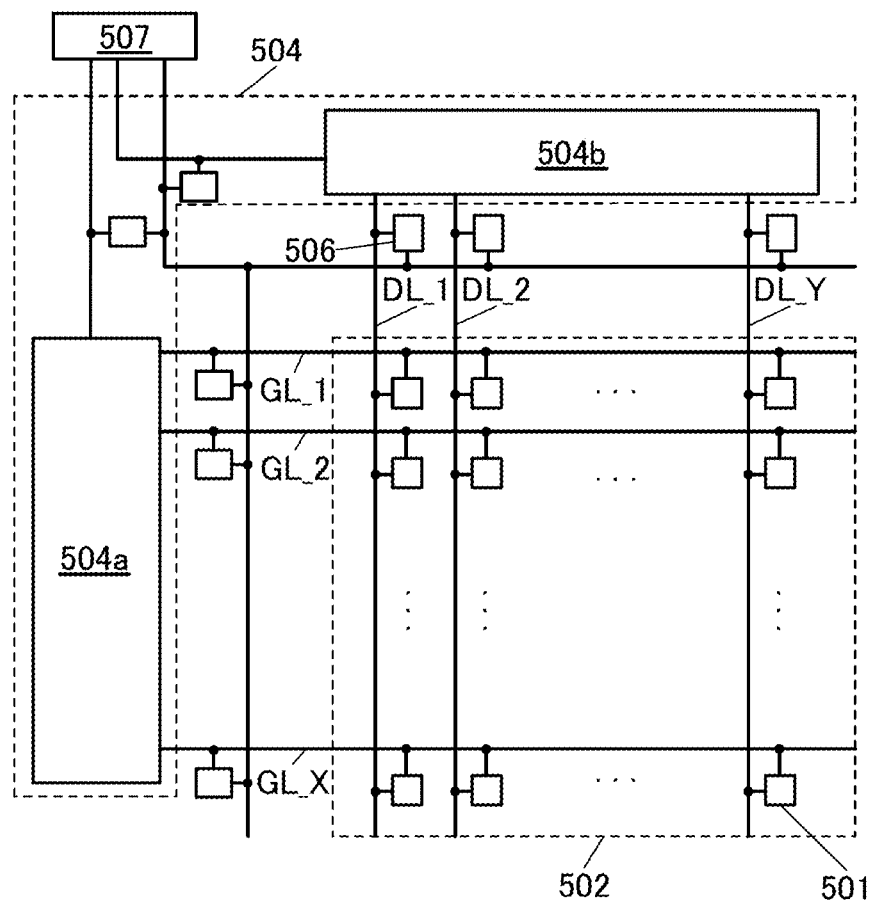
FIGS. 60A to 60C are a block diagram and circuit diagrams illustrating a display device.

The protection circuit 506 in FIG. 60A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 60A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 60A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 60B:
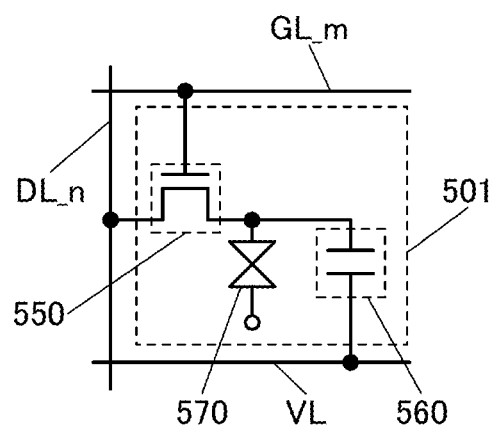

Each of the plurality of pixel circuits 501 in FIG. 60A can have the configuration illustrated in FIG. 60B, for example.

The pixel circuit 501 in FIG. 60B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 60B, the gate driver 504a in FIG. 60A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 60C:
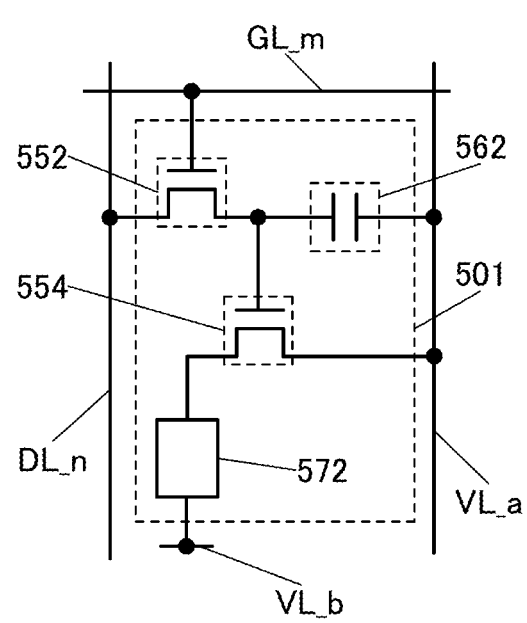

Alternatively, each of the plurality of pixel circuits 501 in FIG. 60A can have the configuration illustrated in FIG. 60C, for example.

The pixel circuit 501 in FIG. 60C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 60C, the gate driver 504a in FIG. 60A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 5

In this embodiment, a display module and electronic devices, each of which includes a semiconductor device of one embodiment of the present invention, are described with reference to FIG. 61, FIGS. 62A to 62E, FIGS. 63A to 63G, FIGS. 64A to 64E, FIGS. 65A and 65B, and FIGS. 66A and 66B.

<5-1. Display Module>

Figure 61:
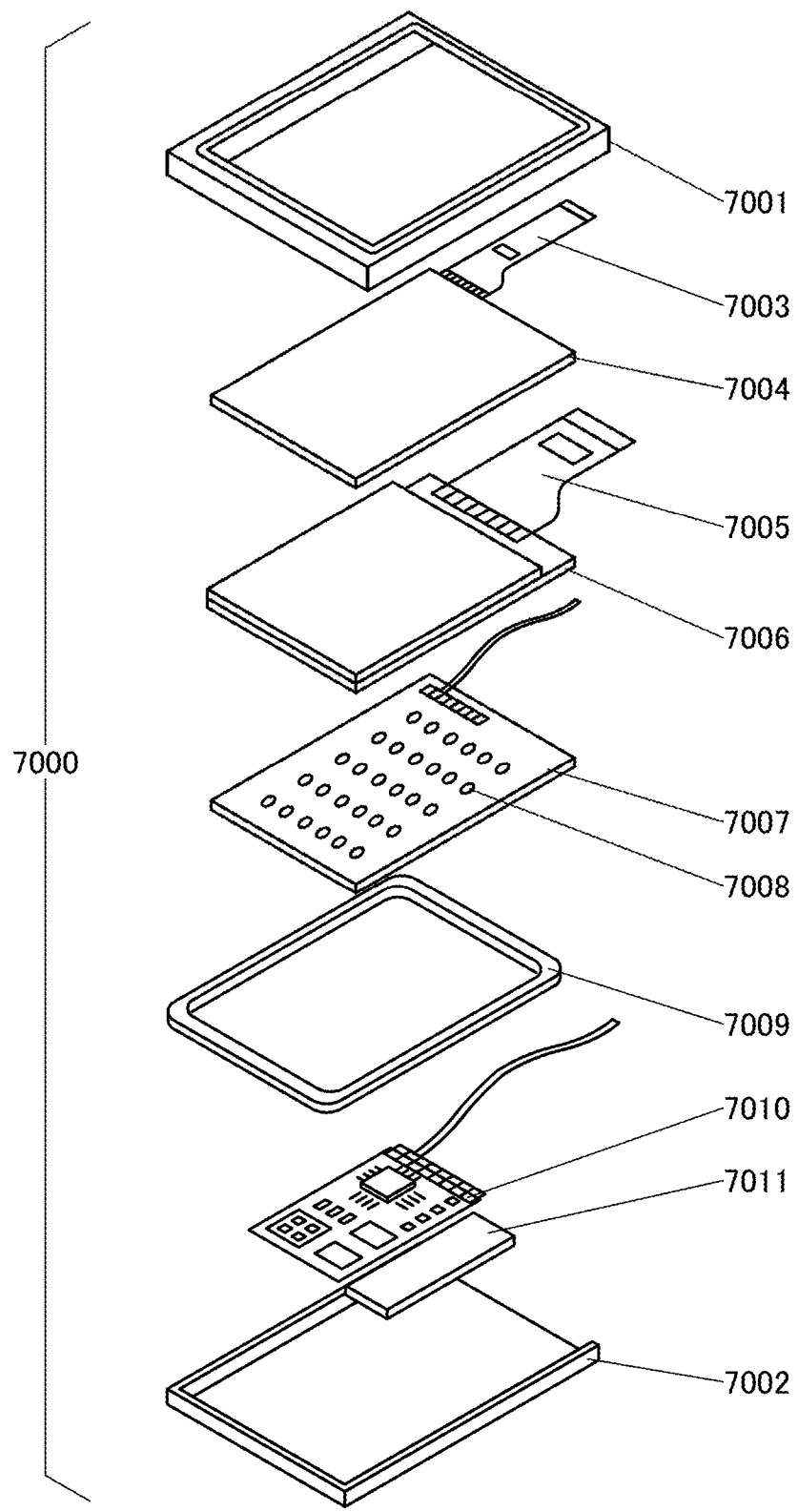
FIG. 61 illustrates a display module.

In a display module 7000 illustrated in FIG. 61, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 61, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<5-2. Electronic Device 1>

Next, FIGS. 62A to 62E illustrate examples of electronic devices.

Figure 62A:
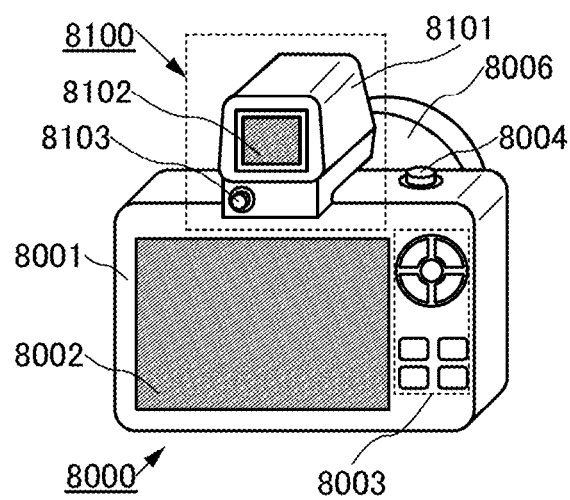
FIGS. 62A to 62E illustrate electronic devices.

FIG. 62A is an external view of a camera 8000 to which a finder 8100 is attached.

The camera 8000 includes a housing 8001, a display portion 8002, operation buttons 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 62A, the housing 8001 of the camera 8000 may include a finder having a display device.

Figure 62B:
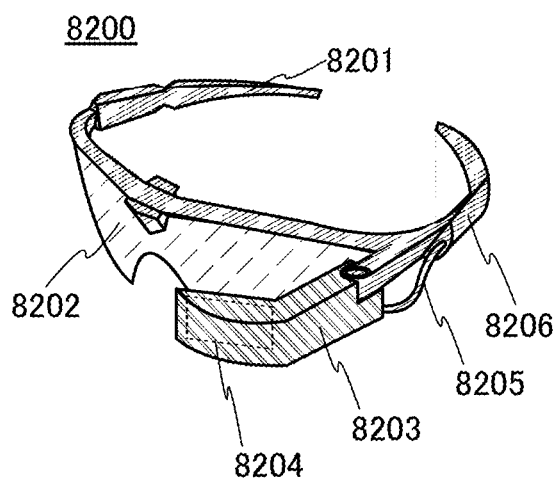

FIG. 62B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion

8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 62C:
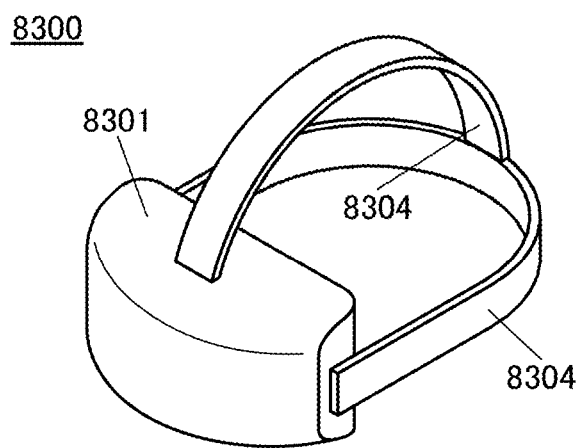
Figure 62D:
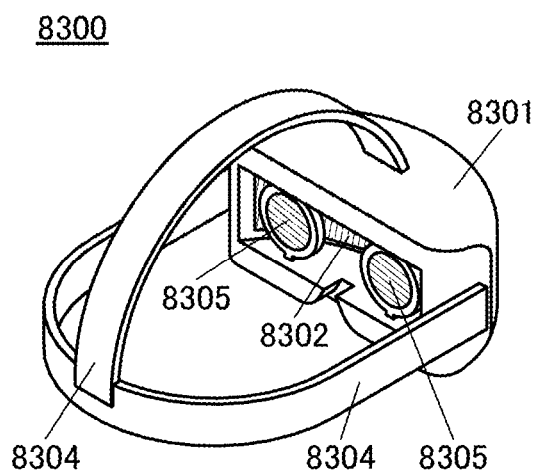
Figure 62E:
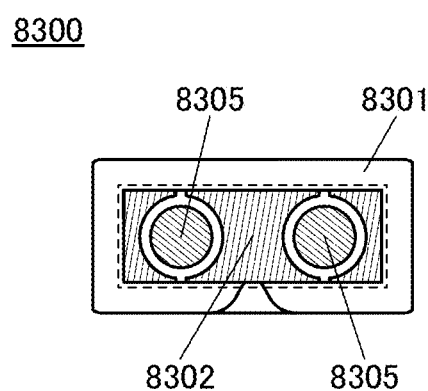

FIGS. 62C to 62E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 62E, the user does not perceive pixels, and thus a more realistic image can be displayed.

<5-3. Electronic Device 2>

Next, FIGS. 63A to 63G and FIGS. 64A to 64E illustrate examples of electronic devices that are different from those illustrated in FIGS. 62A to 62E.

Electronic devices illustrated in FIGS. 63A to 63G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 63A to 63G and FIGS. 64A to 64E have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 63A to 63G and FIGS. 64A to 64E are not limited thereto, and the electronic devices can have a variety of functions. Although not illustrated in FIGS. 63A to 63G and FIGS. 64A to 64E, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 63A to 63G and FIGS. 64A to 64E are described in detail below.

Figure 63A:
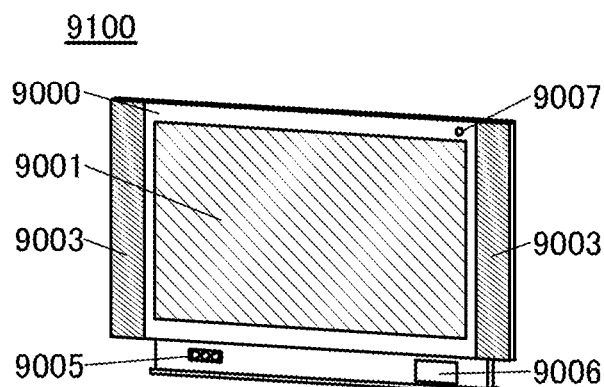
FIGS. 63A to 63G illustrate electronic devices.

FIG. 63A is a perspective view illustrating a television device 9100. The television device 9100 can include the display portion 9001 having a large screen size of, for example, 50 inches or more, or 100 inches or more.

Figure 63D:
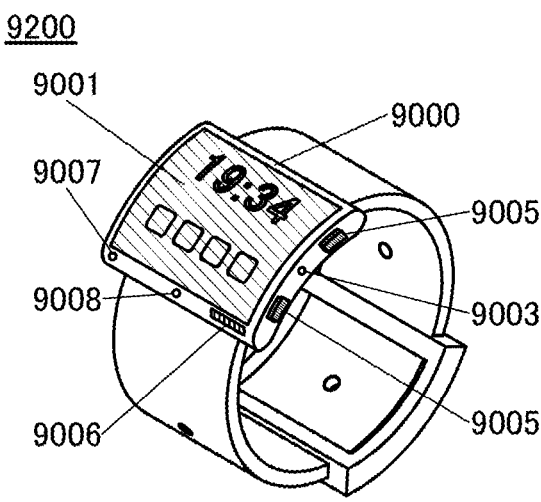
Figure 63B:
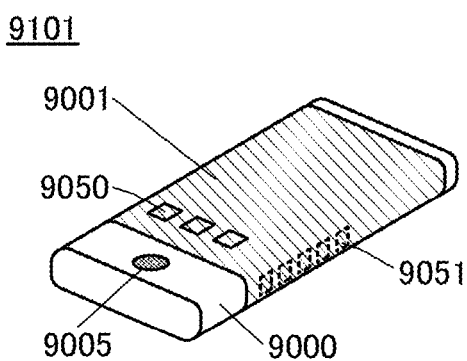

FIG. 63B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 63E:
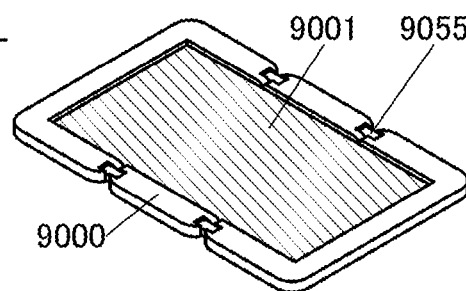
Figure 63C:
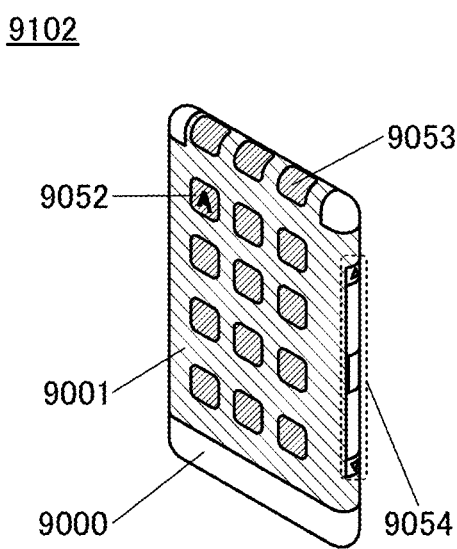

FIG. 63C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 63D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 63F:
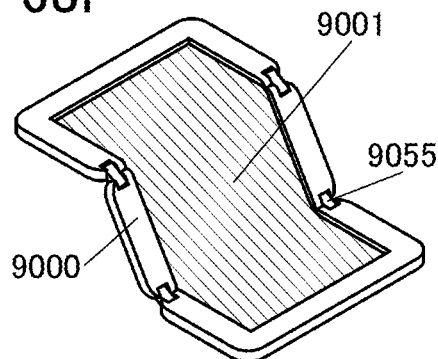
Figure 63G:
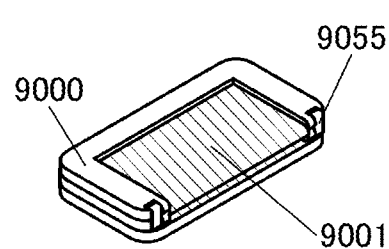

FIGS. 63E, 63F, and 63G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 64A:
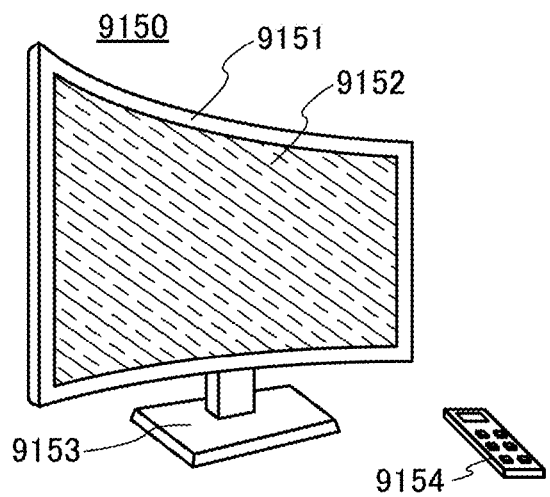
FIGS. 64A to 64E illustrate electronic devices.

FIG. 64A is a perspective view of a television device 9150 that is different from the television device shown in FIG. 63A. In the television device 9150, a display portion 9152 is incorporated in a housing 9151. Here, the housing 9151 is supported by a stand 9153. In the television device 9150, the display portion 9152 and the housing 9151 are formed unlike in the television device 9100.

The television device 9150 illustrated in FIG. 64A can be operated with an operation switch of the housing 9151 or a separate remote controller 9154. The display portion 9152 may include a touch sensor, and can be operated by touch on the display portion 9152 with a finger or the like. The remote controller 9154 may be provided with a display portion for displaying data output from the remote controller 9154. With operation keys or a touch panel of the remote controller 9154, channels and volume can be controlled and images displayed on the display portion 9152 can be controlled.

Note that the television device 9150 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 64B:
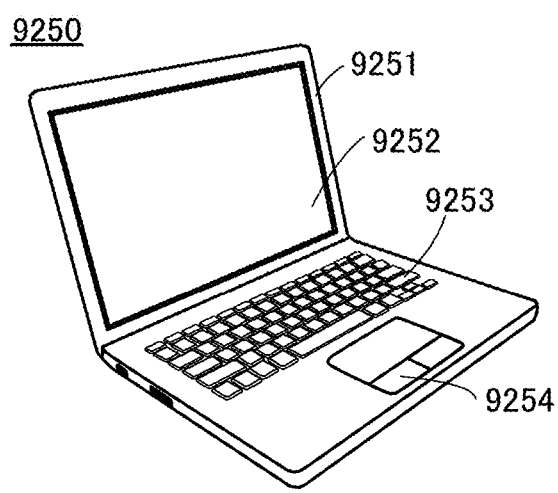

FIG. 64B is a perspective view illustrating a notebook personal computer 9250. The notebook personal computer 9250 includes a housing 9251, a display portion 9252, a keyboard 9253, a pointing device 9254, and the like.

Figure 64C:
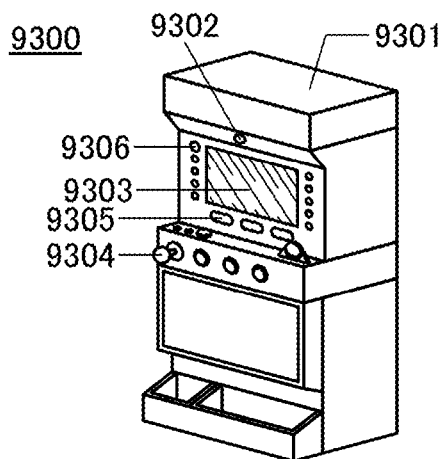

FIG. 64C is a perspective view showing a slot machine 9300 that is a stationary game machine. In the slot machine 9300, a display portion 9303 is incorporated in a housing 9301. In addition, the slot machine 9300 includes an operation means such as a start lever 9304 or a stop switch 9305, a coin slot, a speaker, a light source 9306 for a sensor, a sensor 9302, and the like.

Figure 64D:
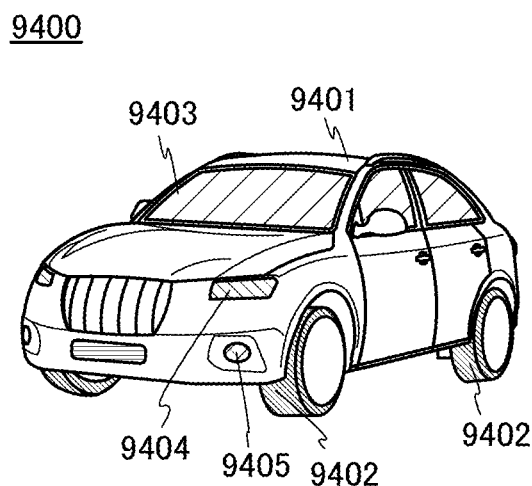
Figure 64E:
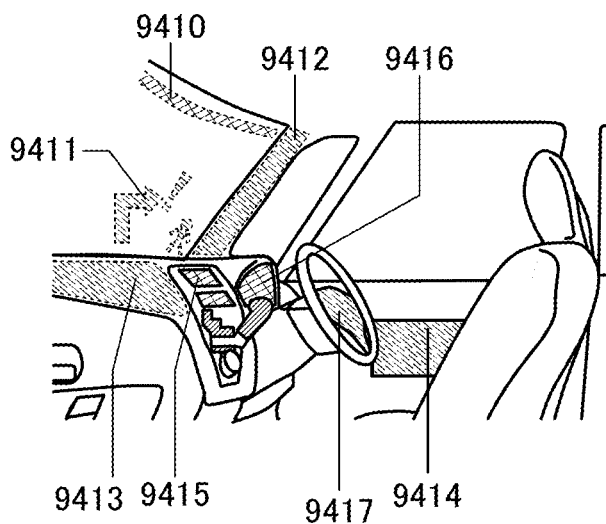

FIG. 64D is an external view of an automobile 9400. FIG. 64E illustrates a driver's seat of the automobile 9400. The automobile 9400 includes a car body 9401, wheels 9402, a windshield 9403, lights 9404, fog lamps 9405, and the like.

The display device of one embodiment of the present invention can be used in a display portion or the like of the automobile 9400. For example, the display device of one embodiment of the present invention can be used in display portions 9410 to 9417 illustrated in FIG. 64E.

The display portion 9410 and the display portion 9411 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 9400. Therefore, the display device of one embodiment of the present invention can be provided in the windshield of the automobile 9400. Note that in the case where a transistor or the like is provided in the display device, a transistor having light-transmitting properties, such as an organic transistor using an organic semiconductor material or a transistor using an oxide semiconductor, is preferably used.

The display portion 9412 is provided on a pillar portion. The display portion 9413 is provided on a dashboard. For example, an image taken by an imaging unit provided in the car body is displayed on the display portion 9412, whereby the view hindered by the pillar portion can be compensated. Similarly, the display portion 9413 can compensate for the view hindered by the dashboard and the display portion 9414 can compensate for the view hindered by the door. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

The display portion 9417 is provided in a steering wheel. The display portion 9415, the display portion 9416, or the display portion 9417 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9410 to 9414.

The display portions 9410 to 9417 can also be used as lighting devices.

Figure 65A:
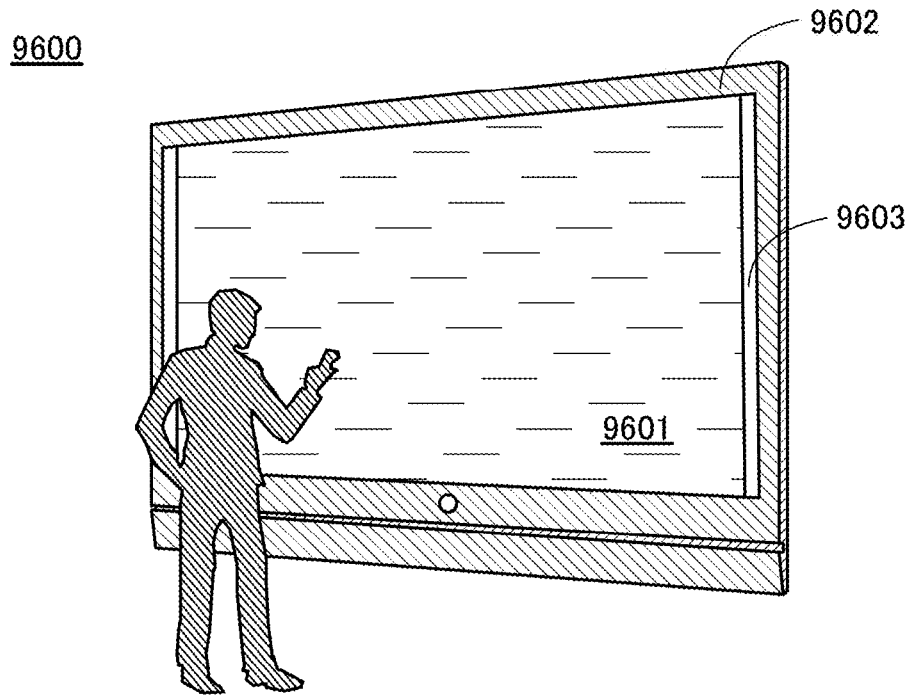
FIGS. 65A and 65B are perspective views illustrating a display device.
Figure 65B:
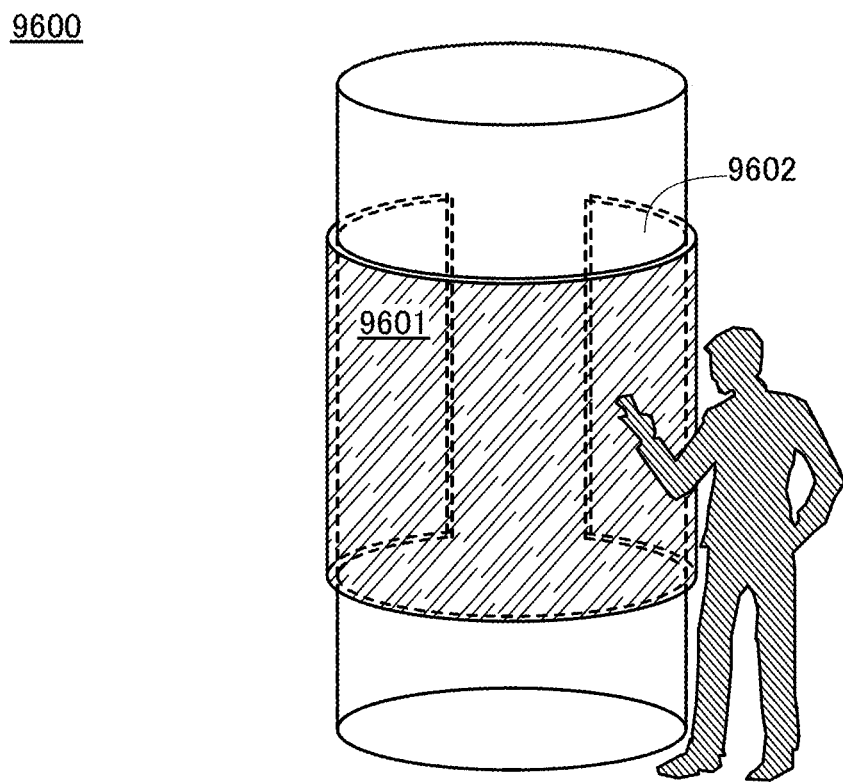

FIG. 65A is a perspective view illustrating a digital signage 9600. The digital signage 9600 can include a display portion 9601, a housing 9602, and a speaker 9603. As shown in FIG. 65B, the digital signage 9600 may be mounted on a cylindrical pillar.

Figure 66A:
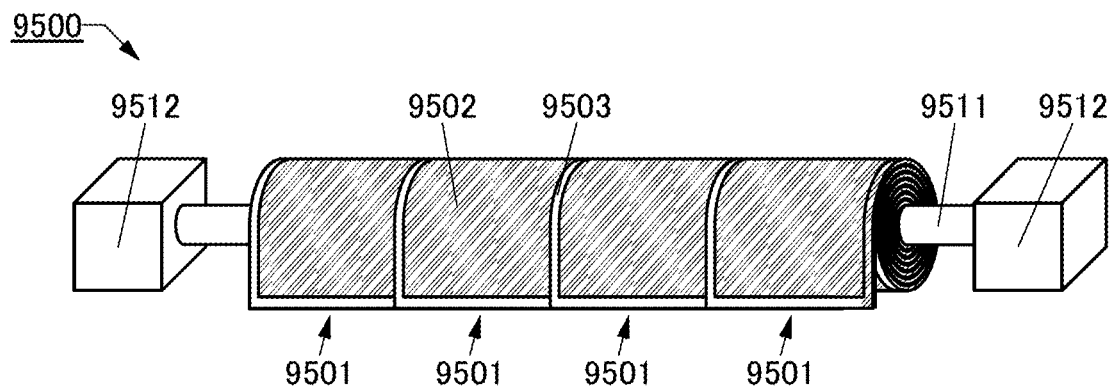
FIGS. 66A and 66B are perspective views illustrating a display device.
Figure 66B:
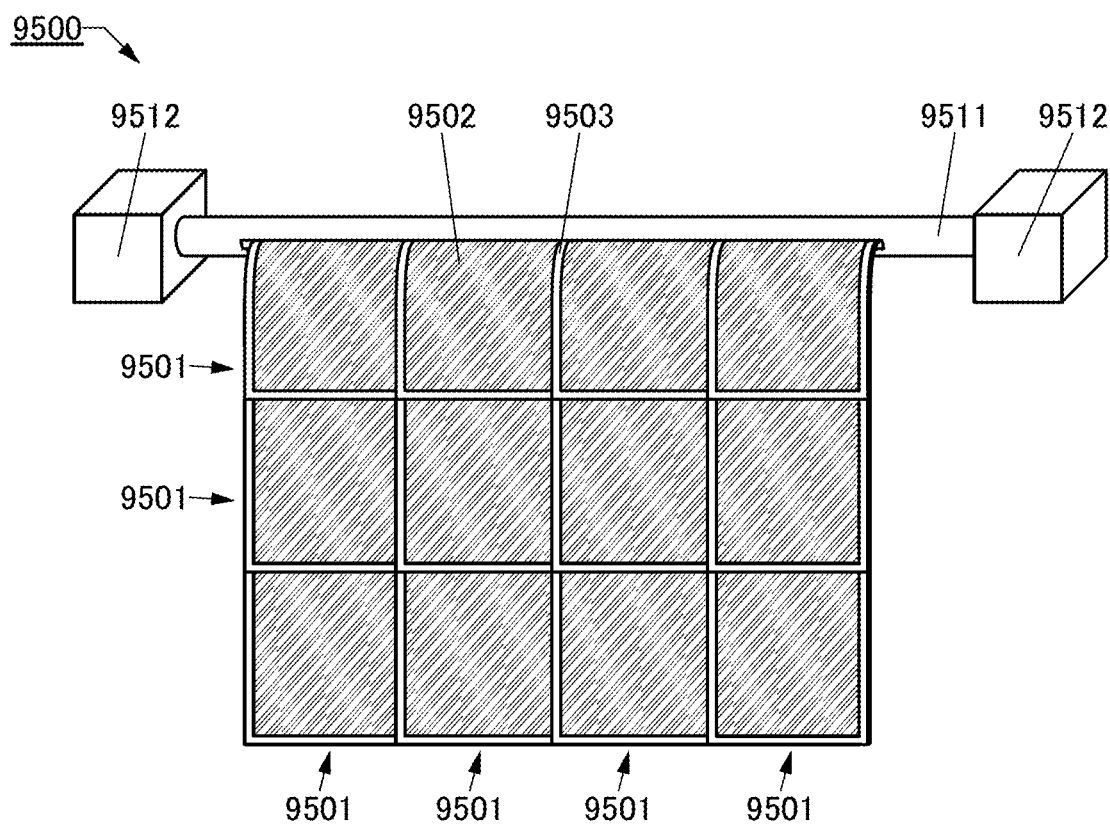

Next, an example of an electronic device that is different from the electronic devices illustrated in FIGS. 62A to 62E, FIGS. 63A to 63G, and FIGS. 64A to 64E is illustrated in FIGS. 66A and 66B. FIGS. 66A and 66B are perspective views of a display device including a plurality of display panels. Note that the plurality of display panels are wound in the perspective view in FIG. 66A, and are unwound in the perspective view in FIG. 66B.

A display device 9500 illustrated in FIGS. 66A and 66B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

The display device shown in FIGS. 66A and 66B can easily have a large screen and thus be used also as the above digital signage.

Moreover, although the display regions 9502 of the adjacent display panels 9501 are separated from each other in FIGS. 66A and 66B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments described in this specification as appropriate.

Embodiment 6

In this embodiment, one mode of a semiconductor device is described with reference to FIGS. 67A and 67B, FIG. 68, and FIG. 69.

Structure Examples

Figure 67A:
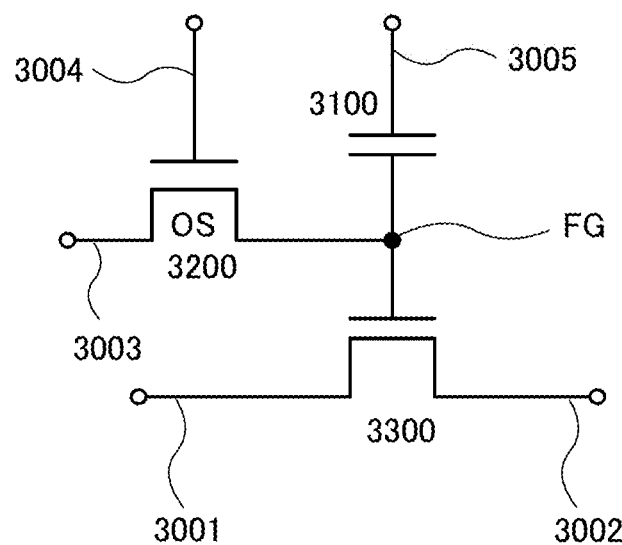
FIGS. 67A and 67B are each a circuit diagram of a semiconductor device of an embodiment.

Examples of a semiconductor device (memory device) including a capacitor of one embodiment of the present invention are illustrated in FIGS. 67A and 67B, FIG. 68, and FIG. 69. Note that FIG. 67A is a circuit diagram corresponding to each of FIG. 68 and FIG. 69.

<Circuit Configuration of Semiconductor Device>

Figure 68:
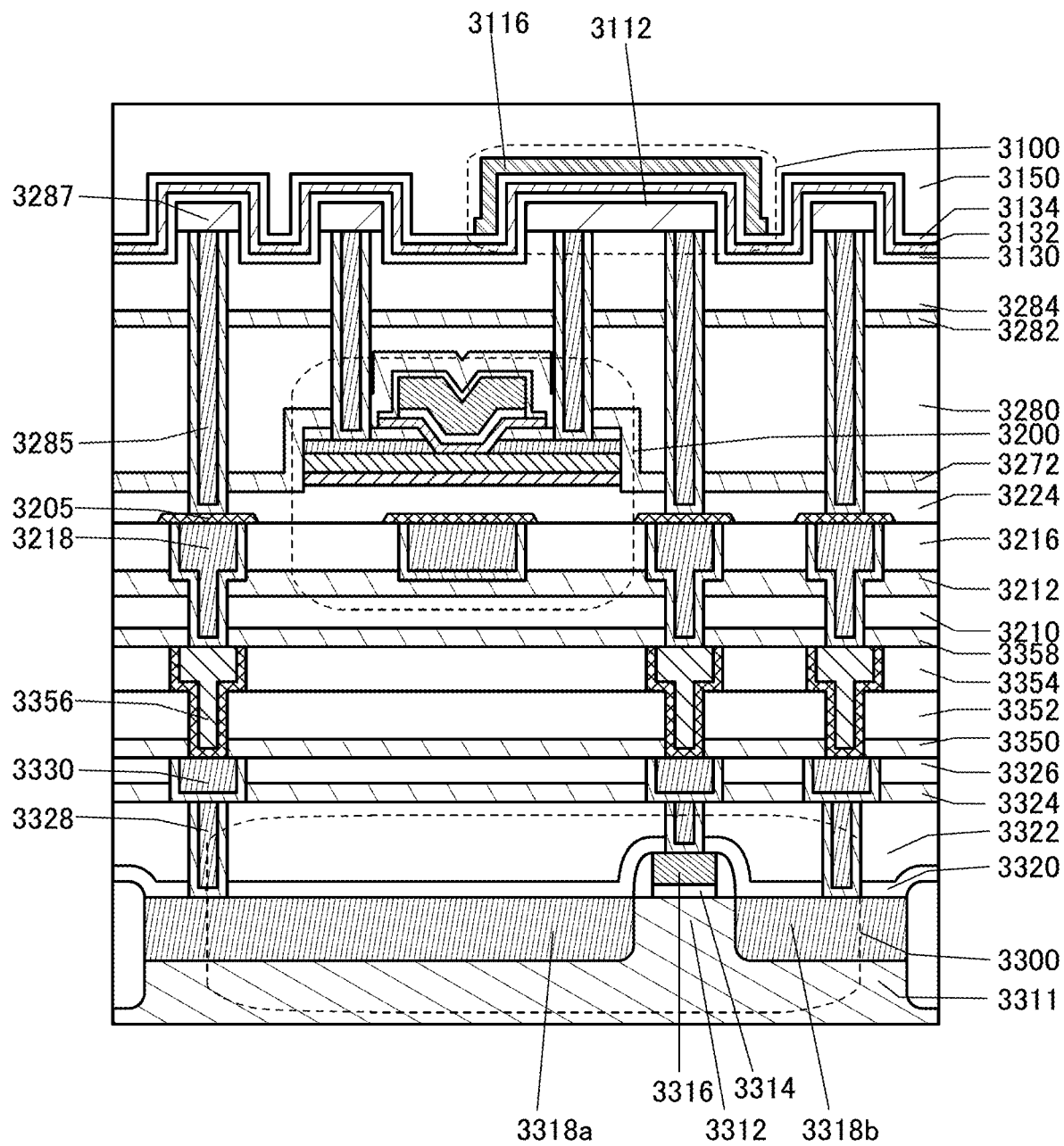
FIG. 68 illustrates a cross-sectional structure of a semiconductor device of an embodiment.
Figure 69:
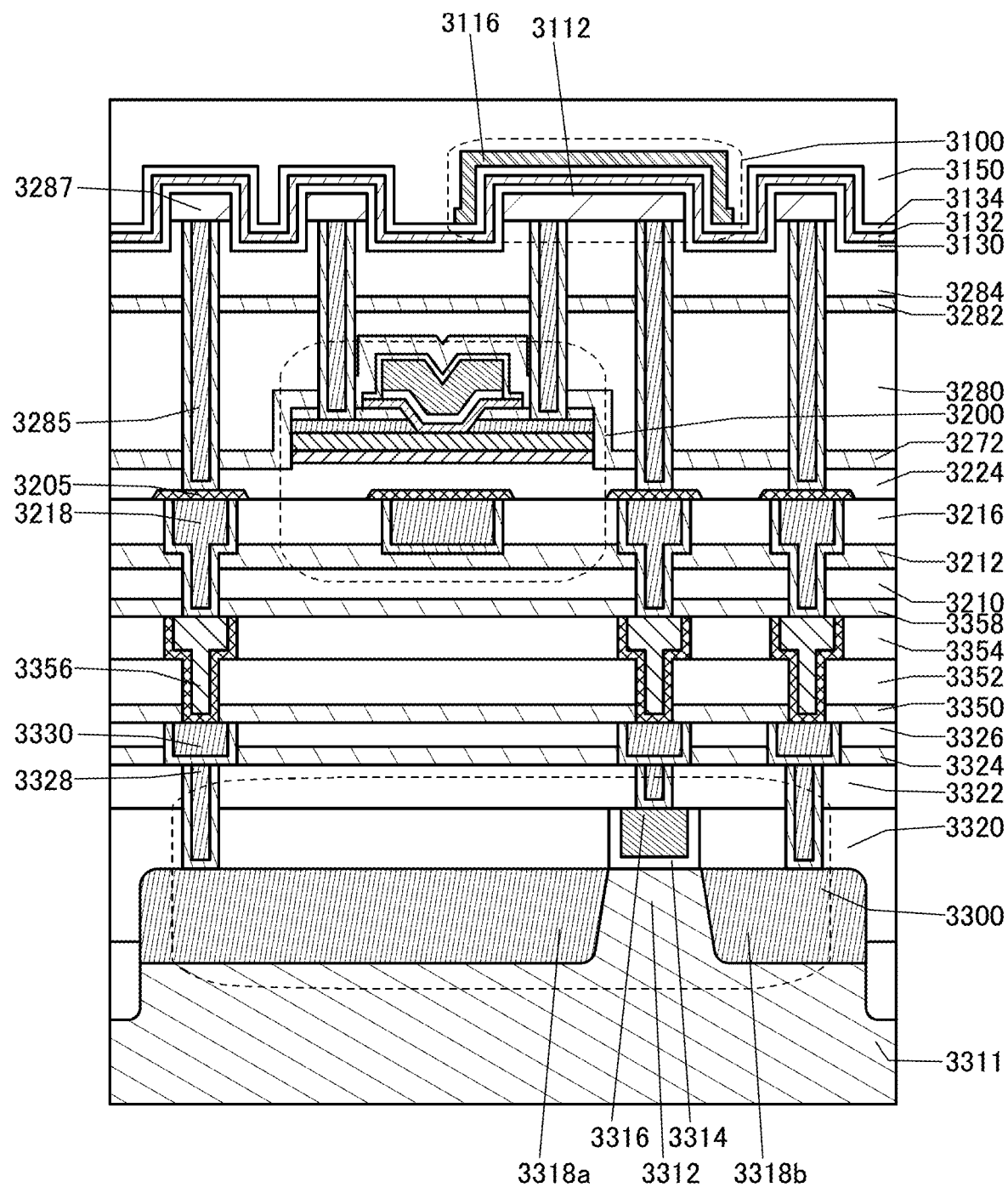
FIG. 69 illustrates a cross-sectional structure of a semiconductor device of an embodiment.

Semiconductor devices illustrated in FIG. 67A, FIG. 68, and FIG. 69 each include a transistor 3300, a transistor 3200, and a capacitor 3100.

The transistor 3200 is a transistor in which a channel is formed in a semiconductor layer including an oxide semiconductor. Since the off-state current of the transistor 3200 is small, by using the transistor 3200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 67A, a first wiring 3001 is electrically connected to a source of the transistor 3300. A second wiring 3002 is electrically connected to a drain of the transistor 3300. A third wiring 3003 is electrically connected to one of a source and a drain of the transistor 3200. A fourth wiring 3004 is electrically connected to a gate of the transistor 3200. A gate of the transistor 3300 and the other of the source and the drain of the transistor 3200 are electrically connected to one electrode of the capacitor 3100. A fifth wiring 3005 is electrically connected to the other electrode of the capacitor 3100.

The semiconductor device in FIG. 67A has a feature that the potential of the gate of the transistor 3300 can be retained, and thus enables writing, retaining, and reading of data as follows.

Writing and retaining of data will be described. First, the potential of the fourth wiring 3004 is set to a potential at which the transistor 3200 is turned on, so that the transistor 3200 is turned on. Accordingly, the potential of the third wiring 3003 is supplied to a node FG where the gate of the transistor 3300 and the one electrode of the capacitor 3100 are electrically connected to each other. That is, a predetermined charge is supplied to the gate of the transistor 3300 (writing). Here, one of two kinds of charges providing different potential levels (hereinafter referred to as a low-level charge and a high-level charge) is supplied. After that, the potential of the fourth wiring 3004 is set to a potential at which the transistor 3200 is turned off, so that the transistor 3200 is turned off. Thus, the charge is retained at the node FG (retaining).

In the case where the off-state current of the transistor 3200 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3300, an apparent threshold voltage $V_{th\_H}$ at the time when the high-level electric charge is given to the gate of the transistor 3300 is lower than an apparent threshold voltage $V_{th\_L}$ at the time when the low-level electric charge is given to the gate of the transistor 3300. Here, an apparent threshold voltage refers to the potential of the fifth wiring 3005 which is needed to make the transistor 3300 be in an on state. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3300 is brought into an on state. On the other hand, in the case where the low-level charge is supplied to the node FG in writing, even when the potential of the fifth wiring 3005 is $V_0$ ($<V_{th\_L}$), the transistor 3300 remains in the off state. Thus, the data retained in the node FG can be read by determining the potential of the second wiring 3002.

By arranging semiconductor devices each having the structure illustrated in FIG. 67A in a matrix, a memory device (memory cell array) can be formed.

Note that in the case where memory cells are arrayed, it is necessary that data of a desired memory cell is read in read operation. A configuration in which only data of a desired memory cell can be read by supplying a potential at which the transistor 3300 is turned off regardless of the charge supplied to the node FG, that is, a potential lower than $V_{th\_H}$ is supplied to the fifth wiring 3005 of memory cells from which data is not read may be employed. Alternatively, a configuration in which only data of a desired memory cell can be read by supplying a potential at which the transistor 3300 is turned on regardless of the charge supplied to the node FG, that is, a potential higher than $V_{th\_L}$ is supplied to the fifth wiring 3005 of memory cells from which data is not read may be employed.

<Circuit Configuration 2 of Semiconductor Device>

Figure 67B:
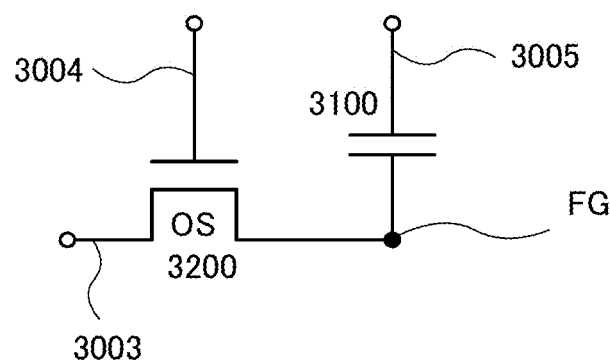

A semiconductor device in FIG. 67B is different from the semiconductor device in FIG. 67A in that the transistor 3300 is not provided. Also in this case, data can be written and retained in a manner similar to that of the semiconductor device in FIG. 67A.

Reading of data in the semiconductor device in FIG. 67B is described. When the transistor 3200 is brought into an on state, the third wiring 3003 which is in a floating state and the capacitor 3100 are brought into conduction, and the electric charge is redistributed between the third wiring 3003 and the capacitor 3100. As a result, the potential of the third wiring 3003 changes. The amount of change in the potential of the third wiring 3003 varies depending on the potential of the one electrode of the capacitor 3100 (or the electric charge accumulated in the capacitor 3100).

For example, the potential of the third wiring 3003 after the charge redistribution is $(C_B \times V_{B0} + C \times V)/(C_B + C)$, where V is the potential of the one electrode of the capacitor 3100, C is the capacitance of the capacitor 3100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3100 is $V_1$ and $V_0(V_1>V_0)$, the potential of the third wiring 3003 in the case of retaining the potential $V_1$ $(=(C_B \times V_{B0}+C \times V_1)/(C_B+C))$ is higher than the potential of the third wiring 3003 in the case of retaining the potential $V_0(=(C_B \times V_{B0}+C \times V_0)/(C_B+C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3200.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure 1 of Semiconductor Device>

The semiconductor device of one embodiment of the present invention includes the transistor 3300, the transistor 3200, and the capacitor 3100 as shown in FIG. 68. The transistor 3200 is provided over the transistor 3300, and the capacitor 3100 is provided over the transistor 3300 and the transistor 3200.

The transistor 3300 is provided on a substrate 3311 and includes a conductor 3316, an insulator 3314, a semiconductor region 3312 that is part of the substrate 3311, and low-resistance regions 3318a and 3318b functioning as a source region and a drain region.

The transistor 3300 may be a p-channel transistor or an n-channel transistor.

It is preferable that a region of the semiconductor region 3312 where a channel is formed, a region in the vicinity thereof, the low-resistance regions 3318a and 3318b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 3300 may be a high-electron-mobility transistor (HEMT) with GaAs and GaAlAs or the like.

The low-resistance regions 3318a and 3318b contain an element which imparts n-type conductivity, such as arsenic or phosphorus, or an element which imparts p-type conductivity, such as boron, in addition to a semiconductor material used for the semiconductor region 3312.

The conductor 3316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 3300 shown in FIG. 68, the semiconductor region 3312 (part of the substrate 3311) in which a channel is formed includes a protruding portion. Furthermore, the conductor 3316 is provided to cover side and top surfaces of the semiconductor region 3312 with the insulator 3314 positioned therebetween. Note that the conductor 3316 may be formed using a material for adjusting the work function. The transistor 3300 having such a structure is also referred to as a FIN-type transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Note that the transistor 3300 shown in FIG. 68 is just an example and is not limited to the structure shown therein; an appropriate transistor may be used in accordance with a circuit configuration or a driving method. For example, the transistor 3300 may be a planar transistor to be described later. In the case of using the circuit configuration shown in FIG. 67B, the transistor 3300 may be omitted.

An insulator 3320, an insulator 3322, an insulator 3324, and an insulator 3326 are stacked sequentially and cover the transistor 3300.

The insulator 3320, the insulator 3322, the insulator 3324, and the insulator 3326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 3322 functions as a planarization film for eliminating a level difference caused by the transistor 3300 or the like underlying the insulator 3322. A top surface of the insulator 3322 may be planarized by planarization treatment using a CMP method or the like to increase the level of planarity.

The insulator 3324 is preferably formed using, for example, a film having a barrier property that prevents hydrogen or impurities from diffusing from the substrate 3311, the transistor 3300, or the like into a region where the transistor 3200 is formed.

As an example of the film having a barrier property against hydrogen, silicon nitride formed by a CVD method can be given. Diffusion of hydrogen into a semiconductor element including an oxide semiconductor, such as the transistor 3200, degrades the characteristics of the semiconductor element in some cases. Therefore, a film that prevents hydrogen diffusion is preferably provided between the transistor 3200 and the transistor 3300. Specifically, the film that prevents hydrogen diffusion is a film from which hydrogen is less likely to be released.

The amount of released hydrogen can be measured by TDS, for example. The amount of hydrogen released from the insulator 3324 that is converted into hydrogen atoms per area of the insulator 3324 is less than or equal to $10 \times 10^{15}$ atoms/cm$^2$, preferably less than or equal to $5 \times 10^{15}$ atoms/cm$^2$ in TDS in the range of 50° C. to 500° C., for example.

Note that the relative dielectric constant of the insulator 3326 is preferably lower than that of the insulator 3324. For example, the relative dielectric constant of the insulator 3326 is preferably lower than 4, more preferably lower than 3. For example, the relative dielectric constant of the insulator 3324 is preferably 0.7 times or less that of the insulator 3326, more preferably 0.6 times or less that of the insulator 3326. In the case where a material with a low relative dielectric constant is used as an interlayer film, the parasitic capacitance between wirings can be reduced.

A conductor 3328, a conductor 3330, and the like that are electrically connected to the capacitor 3100 or the transistor 3200 are embedded in the insulator 3320, the insulator 3322, the insulator 3324, and the insulator 3326. Note that the conductor 3328 and the conductor 3330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 3328 and the conductor 3330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 3326 and the conductor 3330. For example, in FIG. 68, an insulator 3350, an insulator 3352, and an insulator 3354 are stacked sequentially. Furthermore, a conductor 3356 is formed in the insulator 3350, the insulator 3352, and the insulator 3354. The conductor 3356 functions as a plug or a wiring. Note that the conductor 3356 can be formed using a material similar to that used for forming the conductor 3328 and the conductor 3330.

Note that for example, the insulator 3350 is preferably formed using an insulator having a barrier property with respect to hydrogen, like the insulator 3324. Furthermore, the conductor 3356 preferably includes a conductor having a barrier property against hydrogen. The conductor having a barrier property against hydrogen is formed particularly in an opening of the insulator 3350 having a barrier property against hydrogen. In such a structure, the transistor 3300 and the transistor 3200 can be separated by a barrier layer, so that diffusion of hydrogen from the transistor 3300 to the transistor 3200 can be prevented.

Note that as the conductor having a barrier property against hydrogen, tantalum nitride may be used, for example. By stacking tantalum nitride and tungsten, which has high conductivity, diffusion of hydrogen from the transistor 3300 can be prevented while the conductivity of a wiring is ensured. In this case, a tantalum nitride layer having a barrier property against hydrogen is preferably in contact with the insulator 3350 having a barrier property against hydrogen.

An insulator 3358, an insulator 3210, an insulator 3212, and an insulator 3216 are stacked sequentially over the insulator 3354. A material having a barrier property against oxygen and hydrogen is preferably used for one or all of the insulator 3358, the insulator 3210, the insulator 3212, and the insulator 3216.

The insulator 3358 and the insulator 3212 are preferably formed using, for example, a film having a barrier property that prevents hydrogen and impurities from diffusing from a region where the substrate 3311 or the transistor 3300 is formed or the like into a region where the transistor 3200 is formed. Therefore, the insulators 3358 and 3212 can be formed using a material similar to that used for forming the insulator 3324.

As an example of the film having a barrier property against hydrogen, silicon nitride formed by a CVD method can be given. Diffusion of hydrogen into a semiconductor element including an oxide semiconductor, such as the transistor 3200, degrades the characteristics of the semiconductor element in some cases. Therefore, a film that prevents hydrogen diffusion is preferably provided between the transistor 3200 and the transistor 3300. Specifically, the film that prevents hydrogen diffusion is a film from which hydrogen is less likely to be released.

For example, the insulators 3210 and 3216 can be formed using a material similar to that used for forming the insulator 3320. For example, a silicon oxide film, a silicon oxynitride film, or the like can be used as the insulator 3216.

A conductor 3218, a conductor forming the transistor 3200, and the like are embedded in the insulators 3358, 3210, 3212, and 3216. Note that the conductor 3218 functions as a plug or a wiring that is electrically connected to the capacitor 3100 or the transistor 3300. The conductor 3218 can be formed using a material similar to that used for forming the conductor 3328 and the conductor 3330.

In particular, part of the conductor 3218 which is in contact with the insulators 3358 and 3212 is preferably a conductor with a barrier property against oxygen, hydrogen, and water. When a conductor 3205 with a barrier property against oxygen, hydrogen, and water is provided to cover the conductor 3218, the transistors 3300 and 3200 can be completely separated by the layer with a barrier property against oxygen, hydrogen, and water. As a result, diffusion of hydrogen from the transistor 3300 to the transistor 3200 can be prevented.

An insulator 3224 is provided over the conductor 3205 and the insulator 3216. The insulator 3224 functions as a gate insulator of the transistor 3200. Although the insulator 3224 contains excess oxygen in some cases, the excess oxygen is blocked by the conductor 3205 with a barrier property against oxygen, hydrogen, and water; therefore, the excess oxygen can be prevented from diffusing to the conductor 3218, so that oxidation of the conductor 3218 can be prevented.

The transistor 3200 is provided over the insulator 3216. Note that, for example, the structure of the transistor described in the above embodiment can be used as the structure of the transistor 3200. Note that the transistor 3200 in FIG. 68 are just an example and is not limited to the structure shown therein; an appropriate transistor may be used in accordance with a circuit structure or a driving method.

An insulator 3272 and an insulator 3280 are provided over the transistor 3200. The insulator 3280 preferably includes oxide containing oxygen in excess of that in the stoichiometric composition. That is, in the insulator 3280, a region containing oxygen in excess of that in the stoichiometric composition (hereinafter also referred to as an oxygen-excess region) is preferably formed. In particular, in the case where an oxide semiconductor is used in the transistor 3200, when an insulator including an oxygen-excess region is provided in an interlayer film or the like in the vicinity of the transistor 3200, oxygen vacancies in the transistor 3200 are reduced, whereby the reliability can be improved.

As the insulator including the oxygen-excess region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS. Note that the temperature of the film surface in the TDS is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 3280 covering the transistor 3200 may function as a planarization film that covers a roughness thereunder. An insulator 3282 and an insulator 3284 are stacked sequentially over the insulator 3280.

A material having a barrier property against oxygen or hydrogen is preferably used for one or both of the insulator 3282 and the insulator 3284. Thus, the insulator 3282 can be formed using a material similar to that used for forming the insulator 3212. The insulator 3284 can be formed using an insulator similar to that used for forming the insulator 3212. The insulator 3284 can be formed using an insulator similar to that used for forming the insulator 3216.

For example, when the conductor 3285 is formed to have a layered structure, the conductor 3285 preferably includes a conductor with high oxidation resistance. In particular, a conductor with high oxidation resistance is preferably provided in a region in contact with the insulator 3280 including the oxygen-excess region. Such a structure can prevent the conductor 3285 from absorbing excess oxygen from the insulator 3280. Furthermore, the conductor 3285 preferably includes a conductor having a barrier property against hydrogen. In particular, a conductor having a barrier property against an impurity such as hydrogen is provided in a region in contact with the insulator 3280 including the oxygen-excess region, whereby diffusion of the impurity of the conductor 3285, diffusion of part of the conductor 3285, and diffusion of an impurity from the outside through the conductor 3285 can be prevented.

An conductor 3116 is provided over a conductor 3112 with insulators 3130, 3132, and 3134 positioned therebetween. Note that the conductor 3116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 3116 is formed concurrently with another component such as a conductor, Cu (copper), Al (aluminum), or the like which is a low-resistance metal material may be used.

As illustrated in FIG. 68, the conductor 3116 is provided to cover the top and side surfaces of the conductor 3112 with the insulators 3130, 3132, and 3134 positioned therebetween. That is, a capacitance is formed also on the side surface of the conductor 3112, so that a capacitance per projected area of a capacitor can be increased. Thus, the semiconductor device can be reduced in area, highly integrated, and miniaturized.

An insulator 3150 is provided over the conductor 3116 and the insulator 3134. The insulator 3150 can be formed using a material similar to that used for forming the insulator 3320. The insulator 3150 covering the capacitor 3100 may function as a planarization film that covers a roughness thereunder.

Note that in this structure, when the conductor 3112 is formed, it is preferable to remove the top surface of the insulator 3284 so that the depth of the removed part is greater than the total thickness of the insulators 3130, 3132, and 3134. For example, by performing over-etching treatment, part of the insulator 3284 can be removed concurrently. Furthermore, by forming the conductor 3112 or the like by over-etching treatment, etching can be performed without leaving an etching residue.

By changing the kind of etching gas in the etching treatment, part of the insulator 3284 can be removed efficiently.

After the conductor 3112 and the conductor 3287 are formed, part of the insulator 3284 may be removed using the conductor 3112 and the conductor 3287 as a hard mask, for example.

After the conductor 3112 is formed, a surface of the conductor 3112 may be subjected to cleaning treatment. By the cleaning treatment, an etching residue or the like can be removed.

In this structure, the transistor 3200 and the insulator 3216 including the oxygen-excess region can be positioned between the insulator 3212 and the insulator 3272. The insulators 3212 and 3272 have a barrier property that prevents diffusion of oxygen or impurities such as hydrogen and water.

Thus, oxygen released from the insulator 3216 and the transistor 3200 can be prevented from diffusing into the capacitor 3100 or the layer where the transistor 3300 is formed. Furthermore, impurities such as hydrogen and water can be prevented from diffusing from the layer over the insulator 3272 and the layer under the insulator 3212 into the transistor 3200.

That is, oxygen can be efficiently supplied from the oxygen-excess region of the insulator 3216 to the oxide where the channel is formed in the transistor 3200, so that oxygen vacancies can be reduced. Moreover, oxygen vacancies can be prevented from being formed by impurities in the oxide where the channel is formed in the transistor 3200. Thus, the oxide where a channel is formed in the transistor 3200 can be an oxide semiconductor with a low density of defect states and stable characteristics. That is, a change in electrical characteristics of the transistor 3200 can be prevented and the reliability can be improved.

In such a structure, the transistor 3200 and the insulator 3280 can be enclosed tightly. Thus, the oxide where the channel is formed in the transistor 3200 can be an oxide semiconductor with a low density of defect states and stable characteristics. That is, a change in electrical characteristics of the transistor 3200 can be prevented and the reliability can be improved.

Modification Example

FIG. 69 illustrates a modification example of this embodiment. FIG. 69 is different from FIG. 68 in the structure of the transistor 3300.

In the transistor 3300 illustrated in FIG. 69, the semiconductor region 3312 (part of the substrate 3311) in which the channel is formed has a protruding portion. Furthermore, the conductor 3316 is provided to cover the top and side surfaces of the semiconductor region 3312 with the insulator 3314 positioned therebetween. Note that the conductor 3316 may be formed using a material for adjusting the work function. The transistor 3300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

Embodiment 7

Figure 70:
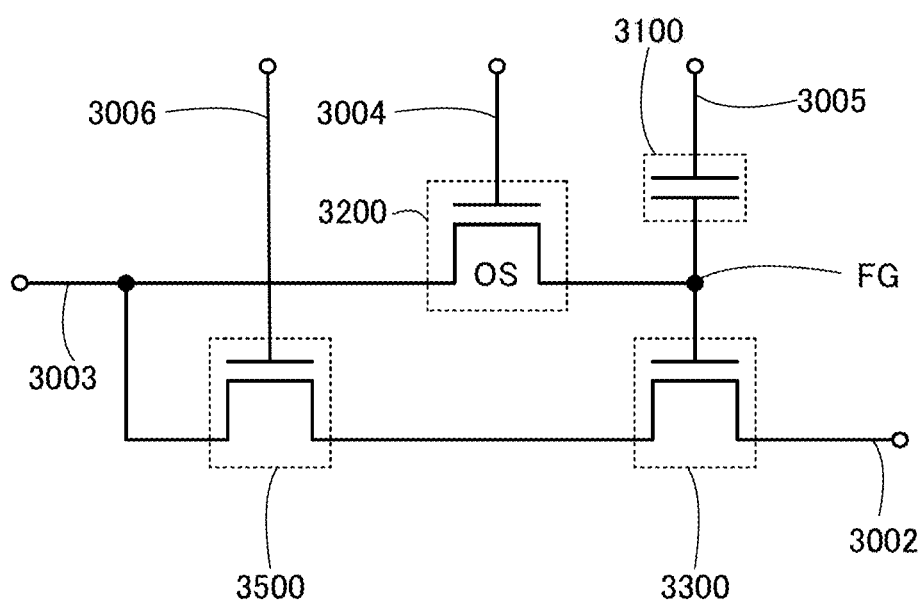
FIG. 70 is a circuit diagram illustrating a memory device of one embodiment of the present invention.

In this embodiment, an example of a circuit of a semiconductor device including the transistor of one embodiment of the present invention or the like will be described.
<Circuit>
Examples of a circuit of a semiconductor device including the transistor or the like of one embodiment of the present invention will be described with reference to FIG. 70 and FIG. 71.
<Memory Device 1>
The semiconductor device in FIG. 70 is different from the semiconductor device described in the above embodiment in that a transistor 3400 and a sixth wiring 3006 are included. Also in this case, data can be written and retained in a manner similar to that of the semiconductor device described in the above embodiment. A transistor similar to the transistor 3300 described above can be used as the transistor 3400.

The sixth wiring 3006 is electrically connected to a gate of the transistor 3400, one of a source and a drain of the transistor 3400 is electrically connected to a drain of the transistor 3300, and the other of the source and the drain of the transistor 3400 is electrically connected to the third wiring 3003.
<Memory Device 2>
A modification example of the semiconductor device (memory device) is described with reference to a circuit diagram in FIG. 71.

Figure 71:
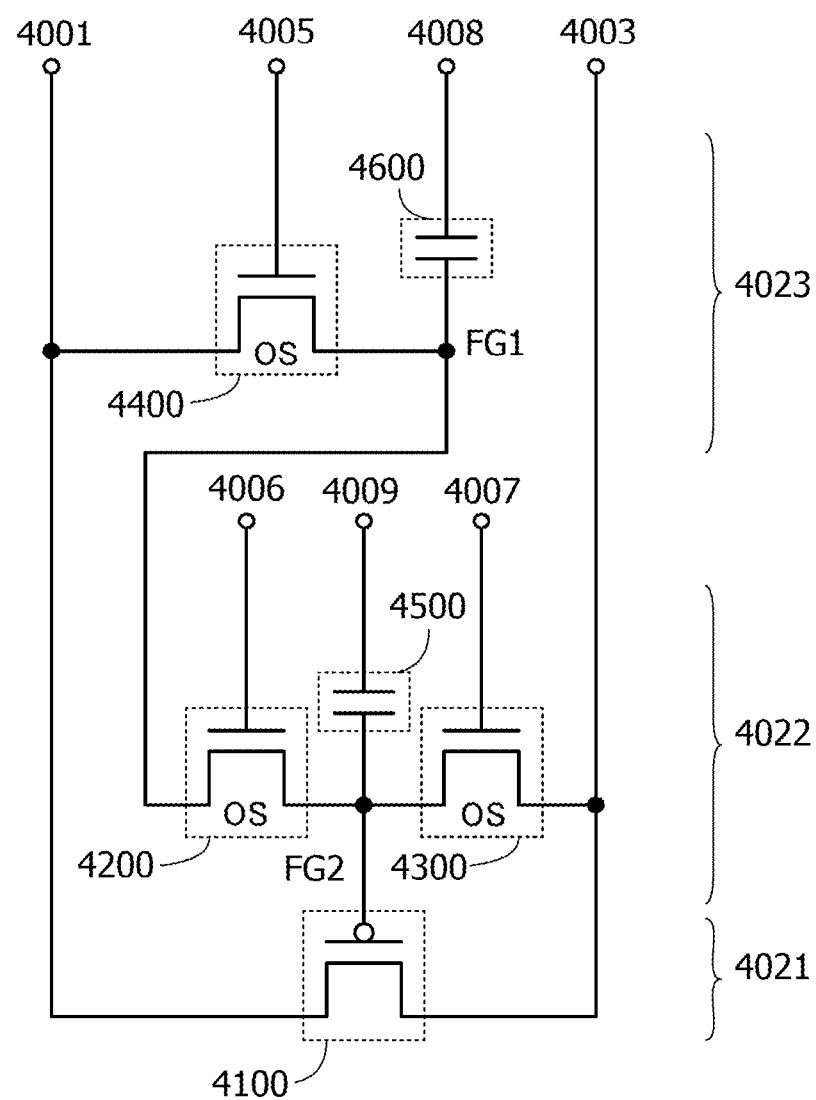
FIG. 71 is a circuit diagram illustrating a memory device of one embodiment of the present invention.

The semiconductor device illustrated in FIG. 71 includes transistors 4100, 4200, 4300, and 4400 and capacitors 4500 and 4600. Here, a transistor similar to the above-described transistor 3300 can be used as the transistor 4100, and transistors similar to the above-described transistor 3200 can be used as the transistors 4200 to 4400. Capacitors similar to the above-described capacitor 3100 can be used as the capacitors 4500 and 4600. Although not illustrated in FIG. 71, a plurality of the semiconductor devices in FIG. 71 are provided in a matrix. The semiconductor device in FIG. 71 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 71, the transistor 4100 may be an n-channel transistor.

The semiconductor device in FIG. 71 includes two data retention portions. For example, a first data retention portion retains a charge between one of a source and a drain of the transistor 4400, one electrode of the capacitor 4600, and one of a source and a drain of the transistor 4200 which are connected to a node FG1. A second data retention portion retains a charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining a charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. Some advantages of an OS transistor are that it has a low off-state current and can be manufactured to overlap with a transistor including silicon, for example. Although the transistors 4200, 4300, and 4400 are n-channel transistors in FIG. 71, the transistors 4200, 4300, and 4400 may be p-channel transistors.

The transistor 4200 and the transistor 4300 are preferably provided in a layer different from the layer where the transistor 4400 is provided even when the transistor 4200, the transistor 4300, and the transistor 4400 are transistors including oxide semiconductors. In other words, in the semiconductor device in FIG. 71, the transistor 4100, the transistor 4200 and the transistor 4300, and the transistor 4400 are preferably stacked. Layers including transistors may be stacked. That is, by integrating the transistors, the circuit area can be reduced, so that the size of the semiconductor device can be reduced.

Next, operation of writing data to the semiconductor device illustrated in FIG. 71 is described.

First, operation of writing a data voltage to the data retention portion connected to the node FG1 (hereinafter referred to as writing operation 1) is described. In the following description, the data voltage written to the data retention portion connected to the node FG1 is referred to as $V_{D1}$, and the threshold voltage of the transistor 4100 is referred to as $V_{th}$.

In the writing operation 1, the wiring 4003 is set at $V_{D1}$, and after the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. By the current flow, the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 reaches the threshold voltage $V_{th}$ of the transistor 4100, the current flowing through the transistor 4100 is decreased. Accordingly, the increase in the potentials of the wiring 4001 and the nodes FG1 and FG2 is stopped, so that the potentials of the nodes FG1 and FG2 are fixed at "$V_{D1}-V_{th}$," which is lower than $V_{D1}$ by $V_{th}$.

In other words, when a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing a data voltage to the data retention portion connected to the node FG2 (hereinafter referred to as writing operation 2) is described. In the following description, the data voltage written to the data retention portion connected to the node FG2 is referred to as $V_{D2}$.

In the writing operation 2, the wiring 4001 is set at $V_{D2}$, and after the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is also decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, the increase in the potentials of the wiring 4003 and the node FG2 is stopped, so that the potential of the node FG2 is fixed at "$V_{D2}-V_{th}$," which is lower than $V_{D2}$ by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 71, after data voltages are written to the plurality of data retention portions, the wiring 4009 is set at the high level, so that the potentials of the nodes FG1 and FG2 are increased. Then, the transistors are turned off to stop the movement of charge; thus, the written data voltages are retained.

By the above-described writing operations of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 71 is described.

First, operation of reading a data voltage from the data retention portion connected to the node FG2 (hereinafter referred to as reading operation 1) is described.

In the reading operation 1, the wiring 4003 which is brought into an electrically floating state after precharge is discharged. The wirings 4005 to 4008 are set at the low level. When the wiring 4009 is set at the low level, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$," which is higher than the potential "$V_{D2}-V_{th}$" of the node FG2 by $V_{th}$. The potential of the wiring 4003 corresponds to the data voltage of the data retention portion connected to the node FG2. The read analog data voltage is subjected to A/D conversion, so that data of the data retention portion connected to the node FG2 is obtained.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the charges retained in the node FG1 are distributed between the node FG1 and the node FG2, so that data voltage in the data retention portion connected to the node FG1 is transferred to the data retention portion connected to the node FG2. The wirings 4001 and 4003 are set at the low level. The wiring 4006 is set the high level. The wiring 4005 and the wirings 4007 to 4009 are set at the low level. When the transistor 4200 is turned on, the charges in the node FG1 are distributed between the node FG1 and the node FG2.

Here, the potential after the charge distribution is decreased from the written potential "$V_{D1}-V_{th}$". Thus, the capacitance of the capacitor 4600 is preferably larger than the capacitance of the capacitor 4500. Alternatively, the potential "$V_{D1}-V_{th}$" written to the node FG1 is preferably higher than the potential "$V_{D2}-V_{th}$" corresponding to the same data. By changing the ratio of the capacitances and setting the written potential higher in advance as described above, a decrease in potential after the charge distribution can be suppressed. The change in potential due to the charge distribution is described later.

Next, operation of reading data voltage from the data retention portion connected to the node FG1 (hereinafter referred to as reading operation 2) is described.

In the reading operation 2, the wiring 4003 which is brought into an electrically floating state after precharge is discharged. The wirings 4005 to 4008 are set at the low level. The wiring 4009 is set at the high level at the time of precharge and then set at the low level. When the wiring 4009 is set at the low level, the node FG2 which is electrically floating is set at "$V_{D1}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$," which is higher than the potential "$V_{D1}-V_{th}$" of the node FG2 by $V_{th}$. The potential of the wiring 4003 corresponds to the data voltage of the data retention portion connected to the node FG1. The read analog data voltage is subjected to A/D conversion, so that data of the data retention portion connected to the node FG1 is obtained. The above is the operation of reading the data voltage from the data retention portion connected to the node FG1.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operations of the data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although first to third layers 4021 to 4023 are provided in the structure illustrated in FIG. 71, the storage capacity can be increased by adding layers without increasing the area of the semiconductor device.

Note that the read potential can be read as a voltage higher than the written data voltage by $V_{th}$. Therefore, $V_{th}$ of "$V_{D1}-V_{th}$" or $V_{th}$ of "$V_{D2}-V_{th}$" written in the writing operation can be canceled out in reading. As a result, the storage capacity per memory cell can be improved and read data can be close to accurate data; thus, the data reliability becomes excellent.

The structure described in this embodiment can be used in appropriate combination with the structure described in any of the other embodiments.

Embodiment 8

In this embodiment, circuit configuration examples to which the OS transistors described in the above embodiment can be used are described with reference to FIGS. 72A to 72C, FIGS. 73A to 73C, FIGS. 74A and 74B, and FIGS. 75A and 75B.

Figure 72A:
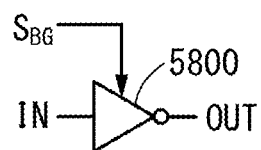
FIGS. 72A to 72C are circuit diagrams and a timing chart illustrating one embodiment of the present invention.

FIG. 72A is a circuit diagram of an inverter. An inverter 5800 outputs a signal whose logic is inverted from the logic of a signal supplied to an input terminal IN to an output terminal OUT. The inverter 5800 includes a plurality of OS transistors. A signal $S_{BG}$ can switch electrical characteristics of the OS transistors.

Figure 72B:
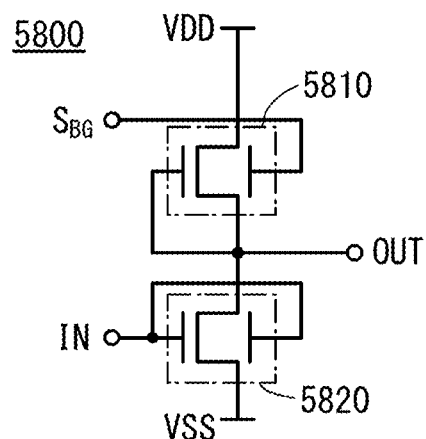

FIG. 72B illustrates an example of the inverter 5800. The inverter 5800 includes an OS transistor 5810 and an OS transistor 5820. The inverter 5800 can be formed using only n-channel transistors; thus, the inverter 5800 can be formed at lower cost than an inverter formed using a complementary metal oxide semiconductor (i.e., a CMOS inverter).

Note that the transistor 3200 of the present invention can be used as the OS transistor 5810.

Note that the inverter 5800 including the OS transistors can be provided over a CMOS circuit including Si transistors. Since the inverter 5800 can be provided so as to overlap with the CMOS circuit, no additional area is required for the inverter 5800, and thus, an increase in the circuit area can be suppressed.

Each of the OS transistors 5810 and 5820 includes a first gate functioning as a front gate, a second gate functioning as a back gate, a first terminal functioning as one of a source and a drain, and a second terminal functioning as the other of the source and the drain.

The first gate of the OS transistor 5810 is connected to its second terminal. The second gate of the OS transistor 5810 is connected to a wiring that supplies the signal $S_{BG}$. The first terminal of the OS transistor 5810 is connected to a wiring that supplies a voltage $V_{DD}$. The second terminal of the OS transistor 5810 is connected to the output terminal OUT.

The first gate of the OS transistor 5820 is connected to the input terminal IN. The second gate of the OS transistor 5820 is connected to the input terminal IN. The first terminal of the OS transistor 5820 is connected to the output terminal OUT. The second terminal of the OS transistor 5820 is connected to a wiring that supplies a voltage $V_{SS}$.

Figure 72C:
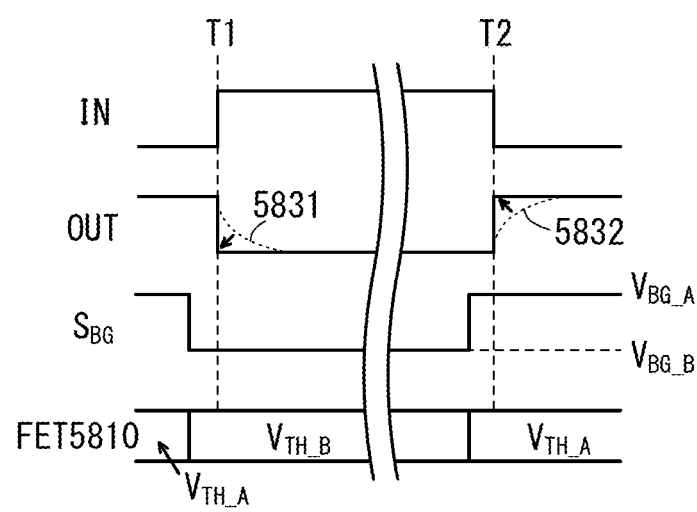

FIG. 72C is a timing chart illustrating the operation of the inverter 5800. The timing chart in FIG. 72C illustrates changes of a signal waveform of the input terminal IN, a signal waveform of the output terminal OUT, a signal waveform of the signal $S_{BG}$, and the threshold voltage of the OS transistor 5810 (FET 5810).

The signal $S_{BG}$ can be supplied to the second gate of the OS transistor 5810 to control the threshold voltage of the OS transistor 5810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 5810 can be shifted in the negative direction to be a threshold voltage $V_{TH\_A}$ when the voltage $V_{BG\_A}$ is applied to the second gate. The threshold voltage of the OS transistor 5810 can be shifted in the positive direction to be a threshold voltage $V_{TH\_B}$ when the voltage $V_{BG\_B}$ is applied to the second gate.

Figure 73A:
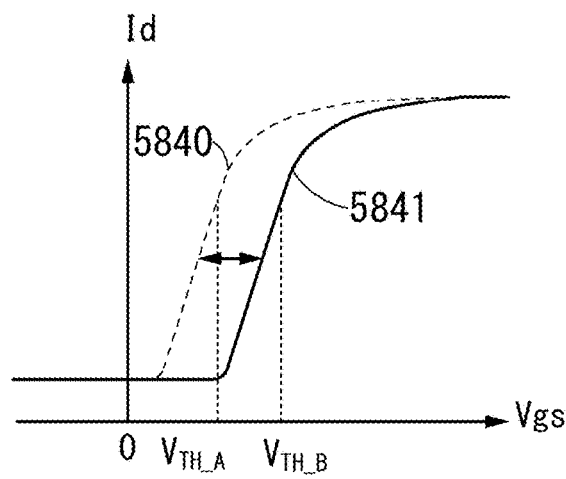
FIGS. 73A to 73C are a graph and circuit diagrams illustrating one embodiment of the present invention.

To visualize the above description, FIG. 73A shows a $V_g-I_d$ curve, which is one of indicators of the transistor's electrical characteristics.

When a high voltage such as the voltage $V_{BG\_A}$ is applied to the second gate, the electrical characteristics of the OS transistor 5810 can be shifted to match a curve shown by a dashed line 5840 in FIG. 73A. When a low voltage such as the voltage $V_{BG\_B}$ is applied to the second gate, the electrical characteristics of the OS transistor 5810 can be shifted to match a curve shown by a solid line 5841 in FIG. 73A. As shown in FIG. 73A, switching the signal $S_{BG}$ between the voltage $V_{BG\_A}$ and the voltage $V_{BG\_B}$ enables the threshold voltage of the OS transistor 5810 to be shifted in the negative direction or the positive direction.

Figure 73B:
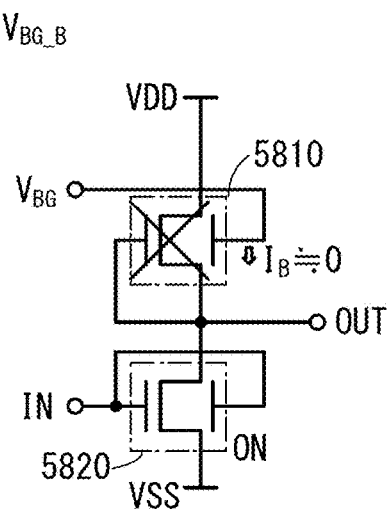

The shift of the threshold voltage in the positive direction to the threshold voltage $V_{TH\_B}$ can make a current less likely to flow in the OS transistor 5810. FIG. 73B visualizes the state. As illustrated in FIG. 73B, a current $I_B$ that flows in the OS transistor 5810 can be extremely low. Thus, when a signal supplied to the input terminal IN is at a high level and the OS transistor 5820 is on (ON), the voltage of the output terminal OUT can be sharply decreased.

Since a state in which a current is less likely to flow in the OS transistor 5810 as illustrated in FIG. 73B can be obtained, a signal waveform 5831 of the output terminal in the timing chart in FIG. 72C can be made steep. Shoot-through current between the wiring that supplies the voltage $V_{DD}$ and the wiring that supplies the voltage $V_{SS}$ can be low, leading to low-power operation.

Figure 73C:
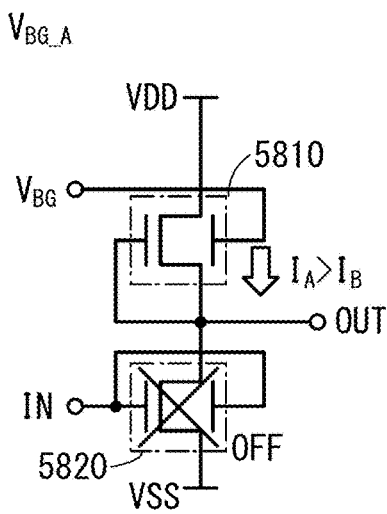

The shift of the threshold voltage in the negative direction to the threshold voltage $V_{TH\_A}$ can make a current flow easily in the OS transistor 5810. FIG. 73C visualizes the state. As illustrated in FIG. 73C, a current $I_A$ flowing at this time can be higher than at least the current $I_B$. Thus, when a signal supplied to the input terminal IN is at a low level and the OS transistor 5820 is off (OFF), the voltage of the output terminal OUT can be increased sharply.

Since a state in which a current is likely to flow in the OS transistor 5810 as illustrated in FIG. 73C can be obtained, a signal waveform 5832 of the output terminal in the timing chart in FIG. 72C can be made steep.

Note that the threshold voltage of the OS transistor 5810 is preferably controlled by the signal $S_{BG}$ before the state of the OS transistor 5820 is switched, i.e., before time T1 or time T2. For example, as in FIG. 72C, it is preferable that the threshold voltage of the OS transistor 5810 be switched from the threshold voltage $V_{TH\_A}$ to the threshold voltage $V_{TH\_B}$ before time T1 at which the level of the signal supplied to the input terminal IN is switched to the high level. Moreover, as in FIG. 72C, it is preferable that the threshold voltage of the OS transistor 5810 be switched from the threshold voltage $V_{TH\_B}$ to the threshold voltage $V_{TH\_A}$ before time T2 at which the level of the signal supplied to the input terminal IN is switched to the low level.

Figure 74A:
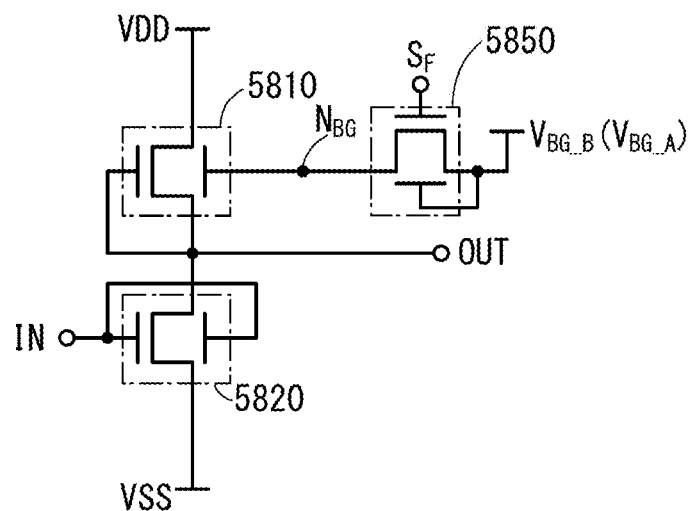
FIGS. 74A and 74B are a circuit diagram and a timing chart illustrating one embodiment of the present invention.

Although the timing chart in FIG. 72C illustrates the configuration in which the level of the signal $S_{BG}$ is switched in accordance with the signal supplied to the input terminal IN, a different configuration may be employed in which voltage for controlling the threshold voltage is held by the second gate of the OS transistor 5810 in a floating state, for example. FIG. 74A illustrates an example of such a circuit configuration.

The circuit configuration in FIG. 74A is the same as that in FIG. 72B, except that an OS transistor 5850 is added. A first terminal of the OS transistor 5850 is connected to the second gate of the OS transistor 5810. A second terminal of the OS transistor 5850 is connected to a wiring that supplies the voltage $V_{BG\_B}$ (or the voltage $V_{BG\_A}$). A first gate of the OS transistor 5850 is connected to a wiring that supplies a signal SF. A second gate of the OS transistor 5850 is connected to the wiring that supplies the voltage $V_{BG\_B}$ (or the voltage $V_{BG\_A}$).

Figure 74B:
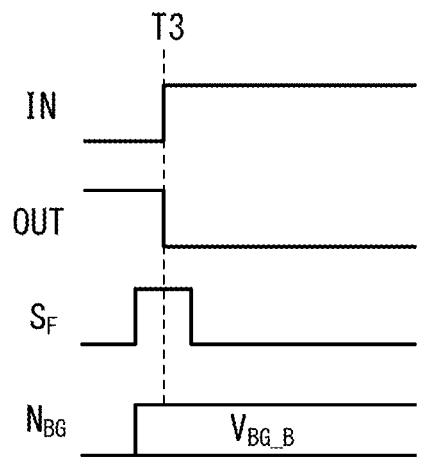

The operation with the circuit configuration in FIG. 74A is described with reference to a timing chart in FIG. 74B.

The voltage for controlling the threshold voltage of the OS transistor 5810 is supplied to the second gate of the OS transistor 5810 before time T3 at which the level of the signal supplied to the input terminal IN is switched to a high level. The signal SF is set to a high level and the OS transistor 5850 is turned on, so that the voltage $V_{BG\_B}$ for controlling the threshold voltage is supplied to a node $N_{BG}$.

The OS transistor 5850 is turned off after the voltage of the node $N_{BG}$ becomes $V_{BG\_B}$. Since the off-state current of the OS transistor 5850 is extremely low, the voltage $V_{BG\_B}$ held by the node $N_{BG}$ can be retained while the OS transistor 5850 remains off and the node $N_{BG}$ is in a state that is very close to a floating state. Therefore, the number of times the voltage $V_{BG\_B}$ is supplied to the second gate of the OS transistor 5850 can be reduced and accordingly, the power consumption for rewriting the voltage $V_{BG\_B}$ can be reduced.

Figure 75A:
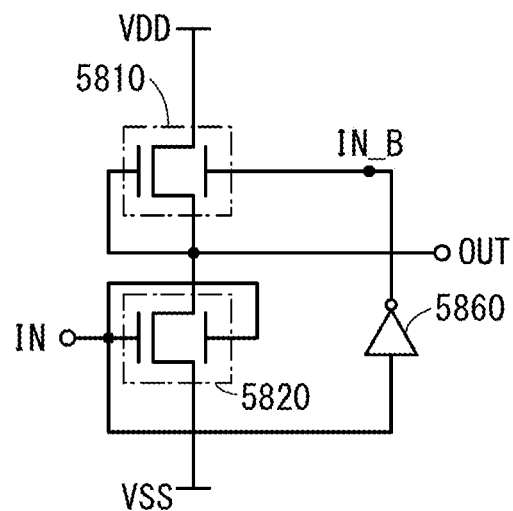
FIGS. 75A and 75B are a circuit diagram and a timing chart illustrating one embodiment of the present invention.

Although FIG. 72B and FIG. 74A each illustrate the configuration where the voltage is supplied to the second gate of the OS transistor 5810 by control from the outside, a different configuration may be employed in which voltage for controlling the threshold voltage is generated on the basis of the signal supplied to the input terminal IN and supplied to the second gate of the OS transistor 5810, for example. FIG. 75A illustrates an example of such a circuit configuration.

The circuit configuration in FIG. 75A is the same as that in FIG. 72B, except that a CMOS inverter 5860 is provided between the input terminal IN and the second gate of the OS transistor 5810. An input terminal of the CMOS inverter 5860 is connected to the input terminal IN. An output terminal of the CMOS inverter 5860 is connected to the second gate of the OS transistor 5810.

The operation with the circuit configuration in FIG. 75A is described with reference to a timing chart in FIG. 75B. The timing chart in FIG. 75B illustrates changes of a signal waveform of the input terminal IN, a signal waveform of the output terminal OUT, an output waveform IN_B of the CMOS inverter 5860, and the threshold voltage of the OS transistor 5810 (FET 5810).

The output waveform IN_B which corresponds to a signal whose logic is inverted from the logic of the signal supplied to the input terminal IN can be used as a signal that controls the threshold voltage of the OS transistor 5810. Thus, the threshold voltage of the OS transistor 5810 can be controlled as described with reference to FIGS. 72A to 72C. For example, the signal supplied to the input terminal IN is at a high level and the OS transistor 5820 is turned on at time T4 in FIG. 75B. At this time, the output waveform IN_B is at a low level. Accordingly, a current can be made less likely to flow in the OS transistor 5810; thus, the voltage of the output terminal OUT can be sharply decreased.

Figure 75B:
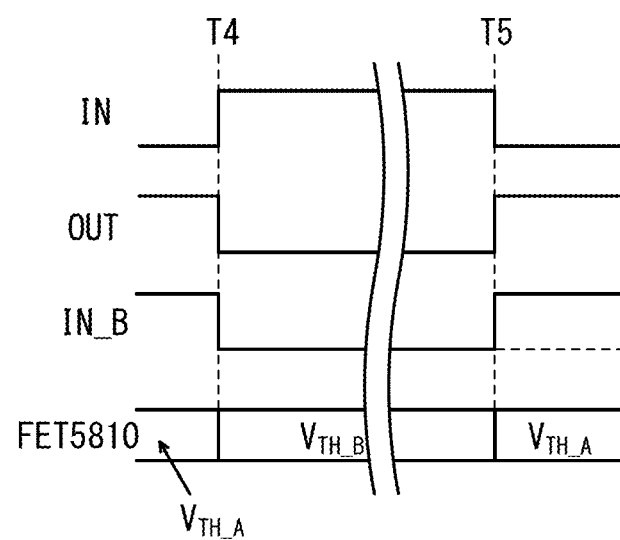

Moreover, the signal supplied to the input terminal IN is at a low level and the OS transistor 5820 is turned off at time T5 in FIG. 75B. At this time, the output waveform IN_B is at a high level. Accordingly, a current can easily flow in the OS transistor 5810; thus, the voltage of the output terminal OUT can be sharply increased.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structure described in this embodiment can be used in appropriate combination with the structure described in any of the other embodiments.

Embodiment 9

In this embodiment, examples of a semiconductor device which includes a plurality of circuits including OS transistors described in the above embodiment are described with reference to FIGS. 76A to 76E, FIGS. 77A and 77B, FIGS. 78A and 78B, FIGS. 79A to 79C, FIGS. 80A and 80B, FIGS. 81A to 81C, and FIGS. 82A and 82B.

Figure 76A:
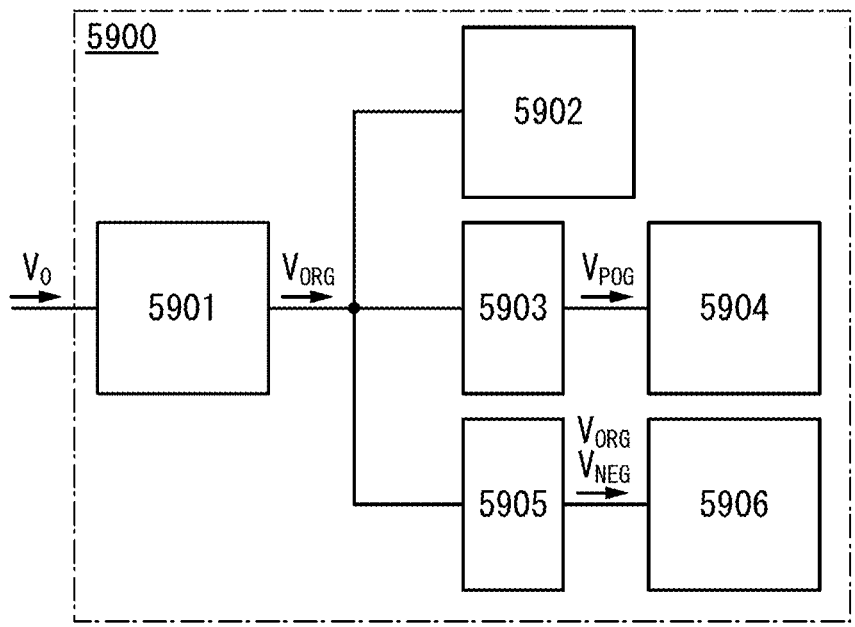
FIGS. 76A to 76E are a block diagram, circuit diagrams, and waveform diagrams illustrating one embodiment of the present invention.

FIG. 76A is a block diagram of a semiconductor device 5900. The semiconductor device 5900 includes a power supply circuit 5901, a circuit 5902, a voltage generation circuit 5903, a circuit 5904, a voltage generation circuit 5905, and a circuit 5906.

The power supply circuit 5901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 5900. The semiconductor device 5900 can generate the voltage $V_{ORG}$ on the basis of one power supply voltage supplied from the outside. Thus, the semiconductor device 5900 can operate without the supply of a plurality of power supply voltages from the outside.

The circuits 5902, 5904, and 5906 operate with different power supply voltages. For example, the power supply voltage of the circuit 5902 is a voltage applied on the basis of the voltage $V_{ORG}$ and the voltage $V_{SS}$ ($V_{ORG}>V_{SS}$). For example, the power supply voltage of the circuit 5904 is a voltage applied on the basis of a voltage $V_{POG}$ and the voltage $V_{SS}$ ($V_{POG}>V_{ORG}$). For example, the power supply voltages of the circuit 5906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground (GND) potential, the kinds of voltages generated in the power supply circuit 5901 can be reduced.

The voltage generation circuit 5903 is a circuit that generates the voltage $V_{POG}$. The voltage generation circuit 5903 can generate the voltage $V_{POG}$ on the basis of the voltage $V_{ORG}$ supplied from the power supply circuit 5901. Thus, the semiconductor device 5900 including the circuit 5904 can operate on the basis of one power supply voltage supplied from the outside.

The voltage generation circuit 5905 is a circuit that generates the voltage $V_{NEG}$. The voltage generation circuit 5905 can generate the voltage $V_{NEG}$ on the basis of the voltage $V_{ORG}$ supplied from the power supply circuit 5901. Thus, the semiconductor device 5900 including the circuit 5906 can operate on the basis of one power supply voltage supplied from the outside.

Figure 76B:
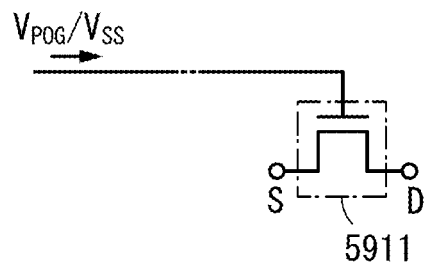
Figure 76C:
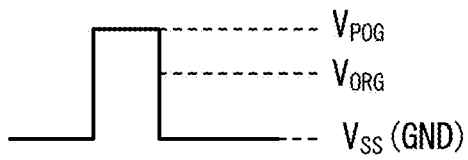

FIG. 76B illustrates an example of the circuit 5904 that operates with the voltage $V_{POG}$ and FIG. 76C illustrates an example of a waveform of a signal for operating the circuit 5904.

FIG. 76B illustrates a transistor 5911. A signal supplied to a gate of the transistor 5911 is generated on the basis of, for example, the voltage $V_{POG}$ and the voltage $V_{SS}$. The signal is generated on the basis of the voltage $V_{POG}$ at the time when the transistor 5911 is turned on and on the basis of the voltage $V_{SS}$ at the time when the transistor 5911 is turned off. As shown in FIG. 76C, the voltage $V_{POG}$ is higher than the voltage $V_{ORG}$. Therefore, a conducting state between a source (S) and a drain (D) of the transistor 5911 can be obtained more surely. As a result, the frequency of malfunction of the circuit 5904 can be reduced.

Figure 76D:
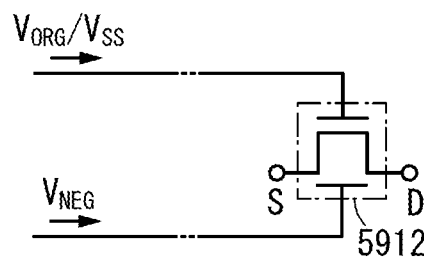
Figure 76E:
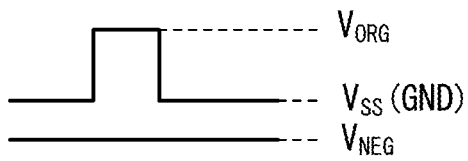

FIG. 76D illustrates an example of the circuit 5906 that operates with the voltage $V_{NEG}$ and FIG. 76E illustrates an example of a waveform of a signal for operating the circuit 5906.

FIG. 76D illustrates a transistor 5912 having a back gate. A signal supplied to a gate of the transistor 5912 is generated on the basis of, for example, the voltage $V_{ORG}$ and the voltage $V_{SS}$. The signal is generated on the basis of the voltage $V_{ORG}$ at the time when the transistor 5911 is turned on and on the basis of the voltage $V_{SS}$ at the time when the transistor 5911 is turned off. A signal supplied to the back gate of the transistor 5912 is generated on the basis of the voltage $V_{NEG}$. As shown in FIG. 76E, the voltage $V_{NEG}$ is lower than the voltage $V_{SS}$ (GND). Therefore, the threshold voltage of the transistor 5912 can be controlled so as to be shifted in the positive direction. Thus, the transistor 5912 can be surely turned off and a current flowing between a source (S) and a drain (D) can be reduced. As a result, the frequency of malfunction of the circuit 5906 can be reduced and power consumption thereof can be reduced.

The voltage $V_{NEG}$ may be directly supplied to the back gate of the transistor 5912. Alternatively, a signal supplied to the gate of the transistor 5912 may be generated on the basis of the voltage $V_{ORG}$ and the voltage $V_{NEG}$ and the generated signal may be supplied to the back gate of the transistor 5912.

Figure 77A:
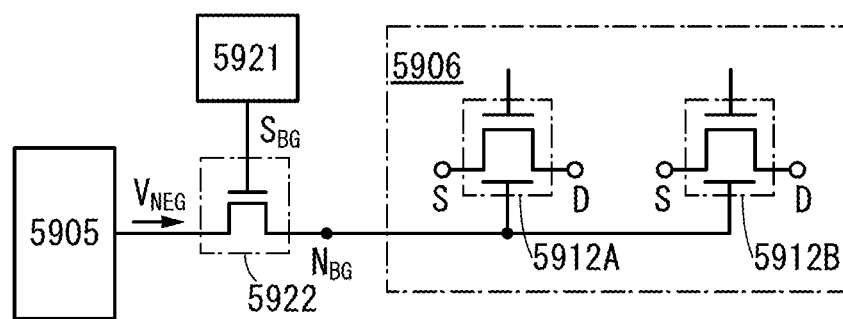
FIGS. 77A and 77B are a circuit diagram and a timing chart illustrating one embodiment of the present invention.
Figure 77B:
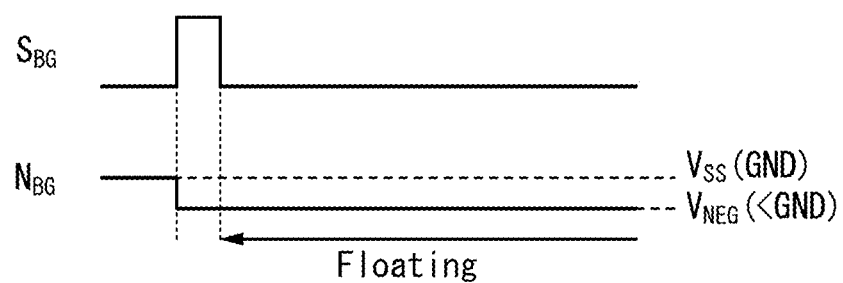

FIGS. 77A and 77B illustrate a modification example of FIGS. 76D and 76E.

In a circuit diagram illustrated in FIG. 77A, a transistor 5922 whose conduction state can be controlled by a control circuit 5921 is provided between the voltage generation circuit 5905 and the circuit 5906. The transistor 5922 is an n-channel OS transistor. The control signal $S_{BG}$ output from the control circuit 5921 is a signal for controlling the conduction state of the transistor 5922. Transistors 5912A and 5912B included in the circuit 5906 are the same OS transistors as the transistor 5922.

A timing chart in FIG. 77B shows changes in a potential of the control signal $S_{BG}$ and a potential of the node $N_{BG}$. The potential of the node $N_{BG}$ indicates the states of potentials of back gates of the transistors 5912A and 5912B. When the control signal $S_{BG}$ is at a high level, the transistor 5922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 5922 is an OS transistor, its off-state current is low. Accordingly, even when the node $N_{BG}$ is in an electrically floating state, the voltage $V_{NEG}$ which has been supplied can be held.

Figure 78A:
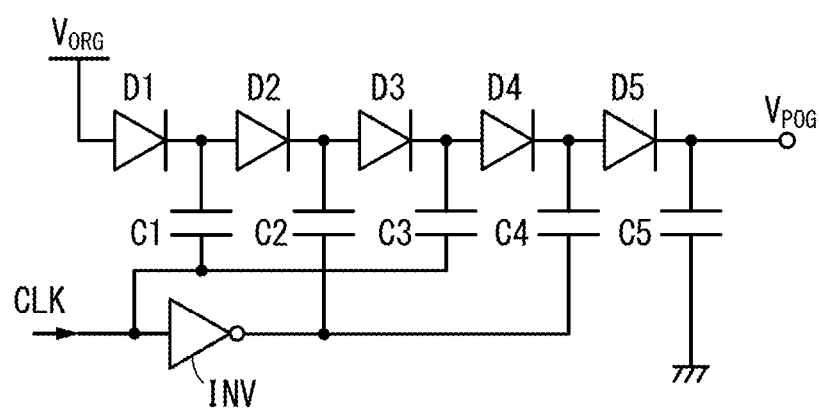
FIGS. 78A and 78B are each a circuit diagram illustrating one embodiment of the present invention.

FIG. 78A illustrates an example of a circuit configuration applicable to the above-described voltage generation circuit 5903. The voltage generation circuit 5903 illustrated in FIG. 78A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 78B:
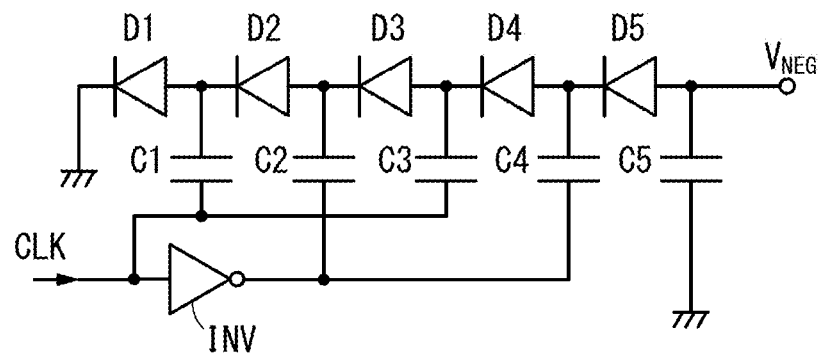

FIG. 78B illustrates an example of a circuit configuration applicable to the above-described voltage generation circuit 5905. The voltage generation circuit 5905 illustrated in FIG.

78B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 5903 is not limited to the configuration of the circuit diagram illustrated in FIG. 78A. Modification examples of the voltage generation circuit 5903 are shown in FIGS. 79A to 79C and FIGS. 80A and 80B.

Figure 79A:
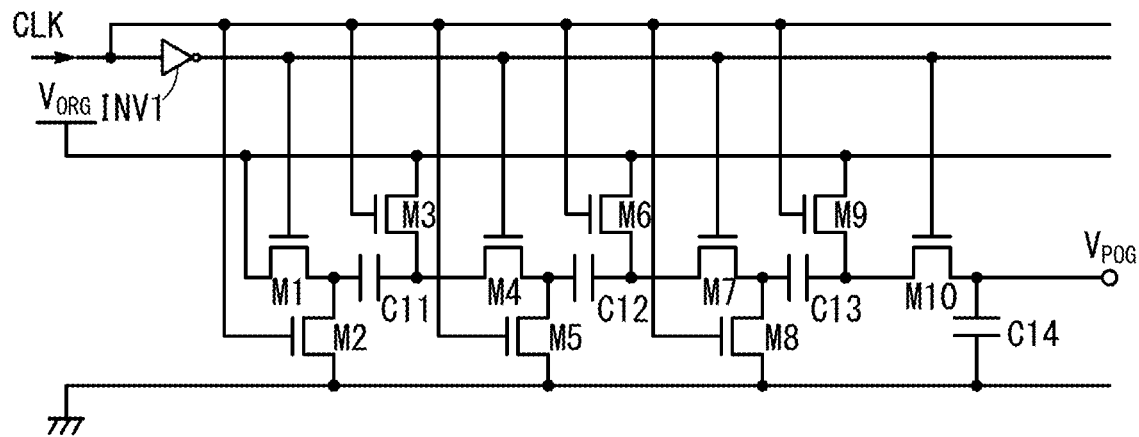
FIGS. 79A to 79C are each a circuit diagram illustrating one embodiment of the present invention.

A voltage generation circuit 5903A illustrated in FIG. 79A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 5903A in FIG. 79A, the off-state current of each of the transistors M1 to M10 can be low when the transistors M1 to M10 are OS transistors, and leakage of charge held in the capacitors C11 to C14 can be inhibited. Accordingly, efficient voltage increase from the voltage $V_{ORG}$ to the voltage $V_{POG}$ is possible.

Figure 79B:
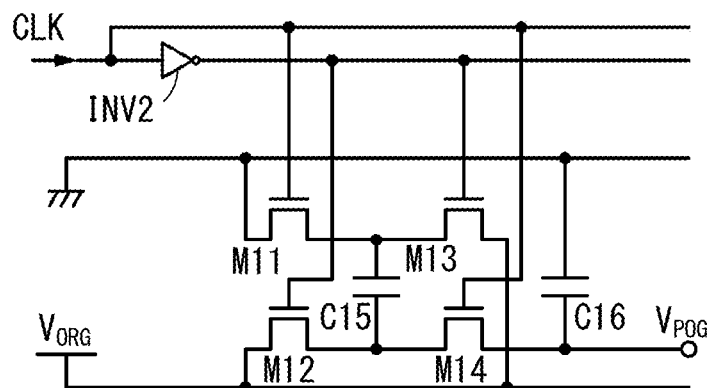

A voltage generation circuit 5903B illustrated in FIG. 79B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 5903B in FIG. 79B, the off-state current of each of the transistors M11 to M14 can be low when the transistors M11 to M14 are OS transistors, and leakage of charge held in the capacitors C15 and C16 can be inhibited. Accordingly, efficient voltage increase from the voltage $V_{ORG}$ to the voltage $V_{POG}$ is possible.

Figure 79C:
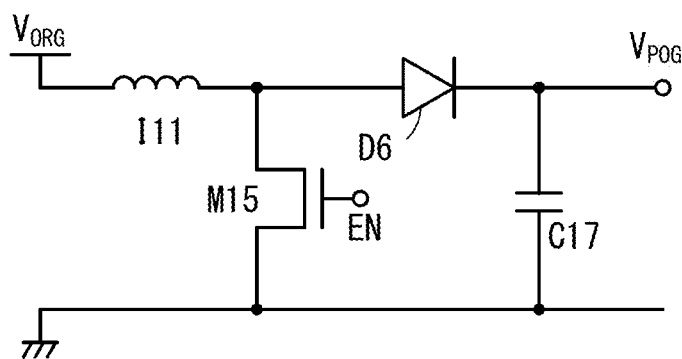

A voltage generation circuit 5903C in FIG. 79C includes an inductor I11, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 5903C in FIG. 79C increases the voltage using the inductor I11, the voltage can be increased efficiently.

Figure 80A:
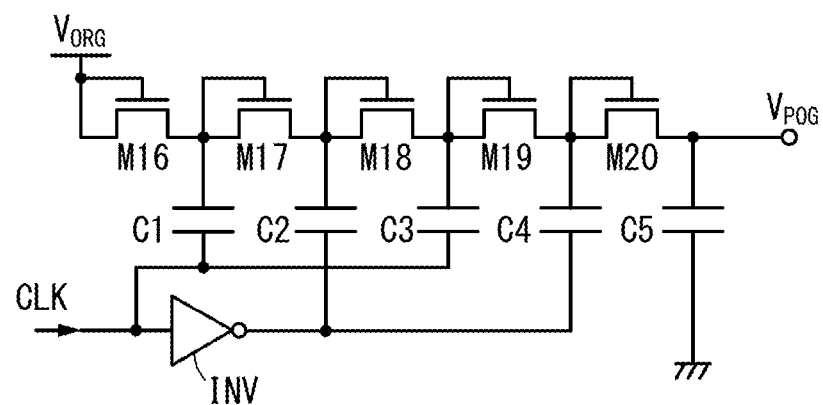
FIGS. 80A and 80B are each a circuit diagram illustrating one embodiment of the present invention.

A voltage generation circuit 5903D in FIG. 80A has a configuration in which the diodes D1 to D5 of the voltage generation circuit 5903 in FIG. 78A are replaced with diode-connected transistors M16 to M20. In the voltage generation circuit 5903D in FIG. 80A, the off-state current of each of the transistors M16 to M20 can be low when the transistors M16 to M20 are OS transistors, and leakage of charge held in the capacitors C1 to C5 can be inhibited. Thus, efficient voltage increase from the voltage $V_{ORG}$ to the voltage $V_{POG}$ is possible.

Figure 80B:
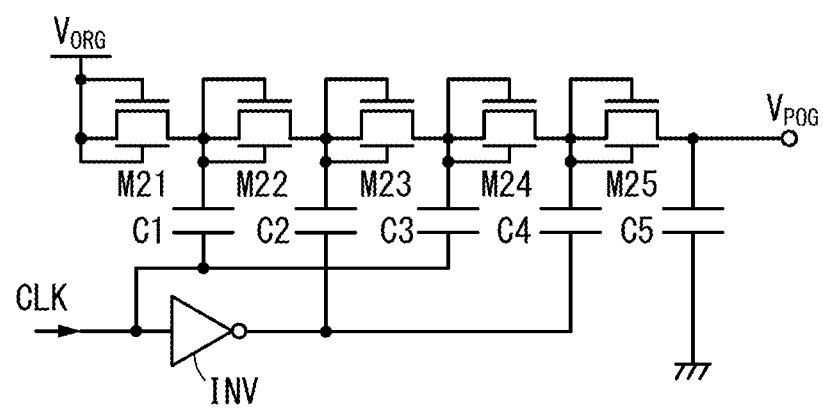
Figure 81A:
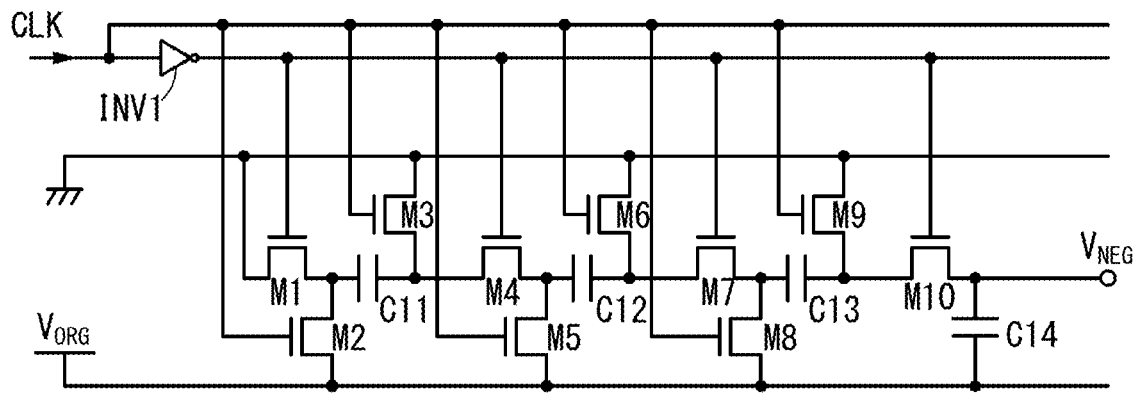
FIGS. 81A to 81C are each a circuit diagram illustrating one embodiment of the present invention.
Figure 81B:
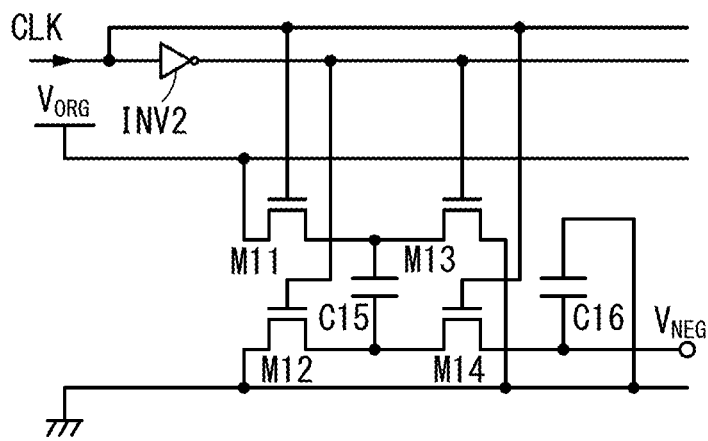
Figure 81C:
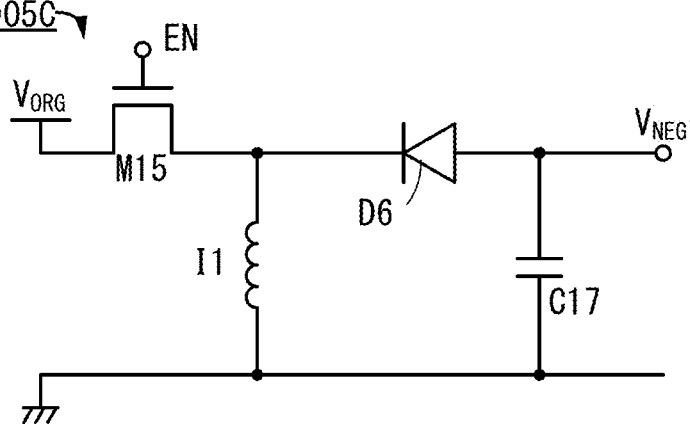
Figure 82A:
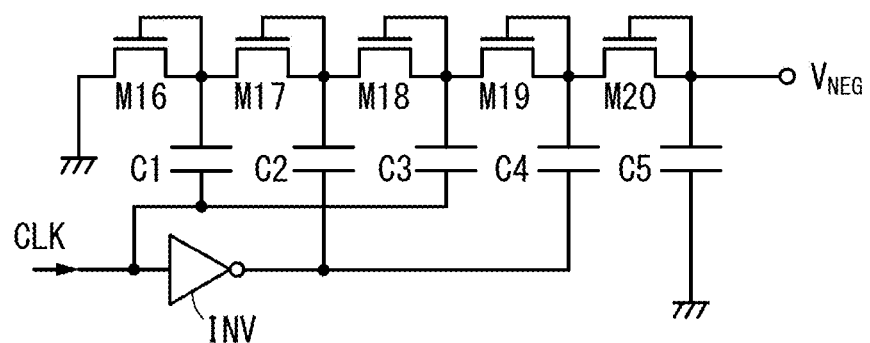
FIGS. 82A and 82B are each a circuit diagram illustrating one embodiment of the present invention.
Figure 82B:
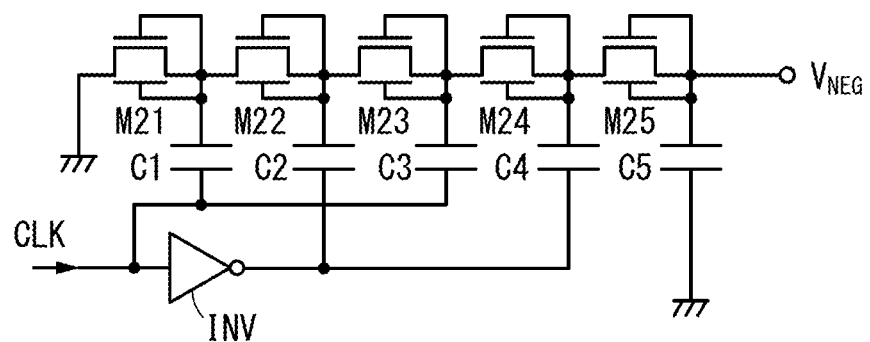

A voltage generation circuit 5903E in FIG. 80B has a configuration in which the transistors M16 to M20 of the voltage generation circuit 5903D in FIG. 80A are replaced with transistor M21 to M25 having back gates. In the voltage generation circuit 5903E in FIG. 80B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 5903 can also be applied to the voltage generation circuit 5905 in FIG. 78B. The configurations of a circuit diagram in this case are illustrated in FIGS. 81A to 81C and FIGS. 82A and 82B. In a voltage generation circuit 5905A illustrated in FIG. 81A, the voltage $V_{NEG}$ which has been reduced from the voltage $V_{SS}$ to a negative voltage having a negatively tripled value of the voltage $V_{ORG}$ by application of the clock signal CLK can be obtained. In a voltage generation circuit 5905B illustrated in FIG. 81B, the voltage $V_{NEG}$ which has been reduced from the voltage $V_{SS}$ to a negative voltage having a negatively doubled value of the voltage $V_{ORG}$ by application of the clock signal CLK can be obtained.

The voltage generation circuits 5905A and 5905B and voltage generation circuits 5905C to 5905E illustrated in FIGS. 81A to 81C and FIGS. 82A and 82B have configurations formed by changing the voltages applied to the wirings or the arrangement of the elements of the voltage generation circuits 5903A to 5903E illustrated in FIGS. 79A to 79C and FIGS. 80A and 80B. In the voltage generation circuits 5905A to 5905E illustrated in FIGS. 81A to 81C and FIGS. 82A and 82B, as in the voltage generation circuits 5903A to 5903E, efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structure described in this embodiment can be used in appropriate combination with the structure described in any of the other embodiments.

Embodiment 10

In this embodiment, examples of CPUs including semiconductor devices such as the transistor of one embodiment of the present invention and the above-described memory device will be described.

<Configuration of CPU>

Figure 83:
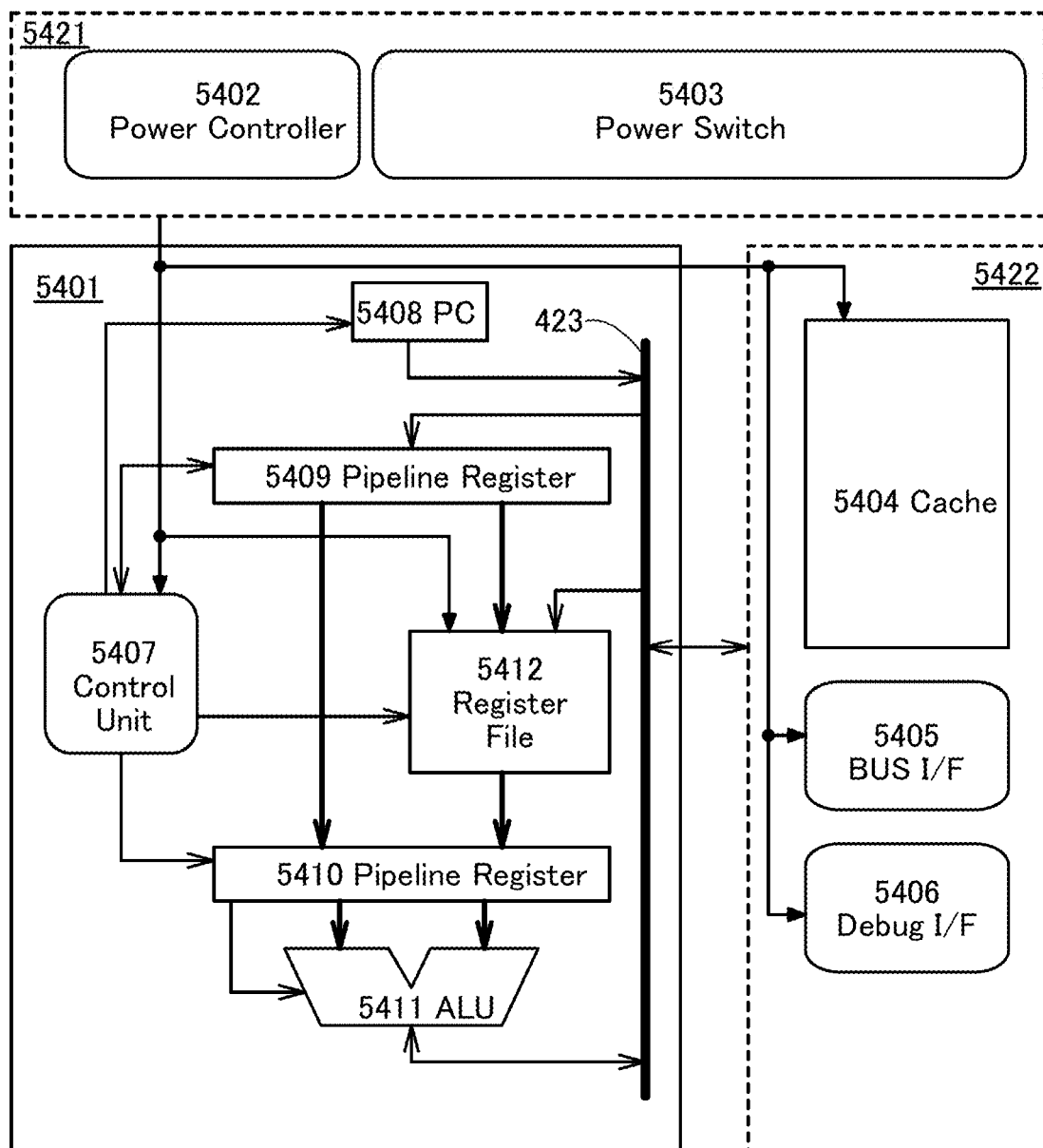
FIG. 83 is a block diagram illustrating a semiconductor device of one embodiment of the present invention.

A semiconductor device 5400 shown in FIG. 83 includes a CPU core 5401, a power management unit 5421, and a peripheral circuit 5422. The power management unit 5421 includes a power controller 5402 and a power switch 5403. The peripheral circuit 5422 includes a cache 5404 including cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as inputted applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 83, the cache 5404 is provided with a cache controller for controlling the operation of the cache memory.

The pipeline register 5409 has a function of temporarily storing instruction data.

The register file 5412 includes a plurality of registers including a general purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling supply of a power supply voltage to various circuits included in the semiconductor device 5400 other than the power controller 5402. The above various circuits belong to several different power domains. The power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction of starting power gating is sent from the CPU core 5401 to the power controller 5402. Then, various registers and the cache 5404 included in the semiconductor device 5400 start data saving. Then, the power switch 5403 stops the supply of a power supply voltage to the various circuits other than the power controller 5402 included in the semiconductor device 5400.

Then, an interrupt signal is input to the power controller 5402, whereby the supply of the power supply voltage to the various circuits included in the semiconductor device 5400 is started. Note that a counter may be provided in the power controller 5402 to be used to determine the timing of starting the supply of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data held by the CPU core 5401 or the peripheral circuit 5422 is preferably saved in a short time. In that case, the power can be turned on or off in a short time, and an effect of saving power becomes significant.

In order that the data held by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 84.

Figure 84:
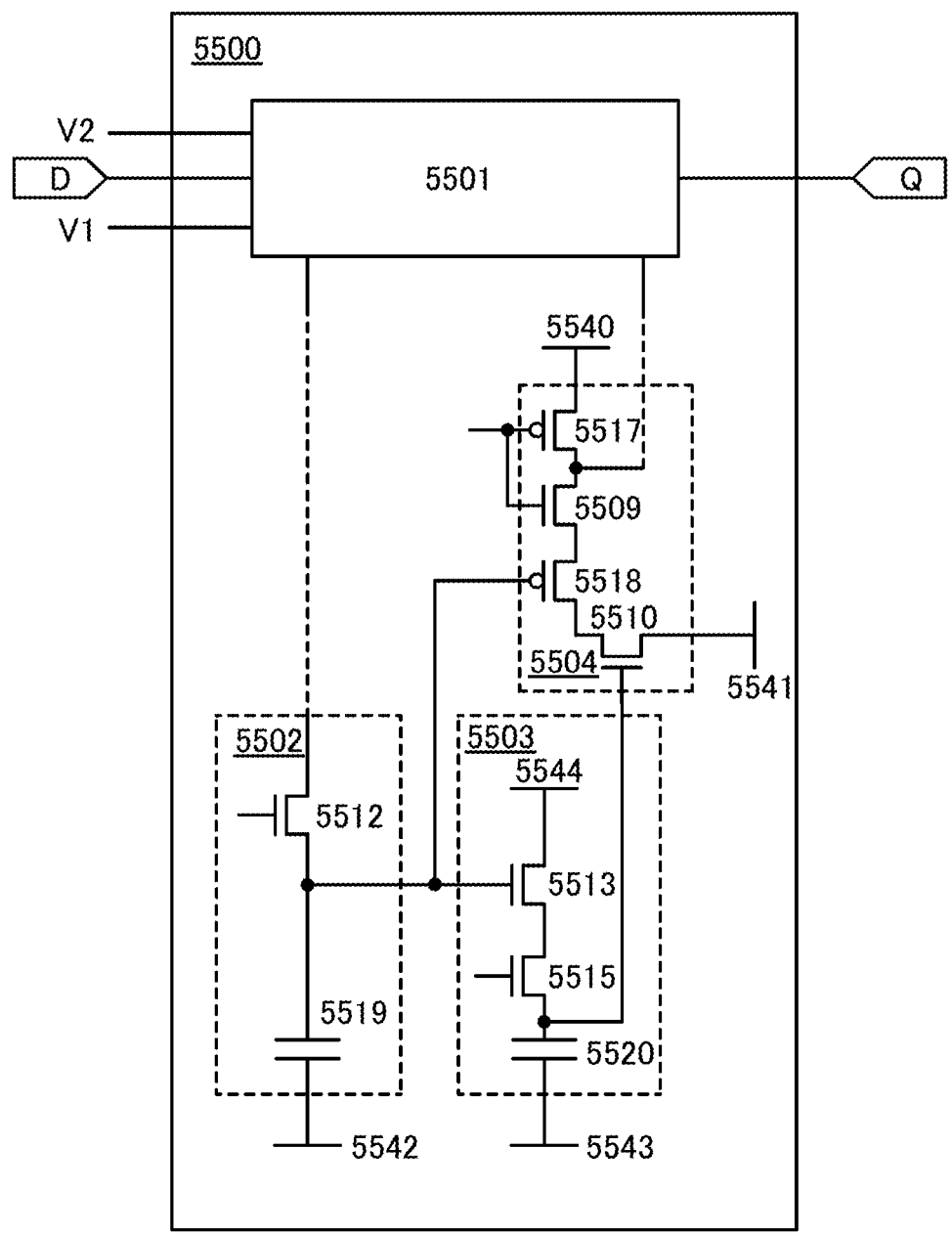
FIG. 84 is a circuit diagram illustrating a semiconductor device of one embodiment of the present invention.

A semiconductor device 5500 shown in FIG. 84 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level will be described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data held in the first memory circuit 5501 to store (or save) it. The third memory circuit 5503 has a function of reading the data held in the second memory circuit 5502 to store (or save) it. The read circuit 5504 has a function of reading the data held in the second memory circuit 5502 or the third memory circuit 5503 to store (or restore) it in the first memory circuit 5501.

In particular, the third memory circuit 5503 has a function of reading the data held in the second memory circuit 5502 to store (or save) it even in the period during which the power supply voltage is not supplied to the semiconductor device 5500.

As shown in FIG. 84, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data held in the first memory circuit 5501. The transistor 5512 is desirably capable of charging and discharging the capacitor 5519 at a high speed in accordance with data held in the first memory circuit 5501. Specifically, the transistor 5512 desirably contains crystalline silicon (preferably polycrystalline silicon, more preferably single crystal silicon) in a channel formation region.

The conduction state or the non-conduction state of the transistor 5513 is determined in accordance with the charge held in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely low. Specifically, the transistor 5515 desirably contains an oxide semiconductor (preferably an oxide containing In, Ga, and Zn) in a channel formation region.

Specific connection relations between the elements will be described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to the wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 84, it is not necessarily connected to the gate of the transistor 5517.

The transistor described in the above embodiment as an example can be applied to the transistor 5515. Because of the low off-state current of the transistor 5515, the semiconductor device 5500 can retain data for a long time without power supply. The favorable switching characteristics of the transistor 5515 allow the semiconductor device 5500 to perform high-speed backup and recovery.

The structure described in this embodiment can be used in appropriate combination with the structure described in any of the other embodiments.

Embodiment 11

In this embodiment, a semiconductor wafer, a chip, and an electronic component of one embodiment of the present invention will be described.

<Semiconductor Wafer and Chip>

Figure 85A:
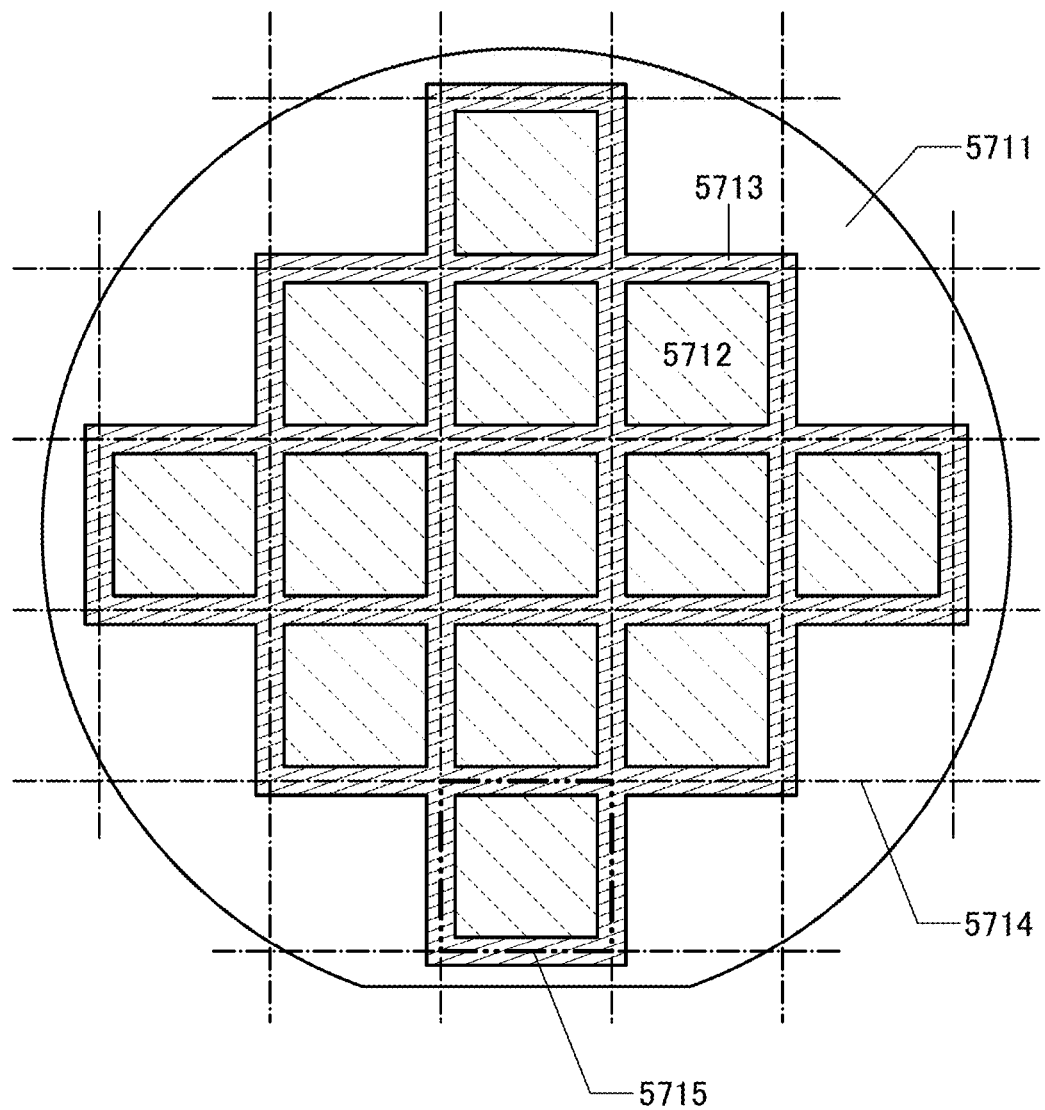
FIGS. 85A and 85B are top views illustrating a semiconductor device of one embodiment of the present invention.

FIG. 85A is a top view illustrating a substrate 5711 before dicing treatment. As the substrate 5711, a semiconductor substrate (also referred to as a "semiconductor wafer") can be used, for example. A plurality of circuit regions 5712 are provided over the substrate 5711. A semiconductor device, a CPU, an RF tag, an image sensor, or the like of one embodiment of the present invention can be provided in the circuit region 5712.

Figure 85B:
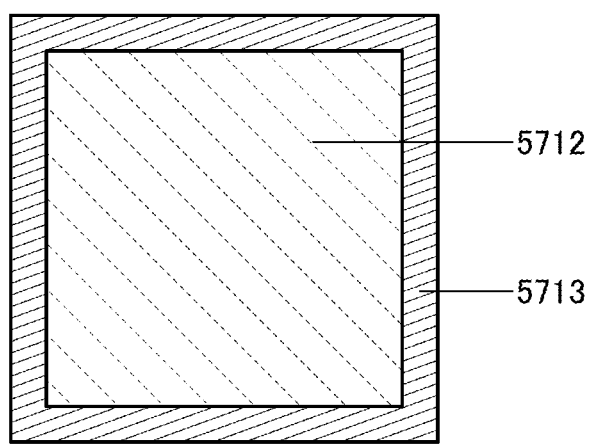

The plurality of circuit regions 5712 are each surrounded by a separation region 5713. Separation lines (also referred to as "dicing lines") 5714 are set at a position overlapping with the separation region 5713. The substrate 5711 can be cut along the separation lines 5714 into chips 5715 including the circuit regions 5712. FIG. 85B is an enlarged view of the chip 5715.

A conductive layer or a semiconductor layer may be provided in the separation region 5713. Providing a conductive layer or a semiconductor layer in the separation region 5713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation region 5713 allows a reduction in the usage of the pure water. Therefore, the cost of manufacturing semiconductor devices can be reduced. Thus, semiconductor devices can be manufactured with improved productivity.

For a semiconductor layer provided in the separation region 5713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 86A:
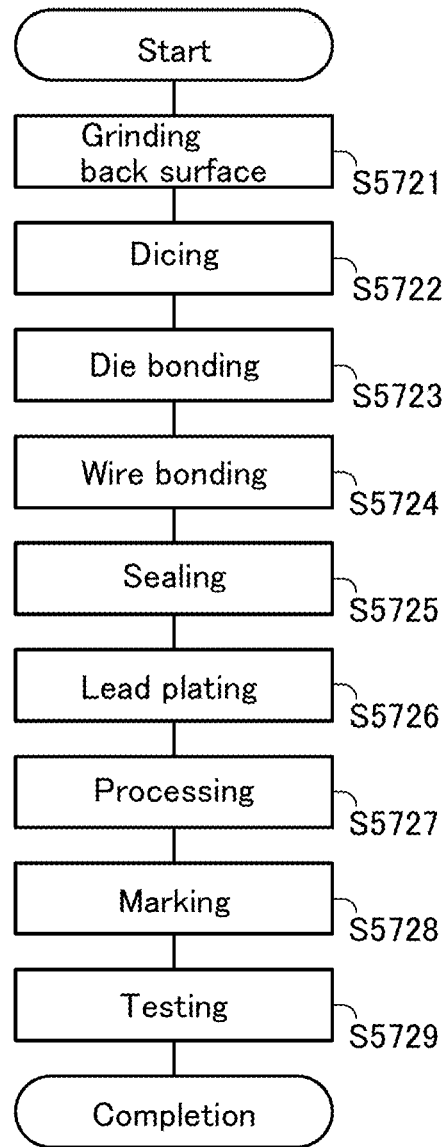
FIGS. 86A and 86B are a flowchart and a perspective view of a semiconductor device illustrating one embodiment of the present invention.
Figure 86B:
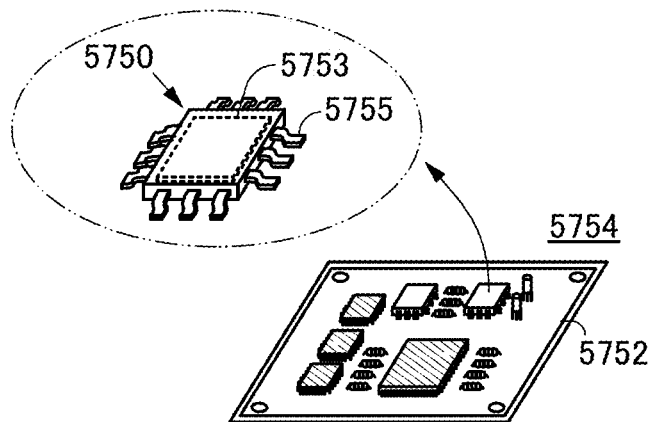

FIGS. 86A and 86B show an example where the chip 5715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

The post-process will be described with reference to a flow chart in FIG. 86A. After an element substrate including the semiconductor device described in the above embodiment is completed in a pre-process, a back surface grinding step in which a back surface (a surface where the semiconductor device and the like are not formed) of the element substrate is ground is performed (Step S5721). When the element substrate is thinned by grinding, warpage or the like of the element substrate is reduced, so that the size of the electronic component can be reduced.

Next, the element substrate is divided into a plurality of chips (chips 5715) in a dicing step (Step S5722). Then, the separated chips are individually picked up to be bonded to a lead frame in a die bonding step (Step S5723). To bond a chip and a lead frame in the die bonding step, a method such as bonding with a resin or a tape is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S5724). A silver line or a gold line can be used as the metal fine line. Ball bonding or wedge bonding can be used as the wire bonding.

The wire-bonded chip is subjected to a sealing step (a molding step) of sealing the chip with an epoxy resin or the like (Step S5725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a lead plating step (Step S5726). This plating process prevents rust of the lead and facilitates soldering at the time of mounting the chip on a printed circuit board in a later step. Then, the lead is cut and processed in a shaping step (Step S5727).

Next, a printing (marking) step is performed on a surface of the package (Step S5728). After a testing step (Step S5729) for checking whether an external shape is good and whether there is a malfunction, for example, the electronic component is completed.

FIG. 86B is a schematic perspective diagram of a completed electronic component. FIG. 86B is a schematic perspective diagram illustrating a quad flat package (QFP) as an example of the electronic component. An electronic component 5750 in FIG. 86B includes a lead 5755 and a semiconductor device 5753. As the semiconductor device 5753, the semiconductor device described in the above embodiment or the like can be used.

The electronic component 5750 in FIG. 86B is mounted on a printed circuit board 5752, for example. A plurality of electronic components 5750 are combined and electrically connected to each other over the printed circuit board 5752; thus, a substrate on which the electronic components are mounted (a circuit board 5754) is completed. The completed circuit board 5754 is provided in an electronic device or the like.

The structure described in this embodiment can be used in appropriate combination with the structure described in any of the other embodiments.

Embodiment 12

In this embodiment, applications of the semiconductor device described in any of the above embodiments will be described. The semiconductor device described in any of the above embodiments is preferably used in an electronic device that can withstand high temperatures. The semiconductor device described in any of the above embodiments can be used, for example, for a protective circuit of a battery in an electronic device such as a computer display that can display images; and a protective circuit of a battery provided for an electromagnetic cooker or a vehicle (e.g., a bicycle) that is driven with power from a fixed power source.

Application examples of a semiconductor device that functions as a protective circuit will be described with reference to FIGS. 87A to 87C.

Figure 87A:
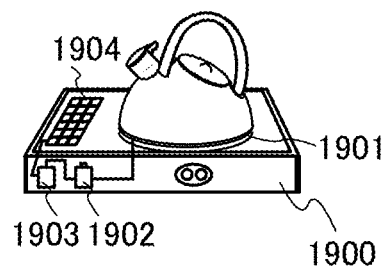
FIGS. 87A to 87C are perspective views illustrating electronic devices of one embodiment of the present invention.

FIG. 87A illustrates an electromagnetic cooker 1900 as an application example of a semiconductor device that functions as a protective circuit. The electromagnetic cooker 1900 heats cookware and the like by using electromagnetic induction generated by current flowing through a coil unit 1901. The electromagnetic cooker 1900 includes a battery 1902 for supplying current that is to flow through the coil unit 1901, a semiconductor device 1903 functioning as a protective circuit, and a solar battery 1904 for charging the battery 1902. Note that FIG. 87A illustrates the solar battery 1904 as a means to charge the battery 1902; alternatively, the battery 1902 may be charged by another means. The semiconductor device 1903 functioning as a protective circuit can reduce application of overvoltage to the battery 1902 even at high temperatures. Moreover, the off-state current that flows when the protective circuit is not operated is extremely low, and thus, the power consumption can be reduced.

Figure 87B:
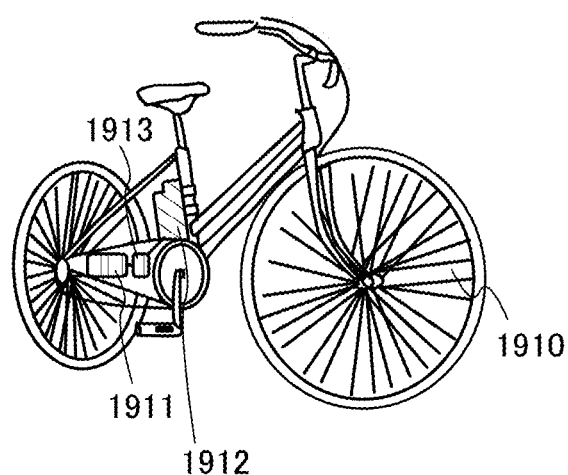

FIG. 87B illustrates an electric bicycle 1910 as an application example of a semiconductor device functioning as a protective circuit. The electric bicycle 1910 obtains power when current flows through a motor unit 1911. The electric bicycle 1910 includes a battery 1912 for supplying current that is to flow through the motor unit 1911 and a semiconductor device 1913 serving as a protective circuit. Although a means to charge the battery 1912 is not particularly illustrated in FIG. 87B, the battery 1912 may be charged by an electric generator or the like that is additionally provided. The semiconductor device 1913 functioning as a protective circuit can reduce application of overvoltage to the battery 1912 even at high temperatures. Moreover, the off-state current that flows when the protective circuit is not operated is extremely low, and thus, the power consumption can be reduced. Note that a pedal is illustrated in FIG. 87B; however; the pedal is not necessarily provided.

Figure 87C:
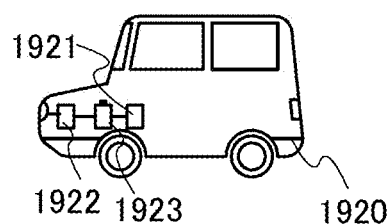

FIG. 87C illustrates an electric car 1920 as an application example of a semiconductor device functioning as a protective circuit. The electric car 1920 obtains power when current flows through a motor unit 1921. Moreover, the electric car 1920 includes a battery 1922 for supplying current that is to flow through the motor unit 1921 and a semiconductor device 1923 functioning as a protective circuit. Although a means to charge the battery 1922 is not particularly illustrated in FIG. 87C, the battery 1922 may be charged by an electric generator or the like that is additionally provided. The semiconductor device 1923 functioning as a protective circuit can reduce application of overvoltage to the battery 1922 even at high temperatures. Moreover, the off-state current that flows when the protective circuit is not operated is extremely low, and thus, the power consumption can be reduced.

Note that in this embodiment, what is illustrated in the drawing can be freely combined with or replaced with what is described in another embodiment as appropriate.

Example 1

In this example, results of observation and elemental analysis of In—Ga—Zn oxide films (hereinafter referred to as IGZO films) formed by the method described in the above embodiment will be described.

An IGZO film of a sample of this example was formed over a glass substrate with the intended thickness set to 100 nm by a sputtering method using an In—Ga—Zn oxide target (with an atomic ratio of In:Ga:Zn=4:2:4.1). The IGZO film was formed in an atmosphere including an argon gas at 180 sccm and an oxygen gas at 20 sccm, where the pressure was controlled to 0.6 Pa, the substrate temperature was room temperature, and an alternating-current power of 2.5 kW was applied.

The formed IGZO film of the sample was observed by HAADF-STEM and was subjected to measurement using EDX. With the use of an atomic resolution analytical electron microscope JEM-ARM200F manufactured by JEOL Ltd., the HAADF-STEM image was taken and the EDX measurement was performed under conditions where the acceleration voltage was 200 kV, and irradiation with an electron beam with a diameter of approximately 0.1 nm$\phi$ was performed.

In the EDX measurement, an energy dispersive X-ray spectrometer JED-2300T was used as an elemental analysis apparatus. A Si drift detector was used to detect X-rays emitted from the sample.

In the EDX measurement, an EDX spectrum of a point is obtained in such a manner that electron beam irradiation is performed on the point in an analysis target region of a sample, and the energy of characteristic X-rays of the sample generated by the irradiation and its frequency are measured. In this example, peaks of an EDX spectrum of the point were attributed to electron transition to the L shell in an In atom, electron transition to the K shell in a Ga atom, and electron transition to the K shell in a Zn atom and the K shell in an O atom, and the proportions of the atoms in the point were calculated. An EDX mapping image indicating distributions of the proportions of the atoms can be obtained through this process in an analysis target region of the sample.

FIGS. 88A to 88E and FIGS. 89A to 89E show the HAADF-STEM images and EDX mapping images of the IGZO film of the sample. FIGS. 88A to 88E show the HAADF-STEM images and EDX mapping images of a plane of the IGZO film, and FIGS. 89A to 89E show those of a cross section of the IGZO film. FIG. 88A and FIG. 89A are the HAADF-STEM images of the sample. FIG. 88B and FIG. 89B are EDX mapping images of O atoms, FIG. 88C and FIG. 89C are EDX mapping images of Zn atoms, FIG. 88D and FIG. 89D are EDX mapping images of Ga atoms, and FIG. 88E and FIG. 89E are EDX mapping images of In atoms. Note that the HAADF-STEM images and EDX mapping images in FIGS. 88A to 88E and FIGS. 89A to 89E were taken at a magnification of 7,200,000 times.

Bars above the EDX mapping images shown in FIGS. 88B to 88E and FIGS. 89B to 89E indicate the proportions [atomic %] of atoms in some points of the IGZO film.

The EDX mapping images in FIGS. 88B to 88E and FIGS. 89B to 89E show relative distribution of brightness indicating that the atoms have distributions in the IGZO film. Here, attention is focused on Outlined Square 1A and Outlined Square 1B in FIGS. 88B to 88E and Outlined Square 2A and Outlined Square 2B in FIGS. 89B to 89E.

In FIG. 88E and FIG. 89E, a relatively bright region occupies a large area in each of Outlined Squares 1A and 2A, while a relatively dark region occupies a large area in each of Outlined Squares 1B and 2B. That is, the number of In atoms is relatively large in the regions indicated by Outlined Squares 1A and 2A and the number of In atoms is relatively small in the regions indicated by Outlined Squares 1B and 2B. In FIG. 88E and FIG. 89E, the relatively bright regions correspond to Regions A1 described in the above embodiment, and the relatively dark regions correspond to Regions B1 described in the above embodiment.

In contrast to FIG. 88E and FIG. 89E, in FIG. 88D and FIG. 89D, a relatively dark region occupies a large area in each of Outlined Squares 1A and 2A, while a relatively bright region occupies a large area in each of Outlined Squares 1B and 2B. That is, the number of Ga atoms is relatively small in the regions indicated by Outlined Squares 1A and 2A and the number of Ga atoms is relatively large in the regions indicated by Outlined Squares 1B and 2B. In this manner, the number of Ga atoms tends to be relatively small in the region including a relatively large number of In atoms, and the number of Ga atoms tends to be relatively large in the region including a relatively small number of In atoms. Accordingly, in FIG. 88D and FIG. 89D, the relatively bright regions roughly correspond to Regions B1 described in the above embodiment, and the relatively dark regions roughly correspond to Regions A1 described in the above embodiment.

In FIG. 88C and FIG. 89C, a relatively bright region occupies a large area in each of Outlined Square 1B and Outlined Square 2B, while Outlined Square 1A and Outlined Square 2A each include a bright region whose area is not as large as that of the relatively bright region in Outlined Square 1B and Outlined Square 2B. In other words, the number of Zn atoms is relatively large in the regions indicated by Outlined Square 1B and Outlined Square 2B, and the number of Zn atoms in the regions indicated by Outlined Square 1A and Outlined Square 2A is not as large as that in the regions indicated by Outlined Square 1B and Outlined Square 2B.

As for FIG. 88B and FIG. 89B, similarly, the number of oxygen atoms is relatively large in the regions indicated by Outlined Square 1A, Outlined Square 1B, Outlined Square 2A, and Outlined Square 2B.

As described above, Region A1 of the IGZO film includes a large number of In atoms and a large number of O atoms and also includes a smaller number of Zn atoms than Region B1. It is thus suggested that Region A1 has a high content of, for example, indium, indium oxide, and In—Zn oxide. Accordingly, Region A1 serves as a region having higher conductivity than Region B1, so that Region A1 contributes to increases in field-effect mobility and on-state current of a transistor.

Here, when Regions A1 in FIG. 88E and FIG. 89E are examined, a plurality of particulate portions can be seen in Region A1. Observation of the particulate portions shows that they have a diameter of greater than or equal to 0.5 nm and less than or equal to 1.5 nm. Regions A1 appear to be formed by the plurality of particulate portions that are connected to each other. In this manner, Regions A1 extend in a cloud-like manner. The particulate portions included in Regions A1 correspond to the clusters in Regions A1 described in the above embodiment.

Furthermore, Region B1 of the IGZO film includes a large number of Ga atoms, a large number of Zn atoms, and a large number of O atoms and also includes a smaller number of In atoms than Region A1. It is thus suggested that Region B1 has a high content of, for example, In—Ga—Zn oxide. Accordingly, Region B1 serves as a region having a higher semiconductor property than Region A1, so that Region B1 contributes to the switching characteristics of a transistor.

Here, when the regions that correspond to Regions B1 in FIG. 88D and FIG. 89D are examined, a plurality of particulate portions can be seen in Region B1. Regions B1 also appear to be formed by the plurality of particulate portions that are connected to each other. In this manner, Regions B1 also extend in a cloud-like manner. The particulate portions included in Regions B1 correspond to the clusters in Regions B1 described in the above embodiment.

As described above, the IGZO film of the sample fabricated in this example is a composite oxide semiconductor where In-rich Regions A1 and In-poor Regions B1 are formed. Region A1 contributes to the on-state current and field-effect mobility of a transistor, and Region B1 contributes to the switching characteristics of a transistor. Therefore, with the use of the composite oxide semiconductor, a transistor with electrical characteristics in which the on-state current and the mobility are high and the S value is small can be manufactured.

At least part of this example can be implemented in combination with any of the embodiments and the other examples described in this specification as appropriate.

Example 2

In this example, a sample (Sample S2) different from Sample S1A described in Embodiment 1 was fabricated, and $I_d$-$V_g$ characteristics of Sample S2 were examined.

The conditions used for fabricating Sample S2 in this example are different from those used for fabricating Sample S1A only in the formation conditions of the oxide semiconductor film 108.

The oxide semiconductor film used for Sample S2 was formed under the following conditions: the substrate temperature was room temperature (25° C.); an argon gas with a flow rate of 140 sccm and an oxygen gas with a flow rate of 60 sccm were introduced into a chamber of the sputtering apparatus; the pressure was set to 0.6 Pa; and an AC power of 2.5 kw was applied to a metal oxide target containing indium, gallium, and zinc (with an atomic ratio of In:Ga:Zn=4:2:4.1). In this example, the oxygen flow rate percentage in deposition of the oxide semiconductor film was 30%.

Next, $I_d$-$V_g$ characteristics of the fabricated transistor of Sample S2 were measured. The measurement conditions of the $I_d$-$V_g$ characteristics of the transistor were the same as those used for measuring the $I_d$-$V_g$ characteristics of Sample S1A in Embodiment 1.

Figure 90:
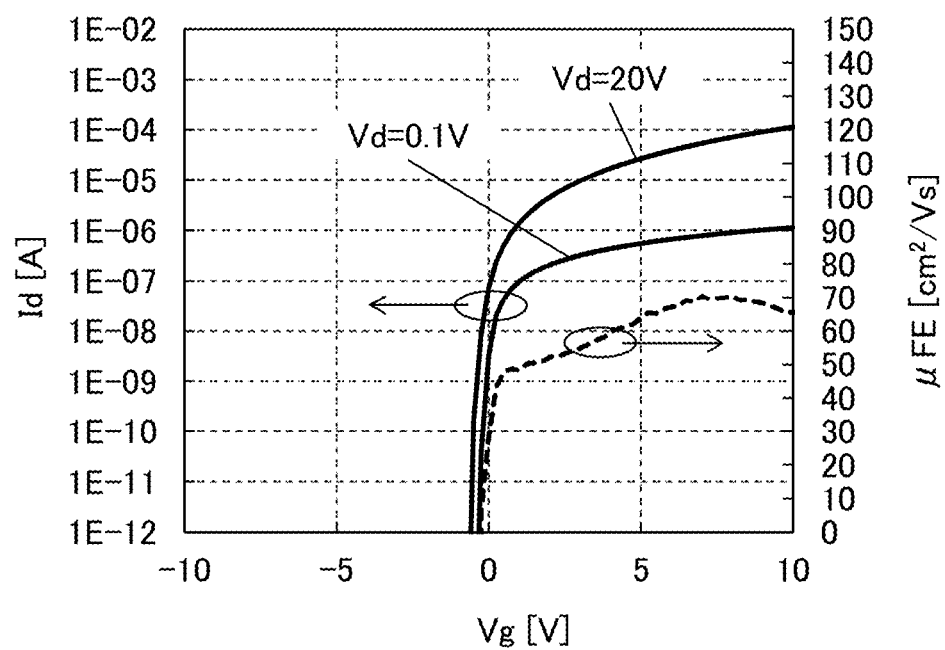
FIG. 90 shows $I_d$-$V_g$ characteristics of a transistor.

FIG. 90 shows the $I_d$-$V_g$ characteristics of Sample S2. In FIG. 90, the first vertical axis represents $I_d$ (A), the second vertical axis represents field-effect mobility ($\mu_{FE}$) (cm$^2$/Vs), and the horizontal axis represents $V_g$ (V). Note that the field-effect mobility was measured when $V_d$ was 20 V.

The transistor, which is a semiconductor device of one embodiment of the present invention, has excellent electrical characteristics as shown in FIG. 90. Here, Table 7 shows the transistor characteristics that are shown in FIG. 90.

TABLE 7

| µFE(max) [cm$^2$V$^{-1}$s$^{-1}$] | Vth [V] | S [V/decade] | Ioff [A/cm$^2$] | µFE(@Vg = 2 V) [cm$^2$V$^{-1}$s$^{-1}$] | µFE(max)/ µFE(@Vg = 2 V) |
|---|---|---|---|---|---|
| 70.5 | −0.42 | 0.14 | <1 × 10$^{-12}$ | 52.2 | 1.35 |

As shown in Table 7, Sample S2 includes a first region where the maximum value of the field-effect mobility of the transistor at a gate voltage of higher than 0 V and lower than or equal to 10 V is larger than or equal to 40 cm$^2$/Vs and smaller than 150 cm$^2$/Vs, a second region where the threshold voltage is higher than or equal to −1 V and lower than or equal to 1 V, a third region where the S value is smaller than 0.3 V/decade, and a fourth region where the off-state current is lower than 1×10$^{-12}$ A/cm$^2$, and $\mu_{FE}$(max)/$\mu_{FE}$ ($V_g$=2V) is larger than or equal to 1 and smaller than 1.5 where $\mu_{FE}$(max) represents the maximum value of the field-effect mobility of the transistor and $\mu_{FE}$($V_g$=2V) represents the value of the field-effect mobility of the transistor at a gate voltage of 2 V.

The above-described transistor characteristics are obtained by using the composite oxide semiconductor or C/IGZO described in Embodiment 1. Therefore, in the case where the composite oxide semiconductor or C/IGZO is used in a semiconductor layer of a transistor, a function of achieving high field-effect mobility and a function of achieving excellent switching characteristics can be obtained at the same time.

At least part of this example can be implemented in combination with any of the embodiments and the other examples described in this specification as appropriate.

REFERENCE NUMERALS

A1: region, A2: region, B1: region, B2: region, 82: insulating film, 84: insulating film, 86: insulating film, 88: oxide semiconductor film, 90: structure, 100A: transistor, 100B: transistor, 100C: transistor, 100D: transistor, 100E: transistor, 100F: transistor, 100G: transistor, 100H: transistor, 100J: transistor, 102: substrate, 104: insulating film, 106: conductive film, 108: oxide semiconductor film, 108_1: oxide semiconductor film, 108_2: oxide semiconductor film, 108_3: oxide semiconductor film, 108d: drain region, 108f: region, 108i: channel region, 108s: source region, 110: insulating film, 112: conductive film, 112_1: conductive film, 112_2: conductive film, 116: insulating film, 118: insulating film, 120a: conductive film, 120b: conductive film, 122: insulating film, 141a: opening portion, 141b: opening portion, 143: opening portion, 300A: transistor, 300B: transistor, 300C: transistor, 300D: transistor, 300E: transistor, 300F: transistor, 300G: transistor, 302: substrate, 304: conductive film, 306: insulating film, 307: insulating film, 308: oxide semiconductor film, 308_1: oxide semiconductor film, 308_2: oxide semiconductor film, 308_3: oxide semiconductor film, 312a: conductive film, 312b: conductive film, 312c: conductive film, 314: insulating film, 316: insulating film, 318: insulating film, 320a: conductive film, 320b: conductive film, 341a: opening portion, 341b: opening portion, 342a: opening portion, 342b: opening portion, 342c: opening portion, 351: opening portion, 352a: opening portion, 352b: opening portion, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure, 780: anisotropic conductive film, 782: light-emitting element, 783: droplet discharge apparatus, 784: droplet, 785: layer, 786: EL layer, 788: conductive film, 790: capacitor, 791: touch panel, 792: insulating film, 793: electrode, 794: electrode, 795: insulating film, 796: electrode, 797: insulating film, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head, 1413: material supply source, 1414: material supply source, 1900: electromagnetic cooker, 1901: coil unit, 1902: battery, 1903: semiconductor device, 1904: solar battery, 1910: electric bicycle, 1911: motor unit, 1912: battery, 1913: semiconductor device, 1920: electric car, 1921: motor unit, 1922: battery, 1923: semiconductor device, 2190: plasma, 2192: cation, 2194: sputtered particle, 2196: cluster, 2198: cluster, 2500a: target, 2500b: target, 2501: deposition chamber, 2502a: region, 2504a: region, 2510a: backing plate, 2510b: backing plate, 2520: target holder, 2520a: target holder, 2520b: target holder, 2530a: magnet unit, 2530b: magnet unit, 2530N1: magnet, 2530N2: magnet, 2530S: magnet, 2532: magnet holder, 2542: member, 2560: substrate, 2570: substrate holder, 2580a: magnetic line of force, 2580b: magnetic line of force, 3001: wiring, 3002: wiring, 3003: wiring, 3004: wiring, 3005: wiring, 3006: wiring, 3100: capacitor, 3112: conductor, 3116: conductor, 3130: insulator, 3132: insulator, 3134: insulator, 3150: insulator, 3200: transistor, 3205: conductor, 3210: insulator, 3212: insulator, 3216: insulator, 3218: conductor, 3224: insulator, 3272: insulator, 3280: insulator, 3282: insulator, 3284: insulator, 3285: conductor, 3300: transistor, 3311: substrate, 3312: semiconductor region, 3314: insulator, 3316: conductor, 3318a: low-resistance region, 3318b: low-resistance region, 3320: insulator, 3322: insulator, 3324: insulator, 3326: insulator, 3328: conductor, 3330: conductor, 3350: insulator, 3352: insulator, 3354: insulator, 3356: conductor, 3358: insulator, 3400: transistor, 4001: wiring, 4003: wiring, 4005: wiring, 4006: wiring, 4007: wiring, 4008: wiring, 4009: wiring, 4021: layer, 4023: layer, 4100: transistor, 4200: transistor, 4300: transistor, 4400: transistor, 4500: capacitor, 4600: capacitor, 5400: semiconductor device, 5401: CPU core, 5402: power control, 5403: power switch, 5404: cache, 5405: bus interface, 5406: debug interface, 5407: control unit, 5408: PC, 5409: pipeline register, 5410: pipeline register, 5411: ALU, 5412: register file, 5421: power management unit, 5422: peripheral circuit, 5423: data bus, 5500: semiconductor device, 5501: memory circuit, 5502: memory circuit, 5503: memory circuit, 5504: circuit, 5509: transistor, 5510: transistor, 5512: transistor, 5513: transistor, 5515: transistor, 5517: transistor, 5518: transistor, 5519: capacitor, 5520: capacitor, 5540: wiring, 5541: wiring, 5542: wiring, 5543: wiring, 5544: wiring, 5711: substrate, 5712: circuit region, 5713: separation region, 5714: separation line, 5715: chip, 5750: electronic component, 5752: printed circuit board, 5753: semiconductor device, 5754: circuit board, 5755: lead, 5800: inverter, 5810: OS transistor, 5820: OS transistor, 5831: signal waveform, 5832: signal waveform, 5840: dashed line, 5841: solid line, 5850: OS transistor, 5860: CMOS inverter, 5900: semiconductor device, 5901: power supply circuit, 5902: circuit, 5903: voltage generation circuit, 5903A: voltage generation circuit, 5903B: voltage generation circuit, 5903C: voltage generation circuit, 5903D: voltage generation circuit, 5903E: voltage generation circuit, 5904: circuit, 5905: voltage generation circuit, 5905A: voltage generation circuit, 5906: circuit, 5911: transistor, 5912: transistor, 5912A: transistor, 5912B: transistor, 5921: control circuit, 5922: transistor, 7000: display module, 7001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing bands, 8305: lenses, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9150: television device, 9151: housing, 9152: display portion, 9153: stand, 9154: remote controller, 9200: portable information terminal, 9201: portable information terminal, 9250: notebook personal computer, 9251: housing, 9252: display portion, 9253: keyboard, 9254: pointing device, 9300: slot machine, 9301: housing, 9302: sensor, 9303: display portion, 9304: start lever, 9305: stop switch, 9306: light source for sensor, 9400: automobile, 9401: car body, 9402: wheel, 9403: windshield, 9404: light, 9405: fog lamp, 9410: display portion, 9411: display portion, 9412: display portion, 9413: display portion, 9414: display portion, 9415: display portion, 9416: display portion, 9417: display portion, 9500: display device, 9501: display panel, 9502: display region, 9503: region, 9511: hinge, 9512: bearing, 9600: digital signage, 9601: display portion, 9602: housing, 9603: speaker.

This application is based on Japanese Patent Application serial no. 2016-057718 filed with Japan Patent Office on Mar. 22, 2016, Japanese Patent Application serial no. 2016-057720 filed with Japan Patent Office on Mar. 22, 2016, and Japanese Patent Application serial no. 2016-057716 filed with Japan Patent Office on Mar. 22, 2016, the entire contents of which are hereby incorporated by reference.

The invention claimed is:

1. A transistor comprising:
an insulating film;
a source electrode;
a drain electrode;
a gate electrode; and
an oxide semiconductor film,
wherein the source electrode includes a region in contact with the oxide semiconductor film,
wherein the drain electrode includes a region in contact with the oxide semiconductor film,
wherein the gate electrode includes a region that overlaps with the oxide semiconductor film,
wherein the insulating film is provided between the gate electrode and the oxide semiconductor film,
wherein drain current-gate voltage characteristics of the transistor when a source voltage is 0V, a drain voltage is 20V, and a gate voltage is higher than −10 V and lower than or equal to 10 V represents:
a maximum value of field-effect mobility of the transistor is larger than or equal to 40 $cm^2/Vs$ and smaller than 150 $cm^2/Vs$;
a threshold voltage of the transistor is higher than or equal to −1 V and lower than or equal to 1 V;

an S value of the transistor is smaller than 0.3 V/decade; and an off-state current of the transistor is lower than $1\times10^{-12}$ A/cm$^2$, wherein the oxide semiconductor film includes a composite oxide semiconductor in which a first region and a second region are mixed, wherein the first region includes a plurality of first clusters including, as a main component, one or more selected from indium, zinc, and oxygen, wherein the second region includes a plurality of second clusters including, as a main component, one or more selected from indium, an element M, zinc, and oxygen, wherein the element M is one of Al, Ga, Y, and Sn, wherein the first region includes a portion in which the plurality of first clusters are connected to each other, and wherein the second region includes a portion in which the plurality of second clusters are connected to each other.

2. The transistor according to claim 1, wherein $\mu_{FE}(\max)/\mu_{FE}(V_g=2V)$ is larger than or equal to 1 and smaller than 1.5, where $\mu_{FE}(\max)$ represents the maximum value of the field-effect mobility of the transistor and $\mu_{FE}(V_g=2V)$ represents a value of the field-effect mobility of the transistor at a gate voltage of 2 V.

3. The transistor according to claim 1, wherein $\mu_{FE}(\max)/\mu_{FE}(V_g=2V)$ is larger than or equal to 1.5 and smaller than 3, where $\mu_{FE}(\max)$ represents the maximum value of the field-effect mobility of the transistor and $\mu_{FE}(V_g=2V)$ represents a value of the field-effect mobility of the transistor at a gate voltage of 2 V.

4. The transistor according to claim 1, wherein an atomic ratio of indium to the element M and zinc is [In]:[M]:[Zn]=4:2:3 or in a neighborhood of 4:2:3 in the second region, and wherein, when the [In] is 4, the [M] is greater than or equal to 1.5 and less than or equal to 2.5 and the [Zn] is greater than or equal to 2 and less than or equal to 4.

5. The transistor according to claim 1, wherein an atomic ratio of indium to the element M and zinc is [In]:[M]:[Zn]=5:1:6 or in a neighborhood of 5:1:6 in the second region, and wherein, when the [In] is 5, the [M] is greater than or equal to 0.5 and less than or equal to 1.5 and the [Zn] is greater than or equal to 5 and less than or equal to 7.

6. A display device comprising a display portion comprising a pixel, wherein the pixel comprises the transistor according to claim 1.

7. A display device comprising a display portion and a driver circuit, wherein the driver circuit comprises the transistor according to claim 1.

8. A transistor comprising:

a first gate electrode;

a first insulating film over the first gate electrode;

an oxide semiconductor film over the first insulating film, a second insulating film over the oxide semiconductor film;

a second gate electrode over the second insulating film; and a third insulating film over the second gate electrode, wherein the oxide semiconductor film comprises a channel region overlapping with the first gate electrode, a source region in contact with the third insulating film, and a drain region in contact with the third insulating film, wherein the first gate electrode is electrically connected to the second gate electrode, wherein drain current-gate voltage characteristics of the transistor when a source voltage is 0V, a drain voltage is 20V, and a gate voltage is higher than −10 V and lower than or equal to 10 V represents:

a maximum value of field-effect mobility of the transistor is larger than or equal to 40 cm$^2$/Vs and smaller than 150 cm$^2$/Vs;

a threshold voltage of the transistor is higher than or equal to −1 V and lower than or equal to 1 V;

an S value of the transistor is smaller than 0.3 V/decade; and an off-state current of the transistor is lower than $1\times10^{-12}$ A/cm$^2$, wherein the oxide semiconductor film includes a composite oxide semiconductor in which a first region and a second region are mixed, wherein the first region includes a plurality of first clusters including, as a main component, one or more selected from indium, zinc, and oxygen, wherein the second region includes a plurality of second clusters including, as a main component, one or more selected from indium, an element M, zinc, and oxygen, wherein the element M is one of Al, Ga, Y, and Sn, wherein the first region includes a portion in which the plurality of first clusters are connected to each other, and wherein the second region includes a portion in which the plurality of second clusters are connected to each other.

9. The transistor according to claim 8, wherein $\mu_{FE}(\max)/\mu_{FE}(V_g=2V)$ is larger than or equal to 1 and smaller than 1.5, where $\mu_{FE}(\max)$ represents the maximum value of the field-effect mobility of the transistor and $\mu_{FE}(V_g=2V)$ represents a value of the field-effect mobility of the transistor at a gate voltage of 2 V.

10. The transistor according to claim 8, wherein $\mu_{FE}(\max)/\mu_{FE}(V_g=2V)$ is larger than or equal to 1.5 and smaller than 3, where $\mu_{FE}(\max)$ represents the maximum value of the field-effect mobility of the transistor and $\mu_{FE}(V_g=2V)$ represents a value of the field-effect mobility of the transistor at a gate voltage of 2 V.

11. The transistor according to claim 8, wherein an atomic ratio of indium to the element M and zinc is [In]:[M]:[Zn]=4:2:3 or in a neighborhood of 4:2:3 in the second region, and wherein, when the [In] is 4, the [M] is greater than or equal to 1.5 and less than or equal to 2.5 and the [Zn] is greater than or equal to 2 and less than or equal to 4.

12. The transistor according to claim 8, wherein an atomic ratio of indium to the element M and zinc is [In]:[M]:[Zn]=5:1:6 or in a neighborhood of 5:1:6 in the second region, and wherein, when the [In] is 5, the [M] is greater than or equal to 0.5 and less than or equal to 1.5 and the [Zn] is greater than or equal to 5 and less than or equal to 7.

13. A display device comprising a display portion comprising a pixel, wherein the pixel comprises the transistor according to claim 8.

14. A display device comprising a display portion and a driver circuit, wherein the driver circuit comprises the transistor according to claim 8.

15. A transistor comprising:
an insulating film;
a source electrode;
a drain electrode;
a gate electrode; and
an oxide semiconductor film,
wherein the source electrode includes a region in contact with the oxide semiconductor film,
wherein the drain electrode includes a region in contact with the oxide semiconductor film,
wherein the gate electrode includes a region that overlaps with the oxide semiconductor film,
wherein the insulating film is provided between the gate electrode and the oxide semiconductor film,
wherein drain current-gate voltage characteristics of the transistor when a source voltage is 0V, a drain voltage is 20V, and a gate voltage is higher than −10 V and lower than or equal to 10 V represents:
  a maximum value of field-effect mobility of the transistor is larger than or equal to 10 cm$^2$/Vs and smaller than 100 cm$^2$/Vs;
  a threshold voltage of the transistor is higher than or equal to −1 V and lower than or equal to 1 V;
  an S value of the transistor is smaller than 0.3 V/decade; and
  an off-state current of the transistor is lower than $1\times10^{-12}$ A/cm$^2$,
wherein the oxide semiconductor film includes a composite oxide semiconductor in which a first region and a second region are mixed,
wherein the first region includes a plurality of first clusters including, as a main component, one or more selected from indium, zinc, and oxygen,
wherein the second region includes a plurality of second clusters including, as a main component, one or more selected from indium, an element M, zinc, and oxygen,
wherein the element M is one of Al, Ga, Y, and Sn,
wherein the first region includes a portion in which the plurality of first clusters are connected to each other, and
wherein the second region includes a portion in which the plurality of second clusters are connected to each other.

16. The transistor according to claim 15,
wherein $\mu_{FE}(\text{max})/\mu_{FE}(V_g=2V)$ is larger than or equal to 3 and smaller than 10, where $\mu_{FE}(\text{max})$ represents the maximum value of the field-effect mobility of the transistor and $\mu_{FE}(V_g=2V)$ represents a value of the field-effect mobility of the transistor at a gate voltage of 2 V.

17. The transistor according to claim 15,
wherein an atomic ratio of indium to the element M and zinc is [In]:[M]:[Zn]=4:2:3 or in a neighborhood of 4:2:3 in the second region, and
wherein, when the [In] is 4, the [M] is greater than or equal to 1.5 and less than or equal to 2.5 and the [Zn] is greater than or equal to 2 and less than or equal to 4.

18. The transistor according to claim 15,
wherein an atomic ratio of indium to the element M and zinc is [In]:[M]:[Zn]=5:1:6 or in a neighborhood of 5:1:6 in the second region, and
wherein, when the [In] is 5, the [M] is greater than or equal to 0.5 and less than or equal to 1.5 and the [Zn] is greater than or equal to 5 and less than or equal to 7.

19. A display device comprising a display portion comprising a pixel,
wherein the pixel comprises the transistor according to claim 15.

20. A display device comprising a display portion and a driver circuit,
wherein the driver circuit comprises the transistor according to claim 15.

21. A transistor comprising:
a first gate electrode;
a first insulating film over the first gate electrode;
an oxide semiconductor film over the first insulating film,
a second insulating film over the oxide semiconductor film;
a second gate electrode over the second insulating film; and
a third insulating film over the second gate electrode,
wherein the oxide semiconductor film comprises a channel region overlapping with the first gate electrode, a source region in contact with the third insulating film, and a drain region in contact with the third insulating film,
wherein the first gate electrode is electrically connected to the second gate electrode,
wherein drain current-gate voltage characteristics of the transistor when a source voltage is 0V, a drain voltage is 20V, and a gate voltage is higher than −10 V and lower than or equal to 10 V represents:
  a maximum value of field-effect mobility of the transistor is larger than or equal to 10 cm$^2$/Vs and smaller than 100 cm$^2$/Vs;
  a threshold voltage of the transistor is higher than or equal to −1 V and lower than or equal to 1 V;
  an S value of the transistor is smaller than 0.3 V/decade; and
  an off-state current of the transistor is lower than $1\times10^{-12}$ A/cm$^2$,
wherein the oxide semiconductor film includes a composite oxide semiconductor in which a first region and a second region are mixed,
wherein the first region includes a plurality of first clusters including, as a main component, one or more selected from indium, zinc, and oxygen,
wherein the second region includes a plurality of second clusters including, as a main component, one or more selected from indium, an element M, zinc, and oxygen,
wherein the element M is one of Al, Ga, Y, and Sn,
wherein the first region includes a portion in which the plurality of first clusters are connected to each other, and
wherein the second region includes a portion in which the plurality of second clusters are connected to each other.

22. The transistor according to claim 21,
wherein $\mu_{FE}(\text{max})/\mu_{FE}(V_g=2V)$ is larger than or equal to 3 and smaller than 10, where $\mu_{FE}(\text{max})$ represents the maximum value of the field-effect mobility of the transistor and $\mu_{FE}(V_g=2V)$ represents a value of the field-effect mobility of the transistor at a gate voltage of 2 V.

23. The transistor according to claim 21,
wherein an atomic ratio of indium to the element M and zinc is [In]:[M]:[Zn]=4:2:3 or in a neighborhood of 4:2:3 in the second region, and
wherein, when the [In] is 4, the [M] is greater than or equal to 1.5 and less than or equal to 2.5 and the [Zn] is greater than or equal to 2 and less than or equal to 4.

24. The transistor according to claim 21,
wherein an atomic ratio of indium to the element M and zinc is [In]:[M]:[Zn]=5:1:6 or in a neighborhood of 5:1:6 in the second region, and
wherein, when the [In] is 5, the [M] is greater than or equal to 0.5 and less than or equal to 1.5 and the [Zn] is greater than or equal to 5 and less than or equal to 7.

25. A display device comprising a display portion comprising a pixel,
wherein the pixel comprises the transistor according to claim 21.

26. A display device comprising a display portion and a driver circuit,
wherein the driver circuit comprises the transistor according to claim 21.

* * * * *